United States Patent
Vojcic et al.

(10) Patent No.: US 10,574,390 B2
(45) Date of Patent: *Feb. 25, 2020

(54) SYSTEMS AND METHODS FOR ADVANCED ITERATIVE DECODING AND CHANNEL ESTIMATION OF CONCATENATED CODING SYSTEMS

(71) Applicant: LN2 DB, LLC, Palm Beach, FL (US)

(72) Inventors: Branimir R. Vojcic, Vienna, VA (US); Farnaz Shayegh, Montreal (CA); Hakan Dogan, Instanbul (TR); Wookwon Lee, Fairview, PA (US)

(73) Assignee: LN2 DB, LLC, Palm Beach, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/171,224

(22) Filed: Oct. 25, 2018

(65) Prior Publication Data

US 2019/0068320 A1    Feb. 28, 2019

Related U.S. Application Data

(63) Continuation of application No. 15/236,066, filed on Aug. 12, 2016, now Pat. No. 10,135,567, which is a (Continued)

(51) Int. Cl.
*H04L 1/00* (2006.01)
*H04L 27/26* (2006.01)
(Continued)

(52) U.S. Cl.
CPC ........ *H04L 1/0045* (2013.01); *G06F 11/1625* (2013.01); *H03M 13/112* (2013.01);
(Continued)

(58) Field of Classification Search
CPC .. H03M 13/3746; H04L 1/0048; H04L 1/005; H04L 1/0631; H04L 25/025
See application file for complete search history.

(56) References Cited

U.S. PATENT DOCUMENTS 6,993,070 B1  1/2006 Berthet et al.
2005/0268204 A1  12/2005 Harada
(Continued)

OTHER PUBLICATIONS

European Search Report for Application No. 18181294.2 dated Jan. 25, 2019.
(Continued)

*Primary Examiner* — David S Huang
(74) *Attorney, Agent, or Firm* — Bryan Cave Leighton Paisner LLP

(57) ABSTRACT

Systems and methods for decoding block and concatenated codes are provided. These include advanced iterative decoding techniques based on belief propagation algorithms, with particular advantages when applied to codes having higher density parity check matrices such as iterative soft-input soft-output and list decoding of convolutional codes, Reed-Solomon codes and BCH codes. Improvements are also provided for performing channel state information estimation including the use of optimum filter lengths based on channel selectivity and adaptive decision-directed channel estimation. These improvements enhance the performance of various communication systems and consumer electronics. Particular improvements are also provided for decoding HD radio signals, satellite radio signals, digital audio broadcasting (DAB) signals, digital audio broadcasting plus (DAB+) signals, digital video broadcasting-handheld (DVB-H) signals, digital video broadcasting-terrestrial (DVB-T) signals, world space system signals, terrestrial-digital multimedia broadcasting (T-DMB) signals, and China mobile multimedia broadcasting (CMMB) signals. These and other improvements enhance the decoding of different digital signals.

21 Claims, 66 Drawing Sheets

System model for a linear block code encoder, channel and soft decoder based on BP

Related U.S. Application Data continuation of application No. 14/942,570, filed on Nov. 16, 2015, now Pat. No. 9,698,941, which is a continuation of application No. 13/693,023, filed on Dec. 3, 2012, now Pat. No. 9,191,256.

(51) Int. Cl.

| | | |
|---|---|---|
| H04L 25/02 | (2006.01) | |
| H04B 17/309 | (2015.01) | |
| H03M 13/00 | (2006.01) | |
| G06F 11/16 | (2006.01) | |
| H03M 13/11 | (2006.01) | |
| H03M 13/15 | (2006.01) | |
| H03M 13/25 | (2006.01) | |
| H03M 13/27 | (2006.01) | |
| H03M 13/29 | (2006.01) | |
| H03M 13/37 | (2006.01) | |
| H03M 13/45 | (2006.01) | |
| H03M 13/23 | (2006.01) | |
| H03M 13/09 | (2006.01) | |
| H03M 13/39 | (2006.01) | |

(52) U.S. Cl.
CPC .... *H03M 13/1108* (2013.01); *H03M 13/1111* (2013.01); *H03M 13/1131* (2013.01); *H03M 13/1154* (2013.01); *H03M 13/1191* (2013.01); *H03M 13/1515* (2013.01); *H03M 13/23* (2013.01); *H03M 13/255* (2013.01); *H03M 13/27* (2013.01); *H03M 13/2792* (2013.01); *H03M 13/2906* (2013.01); *H03M 13/2933* (2013.01); *H03M 13/2948* (2013.01); *H03M 13/373* (2013.01); *H03M 13/3707* (2013.01); *H03M 13/3746* (2013.01); *H03M 13/3784* (2013.01); *H03M 13/45* (2013.01); *H03M 13/451* (2013.01); *H03M 13/453* (2013.01); *H03M 13/612* (2013.01); *H03M 13/616* (2013.01); *H03M 13/6325* (2013.01); *H03M 13/6337* (2013.01); *H03M 13/658* (2013.01); *H03M 13/6541* (2013.01); *H03M 13/6552* (2013.01); *H04B 17/309* (2015.01); *H04L 1/004* (2013.01); *H04L 1/005* (2013.01); *H04L 1/0057* (2013.01); *H04L 1/0059* (2013.01); *H04L 1/0065* (2013.01); *H04L 1/0071* (2013.01); *H04L 25/022* (2013.01); *H04L 25/0222* (2013.01); *H04L 25/0224* (2013.01); *H04L 25/0236* (2013.01); *H04L 27/261* (2013.01); *H04L 27/2649* (2013.01); *H05K 999/99* (2013.01); *H03M 13/09* (2013.01); *H03M 13/3938* (2013.01); *H03M 13/6362* (2013.01)

(56) References Cited

U.S. PATENT DOCUMENTS

| | | |
|---|---|---|
| 2009/0313525 A1 | 12/2009 | Savin |
| 2010/0074319 A1 | 3/2010 | Tseng et al. |
| 2011/0252294 A1 | 10/2011 | Ng |
| 2013/0061107 A1* | 3/2013 | Wang et al. ....... H03M 13/1117 714/752 |
| 2013/0275827 A1* | 10/2013 | Wang ................. G06F 11/1076 714/752 |

OTHER PUBLICATIONS

Chi-Yuan Chang, "New group shuffled BP decoding algorithms for LDPC codes," Proc. IEEE International Symposium on Information Theory, ISIT 2009, Jun. 28, 2009, pp. 1664-1668.
Korea Patent Application No. 10-2015-7015427 Notice to Submit a Response dated Jul. 9, 2019.

* cited by examiner

System model for a concatenated scheme where the outer code is decoded using a soft decoder based on BP Factor graph of a linear block code showing a short cycle using dashed lines. Flooding BP is used for message passing Factor graph of a linear block code showing informed BP scheduling using the RBP algorithm Exemplary proposed decoding method The effect of matrix diversity on the performance of RS(255,239), BP iterations are performed using the simple greedy BP algorithm Comparison of different decoding methods for RS(255,239) including the exemplary proposed method

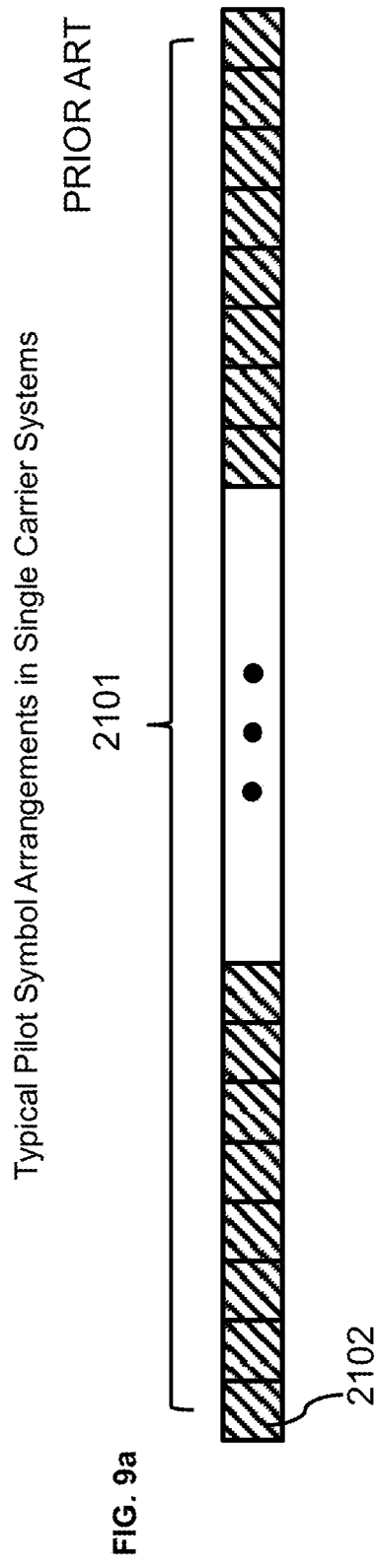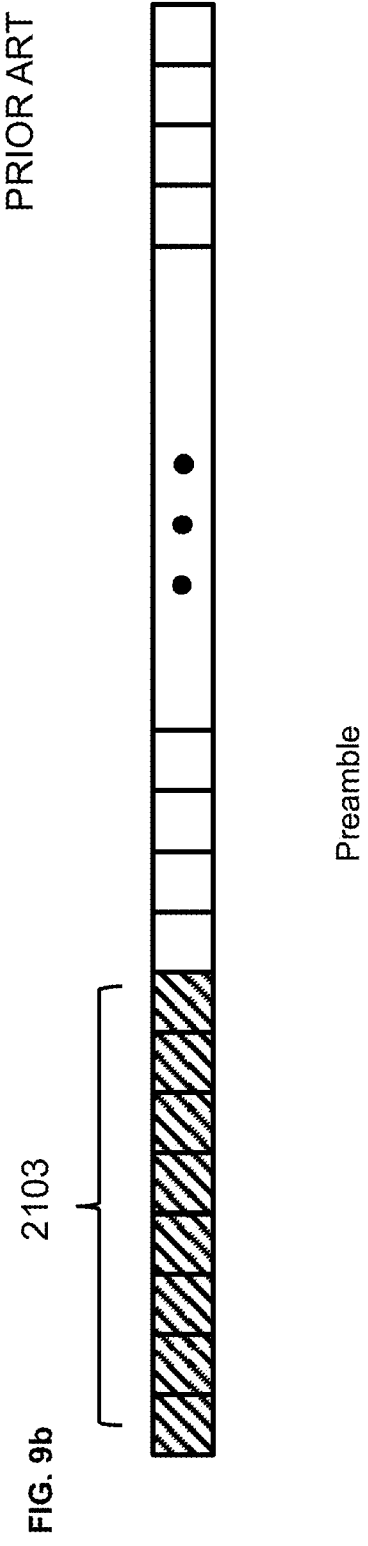
FIG. 9a  Typical Pilot Symbol Arrangements in Single Carrier Systems
FIG. 9b  Pilot Channel (Continous Stream of Pilot Symbols)

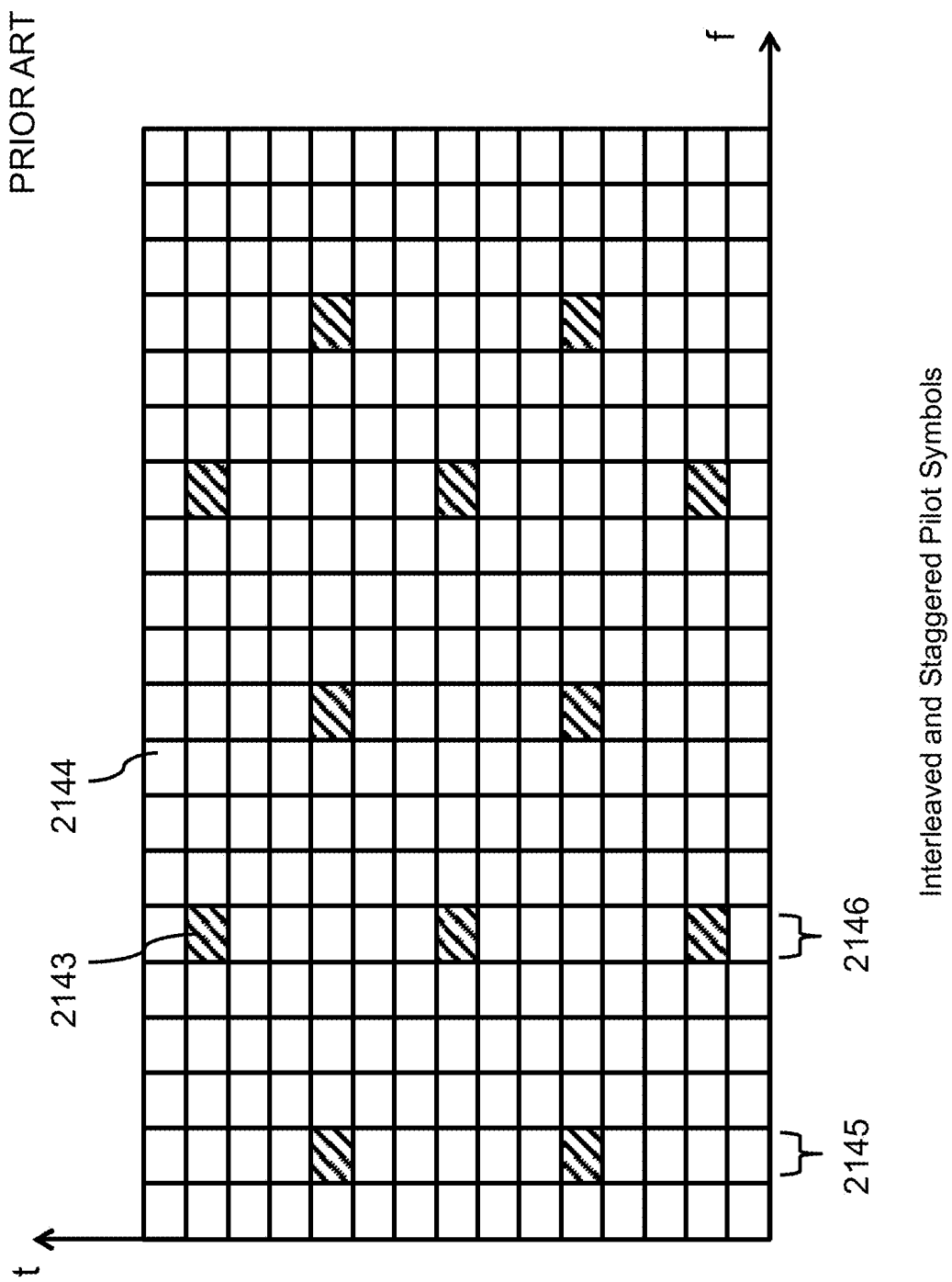

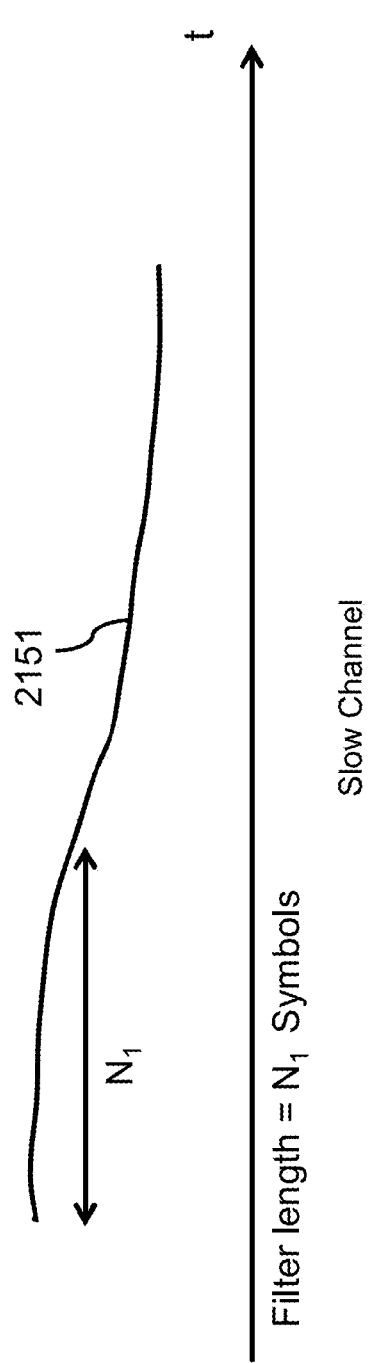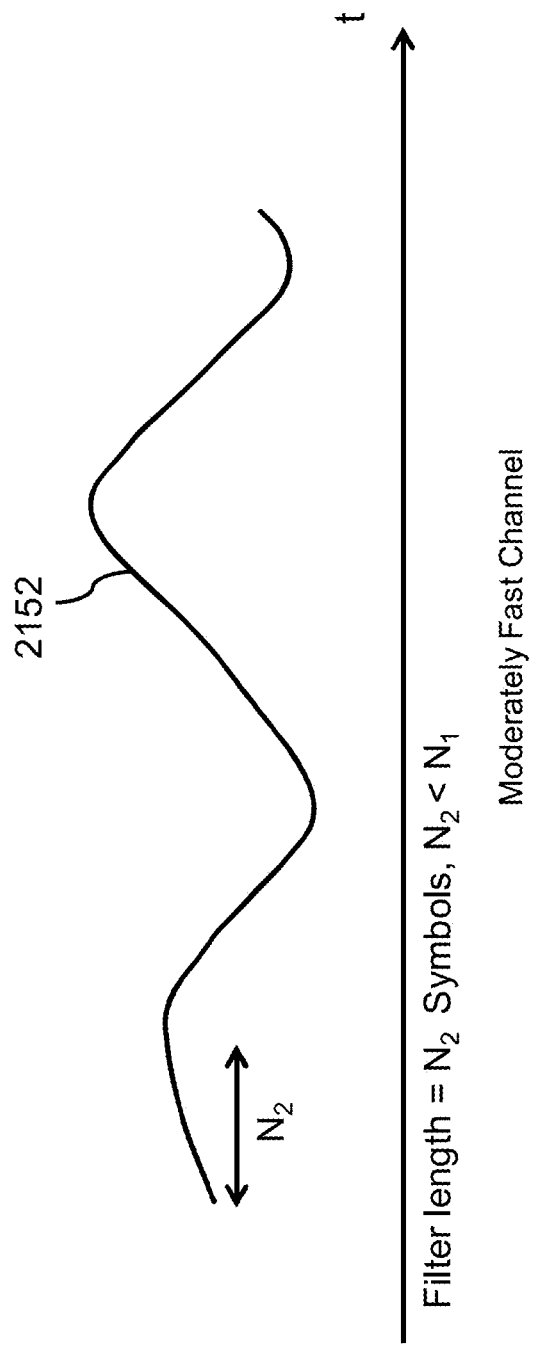
FIG. 11a
FIG. 11b

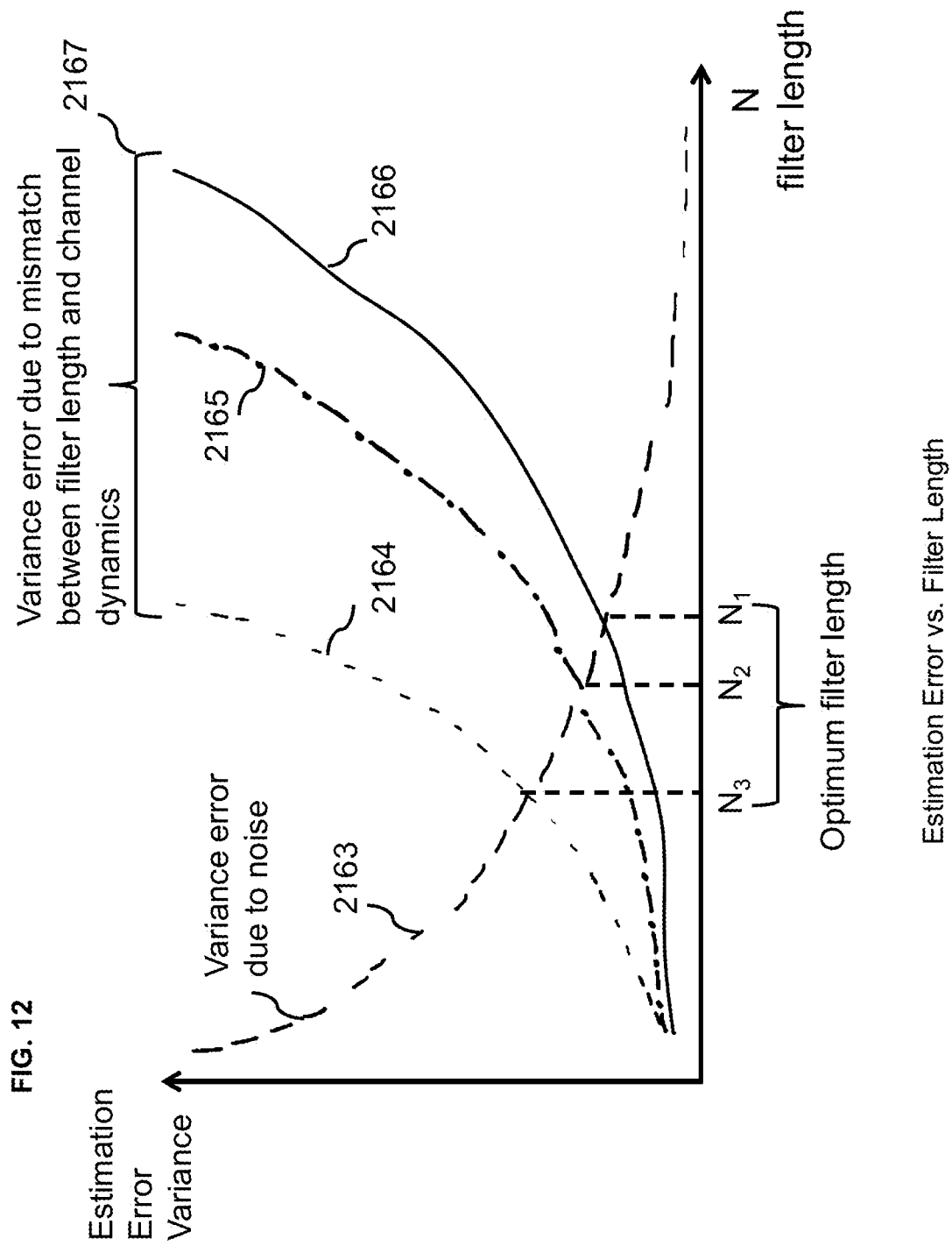

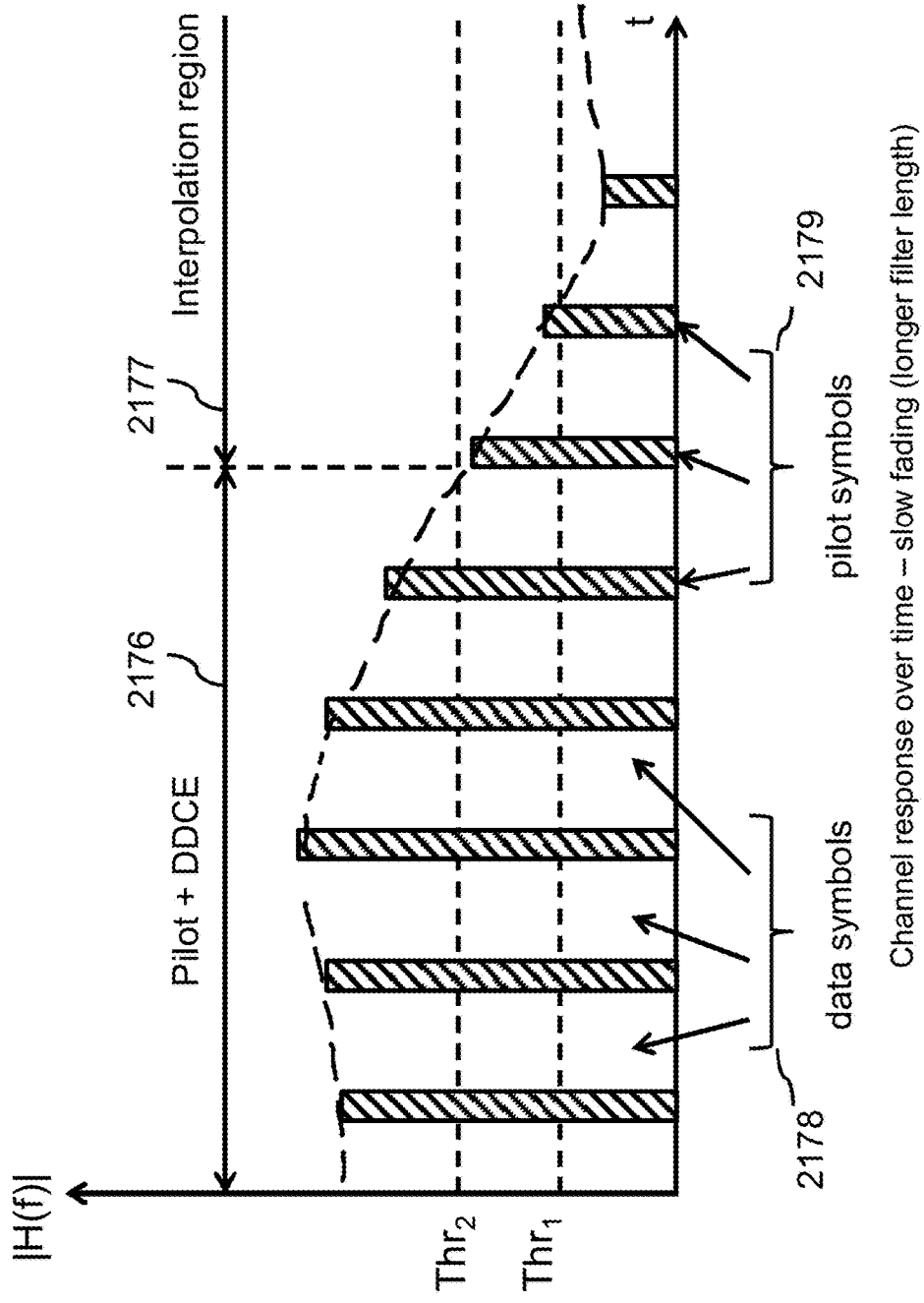

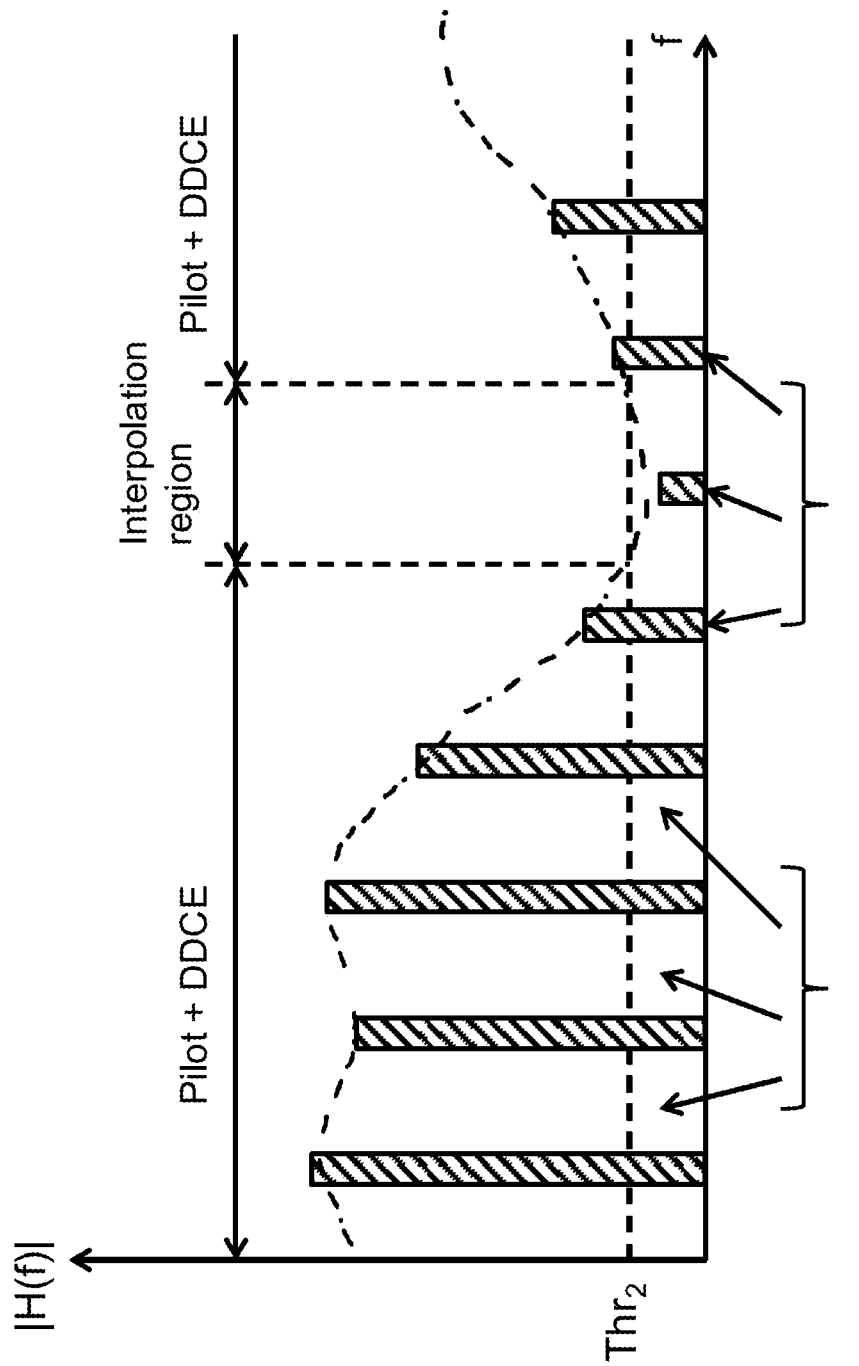

Flow Chart of Initial Algorithm

Joint, Iterative CSI Estimation and SISO Decoding

Time-varying SNIR for Two Diversity Channels

Block diagram for general concatenated encoding and decoding

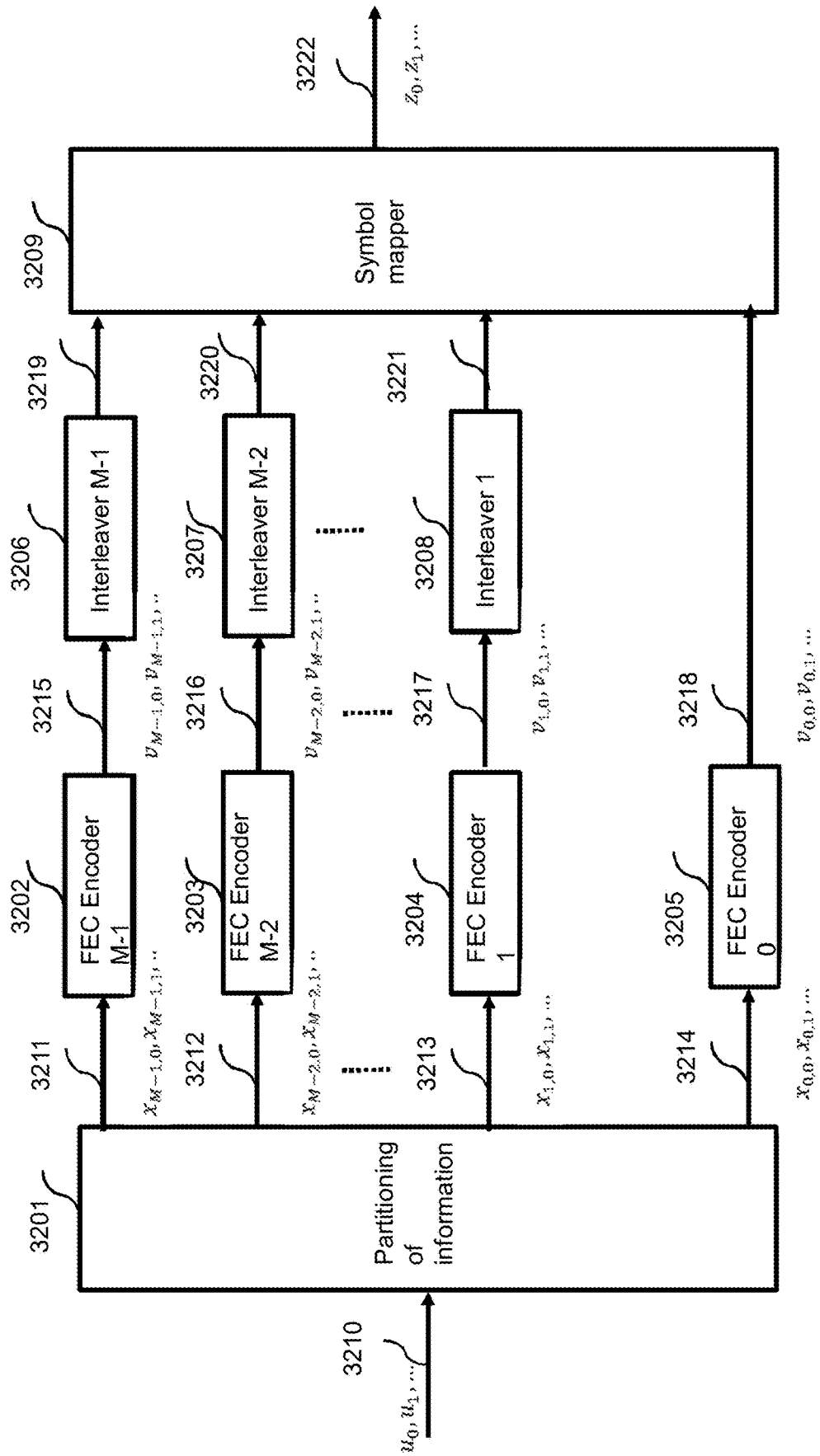

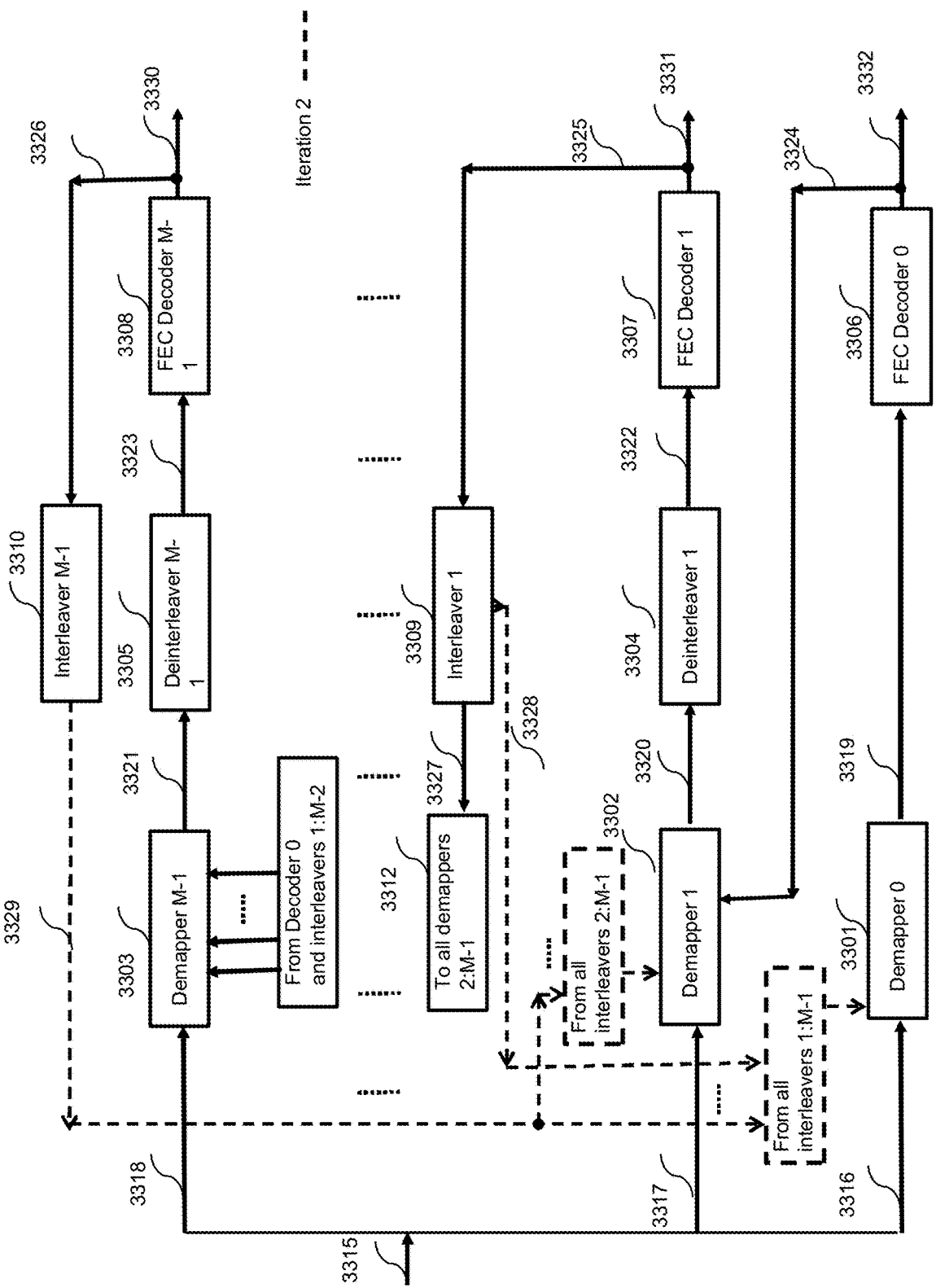
FIG. 20  Multilevel decoding with M levels

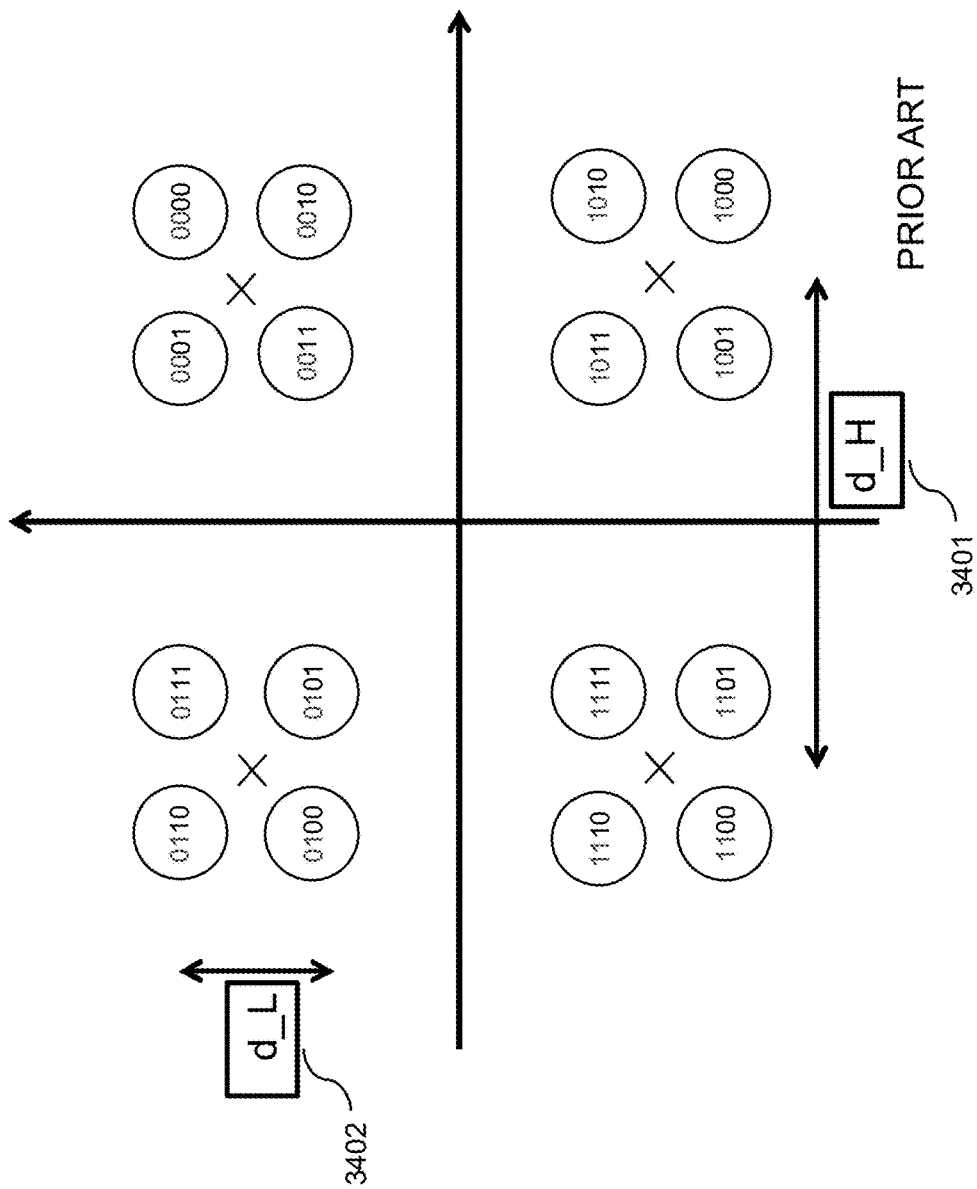

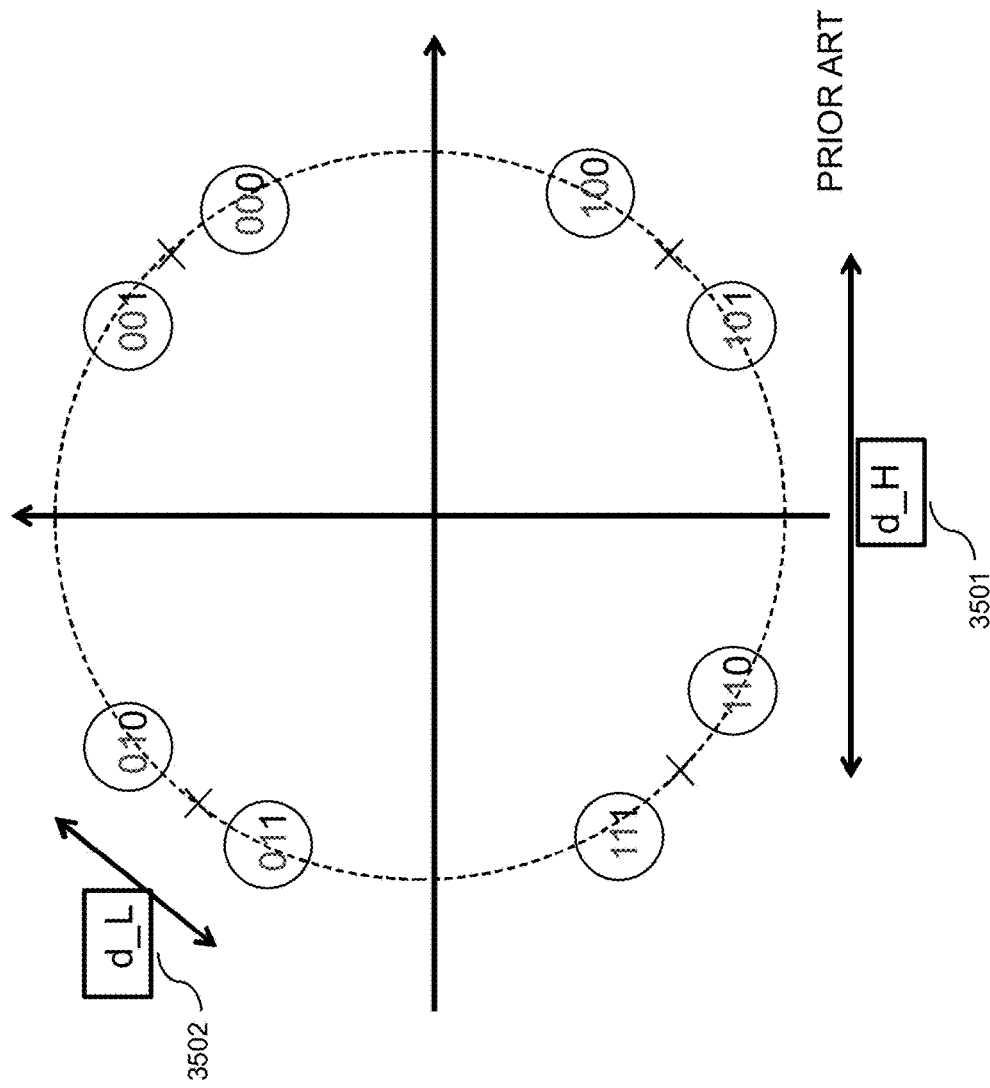

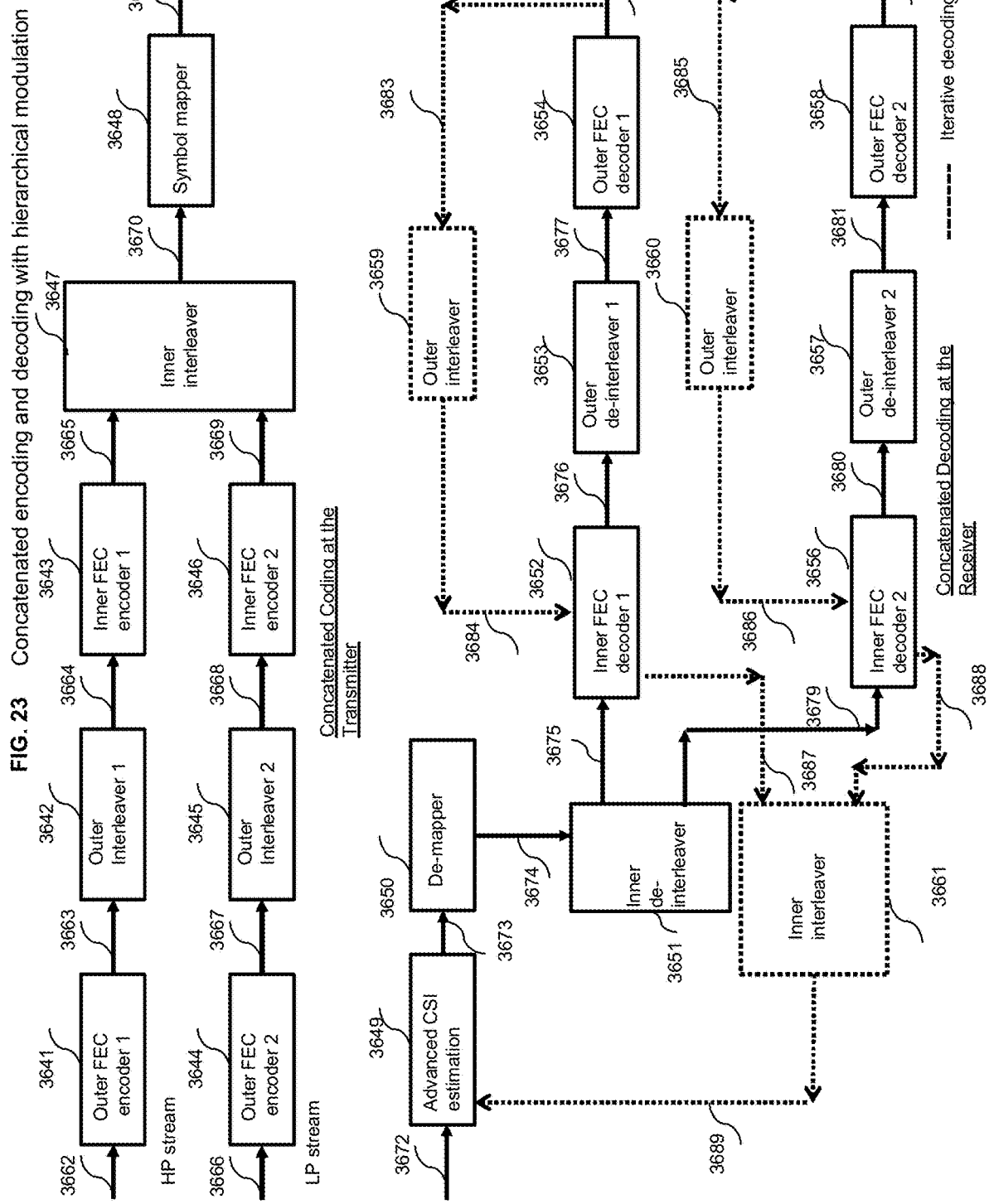
FIG. 23 Concatenated encoding and decoding with hierarchical modulation A schematic functional diagram of simplified HD Radio transmitter

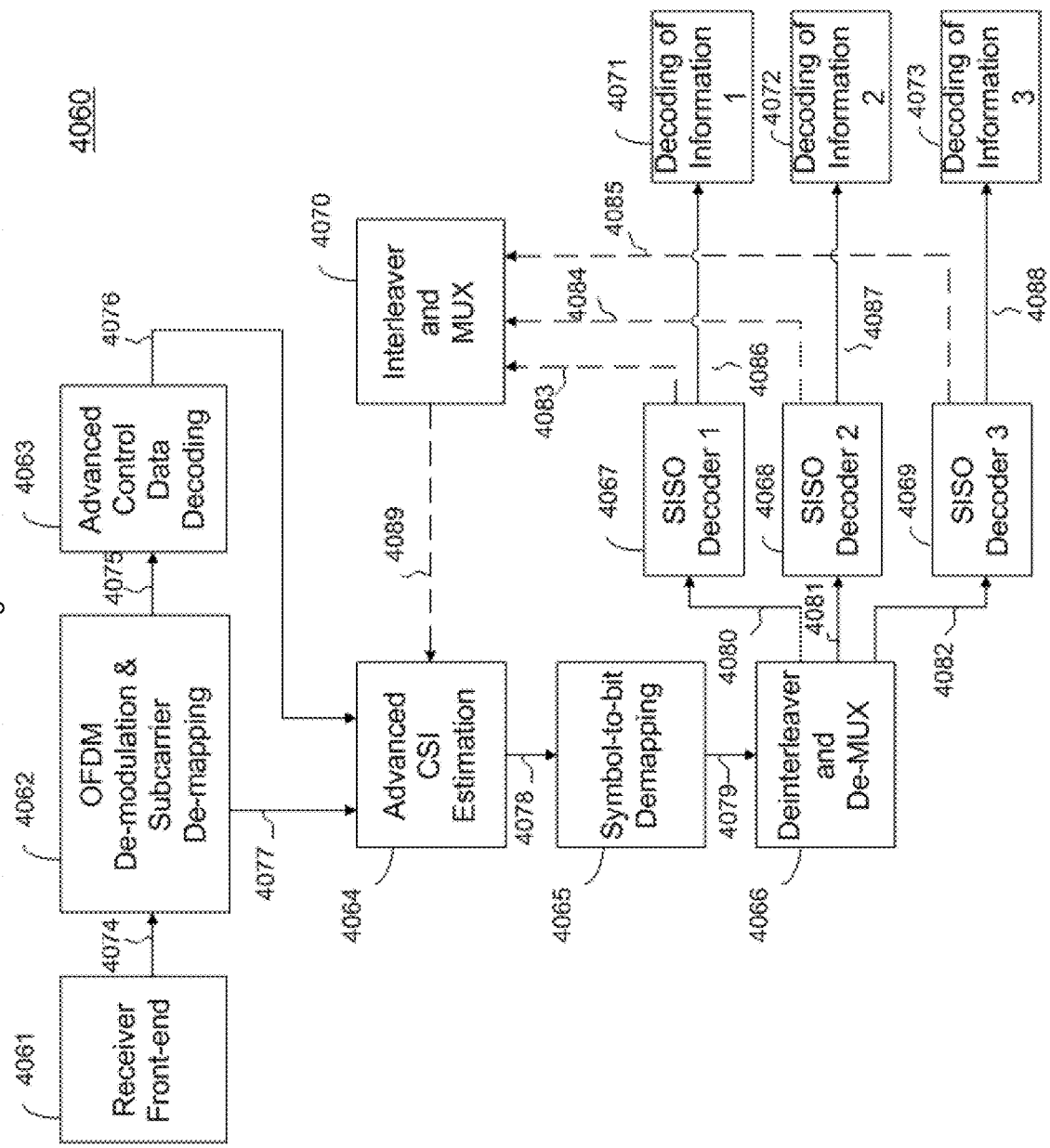
FIG. 24b A schematic functional diagram of HD Radio receiver structure Simplified HD Radio transmitter block diagram
PRIOR ART Block diagram of FM HD Radio OFDM structure with multiplexing/demultiplexing reference and data subcarriers Control data sequence fields in FM HD Radio
PRIOR ART Conceptual representation of reference and data subcarriers in time-frequency plane
PRIOR ART Decoding the system control data sequence bits using hard decisions and majority voting Decoding of the control data sequence bits using soft diversity combining and multiple DPSK symbol intervals Comparison of BERs of the control data sequence bits decoded using prior art methods and certain embodiments of the invention in USLOW multipath fading channels Comparison of FERs of the control data sequence bits decoded using prior art methods and certain embodiments of the invention in USLOW multipath fading channels Comparison of BERs of the control data sequence bits decoded using prior art methods and certain embodiments of the invention in UFAST multipath fading channels Comparison of FERs of the control data sequence bits decoded using prior art methods and certain embodiments of the invention in UFAST multipath fading channels Illustrative diagram of the signal structure in frequency domain of a hybrid FM HD Radio system

PRIOR ART

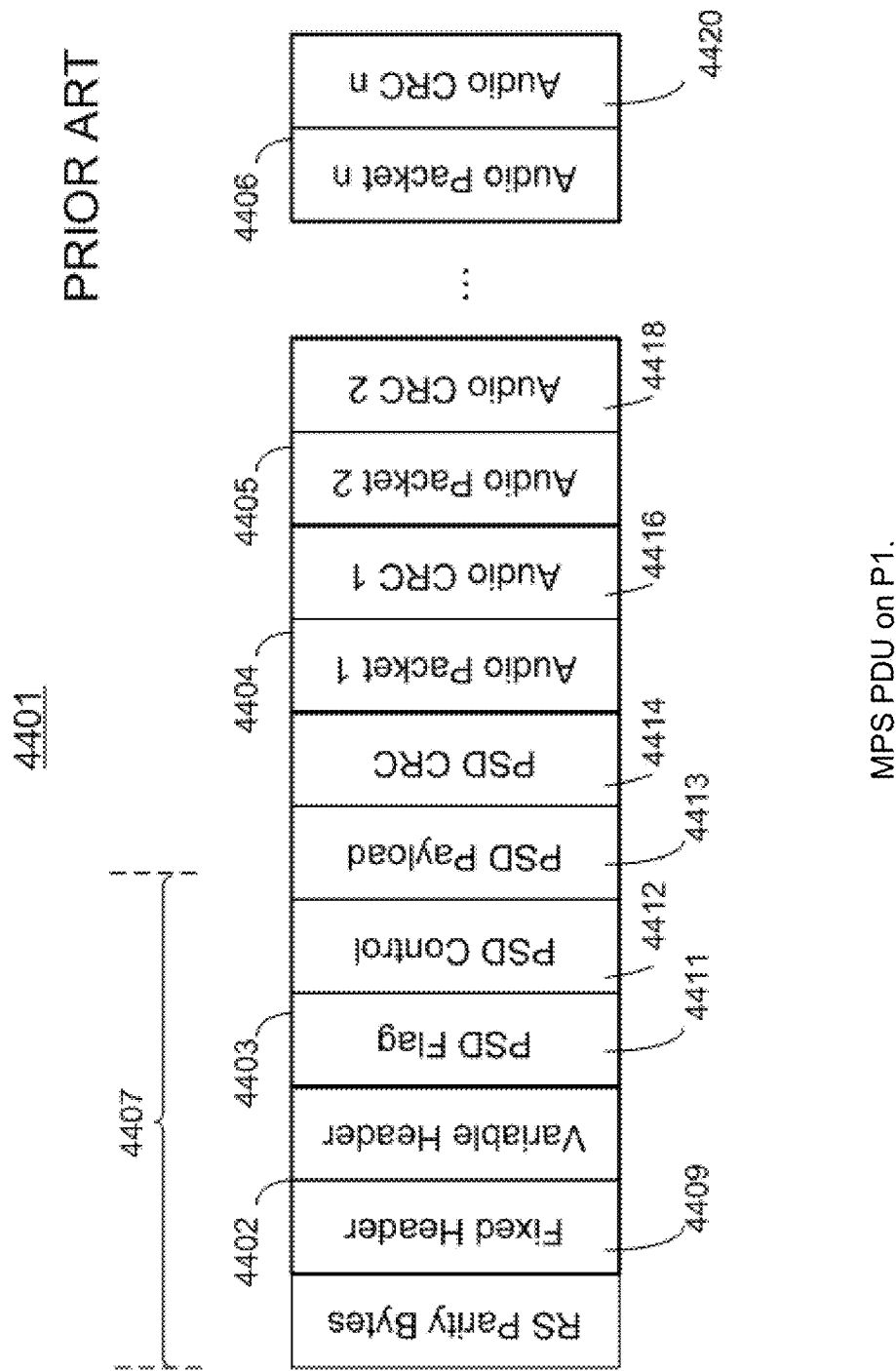

Block diagram of MPS PDU header decoding

Block diagram of PSD decoding

Block diagram of audio packet decoding

Block diagram of SIS PDU decoding

Block diagram of AAS PDU decoding

Block diagram of byte de-interleaving of list sequences

Block diagram of iterative decoding of multiple PDUs in a frame

Audio with Host FM Performance in USLOW2

Conventional Receiver Performance with CSI Estimated from Reference Subcarriers in USLOW2

Audio with Host and 1st Adjacent FM Interference in UFAST60

PSD PDU with Host and 1st Adjacent FM Interference in USLOW2

MPS PDU Header with Host FM Interference in USLOW2

MPS PDU Header with Host and 1st Adjacent FM Interference in USLOW2

PIDS Frame with Host and 1st Adjacent FM Interference in 3-Ray Channel

P3 AAS Data Performance with Host FM and 1st Adjacent Interference in UFAST60

SYSTEMS AND METHODS FOR ADVANCED ITERATIVE DECODING AND CHANNEL ESTIMATION OF CONCATENATED CODING SYSTEMS

CROSS-REFERENCES TO RELATED APPLICATIONS

The present application claims the benefit and is a continuation of U.S. patent application Ser. No. 15/236,066, filed Aug. 12, 2016 which is a continuation of U.S. patent application Ser. No. 14/942,570, filed Nov. 16, 2015 (now U.S. Pat. No. 9,698,941) which is a continuation of U.S. patent application Ser. No. 13/693,023, filed Dec. 3, 2012 (now U.S. Pat. No. 9,191,256). The contents of the above-identified applications are hereby incorporated by reference in their entireties as if recited in full herein.

FIELD OF THE INVENTION

The invention is directed to systems and methods for advanced iterative decoding of multiple concatenated codes and advanced iterative channel state information estimation for communication systems, and particularly receivers, used for HD Radio communication and other systems. These systems and methods improve the performance of such receivers, thereby extending the range/coverage of digital radio preferably without modifying the existing HD Radio infrastructure, and also minimizing power consumption. While certain portions of the specification may focus on HD Radio technology, it should be understood that various aspects of the invention are also advantageous for, and may be used in, many other applications, standards and systems, including wireless or wired broadcasting and transmission systems, consumer electronics, storage media, computer applications and the like, as discussed in more detail in relevant portions of the detailed description.

BACKGROUND

Wireless or wired communications systems often rely on forward-error-correction (FEC) in order to control errors when information is transmitted over noisy communications channels. In such systems, the sender encodes the information to be transmitted using error correcting codes. Exemplary error correcting codes include block codes (i.e., ones that operate on fixed-size packets), convolutional codes (i.e., ones that may operate on streams of arbitrary length), or concatenated codes (i.e., ones that combine block codes and convolutional codes). Certain block codes can be represented by parity check matrices, such as high, medium and low density parity check (H/M/LDPC) codes. Reed-Solomon (RS) codes are an example of well-known block codes as they are not only employed in many wireless or wired communication systems such as broadcast systems (including HD Radio systems which are discussed further below), but also in consumer electronics and data storage systems such as disc drives, CDs and DVDs.

While many methods exist for decoding of LDPC codes such as ones based on belief propagation (BP) algorithms, such methods typically do not yield good performance when used to decode codes having higher parity check matrix densities, including MDPC and HDPC codes, such as RS or BCH codes. Thus, there is a need for improved systems and methods for decoding block codes (or concatenated codes that include block codes), particularly H/M/LDPC codes or any codes that could be represented by parity check matrices including RS codes, in a manner that improves the performance while keeping computational complexity reasonable.

Proper FEC decoding in communications systems also relies on the ability to determine as best as practically possible certain attributes of the communication channel. For instance, the channel response as well as noise power estimation, which together may be referred to as channel state information (CSI), are often estimated and used not only for error correction, but also for other processing functions such as coherent demodulation and diversity combining in order to achieve maximum-possible performance gains offered by those processing tasks. CSI estimation is also of importance in diversity combining systems.

To facilitate CSI estimation, pilot symbols are usually inserted in a stream of data symbols. Such pilot channel estimation relies on filtering techniques that have typically used filter lengths which either do not optimally account for noise effects or channel dynamics (i.e., the rapidity of channel variation). Thus, although prior art filter structures may be suitable for certain scenarios, they are not optimal when the system needs to operate over a wide range of channel dynamics, thereby adversely affecting performance. Accordingly, there is also a need to improve channel estimation techniques in additive white Gaussian noise (AWGN) and fading communication channels, which would result in improved decoding performance.

As discussed above, there is a need for improved techniques for decoding a wide variety of codes, including RS codes, which may be used in various systems including consumer electronics and data storage systems, as well as broadcast systems (where there is also a need to improve channel estimation) such as in HD Radio receivers. HD Radio refers to a digital radio technology that enables the transmission and reception of digital audio and data, addressing the limitations of aging analog broadcast transmission technology.

Current HD Radio systems are based on a particular type of multicarrier technology known as orthogonal frequency-division multiplexing (OFDM). A hybrid method of transmitting analog radio broadcast signals and digital radio signals simultaneously on the same frequency band is referred to as in-band on-channel (IBOC) transmission. IBOC transmission allows broadcasters to transmit both analog and digital signals on their existing assigned channels in the amplitude modulation (AM) or frequency modulation (FM) frequency range. On the other hand, all-digital HD Radio systems of the future (which are not yet deployed) are expected to only carry the digital HD Radio signal.

HD Radio systems typically transmit a system control data sequence for the purpose of system control data synchronization and, possibly, channel estimation. For example, the system control data sequence in FM HD Radio consists of synchronization bits, control bits, and parity bits, which are transmitted on pilot tones that are commonly referred to as the reference subcarriers. The differential phase-shift keying (DPSK) modulated pilot symbols are multiplexed onto OFDM symbol along with data symbols. The reference subcarriers on which pilot symbols are transmitted are distributed over the OFDM spectrum. Control and status information are collected to form system control data sequences and are transmitted on the reference subcarriers. Use of the system control data sequence for acquisition, tracking, channel estimation and coherent demodulation has been described in U.S. Pat. No. 6,549,544. Decoding of the system control data sequence is important for the system performance. The parity bits are inserted into the variable fields of the system control data sequence for error detection and prevention of error propagation at the end of each variable field due to differential encoding.

The DPSK modulated pilot symbols, in which the information is carried in the phase difference between adjacent bits, are decoded non-coherently at the receiver. Selected information bits in a system control data sequence may be repeated within the same system control data sequence and those repeated bits are transmitted on a set of reference subcarriers whose positions in the frequency band are known to the receiver such that frequency diversity could be exploited during the decoding process at the receiver.

In the current HD Radio receivers, all transmitted DPSK-modulated system control data sequences carried on the reference subcarriers are first non-coherently demodulated and then a majority voting is applied to those repeated bits to make a final bit decision of all repeated bits collectively. The final bit decision based on majority voting facilitates a correct decoding of those bits repeated in the system control data sequence, although some of the repeated bits in a system control data sequence may be corrupted when received. This process is commonly referred to as majority voting combining. In addition to the repetition of some bits in a system control data sequence, a small set of bits in a system control data sequence are protected by a parity bit, allowing detection of existence of bit errors in the set of parity-covered bits.

As for channel estimation, if the parity does not match, the parity field is considered unreliable and may not be used to estimate the channel response (or noise power). In this case, non-uniform interpolation could be applied.

In addition, existing HD Radio receivers rely on Viterbi decoders to decode convolutional codes in a manner that produces hard-decision decoded bits. For audio channels, these hard-decision outputs are passed to a conventional cyclic redundancy check (CRC) decoder for error detection, and then to a source audio decoder. For data channels, hard-decision outputs are passed to an algebraic RS decoder, also producing hard decision bits, followed by a conventional CRC decoder for error detection. Each operation is done once and in a sequential manner in the prior art. However, algebraic RS decoding on hard bit decisions out of the Viterbi decoder results in suboptimum performance and such an approach is not amenable to potential iterative decoding improvements.

From the foregoing discussion, it is clear that there is a need for improving the performance of decoders, and more generally, decoding block codes (or concatenated codes that include block codes), as well as channel estimation, in communication and other systems. Moreover, there particularly is a need for systems and methods that improve the decoding performance of AM and FM HD Radio receivers in order to extend the range/coverage of digital radio, preferably without modifying the existing HD Radio transmission or infrastructure.

SUMMARY

Systems and methods are provided for improving the performance of FER decoders, including decoding of any block codes that can be represented by parity check matrices (or concatenated codes that include such block codes) through advanced iterative decoding techniques based on BP algorithms, with particular advantages when applied to RS codes and other codes characterized with higher density parity check matrices.

According to these systems and methods where a code may be represented by a parity check matrix of dimension (N−K)×N, one or more parity check matrices with N−K sparse columns may be generated. Up to N−K sparse columns may contain only a single entry equal to 1 per column, wherein sparse columns of each of P parity check matrices correspond to different subsets of N−K bit log-likelihood ratios of N−K+R least reliable bit log-likelihood ratios, where R≥P is a configurable integer defining R least reliable bits in the dense part of the parity check matrix if only a single parity check matrix were used. The channel log-likelihood ratios (LLRs) may be decoded using the P parity check matrices with sparse columns to produce updated LLRs. This may be done using soft-input soft-output (SISO) message passing decoding until a desired number of iterations is reached or until the decoding using at least one of the P matrices produces a valid codeword. If no valid codeword is produced, additional decoding that is based at least in part on algebraic decoding of the sequences of the updated LLRs may be performed.

The SISO message passing decoding algorithm may be based on belief propagation algorithms or variations thereof. The SISO message passing decoding may generate check-variable messages and scale them by a factor $1-\beta \cdot Min_1/Min_2$, where $0 \leq \beta \leq 1$, and $Min_1$ and $Min_2$ may be the two smallest absolute values in a set of variable-to-check messages. Alternatively, or in addition, SISO message passing decoding may include simple greedy scheduling of check equation updates, where metric values $Val_i, i=1, 2, \ldots, L$ and $L \geq 1$ for scheduling order determination may be calculated for a set of non-updated check nodes. $Val_i$ may be calculated as $Val_i = Min_1 + Min_2$, and the set $\{Val_i\}$ may be sorted in decreasing order to obtain an ordering vector, such that the L check node equations may be updated according to this vector, and corresponding check-to-variable messages may be calculated and propagated. Variable-to-check messages may also be updated for all variables that received check-to-variable messages and these steps may be repeated until all check nodes are updated by calculating and propagating corresponding check-to-variable messages. Message passing updates may be calculated using a min-sum, sum-product, or any other appropriate algorithm. During the course of SISO message passing decoding iterations, one or more of parity check matrices may be updated based on updated bit LLRs.

In certain situations, variable-to-check messages may have different signs in two consecutive iterations, suggesting that convergence for that node is not achieved yet. In some embodiments, variable-to-check messages that have not converged are modified such that the outgoing variable-to-check message is equal to a weighted average of such two non-converged consecutive messages with different signs. The weighting factor may depend upon the specific code and, typically, more weight is given to the more recent message.

Systems and methods are also provided for performing advanced CSI estimation which enhances pilot channel estimation by using an optimum filter length, adaptive decision-directed channel estimation and/or performing the estimation iteratively using shorter filters. For example, filter lengths may be selected based on channel selectivity which is estimated using known pilot symbols and a fraction of unknown data symbols. With these selected filter lengths, estimation of the channel response may be performed using available pilot symbols and data symbols that are considered relatively reliable. As for data symbols that may be considered less reliable, the channel response may be estimated by interpolation using estimated values of channel response obtained from the pilot symbols and the more reliable data symbols. The channel response estimates can be used to estimate noise power and/or improve FEC decoding, and multiple estimation and FEC decoding iterations can be performed. In subsequent iterations, the length of one or more filters may be decreased and the fraction of data symbols obtained using the improved FEC decoding may be increased.

An exemplary criterion for selecting a fraction of more reliable data symbols may be based on the channel response at a given symbol position being larger than a first threshold, or the signal-to-noise ratio (or the signal-to-noise-plus-interference ratio) at a given symbol position being larger than a second threshold, where the thresholds may be determined based on the estimated channel selectivity.

Moreover, systems and methods are particularly provided for decoding digital radio signals, including hybrid digital radio signals, in multicarrier systems such as ones that encode digital data using OFDM. These systems and methods improve HD Radio receivers by, for example, relying on soft-diversity combining of soft values of repeated control data bits carried on a plurality of reference subcarriers, techniques for collectively utilizing soft combining and multiple symbol detection, and/or techniques for correcting bit errors using parity check bits. They also utilize the corrected parity check bits as part of soft-diversity combining and/or as part of the collective use of soft-diversity combining and multiple symbol detection.

For example, a hybrid digital radio OFDM signal may be decoded by performing initial CSI estimation using distorted modulated symbols obtained from the received OFDM signal, producing soft estimates of convolutional code coded bits using SISO decoding of one or more convolutional codes associated with one or more logical channels carried in a radio frame of the OFDM signal, performing at least one additional iteration of CSI estimation by using at least some of the soft convolutional code coded bits estimates, and decoding any logical channel using improved CSI obtained by the at least one additional CSI iteration. Exemplary logical channel information whose decoding may be improved include program service data (PSD) protocol data units (PDUs), Primary IBOC Data Service (PIDS) PDUs, station information service (SIS) PDUs, advanced application service (AAS) PDUs, main program service (MPS) PDU headers, and/or audio packet data.

CSI estimation for such an OFDM multicarrier system may be performed using the techniques stated above. For example, part of this process involves estimating unknown symbols on the reference subcarriers, which may be done by soft diversity combining of control data sequence symbols that carry the same symbol value, and differentially decoding the soft diversity combined symbols to obtain corresponding decoded control data sequence bits. Thereafter, the control data sequence symbols may be reconstructed from the decoded control data sequence bits. In certain embodiments, the control data sequence symbols may be reconstructed from an improved decoded control data sequence using single parity check code bits where the least reliable soft decoded control data sequence bit is flipped if the parity does not check (otherwise, no bit is flipped). Moreover, SISO list Log-MAP decoding of the employed convolutional codes may be employed in conjunction with the CSI estimation herein.

The above systems and methods improve HD Radio receiver performance not only by helping to decode control data sequences more reliably, but also by facilitating better CSI estimation that employs reference subcarriers, which contributes to improved decoding of all HD Radio logical channels.

SISO decoding of convolutional codes, instead of using a Viterbi algorithm, is used to facilitate iterative CSI estimation but also soft decoding of the outer RS codes for applicable logical channels. In some embodiments, in addition to soft outputs, a list of most likely sequences is produced, which is referred to as list SISO decoding. Improved CSI estimation is especially beneficial in combination with list SISO decoding by enabling better estimation of a candidate list of most likely sequences.

Moreover, a SISO RS decoder may be used to decode soft information bits outputs of the convolutional code. List SISO decoding is also advantageous when used in combination with decoding of outer RS codes for applicable logical channels as it could significantly reduce the decoding complexity. This is so given that outer SISO RS decoding would be required only in a relatively small fraction of cases, as list SISO convolutional decoding would produce a correct sequence on the list most of the time. These advanced RS decoding techniques also lead to improvements in HD Radio system performance by enabling better decoding of data channels as well as headers present in audio channels (e.g., MPS PDUs), thereby further improving HD Radio receivers. The foregoing improvements result in extending the range/coverage of digital radio receivers, without modifying the existing HD Radio system infrastructure or the air-interface.

Other benefits and features of the present invention, including its applicability to other areas of wireless transmission systems, as well as wired transmission systems, consumer electronics, storage media, and computer applications may become apparent from the following detailed description considered in conjunction with the accompanying drawings. It is to be understood, however, that the drawings are designed solely for purposes of illustration and not as a definition of the limits of the invention, for which reference should be made to the appended claims.

BRIEF DESCRIPTION OF THE DRAWINGS

The accompanying drawings, which incorporate in and constitute a part of the specification, illustrate preferred embodiments of the invention and their relationship to the prior art, and together with the detailed descriptions serve to explain the principles and advantages of various aspects of the invention:

FIGS. 9*a*, 9*b*, 9*c*, 9*d*, and 9*e* show typical arrangements of pilot symbols in single carrier systems, where FIG. 9*a* illustrates a continuous stream of pilot symbols (also referred to as the pilot channel), FIG. 9*b* illustrates a preamble in a stream of data and pilot symbols, FIG. 9*c* illustrates a midamble in a stream of data and pilot symbols, FIG. 9*d* illustrates interleaved pilot symbols, and FIG. 9*e* illustrates multiple pilot symbol bursts in a stream of data and pilot symbols;

FIGS. 10*a* and 10*b* illustrate typical arrangements of pilot symbols in multicarrier systems, where FIG. 10*a* illustrates an arrangement of dedicated pilot subcarriers, and FIG. 10*b* illustrates an arrangement of interleaved and staggered pilot symbols;

FIGS. 11*a*, 11*b*, and 11*c* illustrate channel response dynamics in fading channels, where FIG. 11*a* illustrates the response dynamics in a slow fading channel, FIG. 11*b* illustrates the response dynamics in a moderately fast (or medium-speed) fading channel, and FIG. 11*c* illustrates the response dynamics in a fast fading channel;

FIG. 12 illustrates a conceptual realization of how to determine optimum filter lengths in certain embodiments, taking into account noise effect on channel estimation but also mismatch between filter lengths and channel dynamics;

FIG. 13*a* illustrates the profile over time and FIG. 13*b* illustrates the profile over frequency in multicarrier systems;

FIGS. 14*a*, 14*b*, 14*c*, and 14*d* illustrate impacts of signal-to-noise ratio (SNR) threshold on the mixture of pilot and decision-directed channel estimation in accordance with certain embodiments, where FIG. 14*a* illustrates the channel response over time in slow fading channels (i.e., longer filter lengths), FIG. 14*b* illustrates the channel response over time in fast fading channels (i.e., shorter filter lengths), FIG. 14*c* illustrates the channel response over frequency with a higher threshold, and FIG. 14*d* illustrates the channel response over frequency with a lower threshold;

FIG. 19 is a block diagram of encoding of a general multilevel code with M levels, encompassing partitioning of information, individual FEC encoders and interleavers for each level as well as symbol mapper;

FIG. 20 is a block diagram of decoding of a general multilevel code with M levels using multistage decoding, encompassing individual de-mappers, FEC decoders and de-interleavers for each level and transmission of decoded information through interleavers from lower level FEC decoders to the higher level de-mappers as well as the possible iterative structure from higher level FEC decoders to the lower level de-mappers;

FIG. 21 shows a 16-QAM (Quadrature Amplitude Modulation) hierarchical modulation scheme where both the base and enhancement layers are encoded using Quadrature Phase Shift Keying (QPSK) modulation such that the base layer bits have larger Euclidean distance than the enhancement layer bits;

FIG. 22 shows an 8-PSK (Phase Shift Keying) hierarchical modulation scheme where the two base layer bits are QPSK encoded and the enhancement layer is one bit and further showing larger Euclidean distance for base layer bits than for the enhancement layer bits;

FIG. 23 is a block diagram of a transmitter and receiver with concatenated FEC and hierarchical modulation encompassing outer and inner FEC encoders/decoders and outer interleaver/de-interleaver for both base and enhancement layers, inner interleaver/de-interleaver, hierarchical symbol mapper/de-mapper, channel, advanced CSI estimation as well as the possible iterative structure between inner and outer FEC decoders and the possible iterative structure between the advanced CSI estimation and the inner FEC decoder for both base and enhancement layers in accordance with certain embodiments of the invention;

FIG. 24*b* is a simplified block diagram illustrating the functionality of an HD Radio receiver in accordance with certain embodiments of the invention;

FIGS. 39a, 39b, and 39c illustrate simplified structures of PDUs in the HD Radio system, where FIG. 39a is a simplified structure of the MPS PDU illustrating a PDU header, a plurality of audio packets, and PSD on logical channel P1, FIG. 39b is a simplified structure of the SIS PDU on logical channel PIDS, and FIG. 39c is a simplified structure of the AAS PDU on logical channel P3;

DETAILED DESCRIPTION OF PREFERRED EMBODIMENTS

Figure 1:
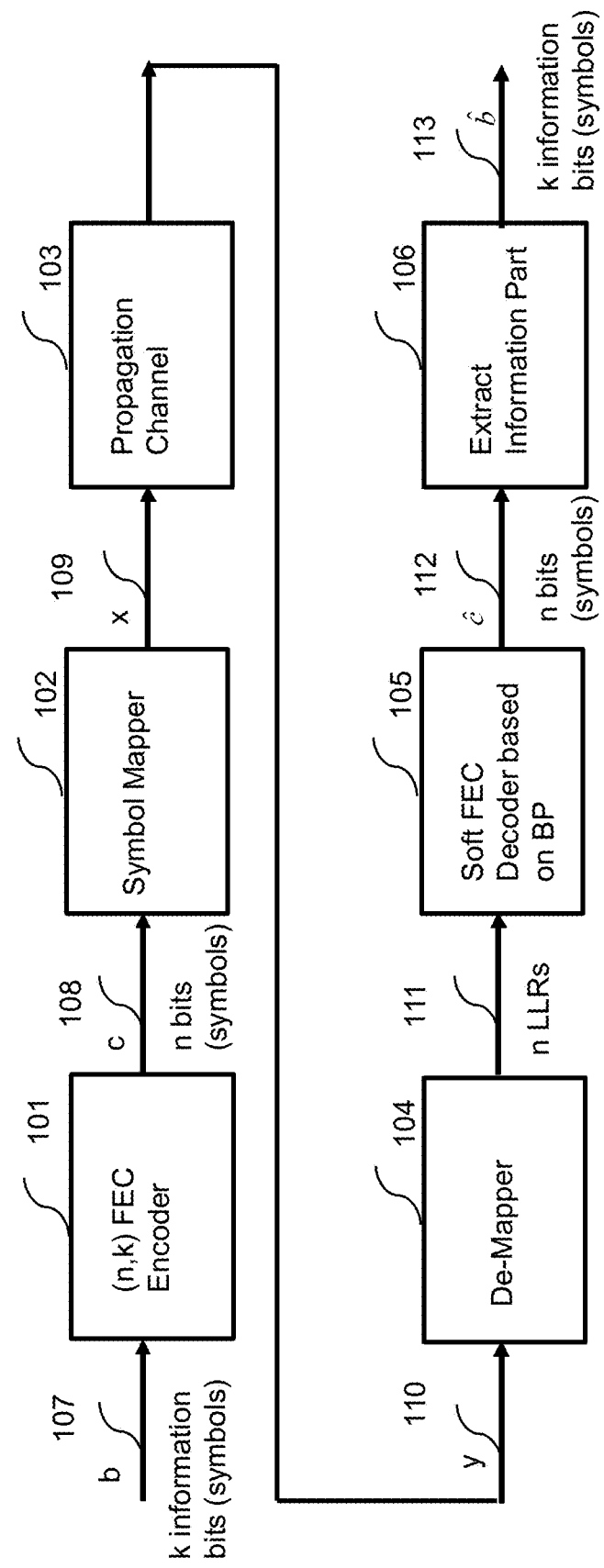
FIG. 1 is a simplified block diagram of a transmitter and receiver, encompassing a single FEC encoder/decoder, modulator/demodulator and channel.

Certain embodiments are directed to systems and methods for advanced iterative decoding of multiple concatenated codes and advanced iterative channel state information estimation for communication systems. While many of the embodiments in this section are discussed in the context of telecommunications systems, with some focus on HD Radio receivers, it should be understood that various aspects of the invention are also advantageous for, and may be used in, many other applications, standards and systems, including many wireless or wired broadcasting and transmission systems, consumer electronics, storage media, computer applications and the like, as discussed in more detail in various portions of this section that follow.

This section is organized into four major subsections, each pertaining to different aspects which relate generally to improvements in decoding and channel estimation, and which are all applicable to HD Radio communication systems, and specifically to receivers/decoders in such systems which use existing standards, as well as other systems mentioned throughout. The first subsection focuses on improved decoding of multiple concatenated codes, and discusses error correction techniques that use block codes, and in particular, certain parity check codes such as high, medium and low density parity check codes. The second subsection focuses on improved CSI estimation techniques which can be used, in part, to enhance error correction and decoding. The third subsection discusses the applicability of the decoding and CSI estimation techniques to various concatenating coding systems and standards mentioned in the beginning of the third subsection, as well as additional aspects, to improve the decoding in such systems. Finally, the fourth subsection discusses certain embodiments for iteratively decoding HD Radio signals, including system control data sequences and logical channel data in FM HD Radio.

I. Advanced Decoding of High/Medium/Low Density Parity Check Codes

This subsection discusses techniques for decoding of high, medium and low density parity check (H/M/LDPC) codes, as well as any codes that could be represented by parity check matrices. Specifically, one aspect of the invention discussed herein pertains to iterative soft decoding techniques based on belief propagation (BP) algorithms. The proposed systems and methods could be used for decoding of standalone H/M/LDPC codes or concatenated codes where one of the component codes is an H/M/LDPC code. These techniques provide improved performance with affordable computational complexity, with particular advantages illustrated when applied to Reed-Solomon (RS) codes. These aspects and certain corresponding embodiments could be used in wireless and wireline communications, as well as in any scenario where H/M/LDPC codes are employed. For example, these aspects are applicable to HD Radio systems, as well as other wireless systems (mobile cellular, wireless LAN, microwave or satellite link, broadcast, mesh or ad-hoc network, infrared, underwater acoustic, etc.), wireline systems (coaxial cable, copper wires, fiber optic, etc.), or even storage media (disc, drive, magnetic tape, etc.).

In certain embodiments of the invention, an adaptive normalized min-sum algorithm (MSA) is applied to improve the MSA performance. A novel adaptive normalized scaling factor is preferably tailored to MSA. In some embodiments, weighted averaging of non-converged variable to check messages is employed. For variable to check node messages with different signs in consecutive iterations, a weighted average of messages might be advantageous for some codes. In one embodiment, a simple greedy BP scheduling is employed in an attempt to perform decoding of check equations in a particular, advantageous order, but without calculating all the residual values in every iteration as in informed BP scheduling for instance. It is based on the notion of first updating the check equations with less chances of having errors in positions corresponding to the dense part of the parity check matrix. The simplicity of the method comes from the fact that for each check node/equation, only one scheduling metric value is preferably calculated and assigned based on only outgoing messages. Based on these values, an order for updating check equations is obtained. In another embodiment, an alternative simple greedy BP algorithm is used where, instead of ordering the metric values of all check equations at the beginning, only the check equation with maximum value is preferably determined and updated. Then the metric values of all check equations are re-evaluated and, again, the next check equation with maximum metric value is determined and updated. This process may be repeated until all the check nodes/equations are preferably updated. In one embodiment, improved best graph BP decoding using multiple parity check matrices is introduced. This method uses multiple parity check matrices with different sparse and dense parts in order to capture and correct more errors compared to a single matrix. This method employs simple greedy BP algorithm to perform BP iterations for each matrix. At the end of iterations, a final decoding, based at least in part on algebraic decoding, is performed to the LLRs of not converged matrices. In other embodiments, in improved best graph BP decoding using multiple parity check matrices, instead of the simple greedy BP algorithm, one can use any of the other BP decoding methods such as flooding BP (sum-product algorithm (SPA), MSA, normalized MSA, etc.) as well as informed BP scheduling (RBP, Node-Wise Scheduling (NWS), etc.). In another embodiment, the final decoder applied to the LLRs of not converged matrices can be improved using error and erasure decoding. Considering the fact that the sign disagreement positions between the updated LLR vectors of different matrices have a high probability of being actually bit errors, in another embodiment, disagreement positions are forced into sparse parts of the matrices in order to avoid the error propagation. In one embodiment, combination of the improved best graph BP decoding using multiple parity check matrices and the alternative with disagreement positions is employed. First the original proposed decoder is applied. If it failed, the alternative with disagreement positions is applied. In the final embodiment, the proposed methods are used and discussed for decoding RS codes which are characterized with high density binary image parity check matrices.

Many existing methods in the art for decoding of high, medium and low density parity check H/M/LDPC codes are based on BP. To explain the decoding of codes represented by a parity check matrix, consider first the system model shown in FIG. 1. It shows a simplified block diagram of a communication system including forward-error-correction (FEC) encoder 101 and decoder 105, symbol mapper/de-mapper 102 and 104 and communication channel 103. As referenced above, the communication channel may be any wireless or wireline channel, or a storage medium, or any other example where H/M/LDPC codes are employed. In this figure, channel encoding using a (n,k) linear block code 101 is performed by converting k information bits (symbols) 107 to n coded bits (symbols) 108 followed by symbol mapper 102 to map coded bits (symbols) to modulation symbols 109. The modulation symbols go through a propagation channel 103 and at the receiver noisy modulation symbols 110 are received. Symbol de-mapping 104 converts noisy modulation symbols into coded bits (symbols) as well as their LLRs 111. Then soft channel decoder based on the BP decoding 105 is used to decode the soft LLRs 111 into n decoded bits (symbols) 112. Finally k information bits (symbols) 113 are extracted in 106. The soft inputs to the channel decoder 105 could be based on channel LLRs or other equivalent metrics. The system may also include, not shown in FIG. 1 for simplicity, other blocks such as source encoder/decoder, interleaver/de-interleaver, other layers of protocol stack, error detection encoder/decoder, radio frequency front-end circuitry, filters, amplifiers and one or more antennas, system clock and local oscillators. The receiver may also include additional blocks for carrier phase and frequency recovery, amplitude/power estimation, timing synchronization, etc. All such additional blocks/elements could be implemented as they are known in the art or in accordance with other embodiments.

Figure 2:
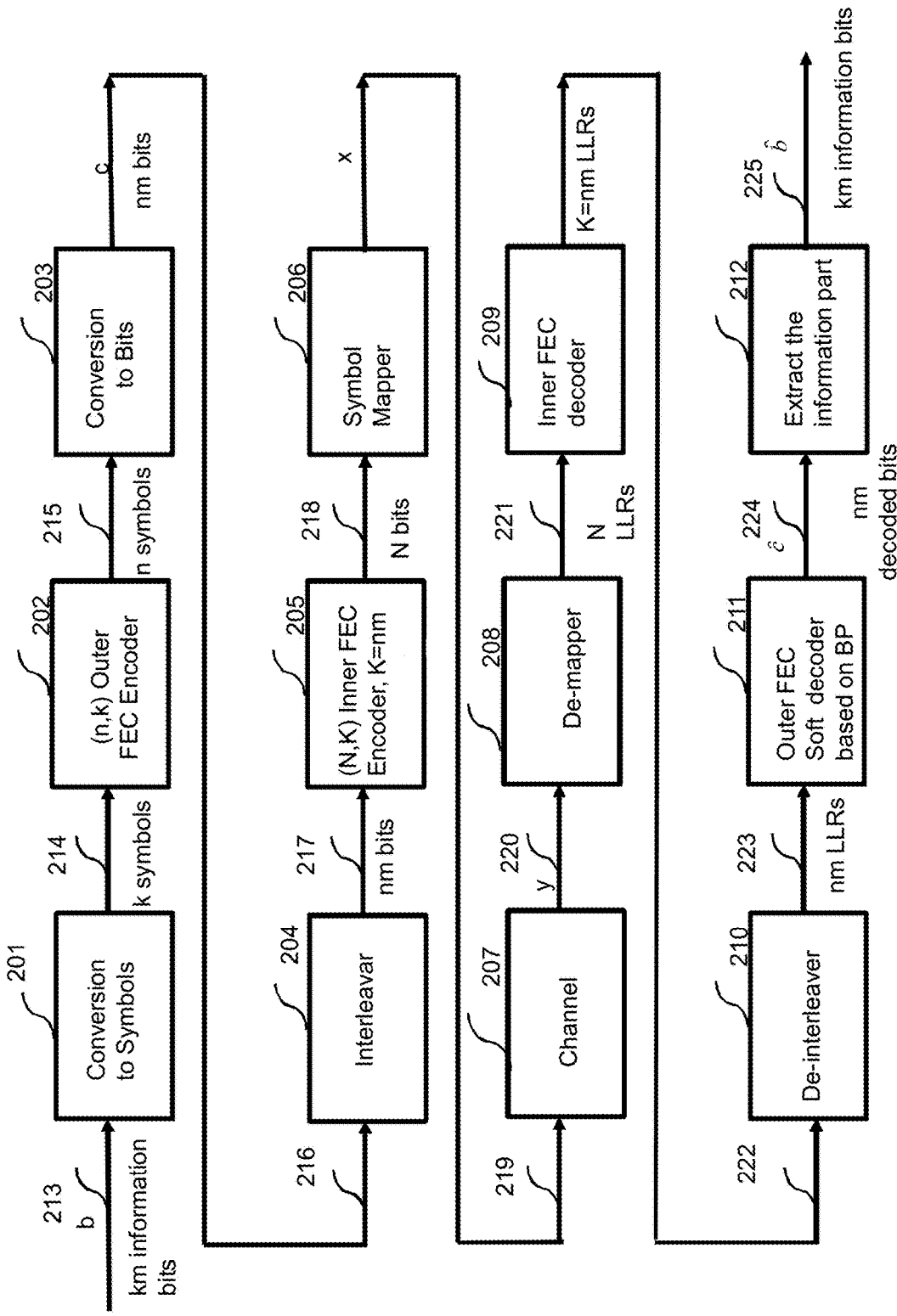
FIG. 2 is a simplified block diagram of a transmitter and receiver with concatenated FEC, encompassing outer and inner FEC encoders/decoders, modulator/demodulator and other relevant transmitter and receiver blocks.

In another scenario, a concatenated scheme is shown in FIG. 2. The inner FEC code 205 could be a convolutional code, a turbo code, an LDPC code or any other block code. Instead of, or in addition to, inner FEC code, there may be another finite state machine representing a multiuser channel, MIMO de-mapper/detector and similar. The system may also include other blocks as they are known in the art, as discussed above in conjunction with FIG. 1. The outer FEC code 202 could be a linear block code representable with a binary parity check matrix such as a BCH code, RS code, or any M/H/LDPC code. For the outer FEC code, a general case of non-binary code over Galois Field GF($2^m$) is considered where each code symbol contains m bits and the case m=1 results in a binary code. The same assumption could be made for the inner FEC code. The input in FIG. 2 213 contains km information bits that are converted into k symbols over GF($2^m$) 214 in block 201. These k symbols are encoded using an (n,k) linear block code 202 to generate n coded symbols 215 that are then converted to nm bits 216 in block 203. The outer FEC code bits 216 are interleaved in 204 and the interleaved outer FEC code bits 217 are encoded with an (N,K) inner FEC encoder 205. The N inner FEC code bits 218 are converted to modulation symbols 219 using the symbol mapper 206. The modulation symbols go through the channel 207 and noisy modulation symbols 220 are received at the receiver. The de-mapper 208 converts the noisy modulation symbols into N inner FEC code bits LLRs 221 that are next decoded using the inner FEC decoder 209. The K updated LLRs at the output of the inner FEC decoder 222 are de-interleaved in 210 and the de-interleaved code LLRs 223 are decoded using the outer FEC decoder 211 to generate decoded bits 224. Finally, information bits 225 are extracted in block 212. A soft channel decoder based on BP 211 can be used for decoding the outer FEC code, whereby soft inputs to the outer FEC decoder based on BP 211 could be provided by the inner decoder block 209, or equivalent.

DESCRIPTION OF KNOWN BP METHODS

Figure 3:
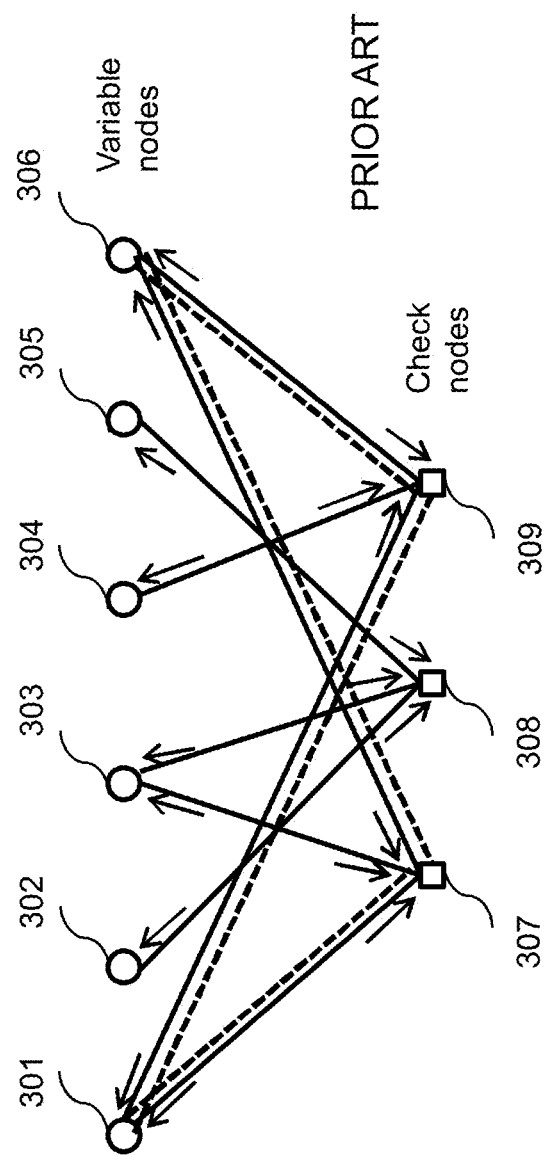
FIG. 3 is a simplified factor graph of a linear code defined by a parity check matrix illustrating flooding BP and a short cycle.

In order to explain the BP decoding, the bipartite graph of the (n, k) linear block code is shown in FIG. 3 (assuming n=6 and k=3 for representation). It is formed using the parity check (PC) matrix H of the code which is an (n−k)×n matrix for a code of rate r=k/n. In this graph, there are two types of nodes: (n−k) check nodes (307, 308, and 309 in FIG. 3) and n variable nodes (301, 302, 303, 304, 305, and 306 in FIG. 3). For any codeword c of this code, $Hc^T=0$ where 'T' denotes the transpose operation. This equation specifies the set of linear constraints satisfied by the codeword bits. In the bipartite graph, the set of variable nodes represents the codeword bits and the set of check nodes represents the set of parity-check constraints satisfied by the codeword bits. There is also a set of edges that connect every check node with all the variables nodes involved in its check equation.

BP decoding is an iterative decoding method that receives the soft bits, corresponding to reliabilities of codeword bits from the channel, such as LLRs and performs message passing (from variable nodes to check nodes and vice versa) using the bipartite graph of the code to update the reliability information based on the parity check constraints (FIG. 3).

In order to explain the algorithm of BP decoding, often performed using the sum-product algorithm (SPA), define $N_{ci}$ as the set of variable nodes participating in check equation i and $N_{vj}$ as the set of check nodes that variable node j is involved with. Typical SPA implementation is summarized in the algorithm that follows immediately below, with usual variations.

Belief Propagation Decoding Based on Sum-Product Algorithm

Define two zero matrices Mvc and Mcv with the same size as the matrix H. Mvc(i,j) represents the variable to check node message from variable node j to check node i. Mcv(i,j) represents the check to variable message from check node i to variable node j.

For all (i,j) such that H(i,j)=1:
  1. Initialization: Mvc(i,j)=ρ(j)
where ρ(j) represents the soft output from the previous block (e.g., channel, de-mapper or inner code) and is usually expressed in terms of LLRs;
  2. Horizontal step (check nodes updates):

$$Mcv(i, j) = 2\tanh^{-1}\left(\prod_{k \in N_{ci}\setminus j} \tanh\left(\frac{Mvc(i, k)}{2}\right)\right) \quad (1)$$

where $N_{ci}\setminus j$ is the set of all variable nodes participating in check equation i except for variable node j.
  3. Vertical step (variable nodes updates):

$$Mvc(i, j) = \rho(j) + \sum_{k \in N_{vj}\setminus i} Mcv(k, j) \quad (2)$$

where $N_{vj}\setminus i$ is the set of all check nodes that variable node j is involved with except for check node i. Mcv(k,j) represents extrinsic information from check node k to variable j; Steps 2 and 3 are repeated until the algorithm converges to a codeword or the maximum number of iterations is reached.
  4. Output LLR:

$$\rho_x(j) = \rho(j) + \sum_{k \in N_{vj}} Mcv(k, j) \quad (3)$$

based on which decisions could be made, or extrinsic information could be calculated in case there is feedback from the linear block code decoder to a previous block (for example a feedback from outer decoder 211 to the inner decoder 209 in FIG. 2 in order to perform iterative concatenated decoding).

The dashed lines in FIG. 3 show a 4-cycle in the graph meaning variable nodes 301 and 306 are both involved in check nodes 307 and 309. The disadvantage of short cycles is that if for example variable node 301 is in error, this error could propagate to variable node 306 during the check node and variable node updates.

In order to perform check node updates in the SPA, a number of tan h and inverse tan h functions needs to be evaluated. This leads to high complexity of implementation. Therefore, another method based on the simplification of the SPA has been proposed which is called the min-sum algorithm (MSA). It has been shown by experiments that the performance of the MSA is often close to that of the SPA, yet with considerably less complexity.

Min-Sum Algorithm

As it is well known in the art, the vertical step (variable node update) is similar to the one in the sum-product algorithm. The difference is in the horizontal step (check node update) where instead of calculating all the tan h and inverse tan h functions, a simpler, approximate alternative is used based on the shape of the tan h function. For each check node, one needs to first calculate $$S_{ci} = \prod_{k \in N_{ci}} \text{sign}(Mvc(i,k)), \quad (4)$$

$$i_{min} = \arg_{k \in N_{ci}} \min |Mvc(i,k)|, \quad (5)$$

$$i_{min2} = \arg_{k \in N_{ci} \setminus i_{min}} \min |Mvc(i,k)|. \quad (6)$$

Next, the check nodes are updated:

$$Mcv(i,j) = \alpha \cdot S_{ci} \cdot |Mvc(i,i_{min})| \cdot \text{sign}(Mvc(i,j)), j \neq i_{min}, \quad (7)$$

$$Mcv(i,i_{min}) = \alpha \cdot S_{ci} \cdot |Mvc(i,i_{min2})| \cdot \text{sign}(Mvc(i,i_{min})) \quad (8)$$

where $\alpha$ is called the damping factor. As it can be seen, the MSA only requires a single floating multiplication and a modulo-2 addition (or counting of + and − signs) to update each check node leading to much lower complexity compared to the SPA. There are numerous approaches in the art for implementing normalization of MSA produced extrinsic information, in order to reduce observed overestimation of same. Instead of scaling/normalization by a multiplicative factor $\alpha$, an additive offset is sometimes used in the art. Also, in certain prior art systems the normalization factor may be adaptive. In some prior art systems, either dumping using a scaling factor or an additive offset could be applied in the vertical step. These approaches could be useful in both SPA and MSA algorithms, as well as other algorithm types. Numerous attempts to improve normalization of MSA demonstrate the need to provide accurate MSA based messages, yet with small computational complexity of applied normalization factors. In one aspect of the invention, a novel and simple adaptive normalization factor, tailored to the structure of MSA check-to-variable messages.

Method for Suppressing Oscillations in Variable to Check Messages

When messages from variable to check nodes alternate signs in consecutive BP iterations, it is often an indication that variable node and/or part of the code graph has not converged and it might be desirable to suppress such messages to minimize possible error propagation. It has been shown in the art that erasing such messages with alternating signs is a good strategy for LDPC codes. Similarly, it has been demonstrated in the art that taking a simple average of variable to check messages in two consecutive iterations, if they have different signs, improves the performance of regular and irregular LDPC codes. It would be advantageous to have a general strategy to deal with non-converged variables for different classes of codes. In one aspect of the invention, a weighted average of variable to check messages in two consecutive iterations, if they have different signs, is employed, with more weight given to the latest message, generally.

Informed BP Scheduling

In the original BP algorithm, all the variable nodes are updated simultaneously using the previous check-to-variable messages and then all the check nodes are updated simultaneously using the previous variable-to-check messages. This approach is often referred to as flooding scheduling and the flow of messages is illustrated in FIG. 3.

Sequential scheduling on the other hand updates the nodes sequentially in an effort not only to improve the convergence speed (less iterations) but also to outperform the flooding scheduling for a given number of iterations. There are multiple ways how to implement ordering in sequential scheduling which generally results in different convergence rate and/or performance.

Figure 4:
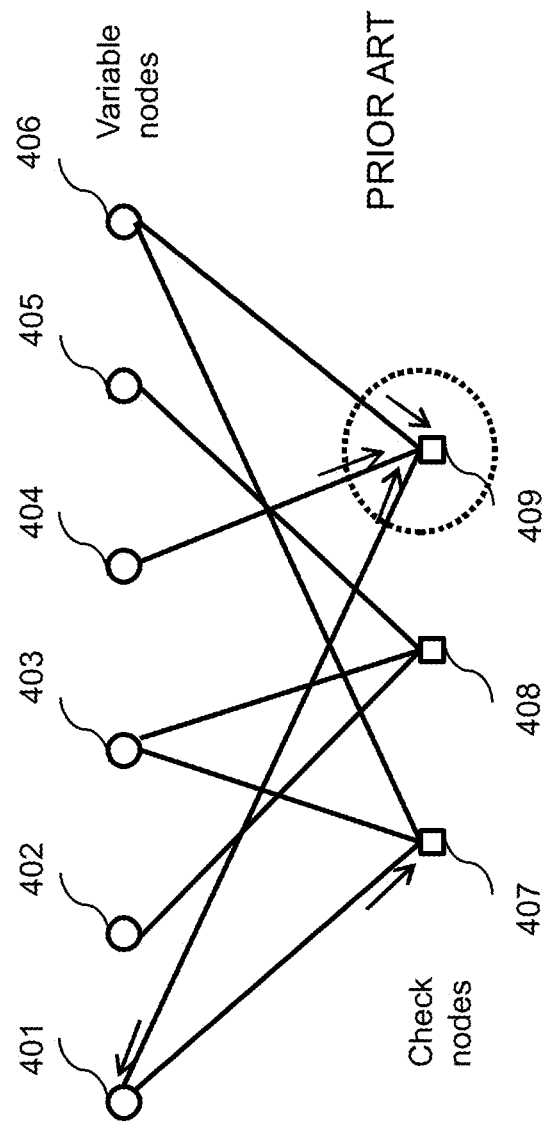
FIG. 4 is a simplified factor graph of a linear code defined by a parity check matrix illustrating informed BP scheduling using Residual BP (RBP) algorithm.

In Informed Dynamic Scheduling (IDS), the schedule is dynamically updated using the current state of the messages in the graph. Residual Belief Propagation (RBP) performs message updates based on the absolute value of the difference between the message generated in the current iteration and the message received in the previous iteration. A larger difference means this part of the graph is further from convergence. Therefore, propagating the messages with larger differences first will make BP converge faster. FIG. 4 shows the bipartite graph of a linear block code with check nodes 407, 408, 409 and variable nodes 401, 402, 403, 404, 405, 406 and illustrates the flow of messages and order in RBP decoding. First, using Mvc values all the Mcv values are calculated. The Mcv(i,j) with maximum residual is selected (Mcv from check node 409 to variable node 401 in FIG. 4) and used to update Mvc(i,j) (Mvc from variable node 401 to check node 409 in FIG. 4). Then Mvc(i,j) is propagated to all the check nodes connected to it except for check node i (409 here). In FIG. 4, this means propagation to check node 407. The Mcv values for these check nodes are calculated and used for obtaining new residual values. The process continues by selecting the next Mcv value with largest residual value and propagating it.

In another method called Variable-to-Check Residual Belief Propagation (VCRBP), Mvc's with maximum residuals are propagated and used to update Mcv's. Each updated Mcv then is propagated to all the variable nodes connected to it except the one it has received new information from. Similar to most greedy algorithms, VCRBP and RBP converge to a codeword faster, but may converge to the correct codeword less often.

Figure 5:
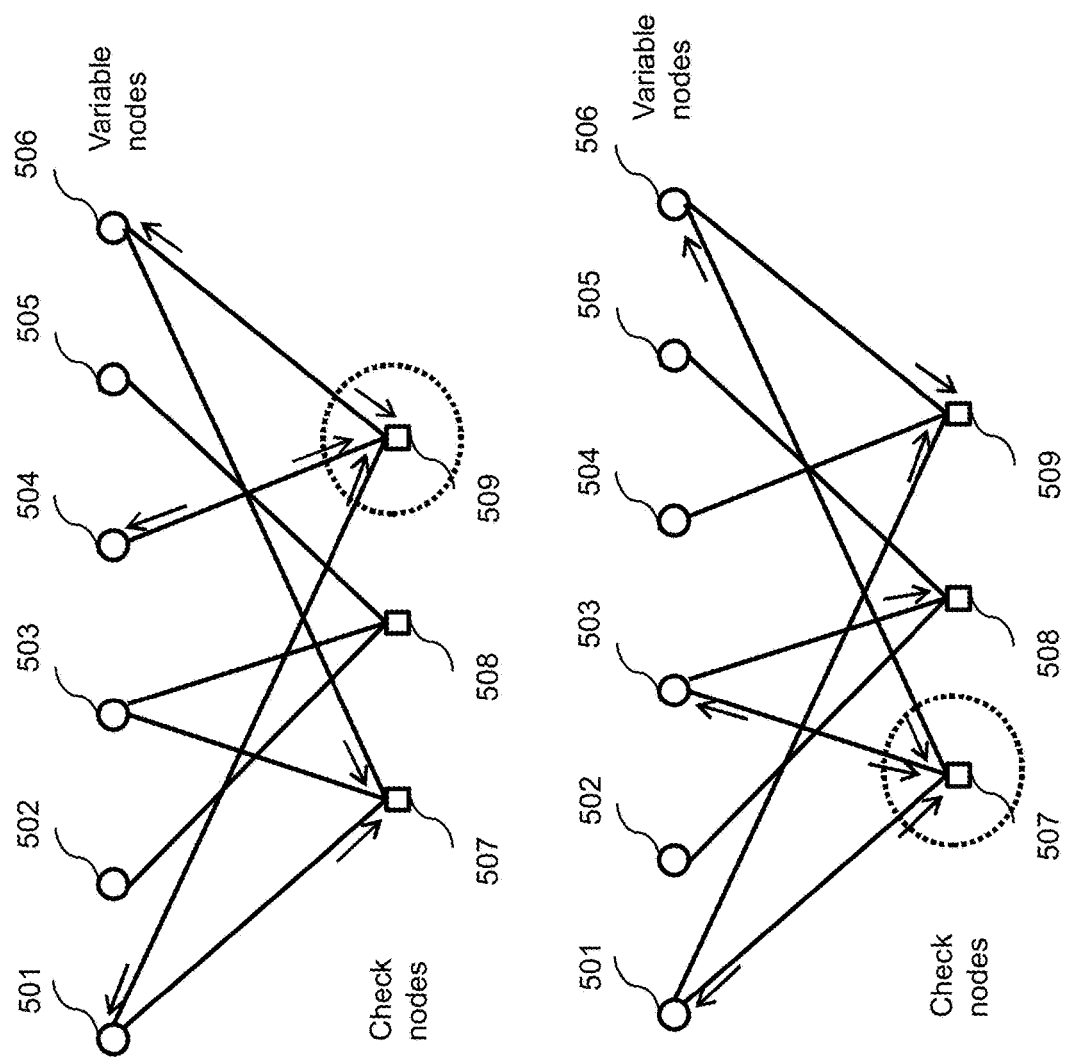
FIG. 5 is a simplified factor graph of a linear code defined by a parity check matrix illustrating simple greedy BP decoding in accordance with certain embodiments of the invention.

Node-wise Scheduling (NWS) is a less-greedy IDS strategy with better performance and convergence than RBP. In NWS, instead of only propagating the message with the largest residual, all the check-to-variable messages corresponding to the same check node are updated and propagated simultaneously. The process is illustrated in FIG. 5 which shows the bipartite graph of a linear block code with check nodes 507, 508, 509 and variable nodes 501, 502, 503, 504, 505, 506 and the message updating routine. First using the Mvc values, a residual value is calculated for every check node. The check node with maximum residual value (509 in FIG. 5) is updated first. Then the variable nodes connected to check node 509 (501, 504 and 506 in FIG. 5) are updated. Using the updated Mvc values, residuals for remaining check nodes are updated and again the check node with largest residual is selected (507 in FIG. 5) and is updated incorporating the newly updated variable nodes (501 and 506 here) and the process is repeated. In NWS, there are many variable nodes that change compared to RBP where only one variable node changes. Therefore, it is less likely to propagate the information from new errors in the next update. In both RBP and NWS, in order to pick which message to update, many messages are computed and not passed which results in high complexity of the decoding. MSA can be used to simplify the ordering metric and significantly decrease the complexity of both strategies while maintaining the same performance. Still, even simplified methods require numerous calculations of outgoing messages that will not be used as well as considerable complexity due to repeated ordering of residuals. Therefore, there is still a need to reduce complexity and/or improve performance of informed dynamic scheduling for decoding of H/M/LDPC codes. In one aspect of the invention, a simple greedy BP algorithm is proposed with considerably smaller complexity and comparable or better performance relative to serial scheduling, RBP and NWS approaches.

BP Decoding for H/M/LDPC Codes

Standard BP iterative decoding is not suitable for H/MDPC cods such as RS codes. The reason is that these codes have high density parity check matrices which results in a large number of short cycles in the factor graph. The presence of short cycles causes correlation between the messages and results in error propagation in the graph. Adaptive BP algorithm (ABP) is the first successful BP-based decoding method in the art for H/MDPC codes.

Methods Based on Extending the Parity Check Matrix

There were several attempts to extend the parity check matrix in order to minimize the number of short cycles that adversely affect the performance of BP decoding. Some of these methods showed relative success in case of short codes but no evidence of improvement for long codes. In another method proposed in the art for decoding of longer codes, RS codes, the binary parity check matrix can be extended with rows and columns in order to reduce the number of short cycles. This method has affordable complexity but the performance is not nearly as good as the ABP algorithm described below.

Methods Based on Multiple Parity Check Matrices

In certain prior art systems, multiple random matrices are employed over iterations, for improved decoding of short codes with dense parity check matrix. Improved decoding of high density parity check matrices for short codes has also been demonstrated in the art by employing multiple, fixed, parity check matrices. No such improvements were shown for longer codes. There is a need to improve upon the performance of these methods and especially for longer codes. In one aspect of the invention, multiple suitably chosen parity check matrices are employed. The matrices are selected based on certain reliability criterion and further adapted over iterations.

Adaptive BP Algorithm

In the adaptive BP algorithm of a (n,k) linear block code, the LLRs at each iteration are used to divide the variable nodes into two groups, (n−k) low reliable (LR) nodes and k high reliable (HR) nodes. The columns of the binary parity check matrix corresponding to the (n−k) independent and least reliable bit positions are reduced to an identity submatrix. The BP iteration is then performed on the factor graph formed by the modified parity check matrix. Since (n−k) least reliable bits are not involved in any cycles, error propagation is limited. Also, these bits only receive extrinsic information from one check node only which is based on the reliability of the other bits connected to this check node which are expected to be correct. Therefore, the performance of BP decoding is improved. During the p-th iteration, first the parity check matrix is reduced to the desired form based on the LLR vector $L_p$ (initially $L_0$ is determined from the channel output). In the second step, BP decoding is applied to produce extrinsic LLRs $L_{p-ext}$ (where $L_{p-ext}(j) \Sigma_{M \in N_{vj}}(k,j)$). The updated reliabilities are then $$L_{p+1} = L_p \alpha L_{p-ext} \quad (9)$$

where $0 < \alpha \leq 1$ is a damping coefficient.

In the original ABP method, after each BP iteration, a decoder is applied on the updated reliabilities. This decoder could be a simple hard decision application or any existing decoder for the H/M/LDPC code.

For example, for RS codes, this decoder could be one of the following:

Hard Decision: Perform hard decisions on the updated LLRs. If the results satisfy the parity check equations, then a decoding success is signaled.

BM: Run the Berlekamp-Massey (BM) algorithm on the LLRs after hard decisions. If the BM algorithm finds a codeword, a decoding success is signaled.

KV: Run Koetter-Vardy (KV) soft decision decoder on the LLRs. KV combined with the ABP algorithm results in impressive coding gains over previously known soft decision decoding algorithms for RS codes. However, KV soft decision decoders are characterized with extremely high computational complexity relative to BM algorithm. There is a need to have better decoding in this step than with BM algorithm but with smaller complexity than with KV algorithm. In one aspect of the invention, unreliable symbols are estimated/flagged and used for erasure BM decoding to yield improved performance over BM decoding.

The stopping criterion in ABP algorithm is when a decoding success is signaled by the decoder or the maximum number of iterations is reached. The final performance depends on the type of the decoder used after each BP iteration.

Best Graph Algorithm

The best graph Algorithm (BGA) is based on the same idea of modifying the graph of the code at each iteration to make it suitable to BP, i.e., to place less reliable variables in the sparse part of the parity check matrix. The difference between ABP and BGA lies in the method by which the bit reliabilities are updated after the graph has been modified. In the p-th iteration, the original H is reduced based on the LLR vector obtained in the previous iteration. BP is then performed on this new matrix using correct BP message passing. Because the matrix H at each iteration is different, one needs to find elements of Mvc for the new matrix. In order to obtain the new Mvc values, the following rule is used:

Complete condition: For Mvc(i,j), from the previous Mvc matrices the most recent one with non-zero Mvc(i,j) is found such that at the same time the variable node j was a high reliable (HR) node. However, if there has never been a connection between check node i and variable node j or the previous connection corresponds to the case where the variable node j was a low reliable (LR) node, the input LLR of the jth variable is used as Mvc(i,j).

In BGA, in order to prevent error propagation, at any iteration one can always use the input LLR of the jth variable node for Mvc(i,j) with a certain probability Proba. Therefore, the above condition is only used with probability (1-Proba). This probability depends on the probability of creating a "pseudo-loop" by selecting a previous Mvc(i,j) and can be adjusted using simulations. In spite of improvements, in some cases, over ABP method, BGA still desires better performance especially for longer codes. In one aspect of the invention, BGA decoding is improved by using a suitable choice of multiple representations of parity check matrix based on a reliability criterion.

Description of Inventive Aspects Pertaining to H/M/LDPC Decoding

Novel Adaptive Normalized Min-Sum Algorithm

In some embodiments, an adaptive normalized MSA algorithm is employed. Preferably, a simple scaling factor adaptation is tailored to MSA. The novel adaptive normalized scaling factor improves MSA performance.

Damping the check to variable messages using a scaling factor could reduce the overestimation of extrinsic values and could consequently help to improve the performance of the min-sum algorithm as shown in the prior art. The scaled check to variable message could be represented as $$Mcv(i,j) = \delta(i,j) * Mcv(i,j) \quad (10)$$

where simple adaptive scaling factor is given by:

$$\delta(i,j) = 1 - \beta \frac{Min_1}{Min_2} \quad (11)$$

where $0 \leq \beta \leq 1$ can be determined by experimentation/simulations for a particular code. $Min_1$ and $Min_2$ are the two smallest values in the set $\{|Mvc(i,:)|\backslash|Mvc(i,j)|\}$. The scaling factor using the above proposed method can be calculated for all the variable nodes connected to check node i easily with a very affordable complexity using only the three smallest values of the set $\{|Mvc(i,:)|\}$. Denoting these three smallest absolute values of variable to check messages by L1, L2 and L3 and assuming L1 and L2 correspond to variable nodes jmin1 and jmin2, simple adaptive scaling factor can be written as $$\delta(i, jmin1) = 1 - \beta \frac{L2}{L3} \quad (12)$$

$$\delta(i, jmin2) = 1 - \beta \frac{L1}{L3} \quad (13)$$

$$\delta(i, j) = 1 - \beta \frac{L1}{L2}, \quad (14)$$
$$j \neq jmin1, jmin2.$$

such that $0 \leq \delta \leq 1$. The numerator in above equations also corresponds to the absolute value of the check to variable messages from the check node i. Thus when $|Mcv(i,j)|$ is larger, the corresponding $\delta(i, j)$ is smaller, and vice versa. That is, the scaling factor is set to suppress more larger-messages and less smaller-messages in an adaptive manner. The denominator in above equation is always larger than or equal to the numerator and represents a rough measure of the reliability of remaining variables connected to the corresponding check node. Thus if remaining variables of the same check equation are more reliable, less suppression of extrinsic information is done, and vice versa. In another embodiment, the adaptive scaling factor could also be used in SPA. In yet other embodiments, the adaptive scaling factor could be used in other suitable variations of BP algorithms. The performance gain of adaptive normalized MSA (ANMSA) of certain aspects of the invention, compared to normal MSA on the example of RS (255,239) code is shown in Table 1.

TABLE 1

BER performance of Novel Adaptive Normalized MSA (NANMSA).

| | No(dB) | | | |
|---|---|---|---|---|
| Eb | 6.5 | 7.0 | 7.5 | 7.75 |
| MSA | 0.007 | 0.004 | 0.002 | 0.001 |
| ANMSA | 0.0043 | 0.0014 | 0.00047 | 0.0002 |

Weighted Averaging of Non-Converged Variable to Check Messages

In another embodiment, for some codes it might be advantageous to employ a weighted average of variable to check node messages if such messages have different signs in consecutive iterations. Specifically, if the signs of Mvc(i,j) messages are different in iterations n and n−1, then the modified Mvc(i,j) is given by:

$$\tilde{M}vc(i,j)^{(n)} = g \times Mvc(i,j)^{(n)} + (1-g) \times Mvc(i,j)^{(n-1)},$$

where $0.5 \leq g \leq 1$, thus giving some preference (more weight) to the newer message, though still suppressing potential propagation of "bad" message. Table 2 shows the performance improvement over ANMSA in decoding RS (255, 239) code when averaging of variable to check messages is employed. g=0.5 case corresponds to equal weight averaging in the prior art, while opt. g corresponds to the approach according to this embodiment, that is when weighting factor is optimized. It could be seen that the aspect of the invention in this embodiment, with optimized weighted averaging, further improves the performance over prior art methods, with essentially same computational complexity.

TABLE 2

BER Performance improvement due to averaging of Mvc.

| | No(dB) | | | |
|---|---|---|---|---|
| Eb | 6.5 | 7.0 | 7.5 | 7.75 |
| ANMSA | 0.0043 | 0.0014 | 0.00047 | 0.0002 |
| ANMSA, g = 0.5 | 0.003 | 0.00046 | 0.00007 | 0.000011 |
| ANMSA, opt. g | 0.002 | 0.00023 | 0.00003 | 0.0000052 |

Simple Greedy BP Scheduling

This method is an attempt to perform informed BP decoding without calculating all the residual values in every iteration. The main idea is to first update the equations that are less likely to have errors in the dense part of the parity check matrix. For each check node i, only one value is calculated and assigned based on only outgoing messages. This value is the sum of the two smallest values in the set $\{|Mvc(i,:)|\}$. In any iteration of BP decoding, the proposed simple greedy scheduling has four main steps:

1. For each check node, calculate a scheduling metric value:

$$Val_i = Min_1 + Min_2, \quad (15)$$

where $Min_1$ and $Min_2$ are the two smallest values in the set $\{|Mvc(i,:)|\}$. These values (Val's) are sorted in a decreasing order and an ordering vector $I = \{I_1, I_2, \ldots, I_{(n-k)}\}$ is determined and saved.

2. Perform check-to-variable updates using a greedy algorithm based on the ordering from step 1. The process is similar to the one shown in FIG. 5. A check node is selected based on ordering. All the Mcv messages corresponding to that check nodes are updated. The changes in the Mcv values are used to update the Mvc messages corresponding to variable nodes connected to that check node. Then the next check node is selected and its Mcv values are updated using the most recent Mvc values. The process is shown in the following steps:
   a) Inputs: previous variable-to-check and check-to-variable messages, $Mvc_{old}$ and $Mcv_{old}$.
   b) Initialization: define a zero matrix Del of the same size as the binary parity check matrix. This matrix shows the changes in the Mcv values. These changes are used to update the Mvc values subsequently.

c) Start from the check node corresponding to the first position $I_1$ in the ordering vector I of step 1. Use normalized MSA with parameter β (alternatively another algorithm known in the art may be used) to update all the check-to-variable messages of check node $I_1$. Also, preferably, multiply check-to-variable messages with a scaling constant α. The new updated messages are represented by $Mcv_{new}(I_1,:)$.

d) Update matrix Del as:

$$Del(I_1,:)=Del(I_1,:)+Mcv_{new}(I_1,:)-Mcv_{old}(I_1,:) \quad (16)$$

e) Update the Mvc values:

$$Mvc_{new}(I_1,:)=Mvc_{old}(I_1,:)+Del(I_1,:) \quad (17)$$

f) Repeat the above procedure c)-e) for next positions of the ordering set I.

3. Perform variable-to check updates:

$$Mvc_{new}(i,j) = \rho(j) + \sum_{k \in N_{vj} \setminus i} Mcv(k,j) \quad (18)$$

In order to improve this part, use the following rule. In cases where the sign of a variable-to-check message changes from the previous iteration, an average between the two messages may be computed:

$$Mvc_{new}(i,j)=g \cdot Mvc_{new}(i,j)+(1-g) \cdot Mvc_{old}(i,j) \quad (19)$$

where $0.5 \leq g \leq 1$ determines the weight that is given to each message.

4. Using the updated Mvc's, it is possible to determine which one of the parity check equations are satisfied at the end of the iteration. The number of satisfied checks is measured in this step. It can be seen that when all the checks are satisfied, the algorithm has converged to a codeword.

This method requires a lot less computations compared to RBP and NWS, yet provides excellent performance. It does not need to calculate residuals after each check node update, for all the remaining unupdated check node equations, in order to choose which check node to update next. Therefore, it avoids calculating unused residual updates for determining the order of check node updates and correspondingly reduces the complexity of residual calculations on average by approximately $$V \cdot \frac{N^2}{2},$$

where N is the number of check equations and V is the average number of variable nodes connected to a check node. The assigned values to the check nodes are only calculated and sorted once at the beginning and check node schedule starts from the check node with maximum value Val and continues according to the calculated ordering vector. Also calculating Val is very easy because it only depends on the outgoing messages and no actual check node updates are required. This results in a very affordable complexity.

In Table 3, the performance of simple greedy algorithm is compared with the min-sum algorithm as well as the normalized min-sum algorithm including weighted averaging of non-converged variable to check messages. The latter is referred to as Min-Sum 2D algorithm in the table. The performance is also compared with the serial scheduling which is similar to the simple greedy except that step 1 is not performed and check node updates are performed from the first check node to the last one without any additional ordering meaning $I=\{I_1, I_2, \ldots, I_{(n-k)}\}=\{1, 2, \ldots, (n-k)\}$. The comparison is performed for RS (255,223) and 3 iterations for each decoder. As it can be seen in Table 3, the proposed simple greedy algorithm has the best performance.

TABLE 3

Comparison of simple greedy algorithm with other BP decoding techniques.

| | | No (dB) | | | |
|---|---|---|---|---|---|
| Eb | | 6 | 6.5 | 7 | 7.5 |
| Min-Sum | FER | 1 | 0.86 | 0.64 | 0.32 |
| | BER | 1.45e−2 | 1.29e−2 | 1.16e−2 | 8.1e−3 |
| Min-Sum 2D | FER | 0.96 | 0.75 | 0.34 | 0.096 |
| | BER | 8e−3 | 7e−3 | 4.9e−3 | 1.9e−3 |
| Serial Scheduling | FER | 0.909 | 0.51 | 0.101 | 0.0112 |
| | BER | 3.98e−3 | 1.49e−3 | 2.3e−4 | 2.46e−5 |
| Simple Greedy | FER | 0.9 | 0.438 | 0.0788 | 0.00749 |
| | BER | 3.95e−3 | 1.48e−3 | 2.15e−4 | 1.89e−5 |

Alternative Simple Greedy BP Algorithm

In another embodiment, in step 1 of the simple greedy algorithm, instead of sorting all the values, Val's, only the check node with maximum Val is determined. Then in step 2, check-to-variable updates are performed for the check node indicated in step 1. Then step 3 is performed as before. After that going back to step 1, only the index of the row with maximum Val among remaining un-updated check equations is determined. Then in step 2 check-to-variable updates are performed for the newly determined check node followed by step 3. Going back to step 1, the next check node with maximum Val is selected and the process continues until all the check nodes are updated. Step 4 will be similar as before. Thus, instead of sorting complexity of N values, Val, initially, with complexity proportional to N·log N, in this alternative approach, before each check node update, a maximum value of Val for the set of remaining unupdated check nodes is found. This results in computational complexity proportional to N·(N−1)/2. In some cases, this alternative approach yields slightly better results.

Improved Best Graph BP Using Multiple Parity Check Matrices

Figure 6:
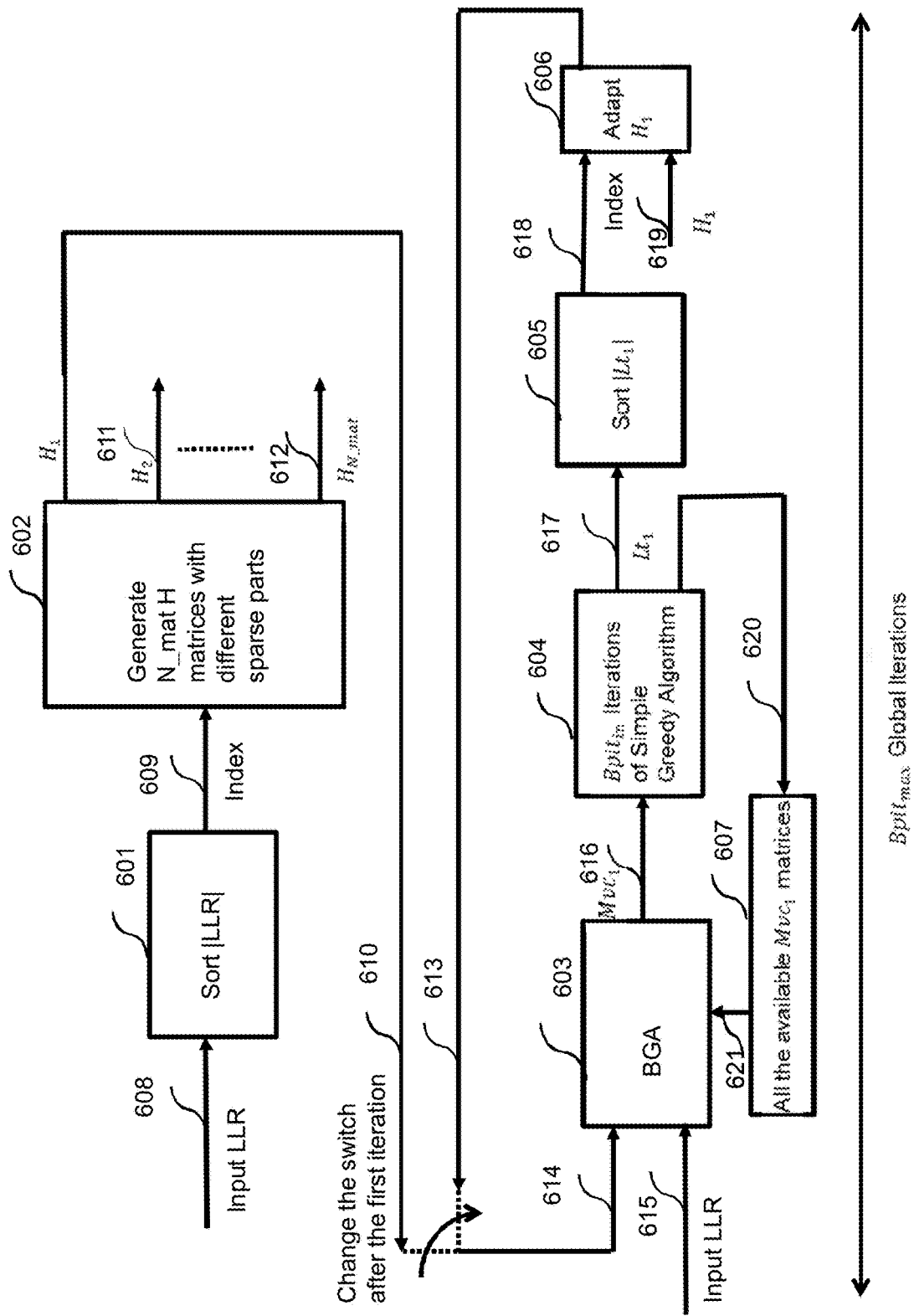
FIG. 6 is a flow diagram illustrating embodiments for decoding, particularly showing relevant elements and process steps in accordance with certain embodiments of the invention.

A soft decoding algorithm for H/M/LDPC codes based on the belief propagation method has been invented. The method is based on BG algorithm extended with multiple parity check matrices. The performance improvement of both ABP and BGA methods is due to the fact that the columns corresponding to low reliable bits are sparsified preventing errors to be propagated specially for M/HDPC codes. Here, some of the methods described add diversity to BGA by starting with the main parity check matrix of the code and generate multiple matrices with different sparsified parts. This way, even some of the lower reliable bits in k high reliable (HR) group will also be put in the sparse parts of one of the matrices. This way error propagation from higher reliable bits may also be prevented. This will help to improve the final performance in two ways. First, it allows for errors in bit positions that would normally be in the dense part of the parity check matrix in ABP and BG methods. Secondly, multiple matrices provide a "decoding diversity method" in that one matrix may enable convergence to the solution while others may not, which indeed has been confirmed by extensive simulations. The steps in the decoder are explained in the following. Also the main steps 1-7 are shown in FIG. 6:

Step 1: The input bit LLRs 608 are sorted in 601 based on their absolute values. The resulting index vector 609 is called I_sort.

Step 2: In BP decoding, one should use the binary parity check matrix of the code. In ABP, the columns of the H matrix corresponding to (n-k) least reliable bit positions (LRBs) are converted to degree 1 columns. This way the errors in low reliability bits are prevented from propagating to "healthy" bits in the dense part. In order to improve the performance even more, diversity can be added by generating N_mat matrices with degree 1 columns in different positions (FIG. 6, 602):

1st: Modify H by converting its (n-k)-L columns corresponding to least reliable bits to degree 1. Call the new matrix Hp.
   2nd: For v=1:N_mat, start with Hp and convert L columns corresponding to I_sort((n-k)-L+(v-1)L+1: (n-k)-L+vL) to degree 1 and call the resulting matrix $H_v$. In the end, there will be N_mat matrices $H_1, H_2, \ldots, H_{N\_mat}$ in lines 610, 611, ..., 612. Row additions are used to make the degrees of selected columns equal to one. All of the matrices have a common set of (n-k)-L columns with degree 1, corresponding to lowest reliable bits. In addition, each of the matrices has another different set of L columns with degree 1. The position of these L columns are different for each matrix providing the matrix diversity and allowing different higher reliable bits to be in the sparse part, in case errors occur in these more reliable positions.

Figure 7:
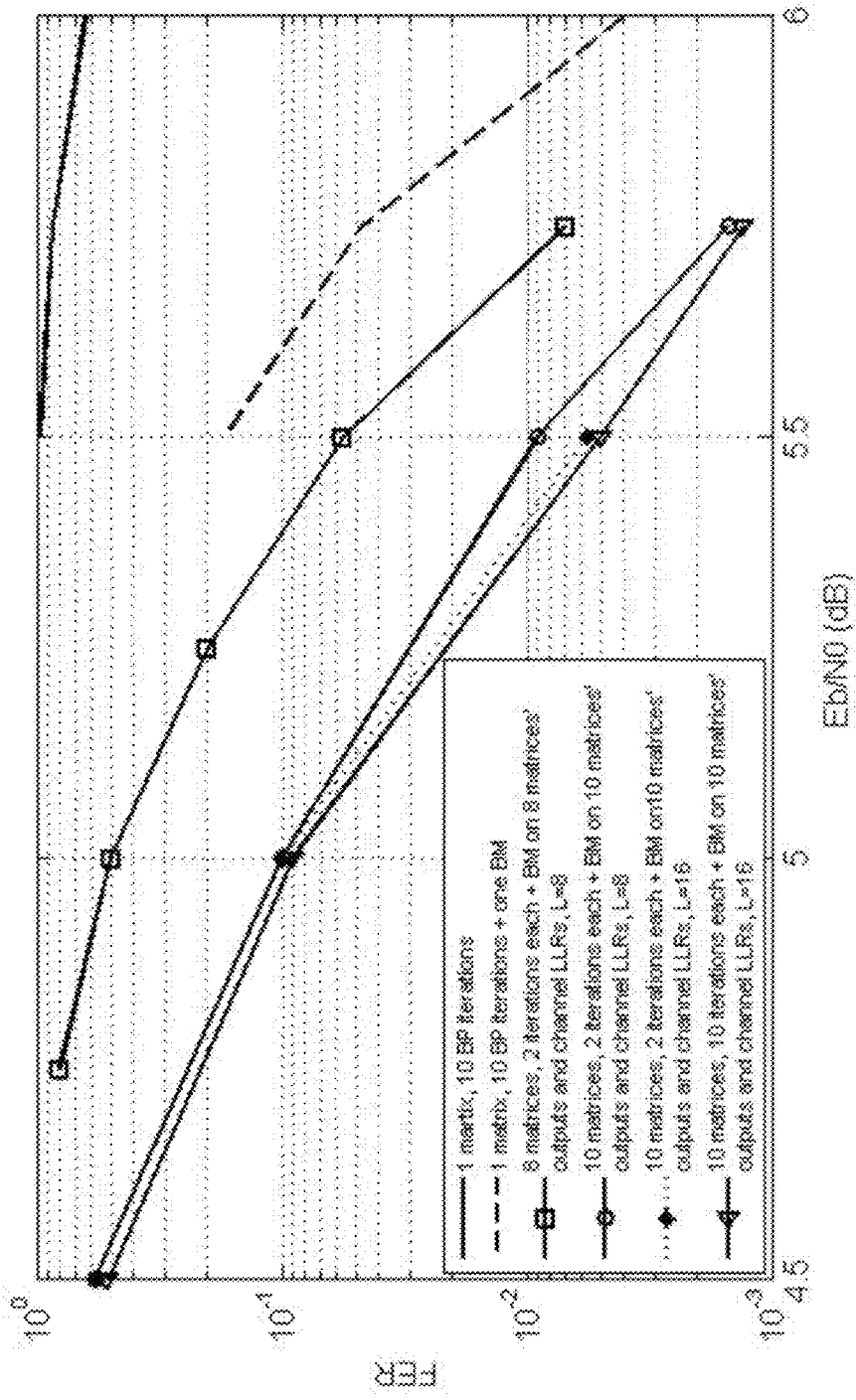
FIG. 7 is a chart illustrating the performance of RS (255,239), such as using multiple parity check matrices, simple greedy BP and simple greedy BP combined with Berlekamp-Massey (BM) decoding in accordance with certain embodiments of the invention.

The effect of matrix diversity explained above, number of iterations for each matrix and the value L explained above has been investigated for RS (255,239) in FIG. 7. From the two right curves, the performance improvement of using BM decoder at the end of iterations is evident compared to only using the hard decisions of the updated LLRs. As it can be seen, by increasing the number of matrices, frame error rate decreases. Both of the two curves at the left use 10 matrices but one of them performs 2 simple greedy BP iterations for each matrix while the other one performs 10 iterations resulting very slightly better performance. The simple greedy BP algorithm does not need many iterations to reach good performance. The value of L should be adjusted for each code using simulations. For example, for RS (255,239) code, L=16 provides the best results.

Step 3: For each of the N_mat matrices, an Mvc matrix is defined based on the input reliabilities 615 such that: Mvc(i,j)=p(j), for all (i,j) where $H_v$(i,j)=1 and Mvc(i,j)=0, for all (i,j) where $H_v$(i,j)=0. The process for $H_1$ is shown in FIG. 6 where BGA block 603 is used to form the $Mvc_1$ matrix 616 using $H_1$ in line 614 and input LLRs in line 615. For the first iteration, there is no input in line 621 because there are no saved Mvc matrices.

Step 4: For each of the N_mat matrices generated in the last step, Bpit_in number of BP iterations are performed using the proposed simple greedy BP algorithm in block 604. Alternatively, other BP algorithms could be used. This way, a set of N_mat updated bit reliabilities, $Lt_v$, v=1:N_mat are generated. The updated LLR for $H_1, Lt_1$, is shown in line 617. All the N_mat final Mvc matrices for all the N_mat cases are saved. The final $Mvc_1$ for $H_1$ is shown in line 620 which is saved in block 607.

Step 5: For v=1:N_mat, $Lt_v$ vector is sorted based on its absolute values (FIG. 6, 605) which results in the index vector I_v shown in line 618 for $H_1$. Then $H_v$ is modified such that the columns corresponding to I_v(1: (n-k)-L) and I_v(((n-k)-L+(v-1)L+1: (n-k)-L+vL) are converted to degree 1. Block 606 receives $H_1$ 619 and its corresponding index 618 and generates the modified new $H_1$ 613. It should be noted that a lot of these columns already have degree 1. Thus, one may only need to convert to degree 1 those columns that are not of degree 1. In the end, there will be N_mat modified matrices.

Step 6: In order to be able to continue the correct BP iterations for each of the N_mat cases, new updated Mvc matrices corresponding to each of the modified N_mat parity check matrices need to be calculated. The principles of the best graph algorithm are used for this task. For each case, the new matrix (613 for $H_1$), previously saved Mvc matrices (621 for $H_1$) and input LLRs 615 are used by the BGA algorithm in block 603 to obtain the new Mvc matrix (616 for $H_1$). According to certain aspects of the invention, it is proposed that instead of the complete condition explained in the discussion of BGA above, the following simple condition can be used without noticeable performance loss:

Simple condition: For Mvc(i,j), from the previous Mvc matrices, the most recent one with non-zero Mvc(i,j) is found and its value is used for the new Mvc(i,j). However, if there has never been a connection between check node i and variable node j, the input LLR of the jth variable is used as Mvc(i,j).

Similar to the complete condition, the input LLR of the jth variable node can always be used for Mvc(i,j) with a certain probability Proba. The above condition is only applied with probability (1-Proba). Based on extensive examples and simulations, for longer HDPC codes, such as RS (255,223), it may be better to use the input LLRs for new Mvc values rather than the BGA, meaning Proba=1.

Step 7: Steps 4-6 are repeated Bpit_max times or until the iterations with at least one of the matrices converge to a valid RS codeword.

Step 8: In this step, for each of the v=1:N_mat matrices, there exists either a decoded RS codeword or a set of updated LLRs, $Lt_v$. The codewords are saved in a list. For cases that have not converged to a codeword, the updated LLRs, $Lt_v$ are decoded by a known hard decision or some kind of erasure or soft decision decoder for that code. If a codeword is decoded, it will be added to the list of codewords. The input LLRs and the average of $Lt_v$'s are also decoded by a known hard decision decoder or some kind of erasure or soft decision decoder for that code.

Step 9: If multiple codewords exists in the list, the one with minimum Euclidean distance from the received signal is chosen. However, when the decoder fails to generate even one codeword, one can select the mean of N_mat LLR vectors from BP iteration or simply select the input LLRs as the output of the decoder.

Proposed Decoder Using Other BP Algorithms

In other embodiments, in step 4 of the above proposed algorithm, instead of the simple greedy BP algorithm, one can use any of the other BP decoding methods such as flooding BP (SPA, MSA, normalized MSA, etc.) as well as informed BP scheduling (RBP, NWS, etc.).

Choosing the Best LLR

In step 9, when the decoder fails to generate even one codeword, one can use input LLRs, average of N_mat LLRs or one of the N_mat LLRs as the output of the decoder. Extensive experiments have been performed in order to choose the best possible LLR vector in order to reduce the final bit error rate. All the output LLR sets of BP decoders corresponding to N_mat different matrices were considered, as well as the average of these N_mat LLR sets and also the input LLRs. From the experiments with long RS codes, it appears that the LLRs from the first matrix and also the average LLRs generally yield the best bit error rate, though the difference is very small. More systematic measurements of the performance suggest that mean of LLRs from multiple matrices results in overall best performance.

Error and Erasure Decoding at the End of BP Iterations

In another embodiment, in step 8, the final decoder applied to the LLRs of not converged matrices can be improved using error and erasure decoding. As an example, for RS codes, the final decoder may be a hard decision BM decoder or a soft decision KV decoder. BM decoder is much simpler than the KV decoder but its performance is worse. Therefore, the whole decoder based on BP will have much better performance using the KV algorithm but with a very high complexity. Erasure decoding is an attempt to have better performance compared to a hard decision decoder such as BM decoder and less complexity compared to a soft decoder such as KV. According to this embodiment, first the updated LLRs, $Lt_v$ are used to determine a set of unreliable symbol positions that if erased might help the BM decoder to decode successfully. Potential erasure symbols could be identified based on probability of symbols being correct. In one embodiment, a certain number, NE<=NEmax, of least reliable symbols could be flagged for erasures, where NEmax is the maximum possible number of erasures for that particular code. In an alternate embodiment, all symbols with probability of correct smaller than a threshold could be erased, such that the number of erasures does not exceed NEmax. After selecting the erasures, the hard decisions of each set of reliabilities along with the erasure positions are applied to the BM error and erasure decoder.

Proposed Decoder Using Disagreement Positions

In another embodiment, the proposed decoder can take advantage of the fact that the sign disagreement positions between the N_mat LLR vectors, Lt, have a very high probability of being actually bit errors. It has been observed by extensive experimentation that approximately half of disagreement positions correspond to errors. Therefore, placing these sign disagreement positions in the sparse part of the matrix might help to prevent error propagation from these positions and consequently to improve the final performance. Using this observation, in this embodiment, the step 5 of the proposed algorithm can be modified as Step 5: For the N_mat LLR vectors Lt generated in the last step, the sign disagreement positions between all of them are found. The vector of selected positions is called I_dis. For v=1:N_mat, $Lt_v$ vector is sorted based on its absolute values which results in the index vector I_v. Then $H_v$ is modified such that the columns corresponding to I_dis, I_v(1: (n−k)−L) and I_v(((n−k)−L+(v−1)L+1: (n−k)−L+vL) are converted to degree 1 in the same order mentioned. Depending on the rank of the matrix, it might not be possible to convert all the mentioned columns to degree 1 and some of the last positions mentioned might have degrees larger than 1 (e.g., 2, 3, etc.). It should be noted that a lot of these columns have degree 1 already. So, one only needs to convert those columns that are not degree 1. In the end, N_mat modified matrices are calculated where in all of them the disagreement positions are placed in the sparse part.

For RS (255,239), the performance of the proposed decoder is compared with its alternative using disagreement positions in Table 4. In both methods, 7 rounds of sorting and matrix adaptation are used. During each round 3 iterations of simple greedy BP algorithm are performed except for the last round where 9 iterations are performed. At the end of iterations for each matrix, BM error and erasure decoding is used. The number of matrices is set to N_mat=6. As it can be seen from this table, it is not clear which of these two methods is absolutely gives better performance. Based on this observation, a new decoder is proposed in the following.

Combination of the Original Proposed Decoder and the Alternative Embodiment with Disagreement Positions In another embodiment, first the original proposed decoder is applied. If it failed, the alternative with disagreement positions is applied. For RS (255,239), the performance of this proposed decoder is also given in Table 4 which clearly outperforms the first two decoders especially at higher SNR values. Specifically, it could be seen that the combined decoder of this embodiment reduces BER and FER several times with respect to either of the two individual decoders. It should also be noted that the combined decoder has only slightly higher complexity than decoder 1 (Proposed decoder) at high SNR, because decoder 2 (Proposed decoder using disagreements) is only invoked if decoder 1 fails.

TABLE 4

Comparison of the performances of the proposed decoder with its alternative using disagreement positions as well as a method using their combination.

| | | | N0 (dB) | | |
|---|---|---|---|---|---|
| | | Eb | 4.5 | 5 | 5.5 |
| 1 | Proposed decoder | FER | 0.31 | 0.0524 | 0.00095 |
| | | BER | $3.6 \times 10^{-3}$ | $4.6 \times 10^{-4}$ | $6.6 \times 10^{-6}$ |
| 2 | Proposed decoder using disagreement positions | FER | 0.32 | 0.044 | 0.0013 |
| | | BER | $3.7 \times 10^{-3}$ | $3.7 \times 10^{-4}$ | $8.3 \times 10^{-6}$ |
| 3 | Combination of 1 and 2 (run 2 when 1 fails) | FER | 0.31 | 0.032 | 0.000278 |
| | | BER | $3.9 \times 10^{-3}$ | $3 \times 10^{-4}$ | $2.1 \times 10^{-6}$ |

Decoding RS Codes Using the Proposed Method

Figure 8:
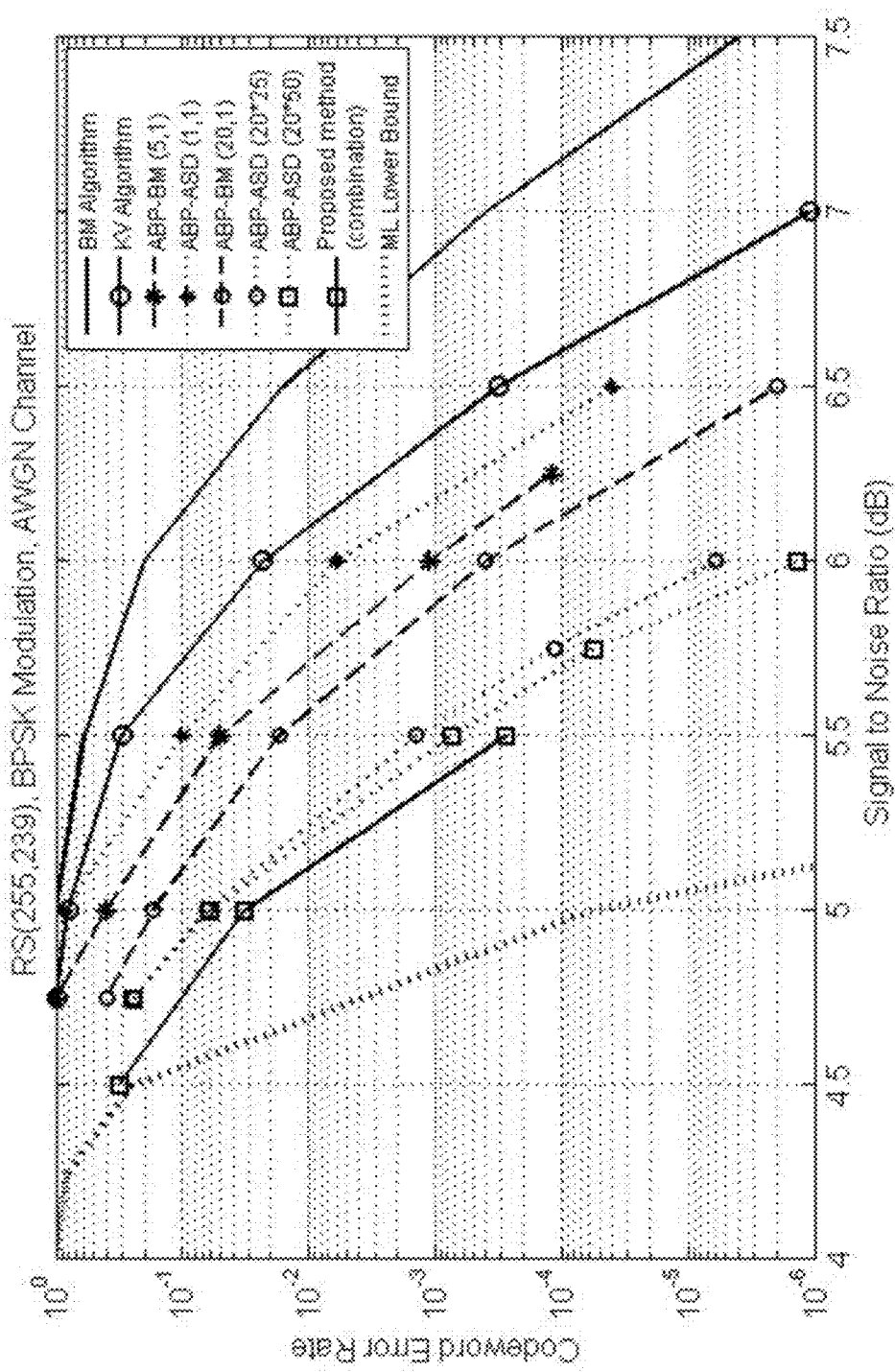
FIG. 8 is a chart illustrating the performance of RS (255,239) using the certain embodiments of the invention compared to known methods in the prior art in accordance with certain embodiments of the invention.

In another embodiment, the performance of the proposed methods described in the previous embodiments is investigated for RS codes. RS codes are non-binary linear block codes. The first step is to derive a binary parity check matrix for a given RS code. For a RS code defined over Galois Field $GF(2^m)$, the primitive element a has a companion m×m binary matrix c. Any other non-zero element of $GF(2^m)$ can be written as $\alpha^s$, $0 \leq s \leq 2^m - 2$ with a companion m×m binary matrix of the form $c^s$. Therefore, all the non-binary elements of the (n−k)×n parity check matrix can be replaced with m×m binary matrices which results in a (n−k)m×nm binary parity check matrix. After finding the binary parity check matrix, all the discussed methods of previous embodiments are applicable to RS codes. In FIG. 8, the performance of the proposed decoder based on the combinations of the original proposed decoder and the one with disagreement positions is compared with the other existing decoding methods for RS codes in the literature for RS (255,239). Similar to the results shown in Table 4, the number of matrices is set to N_mat=6. 7 rounds of sorting and matrix adaptation are performed with 3 iterations of simple greedy BP algorithm for each round except for the last round where 9 iterations are performed. At the end of iterations for each matrix, BM error and erasure decoding is used. Therefore, the proposed method consists of 6×7=42 sorting and matrix adaptations as well as 6×27=162 BP iterations using the simple greedy algorithm. At the end of iterations a maximum of 6+2=8 (6 matrices, input LLRs and the average of all LLRs from 6 matrices) BM error and erasure decodings are performed, if BP decoders did not converge to a codeword during iterations. These numbers are occasionally doubled when the original proposed decoder fails and the method with disagreement positions needs to be performed. The method based on the combination of the ABP algorithm with KV decoding proposed by El-Khamy (ABP-ASD, #20*50) has the best performance in the literature. This method performs 50 rounds of decoding each with 20 ABP iterations. In each round a different set of bit positions are converted to degree 1 in the parity check matrix. Also, after each ABP iteration, KV decoding is performed on the updated LLRs. Therefore, this method needs 50×20=1000 sorting and matrix adaptations as well as BP iterations and KV decodings. The dominant part in the complexity of the KV algorithm is the interpolation part with a time complexity of $O(n^2\lambda^4)$ where $\lambda$ is a complexity parameter determined by the interpolation cost. The performance of the KV algorithm improves by increasing the value of $\lambda$. The high complexity of KV makes it inapplicable in most practical scenarios. The BM algorithm has a time complexity of $o(n(n-k+1))$. As it can be seen form FIG. 8, the proposed method according to certain aspects of the invention outperforms ABP-ASD, #20*50 of El-Khamy with about 0.15 dB with significantly smaller complexity. In terms of sorting, matrix adaptations and BP iterations, the proposed methods are at least $1000/(2*42) \cong 12$ times simpler than ABP-ASD, #20*50. In addition, the proposed method uses 8 BM error and erasures decodings while ABP-ASD, #20*50 performs 1000 KV decodings, resulting in approximately $$\frac{1000*255*\lambda^4}{8*(255-239+1)}$$

times smaller decoding complexity for this part.

II. Advanced Channel State Information Estimation

This subsection discusses techniques for performing advanced channel state information, also referred to as CSI, estimation. Specifically, certain aspects of the invention discussed herein pertain to enhancing pilot channel estimation by using an optimum filter length, adaptive decision-directed channel estimation and/or performing the estimation iteratively using shorter filters. These aspects are applicable to HD Radio systems (e.g., to improve receiver performance given that a better understanding of channel attributes can be ascertained and used to adapt transmission to channel conditions), as well as to any other communication system where channel response may change over time, such as various broadcast or mobile cellular systems. In some embodiments, the pilot structure is also adapted in the transmitter to properly match channel selectivity, thereby enabling better CSI estimation in the receiver.

Figure 9C:
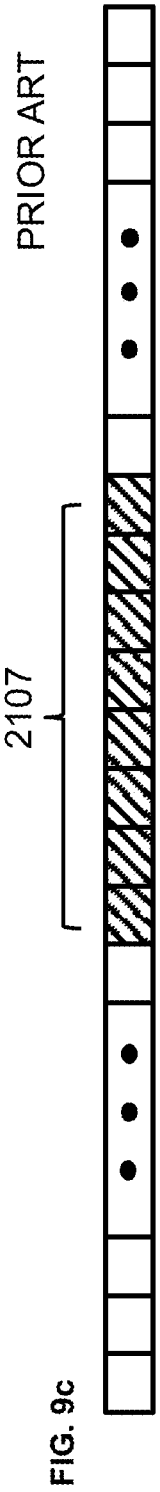
Figure 9D:
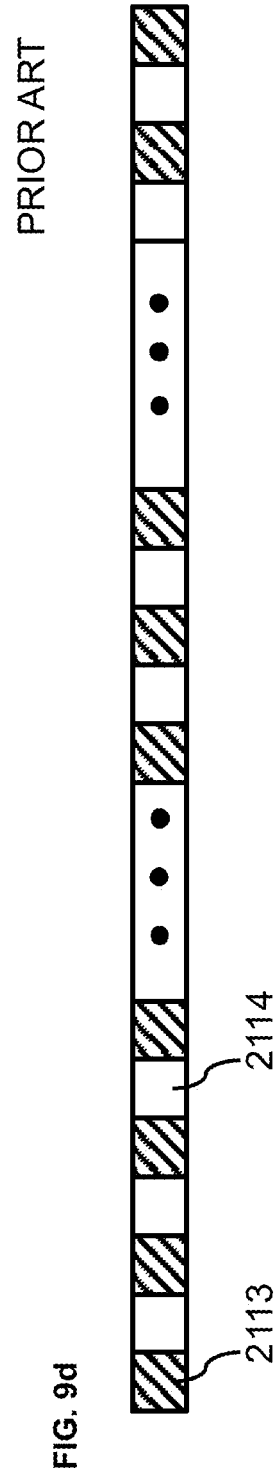
Figure 9E:
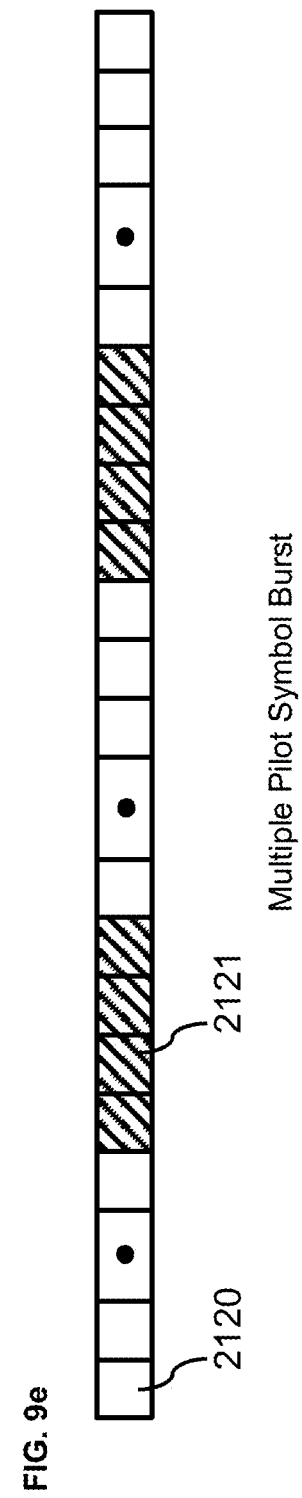

CSI estimation typically includes estimation of channel-induced phase and amplitude on received symbols (which may be referred to as the channel response) as well as noise power estimation. These attributes are used for different processing tasks in communication receivers, such as coherent demodulation, diversity combining, FEC decoding and others as known in the art. Accurate estimation of CSI is very important to properly facilitate these processing tasks and achieve maximum-possible performance gains offered by those processing tasks. To facilitate CSI estimation, pilot symbols are inserted in a stream of data symbols. FIG. 9 shows typical arrangements of pilot symbols in single carrier systems. In some code-division multiple-access (CDMA) systems, a dedicated pilot channel 2101 is used to carry a continuous stream of pilot symbols 2102 as shown in FIG. 9a. In other systems, pilot symbols could be clustered and occupy a fraction of packet, such as a preamble 2103 as illustrated in FIG. 9b or a midamble 2107 in GSM systems as illustrated in FIG. 9c. In other systems, one or more pilot symbols 2113, 2121 could be interleaved with data 2114, 2120 as shown in FIG. 9d and FIG. 9e.

Figure 10A:
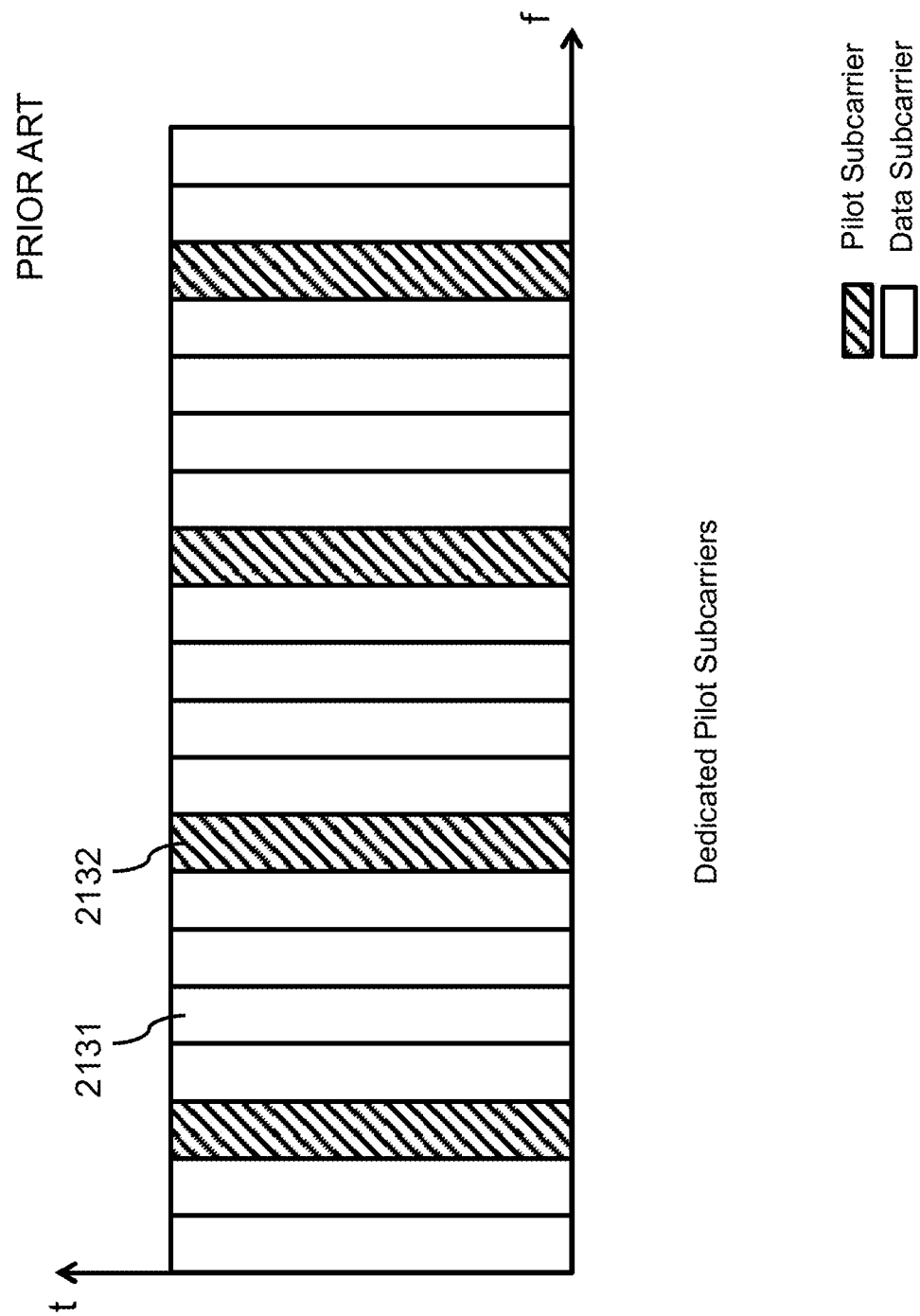

In multicarrier systems, such as orthogonal frequency-division multiplexing (OFDM), pilot symbols can be arranged in time and frequency domains. FIG. 10 illustrates typical arrangements of pilot symbols in multicarrier systems. As shown in FIG. 10a, a select set of OFDM subcarriers are dedicated to pilot symbols 2132 while other subcarriers are dedicated to data symbols 2131. FIG. 10b shows another arrangement in which a select set of subcarriers carry both pilot 2143 and data 2144 symbols interleaved while other subcarriers carry only data symbols. In addition, pilot symbols may be staggered in time on two adjacent subcarriers 2145, 2146 that carry pilot symbols. Pilot symbols are also known in the art as reference symbols or training symbols.

CSI Estimation Based on Received Channel Symbols

In some embodiments, certain aspects of the invention are applicable to systems where no iterative channel estimation is used. The corresponding methods could also be used as initial CSI estimation in systems where iterative, joint CSI estimation and FEC decoding are employed. Although certain aspects described herein generally apply to various pilot arrangements shown in FIG. 9 and FIG. 10, specifics of implementation with some details may differ for different arrangements. Consider first pilot symbol arrangements with continuous pilot symbols shown in FIG. 9a and FIG. 10a. Received pilot symbols on the pilot channel in FIG. 9a or on one pilot subcarrier in FIG. 10a could be mathematically modeled as $$r(i)=h(i)p(i)+n(i) \text{ for } i=1,2,\ldots \quad (20)$$

where $h(i)$ represents the channel response, $p(i)$ is the transmitted pilot symbol, $n(i)$ is the additive white Gaussian noise (AWGN) with zero mean and variance. $E(|(n(i))|^2)=\sigma_n^2$. The channel response could be written as $h(i)=a(i)e^{j\theta(i)}$ where $a(i)$ and $\theta(i)$ represent the amplitude and phase of the channel response, respectively.

By multiplying the received symbols with $p^*(i)$, we obtain $$y(i)=r(i)p^*(i)=h(i)+(i), \text{ for } i=1,2, \quad (21)$$

where noise $\{n'(i)\}$ has the same statistics as $\{n(i)\}$ and $|p(i)|=1$ is assumed without loss of generality. The sequence $\{y(i)\}$ is used to estimate channel response and noise power. In multicarrier systems (MC), (21) could be rewritten as $$y_k(i)=r_k(i)p_k^*(i)=h_k(i)+n_k'(i) \text{ for } i=1,2, \quad (22)$$

where subscript k denotes the k-th subcarrier of the MC system.

Figure 11C:
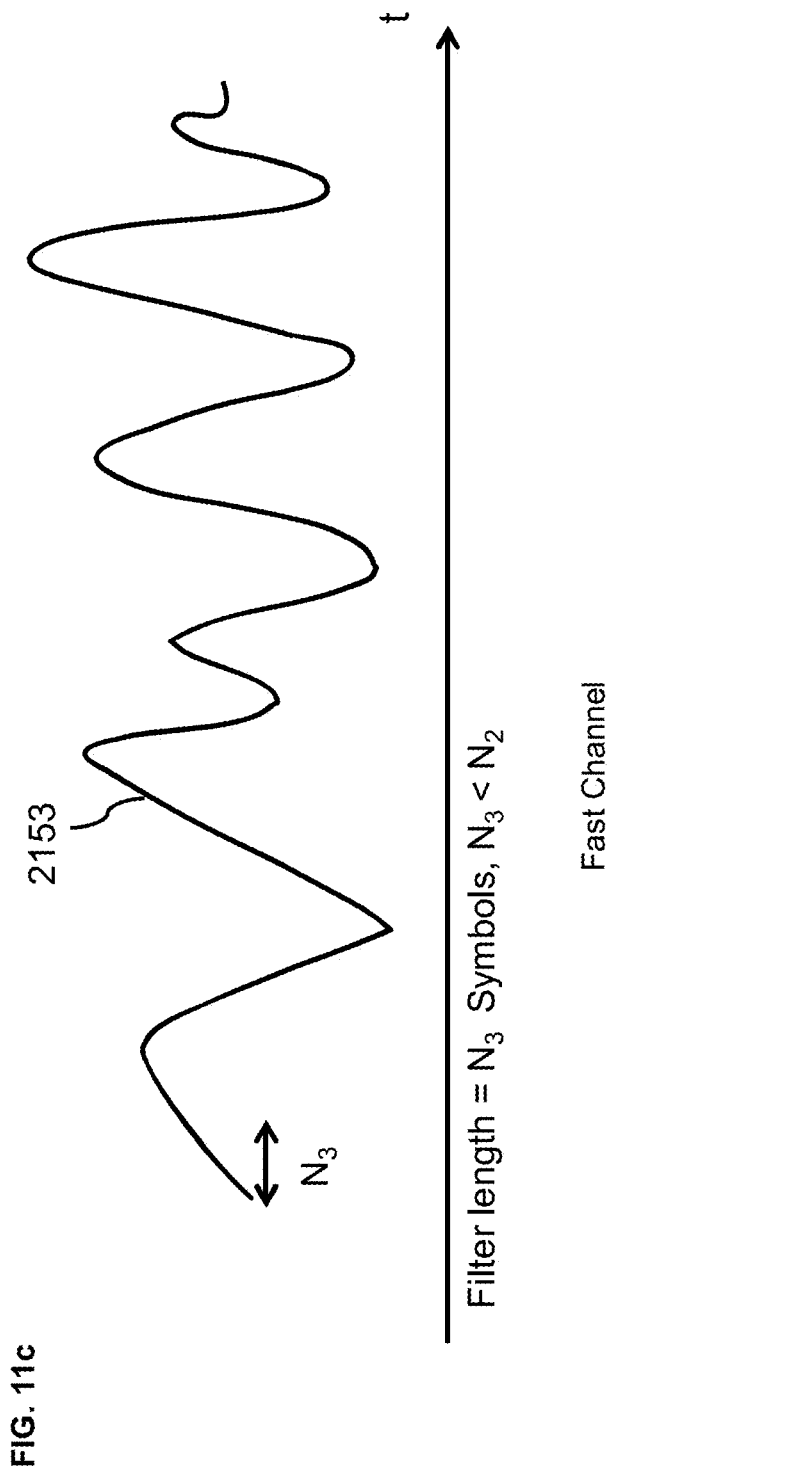

As can be seen from (21), the i-th received sample $y(i)$ represents the channel response distorted by noise. Additive noise impact on the channel estimation could be reduced by use of a finite impulse response (FIR) smoothing filter. For example, assuming the channel response is constant over N consecutive samples, where N is an odd number, the maximum likelihood estimate of the l-th channel is given by $$\hat{h}(l) = \frac{1}{N} \sum_{i=l-\frac{N-1}{2}}^{l+\frac{N-1}{2}} y(i) = h(l) + \frac{1}{N} \sum_{i=l-\frac{N-1}{2}}^{l+\frac{N-1}{2}} n'(i) \quad (23)$$

where a rectangular (i.e., constant filter-tap gains) FIR filter is used. By increasing the filter length N, the impact of noise is reduced and the channel estimation error is reduced. However, the filter length depends also on the rapidity of channel variations. FIG. 11a-FIG. 11c show typical examples of slow, moderately fast (or medium-speed), and fast fading channels, respectively. The length N of the smoothing filter should be selected such that the channel changes are insignificant over the length of the filter. Otherwise, the smoothing over an excessive number of samples corresponding to a varying channel response will cause an estimation error due to the mismatch between channel variations and the filter length. This tradeoff is illustrated in FIG. 12 for the examples of slow 2151, moderately fast 2152, and fast 2153 fading channels shown in FIG. 11. The variance of estimation error has two components, one due to the additive noise 2163 and the other due to the mismatch between the filter length and rapidity of channel variation, i.e., channel dynamics 2167 or also referred to as time selectivity in which variance errors due to the mismatch are shown in three curves, namely, for slow fading 2166, moderately fast fading 2165, and fast fading 2164. In general, as shown in (23), the variance due to noise is decreased by increasing the filter length N. On the other hand, the variance of estimation error may increase by increasing N beyond the range over which the channel changes are insignificant. Therefore, for a given rate of channel variation, i.e., time selectivity, there is an optimum filter length that minimizes the overall impact of noise and mismatch between filter length and channel dynamics. If the channel is slowly varying, longer filter lengths will decrease the mean square error (MSE) of the channel estimation. On the other hand, if a longer filter length is selected for fast fading channel, it will cause undesirable performance degradation. Therefore, the tap length selection must be done properly at the receiver depending on the channel dynamics. As illustrated in FIG. 12, the optimum filter length is chosen such to minimize the total variance of estimation errors due to noise and mismatch, e.g., $N_3$ for fast fading, $N_2$ for moderately fast fading, and $N_1$ for slow fading, respectively, where $N_3 < N_2 < N_1$. Clearly, a shorter filter length is desired when the time selectivity of the channel increases.

In some embodiments, non-rectangular filters could be used to give more weight to samples closer to the current sample and less weight to samples further apart. In the presence of impulsive noise, a median filter, possibly with additional smoothing, may be preferable to minimize the impact of such impulsive noise. In yet another embodiment, a new filtering method that is robust in the presence of impulsive noise could be employed. For example, the samples with strong noise could be first identified, say, by using median filtering and smoothing. That is, samples that significantly deviate from the smoothed median channel response are identified as samples corrupted by impulsive noise. After samples with strong noise are identified and removed (e.g., with an amplitude of zero assigned to those samples), optimal filtering could be applied to the remaining, non-uniformly spaced samples in the sequence. Alternatively, instead of removing those identified as samples with strong noise, the median value of the remaining samples within the filter length could be used before proceeding with optimal filtering. The latter approach simplifies filtering in that uniformly spaced samples are always used. In some instances, this robust filtering approach could provide better results than the median filtering and in many instances, performs similarly as the median filtering-based approach.

In other embodiments, an alternative approach is employed for detecting samples with strong noise. The received signal $r_k(i)$ is multiplied by the complex conjugate of its estimated modulation symbol and the resulting sample can be written as:

$$y_k(i) = \hat{s}_k^*(i) r_k(i) = h_k(i) + \hat{s}_k^*(i) n_k(i) = h_k(i) + \tilde{n}_k(i) \quad (24)$$

where $\hat{s}_k^*(i)$ represents an estimate of the i-th modulation symbol on the k-th subcarrier, and it is also assumed, for simplicity, that modulation symbols have a unity power. Since $h_k(i) \cong h_k(i-1)$, one can calculate $$\begin{aligned} \Delta y_k(i) &= y_k(i) - y_k(i-1),\ i = 2, \ldots \\ &= h_k(i) - h_k(i-1) + \tilde{n}_k(i) - \tilde{n}_k(i-1) \\ &= \tilde{n}_k(i) - \tilde{n}_k(i-1) \end{aligned} \quad (25)$$

If one noise sample is much stronger than the adjacent one, which is a reasonable assumption in truly impulsive noise environment, $\Delta y_k(i)$ will be large in absolute value. Then by comparing $\Delta y_k(i)$ with $\Delta y_k(i-1)$ and $\Delta y_k(i+1)$, the index of strong noise sample could be determined. Similar analysis will help to identify two consecutive samples that are large, which is a less likely event, as long as the two noise samples are not such to approximately cancel each other, e.g., the same amplitude but opposite phase. Once the strong noise samples are identified as described above, robust filtering could be applied according to one of the previous robust filtering embodiments.

The main difficulty in mobile communication systems operating over a wide range of mobile speeds is to select a proper filter length, since the mobile device's speed and correspondingly the channel selectivity are not known in advance. Typically, the filter length is predetermined to cope with fast channel variations, which in turn results in suboptimum performance at lower rates of channel dynamics. In one embodiment, the level channel selectivity in time could be readily established by measuring the mobile device speed, e.g., in receivers with GPS capability. However, GPS may not be available in all situations, and receivers—and other techniques—must also be provided for estimating the time selectivity of the channel. In one embodiment, the level crossing rate (LCR)-based estimator is used to estimate the selectivity of the channel. As LCR values represent channel dynamics, and as shown in FIG. 12, one example relates the optimum filter lengths to channel dynamics. As such, look-up tables (LUTs) are constructed to define the relationship (and thus mapping) between the optimum filter lengths and the time selectivity of the channel. An illustrative example of such an LUT is shown in Table 5. Table 5 shows conceptually mutual relationship between the mobile device's speed, LCR and optimum filter tap length.

TABLE 5

LUT for LCR versus filter length N.

| Mobile device speed | LCR | Filter length |
|---|---|---|
| $V_1$ | $LCR_1$ | $N_1$ |
| . | . | . |
| . | . | . |
| . | . | . |
| $V_i$ | $LCR_i$ | $N_i$ |
| $V_{i+1}$ | $LCR_{i+1}$ | $N_{i+1}$ |
| . | . | . |
| . | . | . |
| . | . | . |
| $V_n$ | $LCR_n$ | $N_n$ |

Since the time selectivity is not known a priori, the channel response is estimated using a conservative filter length appropriate for fast channels and from so obtained channel response, the LCR is measured. There are multiple ways in which LCR could be measured. In one embodiment, the average level of channel amplitude response is estimated and the number of times that amplitude response crosses the average amplitude level is used as LCR estimate. In another embodiment, to minimize the impact of minor variations around the mean amplitude level, two or more levels about the mean level could be used to count level crossings.

To illustrate the use of LUT, which in practice is predetermined by simulations or by analytic techniques, consider a measured LCR equal to $LCR_m$ such that $LCR_i<LCR_m<LCR_{i+1}$. Then the optimum filter length could be found as $$N_m = \text{Interp}[LCR_m, (LCR_i, N_i), (LCR_{i+1}, N_{i+1})], \quad (26)$$

where Interp is desired interpolation function, e.g., linear interpolation for simplicity. Even though there is some noisiness in the estimation of LCR, this approach for selecting an appropriate filter length is favorable to using one filter length for all channel selectivity conditions.

A specific example of LUT based on extensive simulations is shown in Table 6 below. These results were obtained in one exemplary embodiment by simulating an urban frequency selective multipath channel model at different mobile device speed and measuring BER and FER for various filter lengths in an OFDM receiver employing convolutional decoding. It is apparent that optimum filter lengths for different speeds could vary over a very broad range, i.e., over one order of magnitude, signifying the importance of proper filter length selection.

TABLE 6

LUT for mobile device speed and LCR versus the filter lengths for initial and iterative channel estimation.

| Mobile device speed (km/h) | Level Crossing Rate | Time domain filter tap length for initial channel estimation | Time domain filter tap length for iterative channel estimation |
|---|---|---|---|
| 2 | 1 | FIR_tap = 111 | FIR_tap = 81 |
| 4 | 2 | FIR_tap = 81 | FIR_tap = 61 |
| 15 | 6 | FIR_tap = 45 | FIR_tap = 33 |
| 30 | 12 | FIR_tap = 21 | FIR_tap = 17 |
| 60 | 17 | FIR_tap = 15 | FIR_tap = 15 |
| 150 | 20 | FIR_tap = 3 | FIR_tap = 3 |
| >150 | >20 | FIR_tap = 3 | FIR_tap = 3 |

The reliability of LCR estimation may be increased in multicarrier systems. More reliable LCR could be estimated by averaging LCRs estimated over multiple pilot/reference subcarriers at different frequencies. In this case, the average LCR helps to estimate the tap length more accurately. In one embodiment, the average LCR is measured over all reference subcarriers. In another embodiment, M>=1 subcarriers with best SNR are selected, based also on the noise power measurement, to calculate LCR.

Once the optimum filter length is selected based on LUT, the channel response estimation is repeated using the optimum estimated filter length, using one of the approaches described in previous embodiments. Next it is desired to accurately estimate the noise power using pilot symbols.

The noise power estimates, together with phase and amplitude estimates, collectively referred to herein as CSI estimates, are used for various receiver signal processing functions, such as FEC decoding and diversity combining. Also, in one aspect of the invention, noise and signal power estimates are used to estimate SNR to facilitate adaptive data symbol-based decision directed channel estimation (DDCE), as it will be explained subsequently.

The instantaneous noise estimates can be found as $$\hat{n}(i)=(r(i)-\hat{h}(i)p(i)), \text{ for } i=1,2,\ldots, \quad (27)$$

where $\hat{h}_i$ is the channel estimate for the i-th symbol interval. While the noise is complex, its real and imaginary parts $(\hat{n}_{Re}(i)=\text{Re}(\hat{n}(i)), \hat{n}_{Im}(i)=\text{Im}(\hat{n}(i))$ could be calculated separately. Since in most communication systems, the noise is additive and white, the noise power estimation is done by simply averaging the noise power over a large number of samples as follows;

$$|\hat{n}_{Re}|^2 = \frac{1}{M}\sum_{i=1}^{M}|\hat{n}_{Re}(i)|^2 \quad (28)$$

$$|\hat{n}_{Im}|^2 = \frac{1}{M}\sum_{i=1}^{M}|\hat{n}_{Im}(i)|^2$$

Figure 13A:
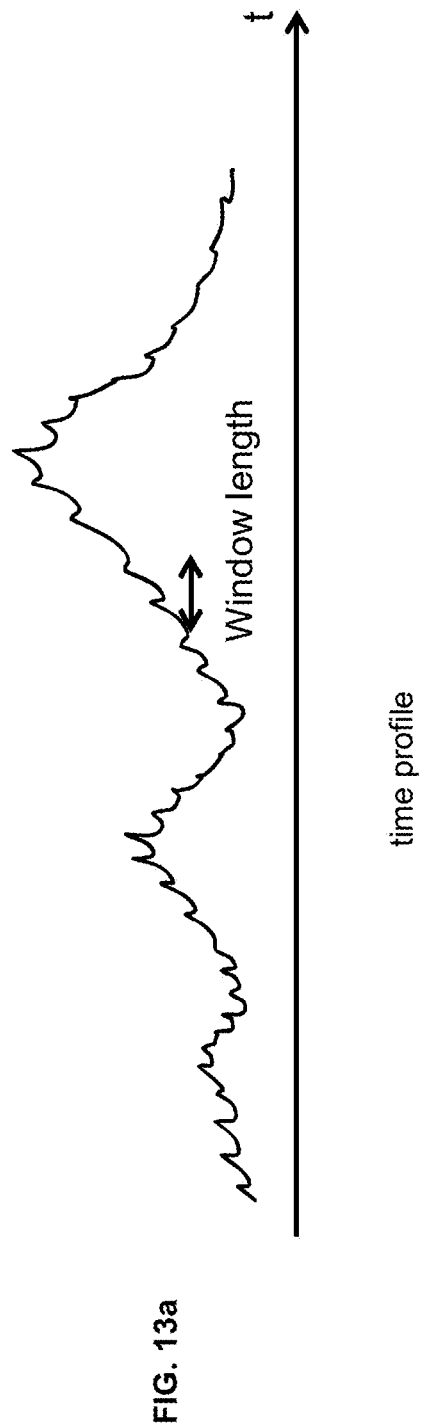
FIGS. 13*a* and 13*b* show illustrative examples of noise plus interference profiles, where
Figure 13B:
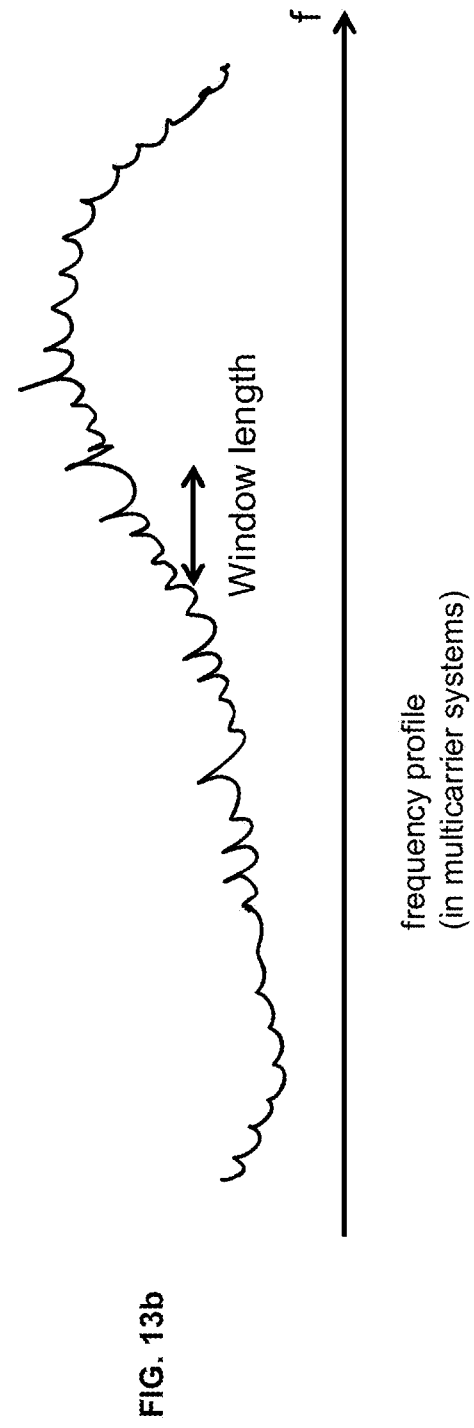

In some practical communication systems where the interference is dominant, however, especially in cases of time-varying and impulsive interference, the noise may be non-white. A typical example of noise plus time- and frequency-selective interference is shown in FIG. 13. It is apparent from FIG. 13, showing exemplary noise power variations in time and frequency domains, that for estimation of noise power level, averaging noise power over a relatively long period is not appropriate. Rather, the noise power estimates should be obtained using shorter filter lengths, depending on the degree of noise power variations over time and frequency domains. The real and imaginary noise power estimates can be expressed as $$|\hat{n}_{Re}|^2 = \frac{1}{L_n}\sum_{l=i-U_n}^{i+U_n}|\hat{n}_{Re}(l)|^2 \quad (29)$$

$$|\hat{n}_{Im}|^2 = \frac{1}{L_n}\sum_{l=i-U_n}^{i+U_n}|\hat{n}_{Im}(l)|^2$$

where $U_n=(L_n-1)/2$ and $L_n$ is the tap length for noise powerestimation filter. Similarly as in channel estimation, suitable tap lengths for the noise power estimation for different channel models based on the LCR should be prepared in a separate LUT. In multicarrier systems, the noise power estimates for data subcarriers can be found by using interpolation, e.g., linear interpolation, over the frequency domain for both impulsive and non-impulsive noise cases. An exemplary LUT for mobile device speed and LCR versus filter length for noise power estimation is given in Table 7. The communication scenario for the results in Table 7 corresponds to an FM HD Radio system in the presence of host and first adjacent FM interference.

TABLE 7

LUT for LCR versus filter length for noise power estimation.

| Mobile device speed (km/h) | Level Crossing Rate | Time Domain filter tap length for noise power estimation |
|---|---|---|
| 2 | 1 | FIR_tap = 19 |
| 4 | 2 | FIR_tap = 19 |
| 15 | 6 | FIR_tap = 17 |
| 30 | 12 | FIR_tap = 17 |
| 60 | 17 | FIR_tap = 13 |
| 150 | 20 | FIR_tap = 5 |
| >150 | >20 | FIR_tap = 3 |

In many prior art systems, the CSI estimates for the data symbols are obtained based on interpolation of the pilot-based CSI estimates. That approach is appropriate if the channel variations could be tracked easily, such as in slow fading channels and high SNR conditions. For the cases where the channel has more selectivity, or the total number of pilot symbols is typically insufficient, in some prior art systems the decision-directed channel estimation with data symbols was also used. However, the decision-directed channel estimation performs poorly in low SNR regime.

In one aspect of the invention, adaptive decision-directed channel estimation with data symbols is used to enhance the performance of the pilot-based channel estimation. Moreover, hybrid channel estimation is used to utilize channel state information obtained from both the pilot symbols and a fraction of unknown data symbols. The adaptive characteristic of certain aspects of the invention is in that the number of data symbols selected for decision-directed channel estimation may vary from frame to frame as a function of the channel. For example, the number of data symbols may depend on channel selectivity or dynamics. More specifically, the number of symbols may be selected based on the rapidity, speed or rate of variation of the channel. As another example, the number of symbols may be based on the noise realization, as it will be explained in more detail below. That is, the decision-directed method utilizes only data symbols with SNR higher than a predetermined threshold. Thus, in one embodiment, only a fraction of data symbols, more reliable ones, in the received symbol sequence, is used for the DDCE. A desired fraction of the decision-directed symbols depends on the selectivity of the communication channel as well as the noise level at the receiver. One objective is to minimize the use of "bad" data symbols with weak SNR that could cause error propagation in CSI estimation, that is, to use less data symbols. Another objective is to use more data symbols to improve CSI estimation in the presence of noise, especially in more selective channels. As these two objectives are contradictory, obviously there is a tradeoff which varies with channel selectivity, i.e., dynamics of changes of channel response.

In slower channels with longer channel estimator filter lengths, better CSI interpolation is possible and one could use less data symbols for DDCE such to minimize the use of data symbols with low SNR. On the other hand, in faster channels to follow channel variations better, shorter filter lengths are desirable and more data symbols are preferable to use. In the latter case, using more symbols with lower SNRs may be beneficial even though some of them may be erroneous, and the use of more data symbols will provide better CSI estimates. These principles will be better understood by considering an exemplary embodiment discussed below.

Certain aspects of some embodiments may be applied to various MC systems. For the example of an MC system with staggered pilot symbols as shown in FIG. 10b, it is instructive to consider examples of channel response variations in time and frequency domain illustrated in FIG. 14. More specifically, FIG. 14 illustrates impact of thresholds on the mixture of pilot and decision-directed channel estimation. In slow fading channels depicted in FIG. 14a, channel response variation in time is slow such that over a relatively long period of time (i.e., Pilot+DDCE period, 2176), the channel gain |H(f)| does not change rapidly. Consequently, in the region 2176 where the channel gain is above a predetermined threshold, e.g., $Thr_2$, pilot plus DDCE channel estimation can be performed in higher accuracy. In the region 2177 where the channel gain is below the threshold, e.g., $Thr_2$, interpolation based on pilot-based channel estimation would work well because of slow channel variations. The use of lower threshold, $Thr_1$, would not necessarily improve interpolation performance because of fairly gradual channel changes, but would risk using erroneous data symbols, 2178, in DDCE, potentially compromising the accuracy of channel estimation. Thus, there is less need to use DDCE in the region where the channel gain is small, and where data symbols are more prone to transmission errors.

Figure 14B:
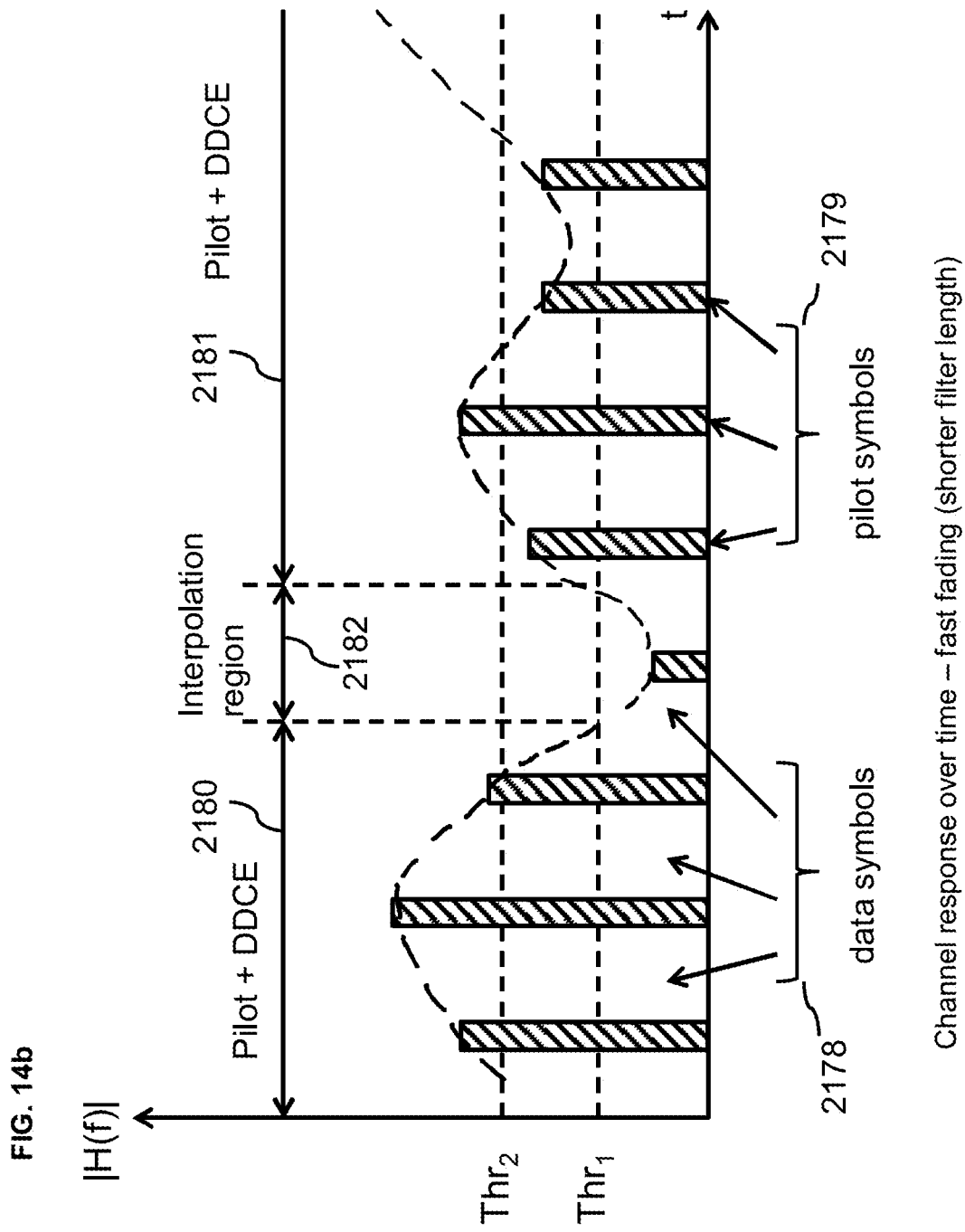
Figure 14C:
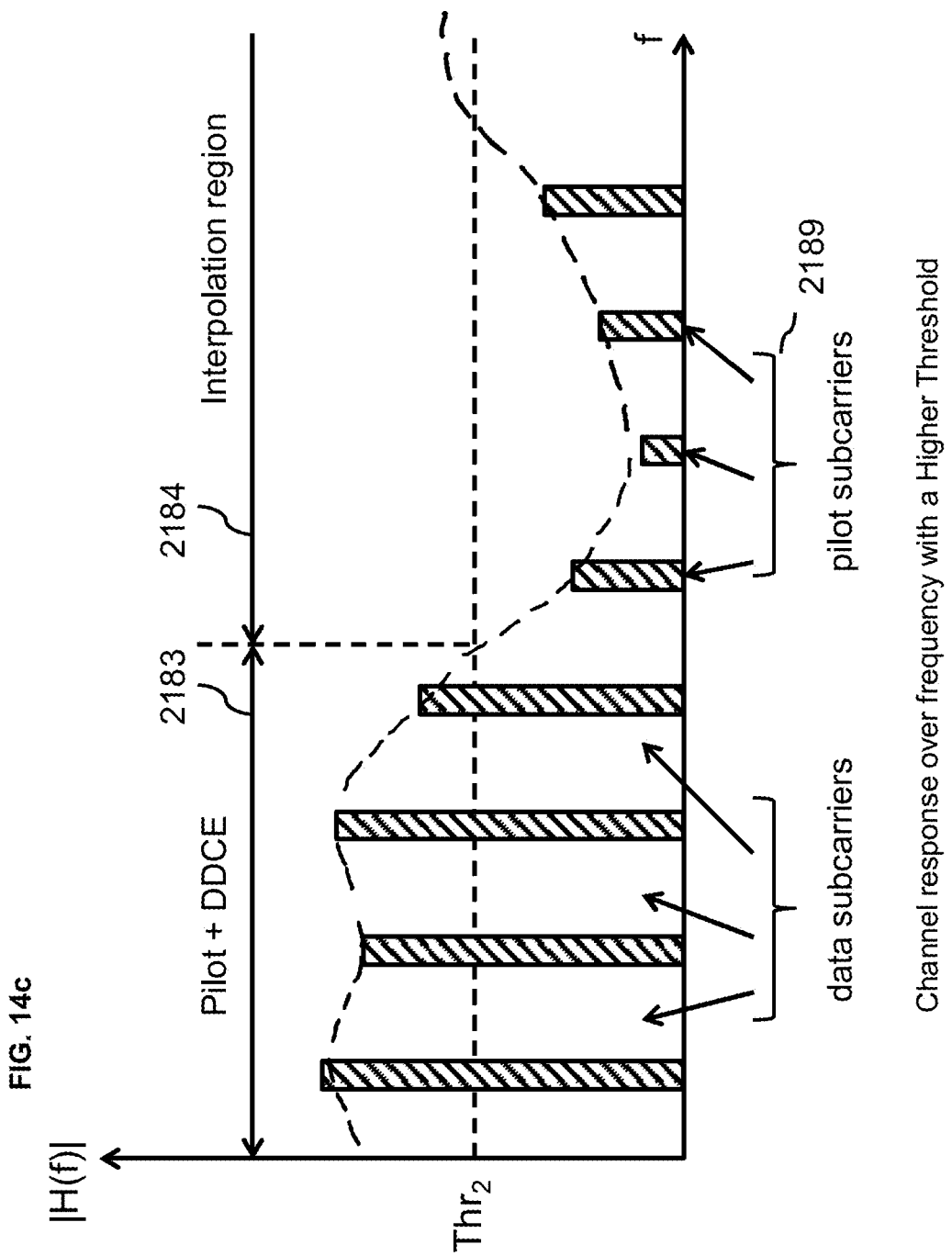

Consider next a fast fading scenario as illustrated in FIG. 14b. If a higher threshold, $Thr_2$, is used in the fast fading scenario, most of the time the channel estimation will be based on pilots, 2179, and interpolation between pilot symbol positions. However, due to fast channel variations, interpolation may not be sufficiently accurate to track rapid channel variations. In this case, it is preferable to use a lower threshold such as $Thr_1$ to better follow channel changes by employing pilot plus DDCE over longer time periods, 2180 and 2181. Thus, even though some data symbol decisions in DDCE may be erroneous by employing $Thr_1$, this would be more than compensated by the use of more data symbols in DDCE to track channel dynamics. With a lower threshold, the region where channel estimation is based solely on pilots and interpolation, 2182, is correspondingly smaller with less impact on overall performance, even though interpolation in that region may not be sufficiently accurate. Correspondingly, a lower threshold for DDCE is preferred. Thus, in general, in slow channels it is preferable to use a higher threshold and less but more accurate data symbols in DDCE; in faster channels, it is preferable to use a lower threshold and more but less accurate data symbols in DDCE.

To summarize, in time periods where the channel gain is above a specified threshold for DDCE, 2180 and 2181 in the example of FIG. 14b, both pilot symbols, 2179, and data symbols, 2178, are employed for channel estimation as described in other embodiments. In regions where the channel gain is below a specified threshold for DDCE, 2182 in the example of FIG. 14b, channel estimation is performed using pilot symbols with low pass filtering with an appropriate filter length corresponding to channel dynamics, as described in other embodiments. Then, for data symbol positions in time period 2182, the channel is estimated by interpolation techniques as known in the art, e.g., linear or polynomial interpolation, using pilot-based channel estimates in the corresponding region and channel estimates from adjacent segments, 2180 and 2181, where both pilot-based estimation and DDCE were employed. After such channel estimation is performed, LCR could be estimated according to some of the embodiments previously described. Noise power estimation is performed similarly as channel estimation; in some time periods, based on both pilot and data symbols where the channel gain is above a threshold, and based on pilots only and interpolation where the channel gain is below a threshold.

Referring again to an MC system with staggered pilot symbols as illustrated in FIG. 14*b*, once the channel estimation on reference subcarriers carrying pilot symbols is performed in time domain, it is desired to estimate channel on data subcarriers carrying only data symbols. Consider a slow fading channel scenario illustrated in FIG. 14*c*. Channel estimates based on time domain channel estimation are available for pilot subcarriers 2189. Again for subcarriers in the frequency region 2183 in which the channel gain on pilot symbols is above the threshold, the channel estimation would be based on both pilot and data symbols, using DDCE, while in the region 2184, the channel response on data subcarriers positions would be obtained by performing interpolation using pilot position channel estimates, similarly as explained for the time domain case. A similar approach is applied in the fast fading case corresponding to FIG. 14*d*, where it is assumed that at a specific point in time, the channel frequency response is the same for fast and slow (in time) fading channel. The difference is that according to the threshold selection explained earlier based on LCR consideration, the threshold for the fast fading case is lower and, thus, more data subcarriers will be used in DDCE and interpolation will be used preferably in relatively small region of frequencies. Thus, overall, taking into account both time and frequency domains, in fast fading channels the channel estimator will have more data symbols for estimation of the channel response than in slow fading channels. Even though this may result in a higher probability of erroneous symbols used for channel estimation in fast fading case than in slow fading case, this will enable better tracking of channel selectivity in the fast fading case, which is more critical in fast fading than in slow fading case. Thus, more symbols used in fast fading for tracking channel dynamics will more than compensate for the possible presence of more erroneous symbols due to the lower threshold. In one embodiment, the estimated time selectivity using LCR is used to facilitate not only the optimal selection of filter coefficients but also the SNR threshold for selecting a subset of data symbols for DDCE. That is, for a given level of time selectivity of the channel, all symbols with estimated SNR larger than a specified threshold corresponding to that level of selectivity, are used for DDCE. On symbol positions where estimated SNR is smaller than the respective threshold, interpolation is used based on pilot symbols and possibly DDCE estimates in adjacent segments with better SNRs. This alternative embodiment could be used when noise plus interference power exhibits time and frequency variations so that channel response gain alone is not sufficient to decide which symbols could be used for DDCE. The exemplary embodiment used to obtain Tables 6 and 7 was also used to determine optimum thresholds for DDCE for various mobile device speeds, such to minimize BER and FER of the exemplary system under consideration. The corresponding results obtained by extensive simulations are summarized in Table 8. By inspection, it could be seen that as the mobile device speed and correspondingly channel LCR increase, a smaller threshold is preferable, meaning that at higher mobile's speeds, more data symbols would be used for DDCE, consistent with previous explanations of certain aspects of the invention.

TABLE 8

LUT for LCR versus DDCE Threshold for different channel models.

| Mobile device speed (km/h) | Level Crossing Rate | Threshold for the Decision Directed mode |
|---|---|---|
| 2 | 1 | Threshold = 0.75 |
| 4 | 2 | Threshold = 0.65 |
| 15 | 6 | Threshold = 0.6 |
| 30 | 12 | Threshold = 0.5 |
| 60 | 17 | Threshold = 0.25 |
| 150 | 20 | Threshold = 0.2 |
| >150 | >20 | Threshold = 0.2 |

In multicarrier systems, the optimum filter length for smoothing in frequency domain could be selected based on the level of frequency selectivity in the channel response, similarly to how it was done with LCR estimation to match the time selectivity of the channel. To facilitate that, in one embodiment, an LUT is constructed, e.g., based on simulations, measurement, analytical or other techniques that establishes the relationship between frequency selectivity of the channel and optimum filter length for filtering in the frequency domain.

In one aspect of the invention, the frequency domain smoothing with optimally selected filter length is applied to the channel and noise power estimation after time domain processing. There are multiple ways in which the frequency selectivity of the channel could be estimated. In one exemplary embodiment, the frequency selectivity is estimated by measuring the rate of change of channel variations over a certain range of frequencies. If the measured channel changes were more pronounced over the range of frequencies $\Delta f$, the channel frequency response is likely more selective and correspondingly shorter filter lengths for smoothing in frequency domain should be used, and vice versa.

To construct an LUT for optimum filter lengths versus frequency selectivity, several channel models with varying levels of frequency selectivity from low to high, such as urban, sub-urban, rural, etc., are used in the simulator of HD Radio OFDM system to analyze the impact of frequency selectivity on the optimum filter length for the frequency domain processing. Alternatively, the LUT could be obtained by analytical techniques or from measurements, or by using other approaches. Intermediate values could be obtained by interpolation, as explained earlier. In cases when noise and/or interference may be non-white over the frequency domain, it is necessary to establish an LUT for filter length selection for noise power estimation, i.e., smoothing over frequency domain, similarly as described earlier for other cases. The frequency selectivity could be estimated as a measure of the channel gain change over a range of frequencies corresponding to K subcarriers, measured at multiple OFDM symbol intervals and represents the average value of Q largest measured channel gain changes. This averaging is applied to minimize the impact of noise. As could be seen from Table 9, higher frequency selectivity implies a shorter filter length, and vice versa. It is important to note that the filter length may vary by as much as a factor of 2.4 between most and least selective channels among considered channel scenarios. The LUT for the analyzed exemplary embodiment is given in Table 9.

TABLE 9

LUT for frequency selectivity parameter delta versus filter
tap length for different frequency selective channel models.

| Channel Model | Delta | Tap length |
|---|---|---|
| Less Frequency Selective Channel | $\overline{\Delta} \leq 0.001$ | FIR_tap = 65 |
| Less-Moderate Frequency Selective Channel | $0.001 \leq \overline{\Delta} \leq 0.1$ | FIR_tap = 35 |
| Moderate Frequency Selective | $0.1 \leq \overline{\Delta} \leq 0.2$ | FIR_tap = 31 |
| Moderate-Very Frequency Selective | $0.2 \leq \overline{\Delta} \leq 0.3$ | FIR_tap = 27 |
| Very Frequency Selective | $\overline{\Delta} \geq 0.3$ | FIR_tap = 23 |

Figure 15:
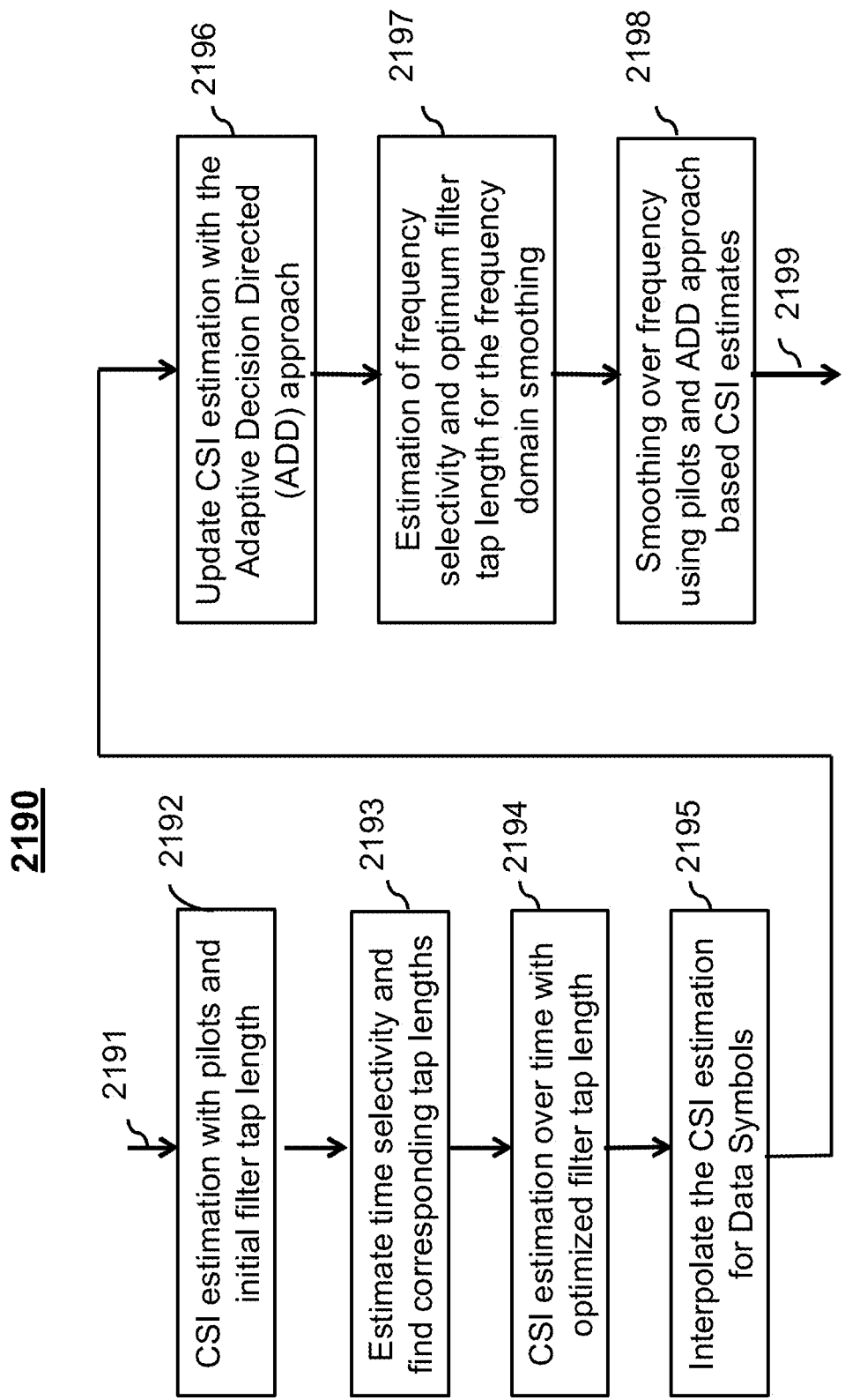
FIG. 15 shows a flow chart of the initial algorithm for CSI estimation.

In some embodiments, aspects of previous embodiments are integrated to provide the initial advanced CSI estimation that can substantially enhance the performance of receivers. Such an approach could be used in receivers without iterative decoding as well as an initial stage in receivers with iterative CSI estimation and FEC decoding. FIG. 15 illustrates an exemplary processing flow for such an advanced CSI estimation.

The input to the Advanced CSI Estimation 2190 (and thus to the overall processing flow), line 2191 represents the received signal containing pilot symbols and data symbols (also referred to as the "received composite signal" for brevity), a pilot-symbol portion of the received composite signal (referred to as the "received pilot signal" for brevity) carrying the complex pilot symbols transmitted on reference subcarriers.

CSI estimator in block 2192 produces channel estimates using pilot symbols and employing a filter tap length corresponding to fast channels, as described in the previous embodiments. In this exemplary embodiment, a multicarrier system with dedicated pilot subcarriers is considered.

Then, the CSI estimates from block 2192 are further processed in the block 2193 where the time selectivity of the channel is estimated by estimating the level crossing rate (LCR) and filter tap lengths, based on an LUT, in accordance with embodiments of the invention.

The updated filter tap lengths from the block 2193 are used in block 2194 to obtain improved channel estimates with an optimized filter length. Similarly, noise power estimation is also performed by using the optimized filter tap length selected from an LUT for a given level of time selectivity.

The channel and noise power estimates from block 2194 for the pilot subcarriers are then low-pass interpolated in frequency domain in block 2195 to produce interpolated channel response and noise power estimates corresponding to the data subcarriers in the symbol sequence.

Then, the resulting CSI estimates for the data signal are further refined in the Adaptive Decision Directed (ADD) approach block 2196, in accordance with the embodiments where selected reliable symbols, with SNR above a Threshold that depends on the time selectivity of the channel, are used to estimate channel and noise power.

In block 2197 the frequency selectivity of the channel response is estimated and correspondingly a filter tap length is selected from an LUT, in accordance with previously described embodiments.

Additional frequency domain smoothing using both pilot and data symbols is performed in block 2198 using the optimum filter tap length estimated in block 2197. Interpolation is employed for symbols with SNR below the Threshold, where DDCEs are not available.

Finally, such refined CSI estimates are output to line 2199 to be used in the subsequent decoding stage of the receiver, as it will be explained below in more detail.

Figure 16:
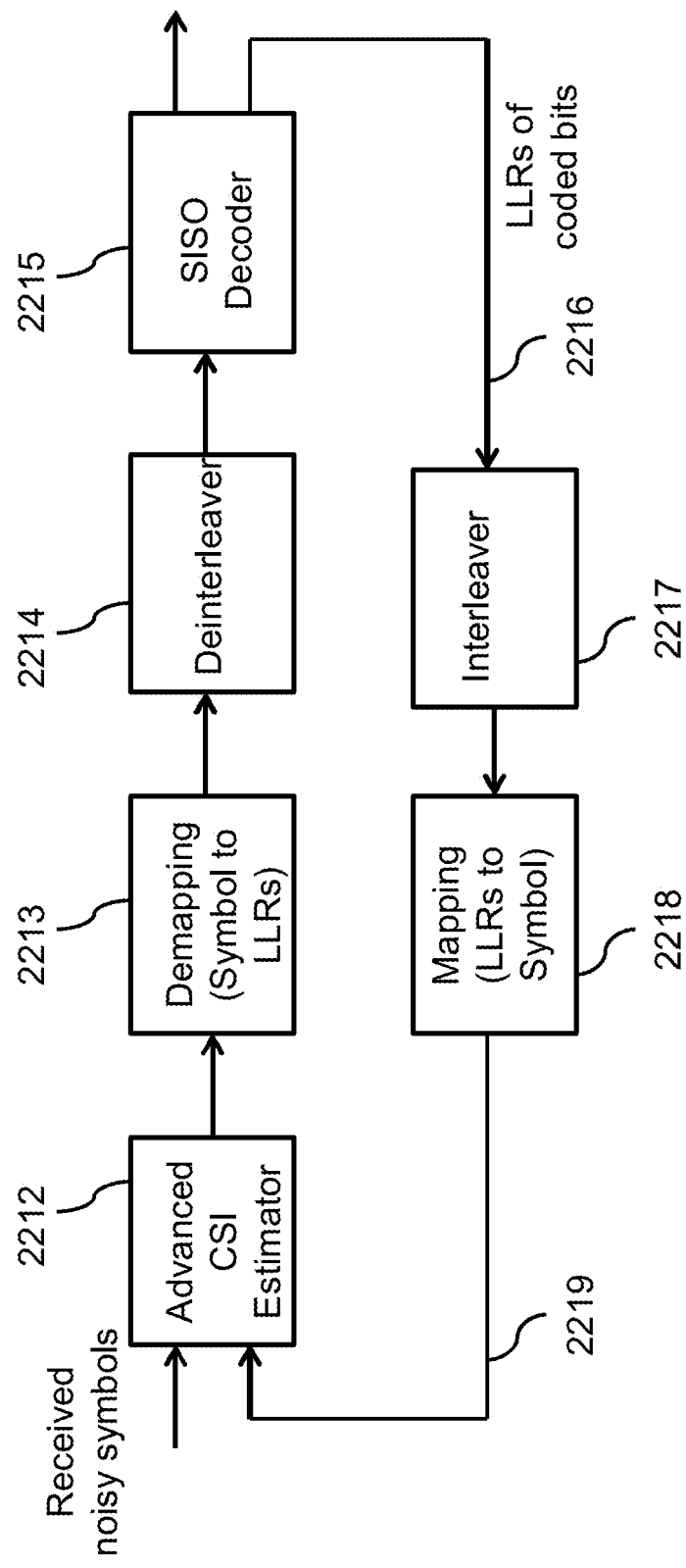
FIG. 16 shows an illustrative block diagram for joint, iterative CSI estimation and SISO decoding.

Decision directed channel estimation in the initial step provides limited gains because only a subset of data symbols is used and still some of data symbols used for DDCE may be erroneous and correspondingly corrupt CSI estimation. In one embodiment, corresponding to FIG. 16, CSI estimation and FEC decoding are performed iteratively. Generally speaking, after the advanced initial CSI estimation following the procedure 2190 in FIG. 15, FEC/SISO decoding 2215 is performed. After the FEC decoding, better estimates of coded symbols are available and used for another iteration of advanced CSI estimation. More specifically, in FIG. 16, block 2212 performs initial CSI estimation as explained in the embodiment corresponding to FIG. 15 and other CSI estimation embodiments. Received noisy channel symbols and CSI estimates produced by block 2212 are processed in de-mapping block 2213, to produce coded bit LLRs, as it is known in the art or as described in other embodiments. Coded bit LLRs are, optionally, de-interleaved in block 2214 if interleaving was employed in the transmitter.

A SISO decoder 2215 performs FEC decoding in accordance with various embodiments, depending on which FEC code might have been employed. The SISO decoder may produce two types of outputs, 1) LLRs of information bits for making final decisions or for processing in subsequent stages of the receiver, or 2) coded bit LLRs on line 2216. The latter is of interest for iterative CSI estimation. In the feedback loop for iteration, the coded bit LLRs are optionally interleaved, if an interleaver was employed in the transmitter, and used to form channel symbols in block 2218 that are fed back to Advances CSI Estimator 2212 for next CSI estimation iteration.

Before the de-mapping block 2213, additional erasure detection may be performed based on the identification of samples with very large noise realizations, as it may happen in scenarios with impulsive noise and/or interference. In this case, the indexes of the erasure positions, with large noise samples, are also supplied to put zeros instead of calculated LLRs for the corresponding composite signal samples. Otherwise, LLR calculation is performed for each and every received symbol. It should be noted, that the described erasure approach may also be implied in the first stage of CSI estimation and LLR calculations, before first FEC decoding.

The estimates of coded bits (i.e., LLRs of coded bits on line 2216) obtained from FEC decoding 2215 are used to produces estimates of channel symbols that are more reliable than decision directed symbols calculated at the initial step (in block 2215 before the iterative processing). The output from the SISO decoder 2215, is fed back to the mapping block 2218 via an interleaving block 2217. Mapper 2218 maps LLR estimates of coded bits after FEC decoding to channel symbols. Consequently, the output from 2218 provides more reliable estimates of the transmitted symbol sequence that it is used for the next iteration of CSI estimation. In one embodiment, the reconstructed channel symbols are "hard" symbols; that is, binary coded bits are mapped to modulation constellation as in the transmitter. In another embodiment, "soft" symbols are employed, which account for the reliability of the coded bits estimated during the FEC/SISO decoding in block 2215.

"Soft" symbols for BPSK signaling could be constructed, with symbols $s_k(i) \in \{+v, -v\}$, as:

$$\ddot{s}_k(i) = v \tan h(LLR(s_k(i))/2) \tag{30}$$

where LLR($s_k(i)$) denotes the LLR for bit $\ddot{s}_{k,k}(i)$, and is calculated from the received signal as known in the art and explained in other embodiments. In the case of QPSK modulation, soft bits for in-phase (I) and quadrature (Q) channels, $\ddot{s}_{k,k,I}(i)$ and $\ddot{s}_{k,k,Q}(i)$, respectively, could be calculated from the corresponding LLRs as shown above and soft, complex, QPSK symbols could be constructed as $\ddot{s}_{k,k}(i) = \ddot{s}_{k,k,I}(i) + 1 \cdot \ddot{s}_{k,k,Q}(i)$.

Also, in each subsequent iteration, channel and noise power estimation is done by the soft symbols on line 2219. The principal difference relative to the embodiment describing the advanced initial CSI estimation is that there is no adaptive DDCE in subsequent iterations when estimated "soft" symbols are employed. That is, all regenerated data symbols on line 2219, along with pilot symbols in the symbol sequence, are used for CSI estimation. If "hard" symbols are used, then the least reliable ones could be skipped in CSI estimation, as before. Additional median and smoothing filters are also applied in block 2212 similarly to the first iteration. Estimation of the time- and frequency-selectivity may also be updated in this block with more reliable symbols used in the iteration. The same steps are followed for processing after block 2212 in the second iteration onward.

Another principal difference relative to the initial advanced CSI estimation is that somewhat shorter filter lengths are found to be optimal in subsequent iterations, since a larger number of estimated data symbols of sufficient accuracy are available for CSI estimation. These shorter filter lengths for subsequent iterations are illustrated in Table 6 earlier. A desired number of iterations for CSI estimation and FEC decoding could be performed. In prior art methods, often several iterations for CSI estimation and FEC decoding are performed. In certain embodiments, one additional iteration after the initial processing, i.e., the initial forward-path processing from block 2212 through block 2215, may suffice. This is enabled by the advanced initial CSI estimation and optimization of CSI estimation parameters in the corresponding steps, based on channel selectivity according to certain aspects of the invention described in various embodiments. Thus, the iterative CSI estimation employing certain embodiments achieves a significant reduction in overall computational complexity and a substantial gain in performance compared to other prior art methods of iterative CSI estimation. For the non-iterative CSI estimation, however, the performance improvement in CSI estimation would come at the expense of computational complexity somewhat higher than in prior art methods.

CSI Estimation for Diversity Combining Systems

Maximal ratio combining (MRC), faces significant challenges in scenarios where one or more diversity channels experience low SNR conditions and may result in mismatched combining. That is, due to noisy, erroneous CSI estimates, a bad channel may be given more weight than appropriate, and thus pollute the diversity-combined signal, resulting in a degradation of performance.

In one embodiment of the invention, the innovative aspects of CSI estimation for non-diversity systems described earlier are extended to diversity systems.

Figure 17:
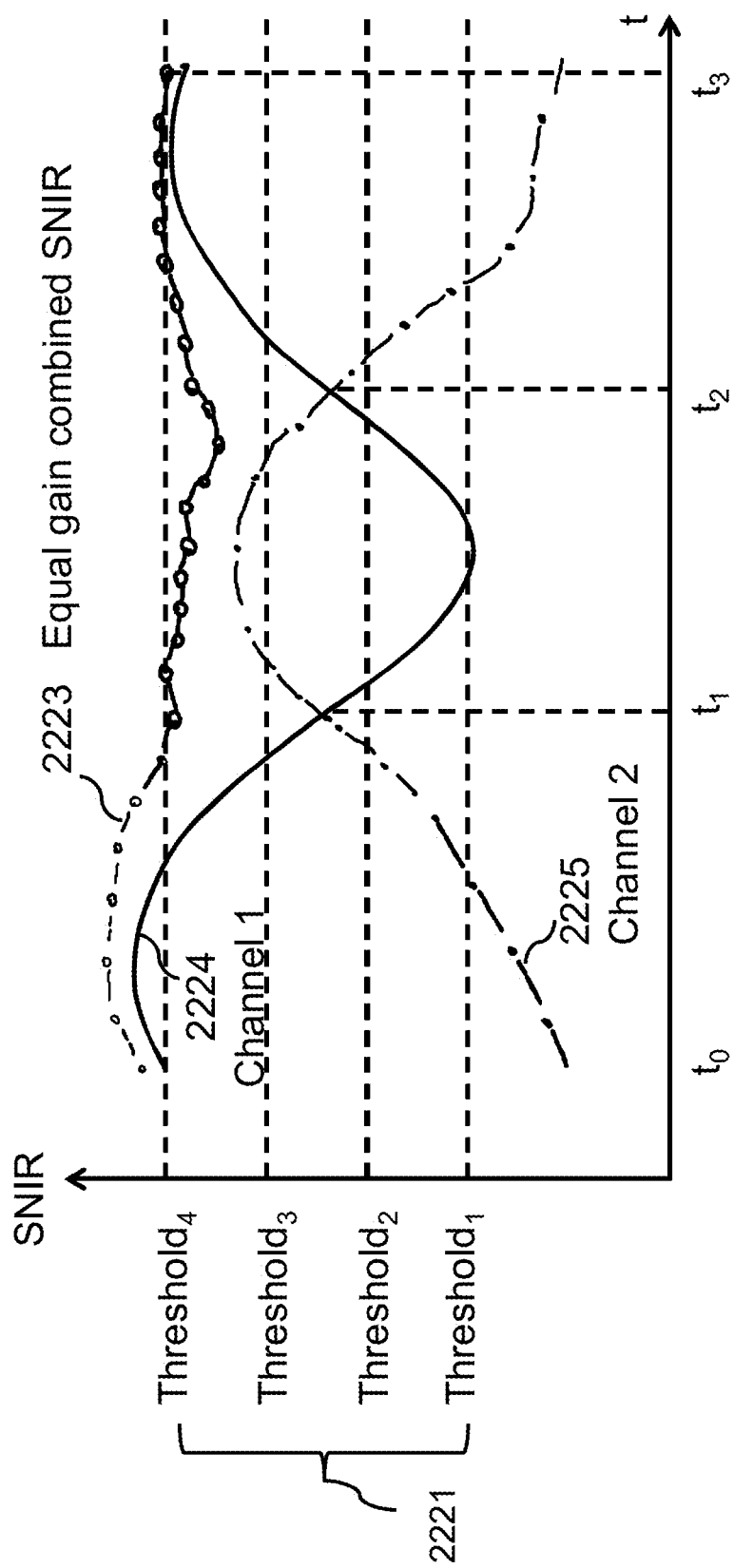
FIG. 17 illustrates time-varying signal-to-noise-plus-interference ratios (SNIRs) for an example of two diversity channels in accordance with certain embodiments of the invention.

In the initial step of CSI estimation, with use of a shorter filter length to estimate LCR, best diversity channel is used to estimate LCR. Using LCR-based selection of optimum filter-tap lengths in the time domain, the pilot-based CSI estimation is performed to equal-gain combine the diversity channels. Equal gain combining (EGC) essentially means phase-coherent combining of different channels with equal weight. That is, for this step, only phase estimation is required. Individual diversity channels and equal-gain combined SNRs are illustratively shown in FIG. 17 for a second-order diversity system. Depending on a threshold, Threshold1 to Threshold4, 2221, it can be seen that for individual diversity channels 2224 and 2225, SNRs would be below the threshold for a significant fraction of time, and corresponding signal segments would not be useful for decision-directed CSI estimation. On the other hand, for a reasonable threshold selection, the equal gain combined SNIR 2223 may most of the time be appropriate to make data symbol decisions to facilitate decision-directed CSI estimation. Thus, on the selected set of symbols with SNR larger than the selected threshold, based on the equal-gain combined signal, data symbols decisions are made and used for complete CSI estimation. This is essentially similar to the adaptive DDCE approach mentioned earlier in the non-diversity CSI estimation embodiments. Specifically, to obtain more accurate phase, amplitude, and noise power estimates for each of diversity channels, both pilot symbols and selected set of data symbols that are more reliably decoded, after equal gain combining, are used. With such improved CSI estimates, MRC combining of diversity channels is then performed as known in the art. All other aspects of CSI estimation remain substantively the same as in the non-diversity CSI embodiments described earlier.

In yet another embodiment for diversity combining, additional improvement is facilitated. Once complete CSI estimates are available for each individual channel as described in the previous embodiment, MRC and EGC are applied selectively. Define a threshold, Thr, for SNR such that for SNR<Thr, CSI estimation error is unacceptable and may degrade MRC performance.

The selective MRC and EGC approach is implemented as follows:
1. Identify all symbol regions/segments, $S_{MRC}$, such that SNRi>Thr, i=1, . . . , L, where L is the number of diversity channels.
2. If a data symbol belongs to the set, $S_{MRC}$, perform MRC,
   else if data symbol does not belong to $S_{miRc}$, perform EGC.

In another embodiment, the receiver is provided a feedback channel to report optimal or near optimal structure of pilot signals based on the channel selectivity in time, and possibly in frequency, and/or SNR. In modern communications systems, such as 3G/4G cellular and WiFi, modulation and FEC coding rate, and possibly MIMO parameters, are adaptively adjusted based on the received signal measurements at the receiver. In some systems, adaptive power control may be employed in addition. This considerably improves the link throughput by allowing a higher throughput when the SNR is relatively high, and a lower throughput when the SNR is lower. However, this approach is still suboptimum in that the pilot structure is fixed and more pilot symbols are preferable during high channel selectivity conditions and/or lower SNR. For example, during times of higher channel selectivity, a higher density of pilots enables better CSI estimation to support higher order modulation schemes. This, in turn, enables the transmission of more data, which more than compensates for increased pilot overhead. Alternatively, more pilot symbols for the same modulation order enables receiving data symbols more accurately. Thus, the throughput of modern communication systems may be improved by using an adaptive pilot structure in addition to adaptive modulation and FEC coding rate and possibly MIMO parameters, all of which could be facilitated by measurements of the received signal at the receiver and reporting an appropriate metric or metrics via a feedback channel to the transmitter.

In another embodiment, the pilot structure is optimized not just based on channel selectivity and possibly signal strength, but also in conjunction with possible modulation and FEC coding scheme operating points. For example, higher order modulation schemes and or less FEC redundancy typically require more accurate CSI estimation and, correspondingly, more pilot symbols are desired. A combination of modulation type, FEC code rate and possibly MIMO parameters is often referred to as modulation-coding scheme (MCS) index. In one embodiment, pilot structure could be selected or optimized based on channel selectivity for each possible MCS index. Each MCS index may be further subdivided into multiple MCS options based on channel selectivity, thus essentially creating a larger set of MCS indexes, where the transmission scheme may be adjusted such that it is more in tune with channel variations, thereby enabling performance improvement.

In an exemplary embodiment, four pilot structures could be employed, for low, medium, fast and very fast mobile device speeds, corresponding to increasing densities of pilot symbols. Thus, with two bits of additional information feedback, the adaptive pilot structure could be implemented. In one exemplary embodiment, these two bits of pilot structure feedback could be transmitted in addition to channel quality indicators for adaptive modulation, FEC coding rate and MIMO parameters. In another embodiment, the pilot structure indicator bits could be combined with channel quality indicators for other mentioned purposes, such that one indicator could describe multiple attributes, including the pilot structure, of the communication transmission. The pilot structure feedback could be based on multiple measured received signal attributes. For example, it could be based on time selectivity of the channel, or in case of multicarrier systems, both time and frequency selectivity could be used to determine the preferable pilot structure. Selection of preferred pilot symbol structure or density could be facilitated by the use of one or more look up-tables. Alternatively, one or more thresholds could be used, or other techniques such as pre-stored performance curves.

In addition, as mentioned earlier, the SNR could also be employed to provide a more refined pilot structure selection. For example, at a given SNR, a higher speed of the device may require a pilot structure with more pilot symbols per frame/packet. However, when the average SNR per packet is higher, less pilot symbols may be needed in some range of mobile device speeds. Thus, it is possible, for example, to use the same pilot structure for a lower and a higher device speed when the SNR is higher during periods of higher speed then during periods of lower speed. Alternatively, instead of the SNR, other indicators of channel quality could be used, such as received signal power, received signal strength indicator, received code power in CDMA systems, and/or BER or FER, as they are known in the art. It is apparent that the system designer could use multiple measured received signal attributes to estimate optimum or near-optimum pilot structure, as well as to use a desired number of possible pilot structures to balance the complexity and the performance gains.

III. Applications to Concatenated Coding Systems

This subsection discusses systems and methods for combining the techniques discussed in the previous two subsections, as well as additional aspects, for advanced decoding of concatenated coding systems. These aspects could be used in various communications systems that utilize concatenated coding schemes, examples of which are discussed below.

Figure 18:
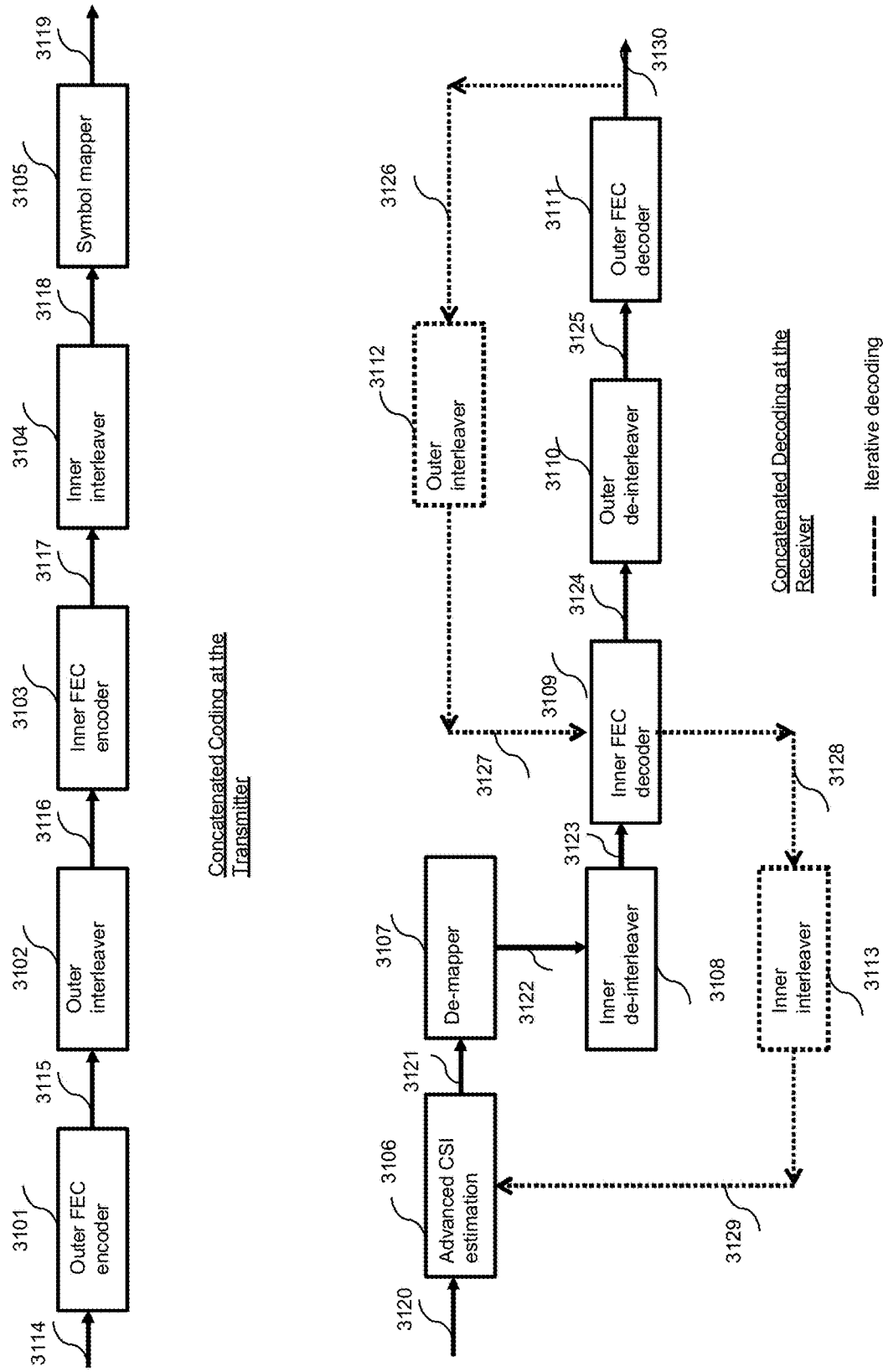
FIG. 18 is a block diagram of a transmitter and receiver with concatenated FEC, encompassing outer and inner FEC encoders/decoders, outer and inner interleavers/de-interleavers, symbol mapper/de-mapper, channel, advanced CSI estimation as well as the possible iterative structure between inner and outer FEC decoders and the possible iterative structure between the advanced CSI estimation and the inner FEC decoder in accordance with certain embodiments of the invention.

A general system model for concatenated encoding and decoding is given in FIG. 18. The outer FEC encoder 3101 encodes information bits 3114 into coded bits 3115 and typically employs a linear block code such as a RS (RS) code or a BCH code in the standards discussed below, but other outer codes may be used as well. An outer interleaver 3102 typically follows the outer FEC encoder 3101 with a matching outer de-interleaver 3110 in the receiver. The outer interleaver 3102 changes the order of coded bits 3115 to produce a different order of coded bits 3116, according to the interleaving algorithm. The outer interleaver and de-interleaver pair is used to disperse error bursts from the output of inner FEC decoder 3109 in the receiver so as to enable the outer FEC decoder 3111 to decode correctly. The outer interleaver could be bit or byte/symbol based. Examples of prior art systems that have adopted such an outer FEC code and an outer interleaver include Digital Video Broadcasting-Handheld (DVB-H), Digital Video Broadcasting-Terrestrial (DVB-T), Digital Audio Broadcasting (DAB), Terrestrial-Digital Multimedia Broadcasting (T-DMB), World Space System, China Mobile Multimedia Broadcasting (CMMB), Satellite Digital Radio (SDR) systems (US, Europe), and MediaFLO.

In the DVB-H standard, each MPEG-2 packet of 188 bytes is encoded using a RS (204, 188) outer FEC code, shortened from RS (255, 239) code, which is implemented as follows: 51 all-zero bytes are added at the beginning of the 188-byte packet to form a 239-byte block. This block is encoded using a systematic RS (255, 239) code. After encoding, the first 51 bytes are discarded and remaining 204 bytes are transmitted. The outer interleaver is a byte-wise convolutional interleaver with depth I=12, implemented based on Forney approach. The interleaving is such that SYNC bytes are at space of 204 bytes from each other.

DVB-T for broadcast transmission of digital terrestrial television employs a RS (204, 188) code as the outer FEC code. In DAB, for forward error correction and outer error protection, RS (204,188) and outer interleaving can be applied to sub-channels carrying service components in packet mode in order to further increase the error robustness of DAB data delivery. In T-DMB, the outer FEC coder has a RS coder and a Forney convolutional interleaver. RS (204, 188) is used in T-DMB, which is obtained from RS (255, 239). In World Space System, the broadcast channel is FEC coded by concatenating a RS (255, 223) block coder, followed by a block interleaver. CMMB uses a RS code as the outer FEC code along with a block byte outer interleaver.

In European Telecommunications Standards Institute (ETSI) SDR systems, the MPEG Transport Stream (MPEG-TS) is protected by an outer BCH code. Up to 8 MPEG-TS packets, each having a size of 188 bytes, are transmitted at the same time. Error correction and detection is performed by using one shortened BCH (3057, 3008) code for each 2 MPEG-TS packets. The outer error correction code (overall minimum distance dmin=10) is actually an outer BCH (3056, 3008, 9) code (with minimum distance dmin=9) concatenated by an inner single-parity check code (3057, 3056, 1). The BCH code is obtained by shortening a narrow-sense binary BCH (4095, 4047, 9) code.

The SDR in the U.S. (Sirius and XM satellite systems) operates on frequencies between 2320 MHz and 2345 MHz. Sirius Satellite Radio operates in the lower 12.5 MHz block of S-Band spectrum between 2320 MHz to 2332.5 MHz, and XM in the higher 2332.5 MHz to 2345 MHz portion. The Sirius band plan is divided between three possible signals: two satellite signals employing single carrier transmission and one terrestrial OFDM based repeater signal. In the urban areas, where the line of sight reception of the satellites is difficult or not possible, the service is covered by terrestrial repeaters adopting a multi-carrier modulation scheme, i.e., OFDM. The outer FEC code in Sirius SDR is a RS (255, 223) code.

In most of the systems mentioned above, inner FEC encoder 3103 is based on convolutional codes but other codes such as turbo or LDPC codes or any trellis or block code may be employed. For example, a non-systematic IRA code, such as the one described in U.S. Pat. No. 8,595,590 entitled Systems and Methods for Encoding and Decoding of Check-Irregular Non-Systematic IRA Codes, herein referred to as inventions pertaining to check-irregular non-systematic IRA codes), the contents of which are fully incorporated by reference herein in their entirety, could be employed as an inner FEC code. Interleaved coded bits 3116 are encoded by inner FEC encoder 3103 into a sequence of inner FEC code bits 3117.

An example of a concatenated system that relies on an inner turbo code is Qualcomm's MediaFLO. Forward Link Only (FLO) Air Interface is a key component of the Media-FLO system developed by Qualcomm as an alternative mobile multicast technology for the efficient transmission of multiple multi-media streams to mobile devices using TV and multi-media channel bandwidths in VHF, UHF, or L-band. The FLO physical layer uses OFDM as the transmission technique. In FLO Air Interfaces, a turbo inner code with code rate 1/5 is used for transmitting critical overhead information, and rates {1/3, 1/2, 2/3} are for transmitting Multicast Logical Channels. The higher code rates are obtained from the base code rate using puncturing. A RS erasure correcting code is used as the outer FEC code. It is a RS (N,K) over the Galois Field with 256 elements, GF(256), with N=16 and K chosen from the set {8, 12, 14, 16}. The case of K=16 corresponds to the case when no RS encoding is actually performed. As another example, CMMB uses an LDPC code (rates 1/2, 3/4) as the inner FEC code while using a RS code as the outer FEC code.

Optional inner interleaver 3104 and inner de-interleaver 3108 are typically employed to break up and disperse error bursts at the output of the channel, which typically occur in correlated fading conditions. Usually convolutional or block bit interleavers are employed, but in case of LDCP codes, an inner interleaver may not be required although in some instances may still be useful, e.g., with bit interleaved coded modulation. Inner FEC code bits 3117 are interleaved in 3104 to produce interleaved sequence of bits 3118 that is further passed to the symbol mapper 3105.

Some examples of the use of inner convolutional coding are provided below. In DVB-H, the inner FEC code consists of a mother 64-state rate 1/2 convolutional code. Different puncturing patterns are designated to allow for achieving different code rates such as 1/2 (no puncturing), 2/3, 3/4, 5/6, 7/8. The transmitter can operate in non-hierarchical and hierarchical modes. In hierarchical mode, data includes High-Priority (HP) and Low-Priority (LP) parts. In case of hierarchical transmission, the transmitter has the ability to assign a lower code rate (more redundancy) for HP data and a higher code rate for LP data. DVB-T for broadcast transmission of digital terrestrial television employs a punctured convolutional code with five valid coding rates 1/2, 2/3, 3/4, 5/6, and 7/8 as the inner FEC code. In DAB, the channel coding is based on a convolutional code with constraint length 7. Different puncturing patterns are designated to allow for achieving different code rates. In T-DMB, convolutional coding with puncturing is used as the inner FEC code. In WorldSpace System, a Rate 1/2 convolutional coder is used. In SDR systems, the inner FEC code is a turbo code employing two systematic, recursive, convolutional encoders connected in parallel, with a turbo interleaver, preceding the second convolutional encoder. The outputs of the convolutional encoders are punctured to achieve different code rates.

In SDR in the US, the satellite and the terrestrial signals carry the same Payload Channels (PC), included in a 432 msec framed packet with RS protection (outer FEC encoding). The content of both Sirius satellites is FEC coded with multiple channel coding schemes, including concatenated RS-convolutional coding and convolutional channel interleaving. A punctured rate 3/8 convolutional inner FEC encoder (from a mother code of rate 1/3) is used. Each satellite transports one half of the non-punctured and interleaved coded bits resulting in an effective inner encoder rate of 3/4, such that two rate 3/4 codes are complementary. An enhanced modulation format (hierarchical modulation coupled with advanced channel coding) has been added to increase the total throughput of the system to 5.4 Mbps. The terrestrial bit-stream is a repeater signal carrying same content as the satellite signals, but with different FEC encoding and modulation. The inner FEC encoder for terrestrial repeaters employs a punctured rate convolutional code of rate 3/5 (from a mother code of rate 1/3). Eventually soft bits from the satellite and terrestrial receiver chains could be diversity combined for improved performance in areas of overlapped terrestrial and satellite coverage.

Mapping of coded bits from interleaver 3118 to modulation symbols 3119 is performed in 3105 with methods well known in the art, such as BPSK, QPSK, various forms of M-QAM, M-PSK or combinations of ASK and PSK, etc. Transmission could be of a single-carrier type or multi-carrier type such as OFDM, which may be system-specific. Furthermore, some form of spread spectrum could be employed as well. Such details are omitted here as persons of ordinary skill in the art would know how to use such techniques in conjunction with the aspects and embodiments described herein. Various other examples of communication systems such as wireless local area networks, cellular networks, infrared, acoustic, wireline and fiber optic systems could also be represented with the general concatenated structure described above.

Decoding of Concatenated Codes

Outer FEC decoding could be implemented with known methods in the art, but is preferably performed by utilizing aspects of the invention described in previous embodiments. Specifically, the outer FEC codes could typically be represented with binary parity check matrices and decoded using BP based decoding algorithms, as described in previous embodiments discussed above in the first subsection pertaining to BP based decoding of H/M/LDPC codes. Other than great performance with affordable complexity, another advantage of BP based decoding methods is that the soft decoder output could be used to derive extrinsic information to be fed back to a soft a priori input of the inner FEC decoder to facilitate iterative decoding between inner and outer FEC decoders. In case the BP based decoding of the outer FEC code converges to a codeword, the output LLRs could be enhanced, i.e., quantized to have a large absolute value that's configurable. This is further justified by confirmation that decoded code word/s are verified as error free by error detection decoder, such as a cyclic redundancy check (CRC) decoder, for example. Since the probability of an undetected codeword error would be orders of magnitude smaller than probability of bit decoding errors, enhanced LLRs could be used as extrinsic information i.e., a priori information for the inner FEC decoder. Thus, the enhanced LLRs obtained from such codewords are used as soft a priori inputs to the inner FEC decoder. One embodiment of the invention is directed to specific realization of BP-based decoding algorithms and iterative decoding with soft reliability values as well as incorporation of enhanced LLRs based extrinsic information in the iterative decoding process.

More specifically, the receiver block diagram in accordance with certain embodiments of the invention is depicted in FIG. 18. At the receiver, initial channel state information (CSI) estimation is performed 3106 on received, noisy modulation symbols 3120, followed by symbol de-mapping 3107 that produces (coded) bit LLRs 3122 using the output of the CSI estimation 3121 and noisy modulation symbols 3120. For initial CSI estimation, conventional methods could be employed. Alternatively, the aspects of the invention described in the second subsection above discussing various embodiments for CSI estimation may be used in order to improve the overall performance of the receiver. Then inner de-interleaving is performed in 3108 on the (coded) bit LLRs 3122. The output of the inner de-interleaver 3123 is then decoded by the inner FEC decoder 3109. In some embodiments the inner interleaver/de-interleaver may be omitted, as discussed earlier. In some embodiments, the inner FEC decoding produces a sequence of soft bit outputs, say LLRs. For example this could be accomplished by means of a Log-MAP decoder or BP decoder, as typical examples. The sequence of soft bit outputs 3124, say LLRs, from the inner FEC decoder is de-interleaved in outer de-interleaver 3110 and de-interleaved output 3125 is fed to the outer FEC decoder 3111. The de-interleaving in 3110 could be bit or symbol/byte based, or could be omitted, depending on the nature and the structure of the outer FEC code. The estimated transmitted information is extracted from the output of the outer FEC decoder at line 3130. The above described process represents a simple sequential decoding as in conventional, non-iterative decoding in the art, or just first decoding iteration in iterative decoding of concatenated codes.

In other embodiments, in addition to a sequence of soft bit outputs, the inner FEC decoder could also produce a list of hard decision sequences among which transmitted sequence could be found with a high likelihood. For example, in cases where the inner FEC code is a convolutional code or a turbo code, a list Log-MAP decoder can be used to generate a set of soft bit outputs, e.g., LLRs, along with a list of M hard-decision sequences ordered based on their likelihood of being correct. That is, the first hard decision sequence on the list is the most likely one, the second hard decision sequence on the list is the second most likely, etc. These sequences are de-interleaved, if interleaving/de-interleaving is employed, along with the soft bit outputs. Before performing soft outer FEC decoding in block 3111 using the de-interleaved LLRs on line 3125, first the de-interleaved hard decision sequences in the list are checked to see if any of them corresponds to a valid codeword of the outer code. If so, there will be no need to perform soft outer FEC decoding. In some embodiments, if the inner FEC decoder/decoders did not produce a valid codeword/s, outer soft decision decoding is performed. If after soft outer FEC decoding a valid codeword is not produced, soft extrinsic information 3126 is interleaved in 3112 and fed back 3127 to the inner FEC decoder 3109, to facilitate iterative decoding. In other embodiments, even if none of the sequences corresponds to a valid outer codeword, simple hard decision error or error and erasure decoding can be applied in 3111, using known such algorithm in the art (for example Berlekamp-Massey (BM) algorithm as described in the previous embodiments) on some (highly ranked on the list) or all sequences on the list and only if it fails, soft channel decoding is performed. Again, if after soft outer FEC decoding a valid codeword is not produced, soft extrinsic information is fed back to the inner decoder to facilitate iterative decoding, as explained earlier. The steps of performing list decoding and/or hard decision error or error and erasure decoding before outer code soft decoding helps reduce the overall complexity of the outer code decoding and improve performance. The complexity is reduced because steps of list decoding and hard decision error and erasure decoding could correct most of the error patterns, and since their complexity is typically much smaller than that of soft outer FEC decoding, the overall decoding complexity is reduced. The performance gain results from observations that some error patterns may be corrected by above steps while they may not be correctable by the soft outer FEC decoder. Specific details how list decoding could be performed in conjunction with the outer FEC code depends on, for example, how outer code codewords relate to inner code codewords, possibly via de-interleaving. More details on this aspect of the invention are provided in the examples discussed in the fourth subsection below pertaining to advanced HD Radio decoding. Specifically, it will be described how list decoding is performed when one outer code codeword corresponds to one inner code codeword (without outer interleaving/de-interleaving), as in the case of MPS PDU header decoding in P1 channel, and also how list decoding is performed if one outer code codeword includes bits/symbols from two or more inner code codewords, coupled via outer byte interleaving/de-interleaving, as in the case of AAS data decoding in P3 channel. Implementations for other possible variations should be apparent to those skilled in the art, from those two provided examples.

In many systems, before outer FEC encoder 3101, or before FEC encoding in general if an outer code is not employed, there is some kind of error detection code encoding. Typically a CRC code is employed for error detection. In that case, there could be a CRC decoder after the outer decoder 3111. Using this CRC decoder, the validity of the outer decoded codeword is checked. As soon as a codeword passes CRC check, it is accepted. The CRC code can also facilitate list Log-MAP decoding when the outer code is systematic, otherwise the outer code could be used for error detection to facilitate list decoding, as these approaches are known in the art. In cases when a CRC code is employed, a valid outer codeword is accepted if it passes the CRC check.

In order to improve the performance of the receiver, as mentioned earlier, in some embodiments iterative decoding is performed as shown with dashed lines in FIG. 18. A soft output decoder 3109 can be used for decoding the inner FEC code which will provide soft inputs 3125, after de-interleaving of soft outputs 3124 in 3110, to the outer FEC decoder 3111. As explained before, any outer code that can be represented by a binary parity check matrix can be decoded by BP-based soft channel-decoding methods including the ones described herein. Depending on the particular system, one inner codeword might contain a specific number (G) of outer codewords. In the outer decoder, all these G codewords are decoded. There are multiple possibilities that could result from such decoding. If decoding of all these G codewords was successful, no iteration is performed and the information bits are extracted at line 3130. However, in some instances these codewords might be divided into two groups of G1 and G2 codewords. The codewords in the first group are not decoded successfully and a set of extrinsic LLRs are generated for each of these codewords at the output of the soft outer FEC decoder 3126 to feed back via interleaver 3112 to the inner decoder 3109 as a priori information. The G2 codewords in the second group are decoded successfully and a set of enhanced LLRs, enhanced extrinsic information, are generated in line 3126 using the decoded codeword bits, as explained earlier, and fed back to the inner decoder 3109 as a priori information. The case G1=0 and G2=G corresponds to the first mentioned case above. Another special case is G1=G and G2=0, where none of the outer codewords are decoded correctly. In the second iteration, generated extrinsic information on line 3126 is interleaved in 3112, if outer interleaving/de-interleaving is employed, and the result 3127 is fed back to the inner decoder 3109 as a priori information. Using the extrinsic information from the outer FEC decoder helps in improving the performance of the inner FEC decoder to produce more reliable soft information for the subsequent outer FEC decoding. The iterations between inner and outer FEC decoders are continued until either all the outer codewords are decoded successfully or the maximum number of iterations is reached. As it can be seen from FIG. 18, there are two iteration loops. One iteration loop is between the inner and outer FEC decoders 3109 and 3111, respectively, as explained above, which in some embodiments may include list decoding, i.e., passing from the inner FEC decoder to the outer FEC decoder both soft bit outputs, say LLRs, and M most likely hard decision sequences, and in other embodiments passing from the inner FEC decoder to the outer FEC decoder only soft bit outputs. The second iteration loop is between the advanced CSI estimation 3106 and inner FEC decoder 3109. The inner FEC decoder could also produce inner code coded bits improved LLRs at its output 3128 which are passed to the inner interleaver 3113 and interleaved coded bit LLRs 3129 are fed back to the advanced CSI estimation block 3106. Improved coded bit LLRs facilitate better channel information, including amplitude, phase, noise and interference power, as described in various embodiments discussed in the second subsection above pertaining to CSI estimation, and also frequency and timing estimates as it might be applicable in some embodiments. This in turn will result in more reliable soft information at the input of the inner FEC decoder and further improvements in inner FEC decoding. In addition, as part of the second/inner loop, iterative de-mapping of noisy channel symbols into channel bit LLRs is performed as described in other embodiments (see, e.g., inventions pertaining to check-irregular non-systematic IRA codes). In some embodiments, the two iteration loops, inner and outer, may be performed separately and individually, i.e., each one can be executed without the other one. In other embodiments both inner and outer iterative loops are performed. In one embodiment, when both inner and outer loop are performed, each inner loop iteration is followed by one outer loop iteration, followed by another inner loop iteration, and so on, until maximum number of iterations is reached, or until all codewords are correctly decoded, or until some other stopping criterion is met. In another embodiment, in case when both loops are performed, the order is as follows:

1. $N_1 \geq 1$ iterations are performed between the advanced CSI estimation 3106 (including de-mapping in 3107 and de-interleaving in 3108) and the inner FEC decoder 3109.
2. The soft output of the inner FEC decoder, 3124, is de-interleaved in 3110 and decoded using the outer FEC decoder 3111.
3. If all the outer codewords are decoded successfully (and pass CRC check if it is employed), or other stopping criterion is met, information bits are extracted at line 3130. Otherwise, the extrinsic information from the outer FEC decoder 3126 is interleaved in 3112 and fed back to the inner FEC decoder 3109 as a priori information.

Steps 2 and 3 above constitute one iteration of the outer iterative loop. Up to $N_2 \geq 1$ outer loop iterations are performed unless a stopping criterion is met.

In yet another embodiment after every $N_3 \geq 1$ iterations of the outer loop, one or more inner loop iterations (including advanced CSI estimation and possibly de-mapping) are performed, followed by further N3 iterations of the outer loop, and so on, until maximum number of overall iterations is reached, or after another stopping criterion is met, as discussed earlier.

In yet other embodiments, the outer code is a CRC code, wherein in some embodiments one CRC code is employed for all codewords or packets of the inner code, and in other embodiments there are multiple CRC codes corresponding to different codewords or packets of the inner code.

In case that one CRC code is used for all codewords of the inner code, there are two options for decoding the outer (CRC) code. In one embodiment, only CRC check is applied on the output of inner FEC decoder 3124, or at the output of outer de-interleaver 3125 if optional outer interleaving/de-interleaving is employed. If this output is soft LLRs, CRC check is performed on their hard decisions, and if the CRC check passes, the information bits are extracted from the hard decisions. In case of list decoding of the inner code, CRC check is performed on the sequences in the output list of the list decoder. If one of the sequences in the list passes the CRC check, it will be accepted and the information bits are extracted from it. In both of the above cases, if CRC does not pass, it means the decoding was not successful and soft LLRs are used to extract the information bits that are not completely correct. Since CRC check is a hard decision process, no iteration can be performed between the inner and outer decoders. In another embodiment, if none of the sequences or soft LLRs passes the CRC check, SISO CRC decoding can be performed using H/M/LDPC decoding approach presented in accordance with certain aspects of the invention or using CRC Log-MAP or other algorithms known in the art. If soft decoding resulted in a codeword, the information bits are extracted and used as the output in Line 3130. However, if soft decoding was not successful, a set of extrinsic LLRs are generated at the output of the SISO CRC decoder. These extrinsic LLRs 3126 can be interleaved (if applicable) and fed back to the inner FEC decoder 3109 as a priori information in the next iteration in order to help improve the inner FEC decoding performance. The iterations between inner and outer decoders are continued until a successful outer decoding result or until a maximum number of iterations is reached. Similar as before, inner and outer loops may be done individually or they may be done together following the three steps discussed above.

In case that multiple CRC codes are used for different codewords of the inner code, each inner codeword may include G CRC codewords. Following the same two options for outer decoding, in one embodiment only CRC check is applied to each CRC codeword. The G CRC codewords are divided into two groups, the first group with G1 codewords that have passed the CRC check and the second group with G2 codewords that have not passed the CRC check. If G1=G and G2=0, the decoding is successful and the information bits are extracted at line 3130. If G1=0 and G2=G, decoding is not successful and information bits are extracted from soft LLRs and they are not completely correct. No iteration can be performed in this case. However if 0<G1, G2<G, G1 CRC codewords that pass the CRC check are converted to enhanced LLRs and fed back to the inner decoder through interleaver (if applicable) along with soft LLRs corresponding to G2 CRC codewords that have not passed the CRC check for the next iteration. It should be noted that another iteration is only possible if at least one of the CRC codewords passes the CRC check and can be converted to enhanced LLRs. In another embodiment, SISO CRC decoding can be applied to G2 CRC codewords that have not passed the CRC check. In this embodiment, G1 enhanced LLRs and G2 updated extrinsic LLRs from soft CRC decoder are fed back to the inner FEC decoder 3109 through the outer interleaver (if applicable) in the next iteration in order to improve the inner decoding performance.

The fourth subsection below pertaining to advanced HD Radio decoding techniques provides more specific examples of the use of CRC described above and it will be apparent to a person of skill in the art how to implement various described combinations.

Multilevel Coding and Decoding

In another embodiment, in FIG. 18, the inner FEC code in the concatenated scheme 3103 can be a multilevel code from the prior art. The main idea of multilevel coding is joint optimization of coding and modulation in an effort to have the best transmission performance. A general system model for multilevel encoding is shown in FIG. 19. The set of information bits 3210 is first partitioned in 3201 into M groups, subsets. The first group 3214 is only encoded using the FEC encoder 3205, while all the other groups 3211, 3212, ..., 3213 are first encoded using FEC encoders M−1, M−2, ..., 1 3202, 3203, ..., 3204 and their respective coded bits 3215, 3216, ..., 3217 are then interleaved in blocks 3206, 3207, ..., 3208. Output coded bits 3218 and interleaved outputs 3219, 3220, ..., 3221 go through a single mapper 3209 where the bits are converted to modulation symbols 3222. This type of channel coding is used in Digital Radio Mondiale (DRM) standard in the prior art, for example. In DRM, different levels of protection can be reached for different parts of the data stream using different component codes formed with punctured convolutional codes of different rates all of which are derived from the same mother code. But in general different codes could be used for different streams.

In addition to standard mapping, a concatenated system with multilevel coding, such as DRM, may also use hierarchical modulation. In one embodiment, three level coding and 64-QAM modulation are employed. The bit stream is first divided into two parts: strongly protected part (SPP) and very strongly protected part (VSPP). The bit stream of the VSPP is sent to the encoder on level 0. The SPP is partitioned into two streams: the bits of the higher protected part are fed to the encoder on level 1 and the bits of the lower protected part are fed to the encoder on level 2.

Optimal decoding of the multilevel coding scheme with an overall Maximum Likelihood (ML) or Maximum-A-Posteriori (MAP) decoder is infeasible because of the very large number of states. Therefore, in certain prior art systems, suboptimum Multi Stage Decoding (MSD) is applied at the receiver. Different levels are decoded successively starting from level 0 and the estimated data are passed to all the higher level de-mappers. This process is shown in FIG. 20 using solid lines. The input in FIG. 20 3315 is assumed to come from the advanced CSI estimation, containing the noisy channel symbols and CSI. This input goes to different decoding levels via 3316, 3317, ..., 3318. In level 0, after demapping in 3301 of input symbols 3316 to coded bit LLRs 3319, the first group of information is decoded using FEC decoder 0 in 3306 generating information bits for the first group in line 3332. The decoded information from decoder 0 3324 is fed to all the higher level de-mappers 3302, ..., 3303. In all the other levels (1 to M−1), de-mapping in 3302, ..., 3303 is performed on the input symbols and corresponding CSI 3317, ..., 3318 using the information from the decoders of all the previous levels and coded bits are generated in lines 3320, ..., 3321. After de-mapping, de-interleaving in 3304, ..., 3305 is performed on the coded bits. The de-interleaved coded bits 3322, ..., 3323 are then decoded using the FEC decoders 1, ..., M−1 in blocks 3307, ..., 3308. The FEC decoder outputs 3325, ..., 3326 are then interleaved 3309, ..., 3310 and the interleaved outputs 3327, ... go to all the higher level de-mappers. The information passed from one level to the other can be soft or binary. The use of soft information requires more complex decoders such as the Soft Input Soft Output (SISO) decoders. In case of binary information, only hard decision decoders (for example Viterbi-Algorithm for convolutional codes) is needed which is less complex than using a SISO decoder. Despite a higher complexity of SISO compared to decoding with hard decision outputs, by using soft information the performance of the decoding is improved considerably. In hard decision decoding, the data of previous levels do not include any information about the reliability of the decision. Therefore, the decoder in the next level has to assume that this decision is known/correct with a probability of 1. If this assumption is not valid, the performance of this decoder is degraded.

In order to further improve the decoding performance, iterative decoding of the individual levels may be applied in certain prior art systems. Therefore, the information obtained from all other levels can be used for the de-mapping and consequently decoding of a certain level. In iterative decoding, the information provided by the higher levels can be used to improve the decoding of the lower levels. The process is shown in FIG. 20 using dashed lines for the second iteration where the outputs of interleavers 3328, ..., 3329 are fed back to all lower level de-mappers.

In this embodiment, as mentioned earlier, the multilevel coding is used as the inner coding 3103 in FIG. 18. In this case, the inner decoding 3109 can be performed using the MSD decoding (straightforward or iterative). In case where SISO decoding is used for each decoder of the MSD, the soft LLRs at the output of the decoders (3332, 3331, ..., 3330) are multiplexed together to form the output stream. However, in case that each decoder of the MSD uses list decoding, the output of each decoder includes a set of soft LLRs and a list of hard decision sequences. The soft LLRs of all decoders are multiplexed to form the output LLR stream. Assuming for each of the M decoders, there is a list of M1 hard sequences, one sequence from each decoder is selected and the M sequences are multiplexed to form a final hard decision sequence. Considering all the combinations, in the end $M1^M$ final sequences are generated. As said before sequences from each decoder are ordered from the most likely one to the least likely one. When combining sequences from different decoders, different combinations have different probabilities of being correct. For example, the combination of first sequences from all decoders has the highest probability of being correct. The combinations are ordered based on their probabilities of being correct. This way, the $M1^M$ hard-decision sequences are also ordered from highest probable one to the lowest probable one. So, at the output of the inner MSD decoder, a stream of soft LLRs along with $M1^M$ binary sequences are produced.

Hierarchical Modulation

In some embodiments hierarchical modulation is employed, with examples as mentioned previously for some of described exemplary systems. In hierarchical modulation, two separate bit data streams are modulated onto a single stream of modulation symbols. High Priority (HP) bit stream, or the base layer, is combined within a Low Priority (LP) bit stream, or the enhancement layer, into modulation symbols as shown in exemplary embodiments in FIG. 21 for 16-QAM and FIG. 22 for 8-PSK. As an example, consider a hierarchical modulation with 16-QAM in FIG. 21, where both the base and enhancement layers are QPSK encoded. The base layer is encoded with two bits and corresponds to a quadrant of the 16-QAM constellation. Denser QPSK constellation in each quadrant corresponds to two enhancement layer bits. Thus, there is larger Euclidean distance d_H 3401 for base layer bits than for the enhancement layer bits d_L 3402. In lower SNR conditions, it may be possible to decode reliably only base layer bits. In better SNR conditions, the detector/de-mapper can establish the phase and amplitude more accurately, to recover also enhancement layer bits corresponding to dense QPSK clusters. In FIG. 22, for 8-PSK hierarchical modulation, the base layer is QPSK encoded with two bits corresponding to a quadrant of the 8-PSK constellation. The enhancement layer is one bit corresponding to one of the two constellation points in each quadrant. Similarly, the Euclidean distance d_H 3501 for base layer bits is larger than the Euclidean distance d_L 3502 for the enhancement layer bits.

Other hierarchical symbol constellations are possible, as long as some subsets of bits are characterized by different Euclidean distance properties than other subsets of bits. In other embodiments, in addition to different Euclidean distance properties of LP and HP bits, LP and HP bits could also have different levels of FEC redundancy/protection to achieve desired spectral efficiency—performance trade off. The main idea is that receivers with good reception conditions, such as good received SNR, can decode both streams correctly, while those with poorer reception conditions may only decode correctly the HP stream.

Hierarchical modulation could be used to facilitate robust signal reception of different users within coverage area. For example, a standard definition SDTV signal (HP stream) and a high definition HDTV signal (LP stream) may be modulated together on the same carrier or same composite OFDM signal. Generally, the SDTV signal is more robust than the HDTV one. Depending on the quality of the received signal, the user may be able to decode both the HDTV and SDTC streams, or the SDTV stream only. Users near the transmission site (with good received signal strength) or the ones with advanced receivers can correctly decode both layers to receive a high fidelity signal, while other users with weaker signal and/or less advanced receivers may only be able to decode base layer, i.e., low fidelity signal.

By providing multiple layers, hierarchical modulation and coding enables graceful degradation in less favorable channel conditions. Hierarchical modulation has been included in various systems, such as DVB-T, DVB-H, MediaFLO, DVB-SH, DRM and etc., either as an option or a standard feature. For example, in DVB-H, two options of non-hierarchical and hierarchical transmissions are included. In non-hierarchical transmission, the available mappings are QPSK, 16-QAM, or 64-QAM. In hierarchical transmission only 16-QAM and 64-QAM can be used. In hierarchical case, the inner interleaver generates its output such that each 16-QAM or 64-QAM symbol contains 2 HP bits and its remaining bits from the LP stream. In order to find the HP bits, it is sufficient that the de-mapper at the receiver identifies the proper quarter-plane where the symbol is located (by applying a QPSK de-mapping). In hierarchical transmission, a parameter r is defined as the minimum distance of the above-discussed assumed QPSK points. The choices of r=1, 2, 4 are possible. r=2, 4 results is a non-uniform QAM mapping. The larger r provides higher protection of the HP bits.

The hierarchical modulation may be used in the general concatenated system shown in FIG. 23. At the transmitter, the HP and LP bit streams 3662 and 3666 go through two branches, where they are first encoded using the outer FEC encoders 1 and 2, 3641 and 3644. The coded bits 3663 and 3667 then go through outer interleavers 3642 and 3645 and the interleaved coded bits 3664 and 3668 are encoded with inner FEC encoders 3643 and 3646. The inner FEC code bits 3665 and 3669 at the outputs of inner FEC encoders 1 and 2 go through the inner interleaver 3647 which generates a single stream of interleaved coded bits 3670 such that every S_1 HP bits are followed by S_2 LP bits that are used together to produce a symbol carrying S_1 HP bits plus S_2 LP bits. The mapping from bits to modulation symbols in 3648 is performed such that in the modulated symbols 3671, there is larger Euclidean distance for S_1 HP bits than for S_2 LP bits.

At the receiver in FIG. 23, advanced CSI estimation 3649 is performed on the received, noisy modulation symbols 3672 and the output 3673 containing noisy channel symbols and CSI is passed to de-mapper 3650 that produces coded bit LLRs 3674. Because of the larger Euclidean distance for HP bits than for LP bits, the HP bits LLRs are more reliable than LP bits LLRs. After de-mapping, inner de-interleaving 3651 is applied to generate two streams of LP and HP code bit LLRs, 3675 and 3679. Both streams go through inner FEC decoders 3652 and 3656 and the outputs 3676 and 3680 are de-interleaved using de-interleavers 1 and 2 3653 and 3657. The outputs of de-interleavers 3677 and 3681 are then decoded using outer FEC decoders 1 and 2 3654 and 3658 and the information bits or LLRs are generated in lines 3678 and 3682. In each branch, inner and outer FEC codes could be similar to the ones explained in the context of FIG. 18. Iterative decoding between inner and outer codes in each branch can be done similar to the process explained for FIG. 18. There are additional loops between inner FEC decoders 1 and 2, 3652 and 3656, respectively, and the CSI estimation block 3649. Each inner FEC decoder could produce inner code coded bits improved LLRs. These coded bit LLRs 3687 and 3688 from both inner FEC decoders go through the inner interleaver 3661 to generate interleaved stream of coded bit LLRs 3689 which is fed back to the advanced CSI estimation block 3649. Improved coded-bits LLRs from inner FEC decoders facilitate better estimation of channel information, including amplitude, phase, and noise and interference power, as described in various embodiments described in the second subsection above discussing CSI estimation. This, in turn, will result in more reliable soft information at the input of both inner FEC decoders and further improvements in inner FEC decoding. In addition, as part of the loop between the advanced CSI estimation and inner FEC decoders, iterative de-mapping of noisy channel symbols into channel bit LLRs is performed as described in other embodiments (see e.g., inventions pertaining to check-irregular non-systematic IRA codes).

In some embodiments, the iterations in the loops between inner and outer FEC decoders 1 and 2 (outer loops) can be performed desired number of times separately from the iterations in the loops between advanced CSI estimation and inner FEC decoders 1 and 2 (inner loop). For example, one or more iterations could be performed in the inner loops between advanced CSI estimation in block 3649 and inner FEC decoders 3652 and 3656. One or more iterations in the inner loops may then be followed by one or more iterations in the outer loops between inner decoders 3652 and 3656 and outer FEC decoders 3654 and 3658. In other embodiments, one iteration in the inner loops is followed by one iteration in the outer loops, constituting one global iteration, and multiple global iterations may be performed, until maximum number of iterations is reached, or until all codewords for both branches are correctly decoded, or until some other stopping criterion is met. Various combinations of number of iterations and interactions between inner and outer loops are possible. In one exemplary embodiment, the order is as follows:

1. $N_1 \geq 1$ iterations of the inner loops are performed between advanced CSI estimation in 3649 (including de-mapping in 3650 and de-interleaving in 3651) and inner FEC decoders 3652 and 3656.
2. For both branches, the soft outputs of the inner FEC encoders 3652 and 3656 are de-interleaved in 3653 and 3657 and decoded using the outer FEC decoders 3654 and 3658.
3. If all the outer codewords are decoded successfully for both branches (and pass CRC check if it is employed), or other stopping criterion is met, information bits are extracted at lines 3678 and 3682. Otherwise, the extrinsic information from the outer FEC decoders 3683 and 3685 are interleaved in blocks 3659 and 3660 and the results 3684 and 3686 are fed back to the inner FEC decoders 1 and 2 as a priori information.

Steps 2 and 3 above constitute one iteration of the outer iterative loops. Up to $N_2 \geq 1$ outer loop iterations are performed unless a stopping criterion is met.

In yet another embodiment after every $N3 \geq 1$ iterations of the outer loops, one or more inner loop iterations (including CSI estimation and possibly de-mapping) are performed, followed by further N3 iterations of the outer loop, and so on, until maximum number of overall iterations is reached, or after another stopping criterion is met, as discussed earlier.

In one embodiment similar inner FEC encoding in 3643 and 3646 is applied to both HP and LP parts of the stream. In another embodiment, different levels of FEC protection is applied to the HP and LP bits, in addition to different distance properties of the hierarchical constellation, to provide desired level of performance optimization.

A more detailed implementation of some aspects of the invention regarding concatenated coding and CSI estimation will be explained in the context of exemplary embodiments for HD Radio decoding in the next subsection. Implementation of various other embodiments described in this subsection should be apparent to those skilled in the art, from descriptions in this subsection as well as description of various described embodiments in other subsections.

IV. Advanced HD Radio Decoding

This subsection discusses certain embodiments for decoding HD Radio signals, including hybrid HD Radio signals. Some of the embodiments concentrate on decoding of the system control data sequences carried by reference subcarriers in FM HD Radio systems. Specifically, certain aspects of the invention discussed herein pertain to providing integrated, iterative receivers/decoders that improve the performance of FM HD Radio systems, through techniques for soft-diversity combining of soft values of repeated control data bits carried on a plurality of reference subcarriers, techniques for collectively utilizing soft combining and multiple symbol detection, and/or techniques for correcting bit errors using parity check bits and utilizing the corrected parity bits in the techniques of soft-diversity combining as well as in the techniques of collectively utilizing soft combining and multiple symbol detection. These improvements not only help to decode control data sequences more reliably, but also facilitate better CSI estimation that employs reference subcarriers, which contributes to improved decoding of all HD Radio logical channels.

In addition, other improvements including, improved and iterative CSI estimation in conjunction with soft-input soft-output list Log-MAP decoding of the employed convolutional codes, as well as improved soft-input soft-output RS decoding, for decoding of HD Radio logical channels are described in various embodiments. These improvements result in extending the range/coverage of digital radio by corresponding implementations in HD Radio receivers, without modifying the existing HD Radio system infrastructure or the air-interface. As discussed further below, most of the principles discussed in this subsection are also applicable to non-HD Radio systems and standards.

Figure 24A:
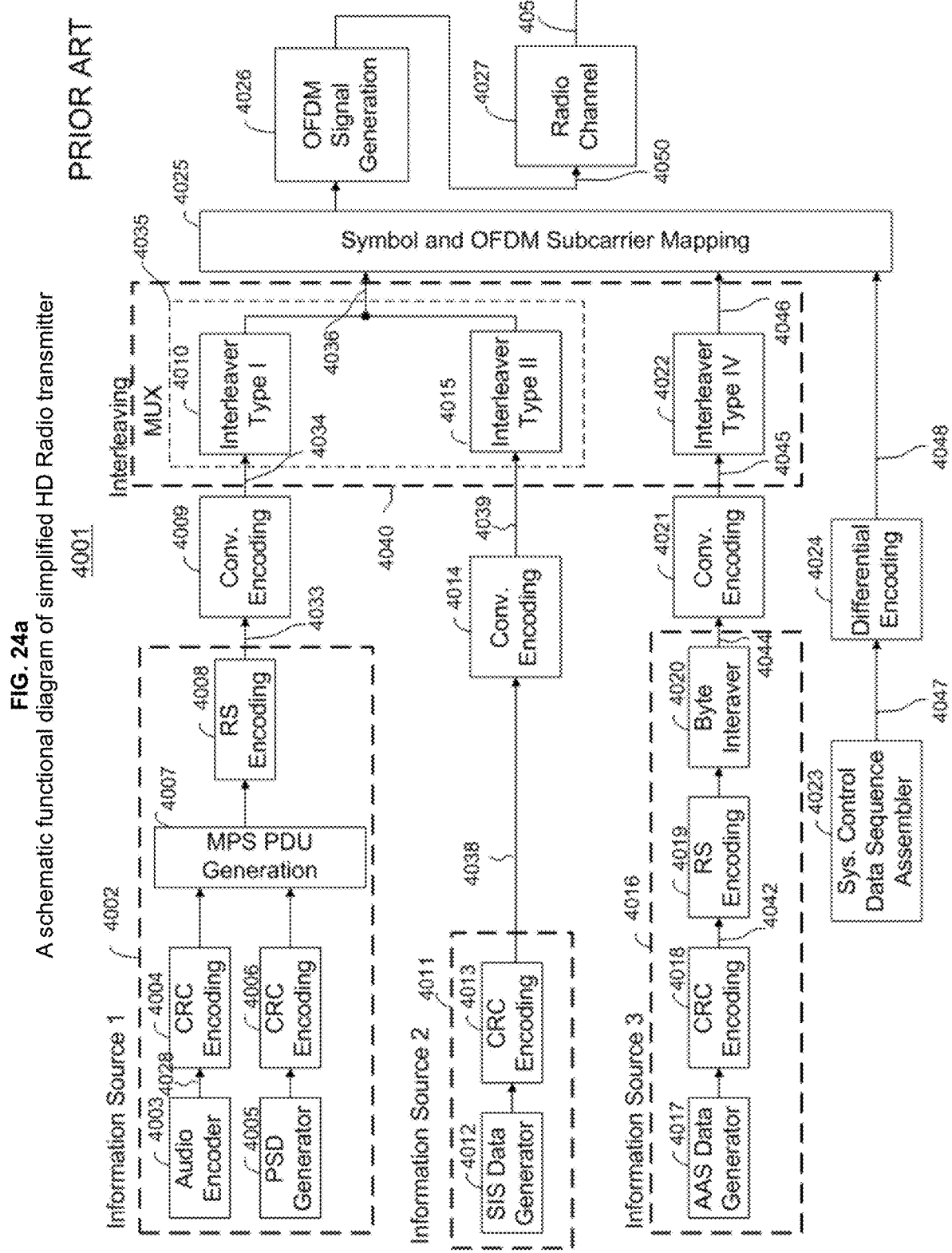
FIG. 24*a* is a simplified block diagram illustrating the functionality of an HD Radio transmitter that multiplexes a plurality of information sequences into a single stream in the time domain.

FIG. 24a illustrates the functionality of a transmitter that multiplexes a plurality of information sequences into a single stream in the time domain as applicable to HD Radio systems including AM and FM, as well as hybrid and all-digital. While certain specific numerology and details of different versions/variations of HD Radio systems are omitted for simplicity, some relevant ones are included and/or pointed out.

Information Source 1 4002 assembles a series of Main Program Service (MPS) Protocol Data Units (PDUs) on line 4033 each of which includes a plurality of audio packets and a program service data (PSD) PDU. The input to the Audio Encoder 4003 is a stream of audio frames generated by an Audio Interface running at a typical sample rate for audio, e.g., 44.1 kilo-samples per second (kSa/s), for left and right audio channels. The Audio Encoder breaks each audio channel into segments, known as audio frames, processes each segment, and delivers encoded audio packets on line 4028. Each encoded audio packet is then processed by CRC Encoder 4004 for integrity check at the receiver. PSD is generated in block 4005 for transmission along with the program audio. PSD may be placed in a specific format to form a PDU and delimited by one-byte flag. The PSD PDU is then processed by CRC Encoder 4006 for integrity check at the receiver. MPS PDUs are generated in block 4007 with a fixed header portion (i.e., Control Word), a variable header portion (including a variable number of audio packet location fields and an optional header expansion field), a PSD PDU, and encoded audio packets. The Control Word is protected by a RS (96,88) code in block 4008. Since the RS codeword is of fixed size, i.e., 96 bytes, it may span portions of the header expansion field, PSD PDU field, and possibly a fraction of the encoded audio packet bits. The rest of the MPS PDU bits beyond 96 bytes remain unchanged in block 4008. The output from the RS Encoder 4008 forms a logical channel, e.g., Logical Channel P1 in HD Radio systems. The bit stream of the logical channel is processed by Convolutional Encoding 4009 with a tail-biting convolutional code. Convolutional encoding may include mother code generation, e.g., code rate 1/3, and puncturing, which together determine the code rate for the logical channel, e.g., code rate 2/5 for some modes of operation in HD Radio systems. The coded bit stream on line 4034 is further bit-interleaved.

But this bit-interleaving in block 4010 may be performed in association with another interleaver 4015 for a coded bit stream from another logical channel, e.g., Primary IBOC Data Service (PIDS) used in HD Radio systems, when the two logical channel bits are multiplexed (i.e., block 4035) to form a single bit stream on line 4036.

The coded bit stream on line 4039 is generated from Information Source 2 4011 which is for Station Information Service (SIS) in HD Radio systems. The output from SIS Data Generator 4012 is processed by CRC Encoding 4013 for integrity check at the receiver. The output on line 4038 from the CRC Encoder forms a logical channel, e.g., Logical Channel PIDS in HD Radio systems. The bit stream of the logical channel is processed by Convolutional Encoding 4014 with a tail-biting convolutional code.

Information Source 3 4016 assembles a series of Advanced Application Service (AAS) PDUs for fixed and/or opportunistic data as in HD Radio systems. AAS Data Generator 4017 receives AAS Data from the Service Interfaces and then encodes and encapsulates the data to generate AAS packets. Each AAS packet is processed by CRC Encoder 4018. FEC may be applied to the encoded packet stream on line 4042 to control packet loss and errors using the following methods: RS (255,223) block coding in block 4019 for error correction, byte interleaving in block 4020 to protect against error bursts, and block synchronization mechanism which is omitted for simplicity in the diagram. The output on line 4044 forms a logical channel, e.g., Logical Channel P3 (or P4 if an additional data processing is performed, i.e., Information Source 4, as in Logical Channel P3) in HD Radio systems. The bit stream of the logical channel P3 (and/or P4) is processed by Convolutional Encoding 4021 with a convolutional code. Convolutional encoding may be performed with the same mother code as the one for Logical Channel P1 but with a different puncturing pattern to result in a different code rate, e.g., code rate 1/2. The coded bit stream on line 4045 is then bit-interleaved in block 4022. As indicated above, in another embodiment, an additional information source, i.e., Information Source 4 for Logical Channel P4 (not shown), could be present in HD Radio systems. In this case, additional blocks for convolutional encoding (block 4021) and interleaver (block 4022) are added to process the Logical Channel P4 bit stream.

System Control Data Sequence Assembler 4023 processes System Control Channel (SCCH) information into a set of system control data sequences. In the FM HD Radio system, there are 61 system control data sequences of 32 bits long in a processing block denoted by matrix Rd (or also known in the art as matrix r (lowercase)), and each output sequence on line 4047 is carried by one of the 61 reference subcarriers that are distributed throughout the OFDM spectrum. The Differential Encoder 4024 then differentially encodes each 32-bit sequence in time in the FM HD Radio system. With all 61 sequences differentially encoded and further transposed, the resulting output on line 4048 is a matrix R (uppercase) of fixed dimension 32×61. The row dimension of R (i.e., 32) corresponds to the number of OFDM symbols per pre-defined time duration and the column dimension (i.e., 61) corresponds to the maximum number of active reference subcarriers per OFDM symbol. In the AM HD Radio system, System Control Data Assembler 4023 processes SCCH information along with synchronization, parity and reserved bits into a stream of system control data sequences. The resulting output on line 4047 is a column vector R destined for two reference subcarriers with BPSK modulation in the AM HD Radio system. Thus, block 4024 is not applicable to the AM HD Radio system.

Symbol and OFDM Subcarrier Mapping 4025 assigns the interleaver matrices on line 4036 for Logical Channels P1 and PIDS, referred to as matrix PM in the FM HD Radio system, and on line 4046 for Logical Channel P3, referred to as matrix PX1 (and matrix PX2 for Logical Channel P4, if present) in the FM HD Radio system, and the system control matrix R on line 4048 to the OFDM subcarriers. The inputs to OFDM Subcarrier Mapping are a row of each active interleaver/system control matrix which is processed every OFDM symbol duration (i.e., Ts) to produce an output vector, herein referred to as X which is a frequency-domain representation of the signal. The output vector X from Symbol and OFDM Subcarrier Mapping for each OFDM symbol is a complex vector of length 1093. The vector is indexed from k=0, 1, 2, . . . , 1092. The k-th element of X corresponds to subcarrier (k−546). Symbol and OFDM Subcarrier Mapping 4025 first maps bits into modulation symbols. For instance, bits read from interleaver partitions, PM, PX1 (and PX2) in the FM HD Radio system, and individual bits read from R are mapped to complex modulation-constellation values, and the appropriate amplitude scaling factor is applied to these complex constellation values. In AM HD Radio systems, interleaver matrices multiplexing and mapping to subcarriers are somewhat different and with different notation, but would be well understood by persons of ordinary skill in the art, and such details are omitted for brevity. Such modulation symbol mapping for data subcarriers may be performed for different modulations schemes such as QPSK, 16-QAM and 64-QAM in different modes of HD Radio systems. For example, for QPSK modulation, the following mapping may be employed:

| 1 Bit | Q Bit | Constellation Value |
|---|---|---|
| 0 | 0 | (−1 − j1) |
| 0 | 1 | (−1 + j1) |
| 1 | 0 | (1 − j1) |
| 1 | 1 | (1 + j1) |

For reference subcarriers, symbol mapping of the bits in matrix R may be by the following rules:

| Bit Value | Constellation Value |
|---|---|
| 0 | (−1 − j1) |
| 1 | (1 + j1) |

Then, block 4025 maps the scaled complex constellation values to the appropriate elements of the output vector X. Elements of X corresponding to unused subcarriers are set to the complex value 0+j0.

The OFDM Signal Generation 4026 receives complex, frequency-domain, OFDM symbols from the Symbol and OFDM Subcarrier Mapping, and outputs time-domain signal representing the digital portion of the FM (or AM or all digital) HD Radio signal. The OFDM signal generation is achieved by using the inverse discrete Fourier transform (IDFT). Also, the guard interval $\alpha T$, where $\alpha$ is the cyclic prefix width, e.g., 7/128, and $T=1/\Delta f$ is the reciprocal of the OFDM subcarrier spacing, is placed in the beginning of the OFDM symbol duration $T_s$. Not shown in the figure for simplicity, the output on line 4050 from the OFDM Signal Generation modulates radio-frequency (RF) carrier in a method well known in the art and is transmitted through the radio channel 4027. Being transmitted through the radio channel, the transmitted signal may suffer from multipath fading commonly encountered in the real-world radio transmission as well as other impairments, such as various forms of interference. The output on line 4051 of the radio channel is received and processed by the receiver 4060 in FIG. 24b.

In the receiver 4060 shown in FIG. 24b, Receiver Front-end 4061 processes the received radio signal (on line 4051 in FIG. 24a) with the methods commonly adopted in the prior art for carrier demodulation, including but not limited to carrier recovery and timing synchronization, and appropriate sampling, i.e., analog-to-digital conversion, ultimately resulting in a discrete baseband signal, and outputs the baseband signal on line 4074. Then, OFDM De-modulation and Subcarrier De-mapping 4062 performs the Fourier transform and subcarrier de-mapping to produce two streams of baseband signals, one on line 4077 for information sources 1, 2, and 3 and the other on line 4075 for the system control data, respectively. The system control data bits are first decoded in block 4063 from the system control data signal on line 4075 to produce regenerated system control data bits as well as raw system control data signal on line 4076. Using the regenerated system control bits and raw system control data signal, the Advanced CSI Estimation block 4064 performs channel state information (CSI) estimation, which produces the channel response and noise power estimates that is further explained herein, and performs phase correction, i.e., coherent demodulation, of the signal on line 4077. The resulting signal on line 4078 is a stream of phase-corrected complex symbols. Symbol-to-bit De-mapping 4065 calculates LLRs from the symbols on line 4078 and assigns them to corresponding coded-bit positions. These LLRs on coded-bit positions are also referred to as channel LLRs. Then, the channel LLRs on line 4079 are de-interleaved and demultiplexed in block 4066 to produce the logical channel signal P1 (i.e., channel LLRs corresponding to the coded-bit positions of logical channel P1) on line 4080, the logical channel signal PIDS on line 4081, and the logical channel signal P3 on 4082 as well as the logical channel signal P4 as applicable (not shown in FIG. 24b). These logical channel signals are then processed by SISO decoders, in blocks 4067, 4068, and 4069, respectively, for decoding of the logical channel bits that were channel-encoded with a convolutional code at the transmitter. SISO decoding could be performed using Log-MAP decoders, or various sub-optimum implementations such as Max-Log-MAP or soft-output Viterbi algorithm (SOVA), soft-output sequential decoding or other "tree" based algorithms, or other algorithms known in the art, or in some steps could be implemented using list Log-MAP algorithm as explained in some embodiments and as it will be discussed subsequently for specific implementations in HD Radio systems. Then, to improve the CSI estimation and decoding accuracy, the output LLRs on line 4083, 4084, and 4085, which are coded bit LLRs, from the SISO/Log-MAP decoders may be processed in the Interleaver and MUX block 4070. In block 4070, all three (or four if Logical Channel P4 is present) logical channel signals are interleaved and multiplexed in the same way as processed in the transmitter, i.e., block 4040 in FIG. 24a. Then, its output signal on line 4089 is supplied to Advanced CSI Estimation 4064 for another iteration of CSI estimation as described in previous embodiments. Signal with improved CSI estimates is passed subsequently to blocks 4065-4069 for next decoding iteration. As discussed in the previous embodiments, there are multiple alternatives to implement joint iterative decoding and CSI estimation and the number of iterations depends on the stopping criterion. In one of alternative approaches, after the final iteration of joint CSI estimation and SISO decoding in the loop including Advanced CSI Estimation 4064 and SISO Decoders 1, 2 and 3, 4067-4069, the SISO decoders, employing a list Log-MAP algorithm, may produce both the output LLRs and M most likely hard-decoded sequences, as explained earlier, on line 4086, line 4087, and line 4088, corresponding to information-bit positions of the logical channels for further decoding of the information, i.e., MPS PDUs in block 4071, SIS PDUs in block 4072, and AAS PDUs in block 4073, respectively. More details of certain relevant aspects of the invention are further described below.

The methods described herein can be applied to both FM and AM, hybrid and all-digital HD Radio systems taking into consideration system-specific parameters such as constraint length of the convolutional code, e.g., 7 for FM and 9 for AM, code rate, or number of subcarriers, modulation and other elements of numerology. Detailed numerology for individual modes of HD Radio systems is omitted as it would be well understood by persons of ordinary skill in the art, and when specific numerology is relevant it will be taken into account.

Control Channel Decoding

In reference to block 4063 in FIG. 24b, the methods constructed in this embodiment are based on diversity combining of soft values of the differentially encoded control data sequence bits (or modulation-symbols as applicable throughout certain embodiments) to enhance the detection of the system control data sequence of HD Radio systems. To further elaborate the methods, consider FIG. 25 which is a simplified representation of the transmitter 4001 in FIG. 24a for the FM HD Radio system with additional logical channel P4 from Information Source 4 as well as interleaver matrices, PM, PX1, PX2, and R denoted accordingly along with their illustrative dimensions. Of particular importance is the Control Data Sequence Assembler 4104 which produces a set of logical bits denoted by matrix $R_d$ (also interchangeably referred to as the binary reference matrix) on line 4116. The size of $R_d$ is (P×M), for example, P=61 and M=32 as shown in the figure. The M-bit sequence in each row of $R_d$ is differentially encoded and transposed, and P sequences collectively produce a matrix R (also interchangeably referred to as R matrix) on line 4112 of size (M×P). Note that the row dimension of $R_d$ (or the column dimension of R, i.e., P=61) corresponds to the maximum number of active reference subcarriers per OFDM symbol and the column dimension of $R_d$ (or the row dimension of R, i.e., M=32) corresponds to the number of OFDM symbols per predefined time duration. All or some, say U, of the M-bit sequences in a (P×M) matrix Rd may contain the same bit pattern (or patterns) (such as SYNC bits and/or Control bits shown in FIG. 28) at designated bit positions in each sequence. Furthermore, a plurality of (P×M) $R_d$ matrices may be concatenated to produce longer sequences in rows of Rd, resulting in a (P×qM) Rd matrix if concatenated q times, and thus qM-bit sequences in columns of R. In this case, the same bit pattern (or patterns) placed in all (e.g., U=P) or some (e.g., U<P)) of the sequences in a (P×M) Rd matrix appear q·U times in the concatenated (P×qM) $R_d$ matrix. For example, with q (P×M) $R_d$ matrices concatenated, a resulting ((q·M)×P) R matrix with q=32, M=32, and P=61 is shown on line 4112 in FIG. 25. The output, R matrix, of the Differential Encoding 4105 is processed in the Symbol and OFDM Mapping block 4106 as described in earlier embodiments.

Figure 25:
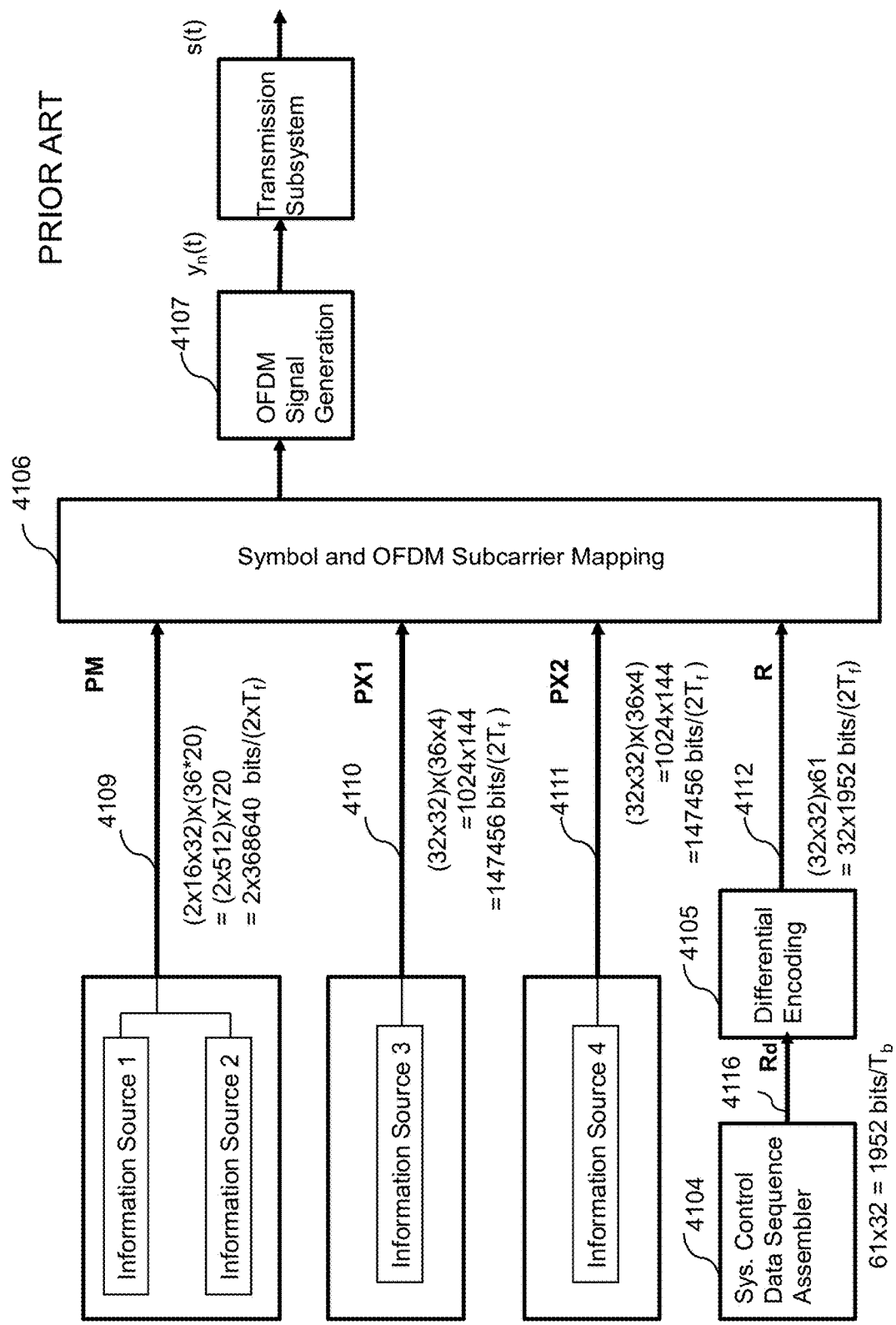
FIG. 25 is a simplified block diagram illustrating the functionality of an HD Radio transmitter that multiplexes a plurality of binary sequences into a single stream in time domain.
Figure 26:
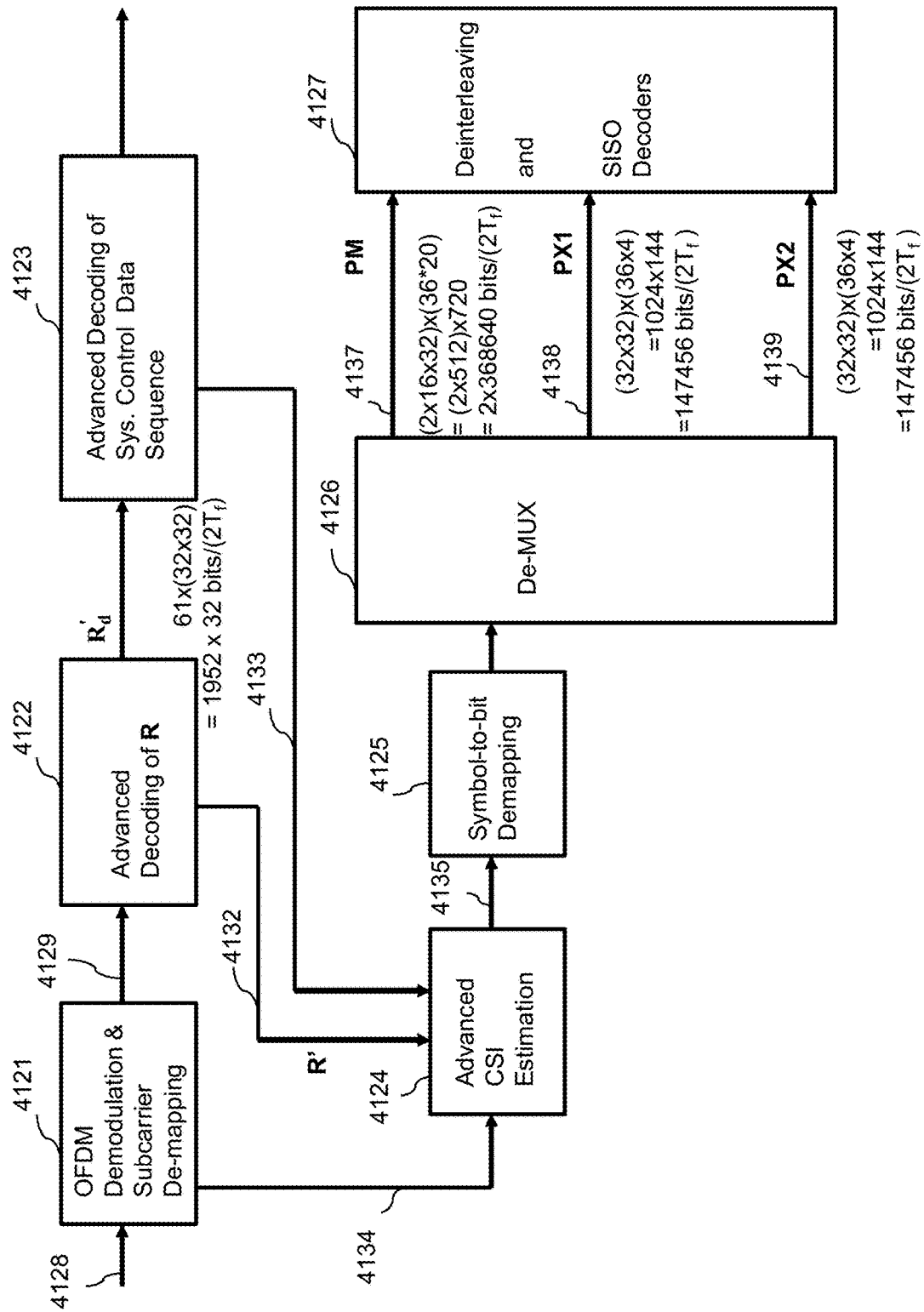
FIG. 26 is a simplified block diagram illustrating the functionality of an HD Radio receiver in accordance with certain embodiments of the invention.

FIG. 26 is an alternative block diagram illustrating the functionality of the receiver in FIG. 24b in accordance with certain embodiments. The baseband signal on line 4128 (equivalent to the signal on line 4074 in FIG. 24b) is supplied to OFDM Demodulation and Subcarrier De-mapping 4121. Its output on line 4129 is supplied to Advanced Decoding of R 4122. The R matrix decoding block extracts a set of complex symbols denoted by R' corresponding to the R matrix in FIG. 25 as well as matrix R'$_d$. The R' matrix on line 4132 is supplied to Advanced CSI Estimation 4124 for CSI estimation and phase correction of the signal on line 4134 carried on data subcarriers (i.e., information bits from Information Sources). Advanced CSI Estimation 4124 may also perform frequency offset estimation for the entire OFDM subcarriers as well as timing estimation of the system control data sequence. The decoded output R'$_d$ matrix is supplied to Advanced Decoding of System Control Data Sequence 4123 for further processing. The processing in block 4123 may include regeneration of R matrix using R'$_d$ matrix and its output 4133 may be fed-back to the Advanced CSI Estimation block 4124 for improvement of CSI/time/frequency estimation. Symbol-to-bit De-mapping 4125 calculates channel LLRs from the symbols on line 4135 and assigns them to corresponding coded-bit positions. The channel LLRs are further supplied to the De-MUX block 4126 to produce the interleaver matrices of channel LLRs on lines 4137, 4138, and 4139. The interleaver matrices are then de-interleaved by corresponding logical channel interleavers, i.e., Type I for P1, Type II for PIDS, and Type IV for P3 and P4, followed by SISO decoding in block 4127.

Figure 27:
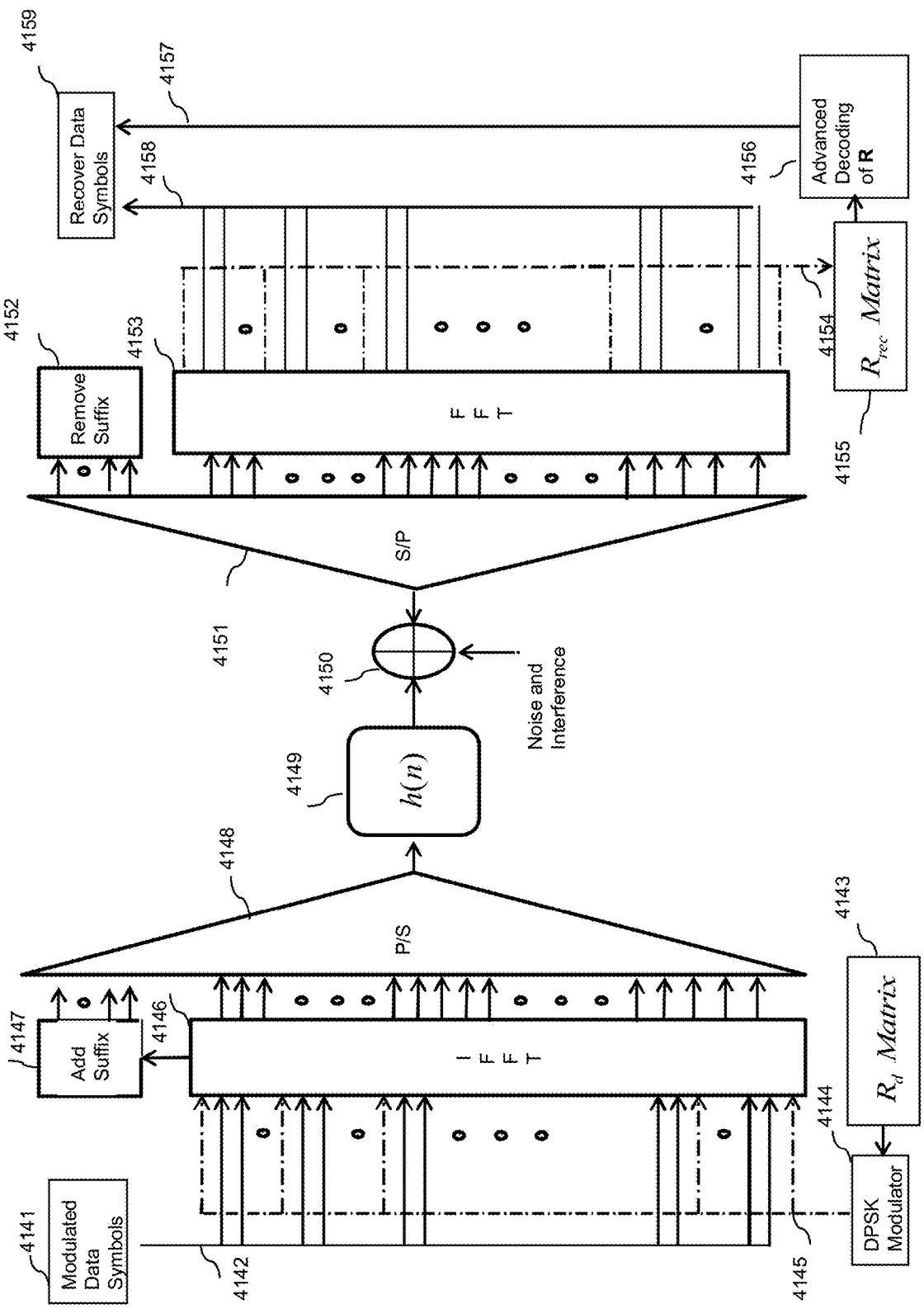
FIG. 27 is a block diagram of an FM HD Radio OFDM system showing multiplexing/demultiplexing of reference and data subcarriers.

FIG. 27 is a schematic diagram detailing the operation of the OFDM signal generation block 4107 in FIG. 25. The modulated data symbols in block 4141 represent the QPSK symbols on the data streams 4109, 4110, 4111 in FIG. 25. The data symbols on line 4142 are, after symbol and OFDM subcarrier mapping, supplied to the Inverse Fast Fourier Transform (IFFT) block of length N 4146. Similarly, the R$_d$ matrix which contains control data sequence bits to facilitate channel estimation, synchronization, as well as other control functions for the overall HD Radio system operation, is formed in block 4143 and modulated by the DPSK modulator in block 4144. The DPSK modulated control symbols on line 4145, equivalent to R matrix on line 4112 in FIG. 25 are supplied to the IFFT block 4146. Both the data and control data symbols (the latter will be used in the receiver to facilitate block synchronization and channel estimation, among other functions) are processed by the IFFT of length N in block 4146 to transform the data and control symbol sequences into the time domain. The resulting time domain signal is also supplied to block 4147 in which a suffix, whose length is chosen to be longer than the expected delay spread, e.g., 7/127 of the OFDM symbol duration T$_s$, to avoid the inter symbol interference (ISI), is formed. The outputs of block 4146 and block 4147 are processed by the parallel to serial (P/S) block 4148 to form a set of OFDM symbols and converted to an analog OFDM signal before transmission on the RF carrier (not shown).

OFDM signal is transmitted over a multipath channel (block 4149 in FIG. 27) and then noise is added (block 4150), representing thermal noise in the receiver and possibly other sources of interference. After initial frequency and timing synchronization and frequency down conversion (RF demodulation), the received signal is sampled and processed by serial to parallel (S/P) block 4151 and its output is supplied to block 4152 and block 4153 where removal of the suffix part and fast Fourier transform (FFT) take place, respectively, to transform the data and control sequences back into the frequency domain samples. The output of the FFT block on line 4154 is supplied to block 4155 to form the received DPSK-modulated signal matrix R, denoted at the receiver as R$_{rec}$ that will be used to decode the system control data sequence matrix R'$_d$ in the Advanced Decoding of R block 4156. A prior art method or preferably certain embodiments may be applied in block 4156 to decode the DPSK-modulated matrix R$_{rec}$ that carries necessary information to decode the data coherently in block 4159. The output of the FFT block on line 4158 is also supplied to block 4159 to recover the data symbols utilizing the signal on line 4157 from the block 4156.

Figure 28:
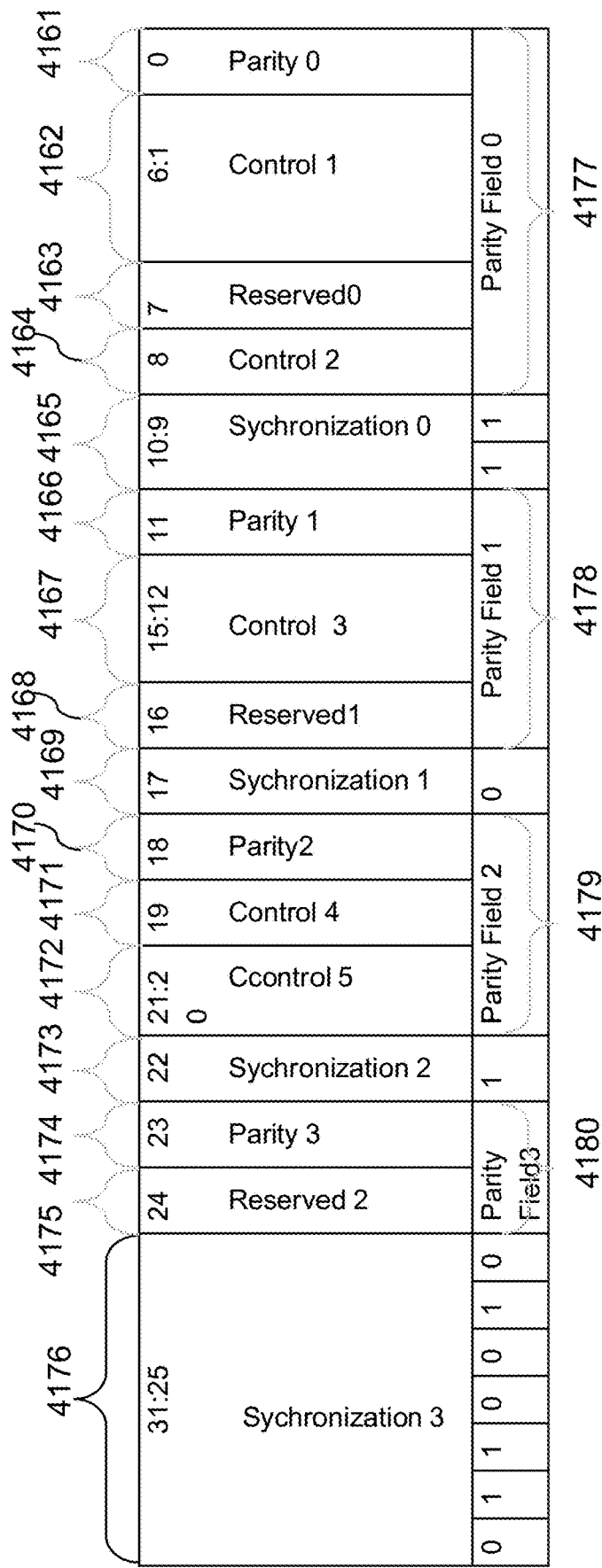
FIG. 28 depicts control data sequence fields in FM HD Radio systems.

FIG. 28 shows a schematic representation of the M-bit system control data sequence (SCDS). In HD Radio systems, M=32 but a different value of M could be used as applicable to a radio system design. This system control data sequence also corresponds to one of the P rows of R$_d$ matrix on line 4116 in FIG. 25. The system control data sequence includes synchronization, control, parity, and reserved bits. As shown in FIG. 28, eleven (11) out of thirty two (32) bits represent the known synchronization sequence (SYNC) and the SYNC bits are placed in fields 4176, 4173, 4169, and 4165, and used for block synchronization and channel estimation purposes. The system control data sequence also includes control bits in fields 4162, 4164, 4167, 4171, and 4172, and reserved bits in fields 4163, 4168, and 4175 that carry information about transmit block counts and other information pertinent to the frame structure that carries the data sequences 4109, 4110, and 4111 in FIG. 25. Moreover, the system control data sequence also includes four parity bits in fields 4161, 4166, 4170, and 4174 to protect bits in the parity fields 4177, 4178, 4179, and 4180, and possible inventive use of the parity bits in HD Radio systems will be discussed subsequently.

TABLE 10

| SCDS Bits | Bit Positions | U |
|---|---|---|
| Synchronization 0/1/2/3 | 31-25, 22, 17, 10-9 | 30 |
| Reserved 2/1/0 | 24, 16, 7 | 30 |
| Parity 3/1/0 | 23, 11, 0 | 30 |
| Control 4/3/2/1 | 19, 15-12, 8, 6-1 | 30 |
| Control 5 | 21-20 | 6/8/8/8 |
| Parity2 | 18 | 6/8/8/8 |

When one or more particular fields (or bit patterns) are repeatedly used in U system control data sequences in a processing block, i.e., (P×M) matrix R$_d$, the transmitted bits corresponding to those fields (or bit patterns) in the system control data sequence are repeated (i.e., carried) on U reference subcarriers. Table 10 shows an example of this repetition of particular fields or bit patterns in the system control data sequence for a case of thirty (30) reference subcarriers, i.e., P=30, as used in the Primary Service Mode of operation in the hybrid FM HD Radio system. As shown in the table, in this example, most bits in the system control data sequence are repeated over all subcarriers except for Control 5 bits in the field 4172, where the reference subcarrier identification (RSID) bits are transmitted in the HD Radio system. In these Control bits, their protection bit, Parity 2 in the field 4170, may be different over their respective reference subcarriers. However, clearly, in the FM HD Radio system, frequency diversity is provided to those particular fields and/or bit patterns by transmission of the identical modulated symbols on multiple reference subcarriers and/or subbands. Likewise, with the concatenation of a plurality (e.g., q) of (P×M) R$_d$ matrices that are transmitted on q·M OFDM symbols, time diversity is provided to those particular fields and/or bit patterns in a sequence over q consecutive (P×M) blocks in time.

Figure 29:
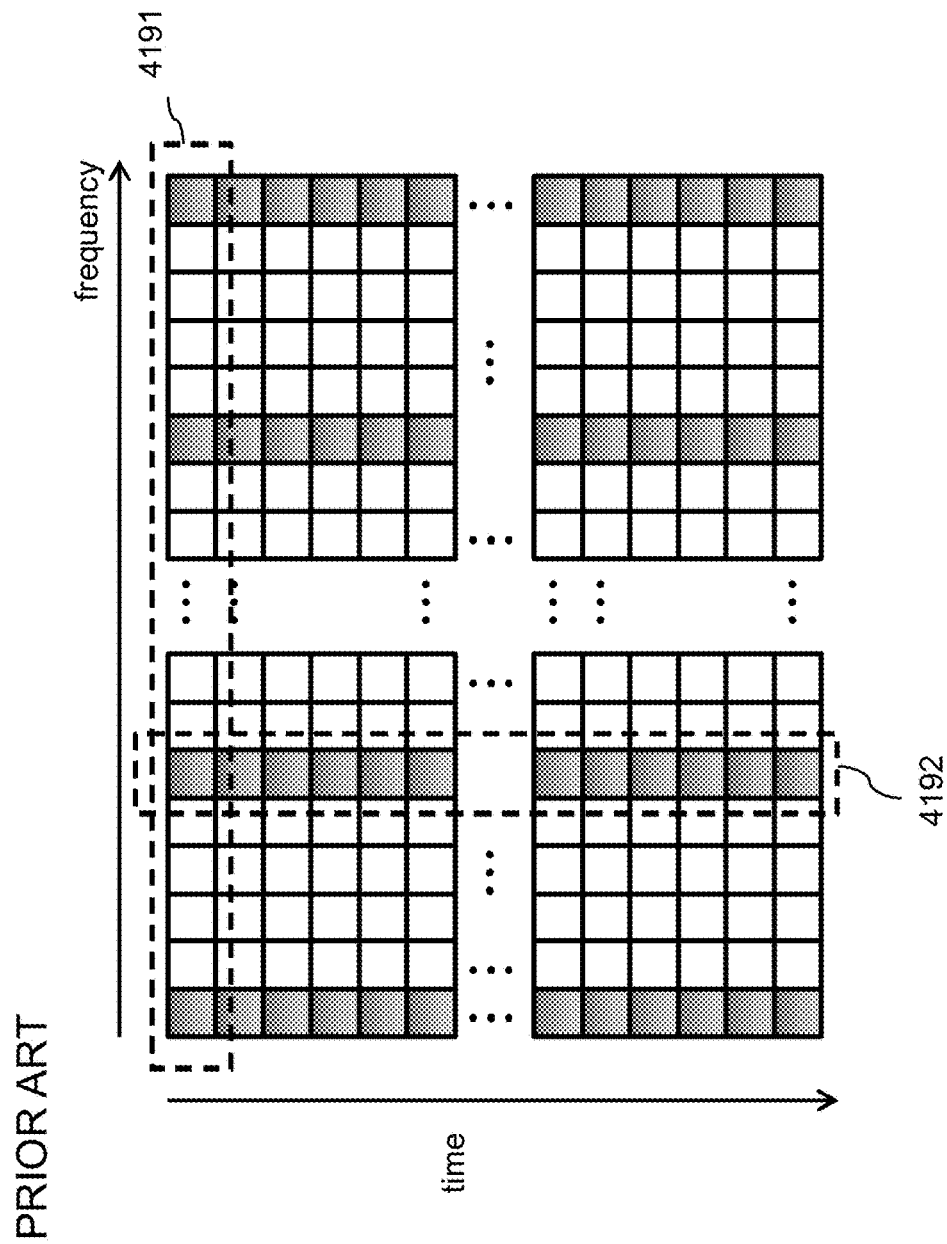
FIG. 29 is a conceptual representation of reference subcarriers (carrying the system control data sequence) and data subcarriers in time-frequency plane in FM HD Radio systems.

FIG. 29 shows a mapping of system control data sequence bits (or modulation symbols after symbol mapping) onto a set of reference subcarriers 4192 and a plurality of OFDM symbols 4191. The control data sequence bits (or modulation symbols) are carried on the reference subcarriers (shaded ones) distributed over the OFDM spectrum (on the frequency axis). In reference to certain embodiments mentioned earlier, there are P (=up to 61) reference subcarriers and those P reference subcarriers are distributed throughout the OFDM spectrum. In this exemplary embodiment, the mapping of system control data sequence bits (or modulation symbols) onto reference subcarriers resembles the method in extended hybrid spectrum of the HD Radio FM air interface that utilizes the primary sidebands within its defined spectrum band.

The binary reference matrix $R_d$ on line 4116 in FIG. 25 can be expressed as $$R_d = \begin{bmatrix} d_{1,1} & d_{1,2} & L & d_{1,M-1} & d_{1,M} \\ d_{2,1} & d_{2,2} & L & d_{2,M-1} & d_{2,M} \\ M & M & O & M & M \\ d_{P-1,1} & d_{P-1,2} & L & d_{P-1,M-1} & d_{P-1,M} \\ d_{P,1} & d_{P,2} & L & d_{P,M-1} & d_{P,M} \end{bmatrix} \quad (31)$$

where indexes P and M correspond to the number of reference subcarriers and the total number of OFDM symbols, respectively. As mentioned earlier, some elements of the $R_d$ matrix are repeated in the pre-defined rows to enhance the performance at the receiver. Then, each row of matrix $R_d$ is DPSK-modulated and transmitted on one of the reference subcarriers 4191 in FIG. 29.

Regarding the DPSK modulation of matrix $R_d$, the differentially encoded sequence $c_{p,m}$ is generated from the elements of $R_d$, $\{d_{p,m}\}$, by taking a modulo-2 addition of $d_{p,m}$ and the immediately preceding encoded bit, $c_{p,m-1}$, and can be written as $$c_{p,m} = d_{p,m} \oplus c_{p,m-1} \quad (32)$$

where $\oplus$ denotes the modulo-2 addition. The constellation for the resulting modulated signal element, $R_{p,m}$, of the R matrix on line 4112 in FIG. 25 (or equivalently, on line 4145 in FIG. 27) is given by $$R_{p,m} = \begin{cases} -1 & \text{if } c_{p,m} = 0 \\ 1 & \text{if } c_{p,m} = 1 \end{cases}. \quad (33)$$

In reference to FIG. 26 and FIG. 27, the received OFDM signal on line 4128 in FIG. 26 is demodulated by the FFT block 4153 in FIG. 27 and the DPSK-modulated reference symbols 4154 in FIG. 27 are extracted from the reference subcarriers to form $R_{rec}$ and written as $$R_{rec} = \begin{bmatrix} r_{1,1} & r_{1,2} & L & r_{1,M-1} & r_{1,M} \\ r_{2,1} & r_{2,2} & L & r_{2,M-1} & r_{2,M} \\ M & M & O & M & M \\ r_{P-1,1} & r_{P-1,2} & L & r_{P-1,M-1} & r_{P-1,M} \\ r_{P,1} & r_{P,2} & L & r_{P,M-1} & r_{P,M} \end{bmatrix} \quad (34)$$

where $r_{i,j}$, i=1, . . . , P and j=1, . . . , M, are complex numbers. The purpose of decoding matrix R blocks, 4122 and 4123, in FIG. 26 (or equivalently, the block 4156 in FIG. 27) is to obtain the $R_d$ matrix at the receiver that will be further utilized for CSI estimation and synchronization in block 4124 in FIG. 26.

Figure 30:
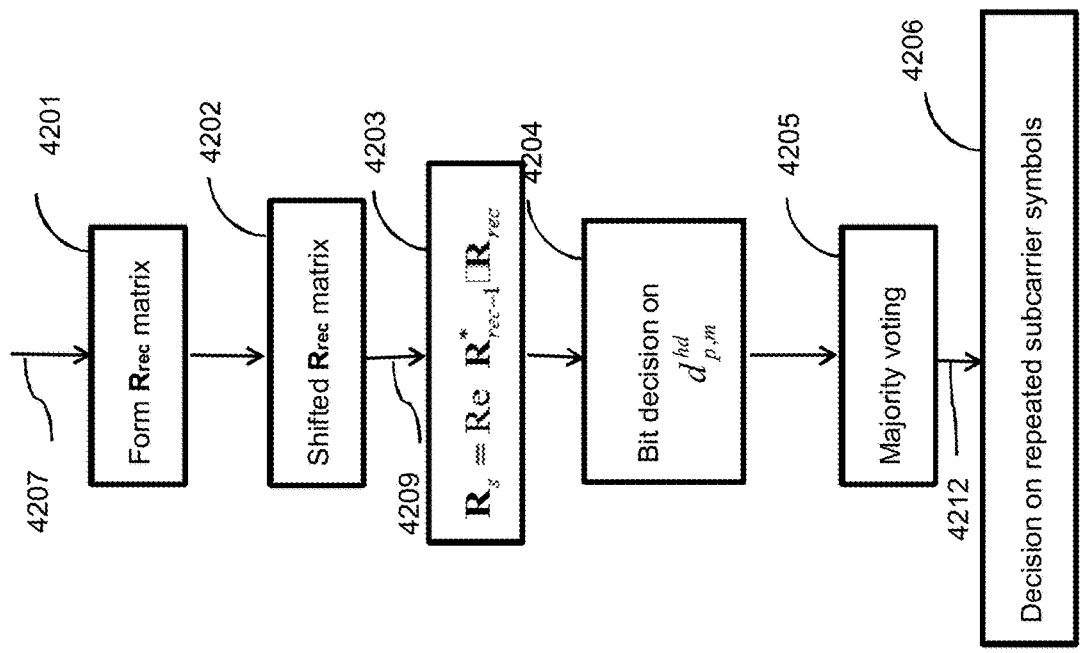
FIG. 30 is a diagram of processing flow for decoding of the system control data sequence bits with hard decisions and majority voting in conventional receivers.

The following is intended to describe processes for decoding of the system control data sequence bits using soft diversity combining according to certain principles of the invention. To help provide context for such processes, an exemplary method that is known in the art is first described. Such a method is based on majority logic combining of hard decisions on individual reference subcarriers, as described in U.S. Pat. No. 7,724,850. This technique is herein referred to as the Majority Voting Combining (abbreviated as "MVC"). In reference to the processing flow shown in FIG. 30, it can be further summarized as follows.

Step 1: From the received demodulated OFDM signal on line 4207, form the $R_{rec}$ matrix (block 4201).

Step 2: Construct a shifted version of $R_{rec}$ (block 4202) denoted as $R_{rec-1}$ such that the output on line 4209 can be written as $$R_{rec-1} = [I(P, 1), R_{rec}(:, 1:M-1)] \quad (35)$$

$$= \begin{bmatrix} -1 & r_{1,1} & L & r_{1,M-2} & r_{1,M-1} \\ -1 & r_{2,1} & L & r_{2,M-2} & r_{2,M-1} \\ M & M & O & M & M \\ -1 & r_{P-1,1} & L & r_{P-1,M-2} & r_{P-1,M-1} \\ -1 & r_{P,1} & L & r_{P,M-2} & r_{P,M-1} \end{bmatrix}.$$

where I(P,1) is a P×1 zero vector with its elements being a logical bit value of 0 mapped onto amplitude of −1.

Step 3: Obtain the element-wise product matrix $R_s$ (block 4203) by $$R_s = \text{Re}\{R_{rec-1}^* \bullet R_{rec}\} \quad (36)$$

where '●' denotes the operation of element-by-element multiplication and Re{g} is the operator to select the real part of the complex number. Note that in (35) a commonly accepted notation x(m:n) is used to extract entries m through n of vector x, and a notation X($m_1$:$n_1$,$m_2$:$n_2$) is to extract the sub matrix from rows $m_1$ through $n_1$ and from columns $m_2$ through $n_2$. The initial value of DPSK modulated signal is set to "−1" for each reference subcarrier. The product matrix $R_s$ can be further written as $$R_s = \text{Re}\left\{ \begin{bmatrix} -1^* r_{1,1} & r_{1,2}^* r_{1,1} & L & r_{1,M-2}^* r_{1,M-1} & r_{1,M-1}^* r_{1,M} \\ -1^* r_{2,1} & r_{2,2}^* r_{2,1} & L & r_{2,M-2}^* r_{2,M-1} & r_{2,M-1}^* r_{2,M} \\ M & M & O & M & M \\ -1^* r_{P-1,1} & r_{P-1,2}^* r_{P-1,1} & L & r_{P-1,M-1}^* r_{P-1,M-1} & r_{P-1,M-1}^* r_{P-1,M} \\ -1^* r_{P,1} & r_{P,2}^* r_{P,1} & L & r_{P,M-1}^* r_{P,M-1} & r_{P,M-1}^* r_{P,M} \end{bmatrix} \right\}, \quad (37)$$

and with $d_{p,m}^s$ defined as the $(p,m)^{th}$ element of $R_s$ for notational simplicity, it is further written as $$R_s = \begin{bmatrix} d_{1,1}^s & d_{1,2}^s & L & d_{1,M-1}^s & d_{1,M}^s \\ d_{2,1}^s & d_{2,2}^s & L & d_{2,M-1}^s & d_{2,M}^s \\ M & M & O & M & M \\ d_{P-1,1}^s & d_{P-1,2}^s & L & d_{P-1,M-1}^s & d_{P-1,M}^s \\ d_{P,1}^s & d_{P,2}^s & L & d_{P,M-1}^s & d_{P,M}^s \end{bmatrix} \quad (38)$$

Step 4: Obtain hard decision on each element of the $R_s$ matrix (block 4204) as follows:

$$d_{p,m}^h = d_{p,m}^s \overset{m_1}{\underset{m_2}{\gtrless}} 0 \quad (39)$$

where $m_1$ and $m_2$ are the decision values of $d_{p,m}^h$ that correspond to bit "0" and bit "1", respectively. The four steps above leading to (39) are indeed for non-coherent differential demodulation. The non-coherent differential demodulation is employed in the prior art as the entries in $R_{rec}$ correspond to the entries of the DPSK-modulated signal matrix R in the transmitter.

Step 5: For the m-th control sequence bit repeated $U_m$ times and placed on $U_m$ reference subcarriers, majority voting 4205 (which is referred to as majority voting combining) is performed after finding hard decisions on all elements of $R_s$. Generally, $U_m$ is an odd number for better facilitation of the majority voting. The final decision for the $(p,m)^{th}$ element, $d_{p,m}^{hd}$, is given by $$d_{p,m}^{hd} = (d_{p_1,m}^h + d_{p_2,m}^h + L + d_{p_{U_m},m}^h) \overset{m_1}{\underset{m_2}{\gtrless}} \frac{U_m + 1}{2} \quad (40)$$

where the term in the right-hand side is the threshold for the majority voting which would be normally an odd number if $U_m$ is an odd number, and the decision values $m_1$ and $m_2$ are for bit 0 and bit 1, respectively, and $p \in \{p_m\}$, $p_m = p_1, p_2, Kp_u Kp_{U_m}$ with $p_u$ denoting the subcarrier index for one of $U_m$ subcarriers among the P reference subcarriers in the system. Although (40) could be calculated for all $U_m$ subcarriers, as the $U_m$ results would be the same, it can be performed only once for a subcarrier in the set $\{p_m\}$. In an alternative embodiment of the prior art method, if $U_m$ is an even number, a round-up (i.e., ceil( )) or down (i.e., floor( )) operation could be performed on the threshold value in the right-hand side, i.e., round-up/down $$\left(\frac{U_m + 1}{2}\right),$$

or simply, a tie could be resolved by randomly selecting a value, i.e., by flipping a coin.

Step 6: Then, the same bit decision on line 4212 is applied in block 4206 to all $U_m$ subcarriers that carry one of the repeated control sequence bits at its m-th bit position.

$$d_{(p \in p_m),m}^h = d_{p,m}^{hd} \quad (41)$$

Figure 31:
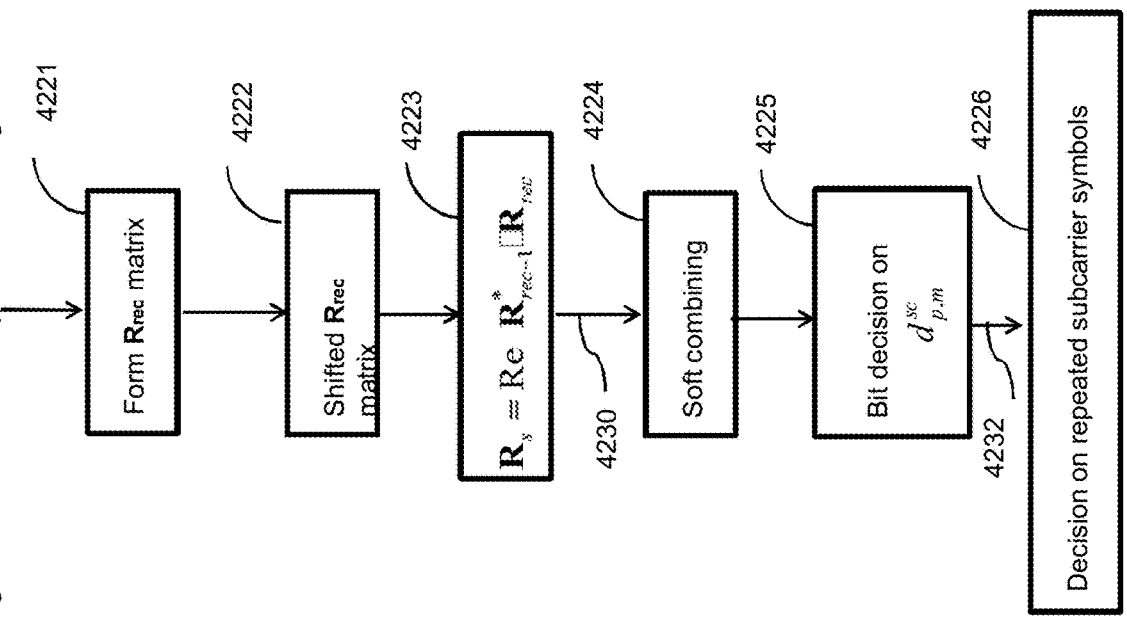
FIG. 31 is a diagram of processing flow for decoding of the system control data sequence bits with soft diversity combining in certain embodiments of the invention.

For one of the embodiments, FIG. 31 illustrates the processing flow for decoding of the system control data sequence bits with soft diversity (abbreviated as 'sd') combining with non-coherent DPSK. Soft diversity combining will facilitate better non-coherent DPSK decoding of control data sequence. As shown in FIG. 31, Steps 1 through 3, 4221, 4222, 4223, may correspond to the first three steps shown in FIG. 30, which are applied to find the $R_s$ matrix defined in (38) such that the matrix is output on line 4230. In the next step, Step 4, 'soft' values in $U_m$ subcarriers carrying the repeated system control data sequence bit are summed in block 4224 as follows $$d_{p,m}^{sc} = (d_{p_1,m}^s + d_{p_2,m}^s + L + d_{p_{U_m},m}^s) \quad (42)$$

where the superscript 'sc' represents soft combining. In the next step, Step 5, after the soft combining, hard decision on the $(p,m)^{th}$ element of $R_s$ is obtained in block 4225 by $$d_{p,m}^h = d_{p,m}^{sc} \overset{m_1}{\underset{m_2}{\gtrless}} 0 \quad (43)$$

where $m_1$, and $m_2$ are decision values of $d_{p,m}^h$ that correspond to bit "0" and bit "1", respectively, as in the prior art method. Finally, the same bit decision on line 4232 is applied in block 4226 to all $U_m$ subcarriers that carry one of the repeated bits at its m-th bit position, which is mathematically represented as follows:

$$d_{(p \in p_m),m}^h = d_{p,m}^h \quad (44)$$

where $p \in \{p_m\}$ with $p_m = p_1, p_2, K p_u K p_{U_m}$ as in the prior art method (40) mentioned earlier.

Figure 32:
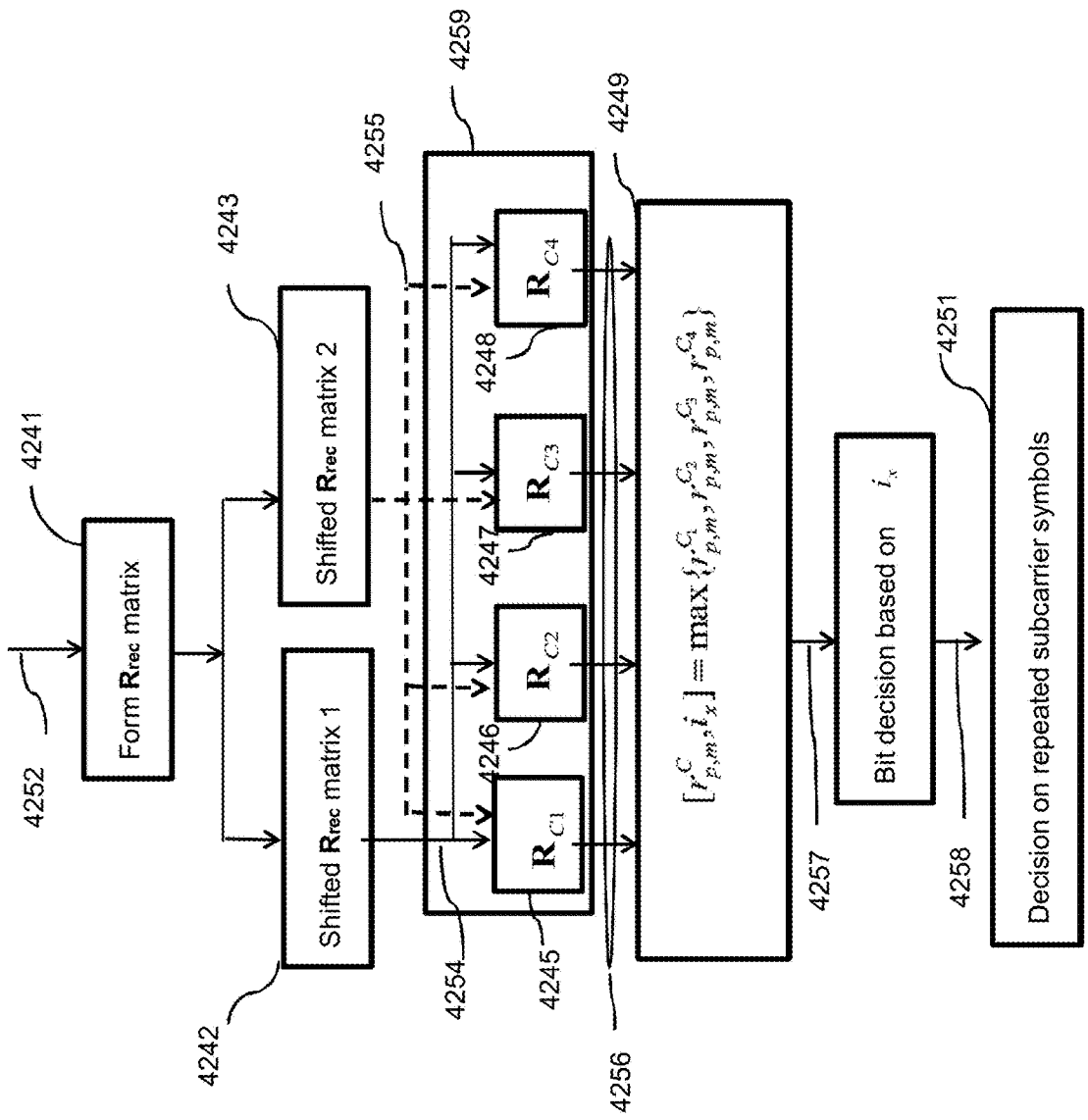
FIG. 32 is a diagram of processing flow for decoding of the system control data sequence bits with soft diversity and multiple DPSK symbol interval detection.

For another embodiment shown in FIG. 32, the decoding of the system control data sequence bits is further extended to exploit multiple symbol detection in addition to soft diversity combining. The method (MVC) in FIG. 30 and soft diversity combining (sd) embodiment in FIG. 31 use the conventional non-coherent DPSK demodulation where the actual phase is determined by the difference between the received phases of two consecutive symbols. Multiple-symbol differential detection (MSDD) method by Divsalar and Simon, which employs more than two consecutive symbols for DPSK demodulation, provides better error rate performance than the conventional DPSK demodulation. In MSDD, the received carrier phase is assumed to be constant over the time duration corresponding to the plurality of consecutive symbol intervals utilized for detection. In another embodiment shown in FIG. 32, the decoding of the system control data sequence bits employs soft diversity combining and multiple symbol detection (abbreviated as "sdm"). As an example, as the frequency response of the wireless channel may change over time, three consecutive symbols are used for the MSDD. More specifically, in reference to FIG. 32, "sdm" is performed in the following steps:

Step 1: From the received demodulated OFDM signal on line 4252, form the $R_{rec}$ matrix (block 4241) as shown in (34).

Step 2: Construct a shifted version of $R_{rec}$ denoted by $R_{rec-1}$ (block 4242) and output on line 4254, written as $$R_{rec-1} = [I(P, 1), R_{rec}(:, 1:M-1)] \quad (45)$$

$$= \begin{bmatrix} -1 & r_{1,1} & L & r_{1,M-2} & r_{1,M-1} \\ -1 & r_{2,1} & L & r_{2,M-2} & r_{2,M-1} \\ M & M & O & M & M \\ -1 & r_{P-1,1} & L & r_{P-1,M-2} & r_{P-1,M-1} \\ -1 & r_{P,1} & L & r_{P,M-2} & r_{P,M-1} \end{bmatrix}$$

where I(P,1) is a P×1 zero matrix with each logical bit value of 0 mapped onto amplitude of −1.

Step 3: Calculate another shifted version of $R_{rec}$ denoted by $R_{rec-2}$ (block 4243) and output on line 4255, written as $$R_{rec-2} = [Z(P, 1), I(P, 1), R_{rec}(:, 2:M-1)] \quad (46)$$

$$= \begin{bmatrix} 0 & -1 & r_{1,2} & L & r_{1,M-1} \\ 0 & -1 & r_{2,2} & L & r_{2,M-1} \\ M & M & O & M & M \\ 0 & -1 & r_{P-1,2} & L & r_{P-1,M-1} \\ 0 & -1 & r_{P,2} & L & r_{P,M-1} \end{bmatrix}$$

where Z(P,1) denotes a P×1 zero vector.

Step 4: The MSDD for DPSK in this embodiment is based on maximum-likelihood sequence estimation (MLSE) for three symbol intervals. This method results in four phase differential sequences. Calculate $R_{C_x}$, x=1, 2, 3, 4 (block 4259) using the following equations for the four cases.

$$R_{C_x} = \text{Re}\{(R_{rec} \cdot R_{rec-1}^*)e^{-j\Phi_k} + \text{Re}\{R_{rec-1} \cdot R_{rec-2}\}e^{-j\Phi_{k-1}} + \text{Re}\{R_{rec} \cdot R_{rec-2}^*\}e^{-(\Phi_k + \Phi_{k-1})}\} \quad (47)$$

where $C_1 = \{\Phi_k = 0, \Phi_{k-1} = 0\}$, $C_2 = \{\Phi_k = 0, \Phi_{k-1} = \pi\}$, $C)_3 = \{\Phi_k = \pi\}$, $C_4 = \{\Phi_k = \pi, \Phi_{k-1} = 0\}$. This results in $R_{C_1}$ 4245, $R_{C_2}$ 4246, $R_{C_3}$ 4247, and $R_{C_4}$ 4248 that are output on line 4256 and can be expressed, respectively, as $$R_{C_1} = \text{Re}\{R_{rec} \cdot R_{rec-1}^*\} + \text{Re}\{R_{rec-1} \cdot R_{rec-2}^*\} + \text{Re}\{R_{rec} \cdot R_{rec-2}^*\} \quad (48)$$

$$R_{C_2} = \text{Re}\{R_{rec} \cdot R_{rec-1}^*\} - \text{Re}\{R_{rec-1} \cdot R_{rec-2}^*\} - \text{Re}\{R_{rec} \cdot R_{rec-2}^*\} \quad (49)$$

$$R_{C_4} = \text{Re}\{R_{rec} \cdot R_{rec-1}^*\} + \text{Re}\{R_{rec-1} \cdot R_{rec-2}^*\} - \text{Re}\{R_{rec} \cdot R_{rec-2}^*\} \quad (51)$$

Denote the $(p,m)^{th}$ elements of $R_{C_1}$, $R_{C_2}$, $R_{C_3}$, $R_{C_4}$, respectively, as $r_{p,m}^{c1}, r_{p,m}^{c2}, r_{p,m}^{c3}, r_{p,m}^{c4}$.

Step 5: For the m-th symbol, repeated $U_m$ times and carried on the subcarriers $p \in \{p_m\}$ where $p_m = p_1, p_2, L \, p_{U_m}$, calculate the metrics $r_{p,m}^{c1}, r_{p,m}^{c2}, r_{p,m}^{c3}, r_{p,m}^{c4}$ of soft diversity combining over the subcarriers in block 4249 for the four cases with $$r_{p,m}^{c1} = \left(r_{p_1,m}^{c1} + r_{p_2,m}^{c1} + L + r_{p_{U_m},m}^{c1}\right) \quad (52)$$

$$r_{p,m}^{c2} = \left(r_{p_1,m}^{c2} + r_{p_2,m}^{c2} + L + r_{p_{U_m},m}^{c2}\right) \quad (53)$$

$$r_{p,m}^{c3} = \left(r_{p_1,m}^{c3} + r_{p_2,m}^{c3} + L + r_{p_{U_m},m}^{c3}\right) \quad (54)$$

$$r_{p,m}^{c4} = \left(r_{p_1,m}^{c4} + r_{p_2,m}^{c4} + L + r_{p_{U_m},m}^{c4}\right) \quad (55)$$

Equations (52-55) represent the probabilities of the defined cases. Among the $(p,m)^{th}$ elements of $R_{C_1}, R_{C_2}, R_{C_3}$, and $R_{C_4}$, select the index of the maximum value (block 4249) given as $$[r_{p,m}^c, i_x] = \max\{r_{p,m}^{c1}, r_{p,m}^{c2}, r_{p,m}^{c3}, r_{p,m}^{c4}\} \quad (56)$$

where $r_{p,m}^c$ and $i_x$ denote the maximum value among $r_{p,m}^{c1}$, $r_{p,m}^{c2}$, $r_{p,m}^{c3}$, $r_{p,m}^{c4}$ and its index in vector $\{r_{p,m}^{c1}, r_{p,m}^{c2}, r_{p,m}^{c3}, r_{p,m}^{c4}\}$, respectively.

Step 6: Then, with the index on line 4257, the final decision for $d_{p,m}$ is made as follows:

$$d_{p,m} = 0 \text{ if } i_x = 1 \text{ or } 2 \quad (57)$$

$$d_{p,m} = 1 \text{ if } i_x = 3 \text{ or } 4 \quad (58)$$

Step 7: Apply the same decision value of $d_{p,m}$ on line 4258 to the rest of the elements representing the repeated symbols (block 4251):

$$d_{(p_a p_m),m} = d_{p,m} \quad (59)$$

Certain aspects of the invention also incorporate a method of correcting the (even or odd) parity bit in each parity field by bit flipping when a predefined criterion is satisfied. One embodiment incorporating the bit flipping adopts a conventional bit flipping in the prior art. In the prior art, the parity bit for each parity field is calculated at the receiver and compared with the received parity bit. If they are the same, it is assumed that there is no bit error in the parity field of the decoded system control data sequence (as an even or odd parity code can correctly detect only single-bit errors), otherwise the parity field is assumed to be corrupt. When there is an error in the parity field, the error will propagate into the rest of the sequence when differential encoding is performed on the decoded system control data sequence to regenerate a DPSK signal. To prevent such error propagation caused by the single-bit error in the parity field, the received parity bit can be flipped when it does not match the calculated parity bit. This conventional parity flipping (abbreviated as "cpf") is applied to the aforementioned embodiments, i.e., those abbreviated as "sd", and "sdm", respectively, as well as the prior art method abbreviated as "MVC", to enhance the system performance. The resulting embodiments are denoted as MVC with conventional parity flipping (MVC-wcpf), sd with conventional parity flipping (sd-wcpf), and sdm with conventional parity flipping (sdm-wcpf), respectively.

Figure 33:
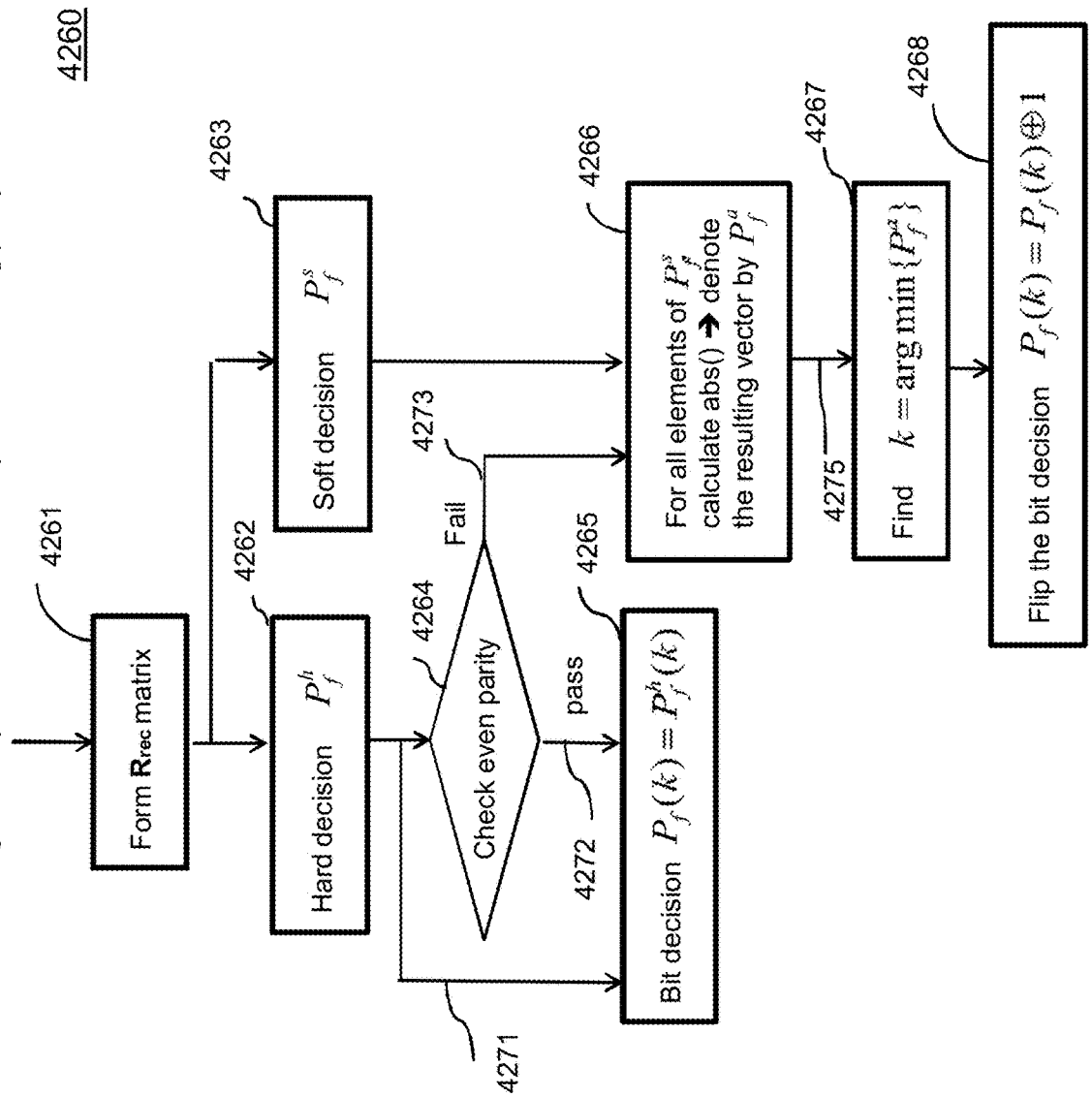
FIG. 33 is a diagram of processing flow for decoding of the system control data sequence bits with parity bit correction.

Another embodiment incorporating the parity bit flipping utilizes the reliabilities of parity-field bits to select a bit to be flipped in each parity field. In this aspect of the invention, the least reliable bit in each parity field is flipped. More specifically, according to certain embodiments, for an example of an even parity code, the $R_d$ matrix is formed at the transmitter (block 4104 in FIG. 25) with the system control data sequence shown in FIG. 28 that includes parity bits 4161, 4166, 4170, and 4174. The parity bit in a parity field can be denoted by $d_{p,m+D}$ and written as $$d_{p,m+D} = d_{p,m} \oplus d_{p,m+1} \oplus L \oplus d_{p,m+D-1} \quad (60)$$

where $d_{p,m+j}$, j=1, . . . , D−1 denote the parity-field source bits in a parity field covered by the even parity code. Then, as shown in FIG. 33, at the receiver 4260, the $R_{rec}$ matrix is formed (block 4261) as in other embodiments. Subsequently, hard bit-decisions are made on the parity-field bits and denoted by $P_f^h = [d_{p,m}^h, d_{p,m+1}^h, L, d_{p,m+D-1}^h, d_{p,m+D}^h]$ (block 4262) and its reliabilities of soft value are denoted by $P_f^s = [d_{p,m}^s, d_{p,m+1}^s, L, d_{p,m+D-1}^s, d_{p,m+D}^s]$ (block 4263). With the hard bit-decisions on line 4271, it is checked whether or not even parity is satisfied in the parity field (block 4264). For the even parity check, the following criterion is used:

$$\text{if } [d_{p,m} \oplus d_{p,m+1} \beta L \oplus d_{p,m+D-1} \oplus d_{p,m+D}] = 0 \quad (61)$$

If even parity is satisfied (or equivalently, the parity check passes) 4272, it is assumed that no errors were made in the transmission of the parity-field code word and vector $p_f^h$ on line 4271 of hard decisions of the transmitted sequence is used as the true transmitted vector (block 4265). If even parity is not satisfied 4273, which indicates that there is one error, or an odd number of errors in general, in the code word, then, the bit with the smallest reliability, most likely to be in error, among those in the code word is flipped. More details of this error correction procedure by parity bit-flipping are described in the following steps 1-2.

Step 1: Find the absolute values of all elements in $P_f^s$ (block 4266) and output the result $P_f^a$ on line 4275, written as $$P_f^a = [\text{abs}(d_{p,m}^s), \text{abs}(d_{p,m+1}^s), L, \text{abs}(d_{p,m+D-1}^s), \text{abs}(d_{p,m+D}^s)] \quad (62)$$

Step 2: Find the index of the smallest value in $p_f^a$ (block 4267) that is an identification of the least reliable bit in the vector:

$$k = \arg\min \{P_f^a\} \quad (63)$$

Equation (63) returns the index k of the minimum value in the vector. By using the index k, the k-th element of the $P_f$ is flipped in block 4268, which can be mathematically written as $$P_f(k) = P_f(k) \oplus 1 \quad (64)$$

Flipping the least reliable bit (abbreviated as "flr") is then applied to the aforementioned embodiments, abbreviated as "sd" and "sdm" to enhance the system performance. The resulting embodiments are denoted as sd with parity check (sd-wflr) and sdm with parity check (sdm-wflr), respectively.

R-matrix decoding performance of certain embodiments was evaluated via computer simulation to illustrate and confirm certain benefits of the invention. The parameters of the fading channel models used to evaluate and compare the performance of the conventional method and various embodiments are summarized for urban slow (USLOW) and urban fast (UFAST) in Table 11.

TABLE 11

| Urban Slow Rayleigh Multipath Profile(USLOW) | | | | Urban Fast Rayleigh Multipath Profile(UFAST) | | | |
|---|---|---|---|---|---|---|---|
| Ray | Delay (ms) | Doppler (Hz) | Attenuation (dB) | Ray | Delay (ms) | Doppler (Hz) | Attenuation (dB) |
| 1 | 0.0 | 0.1744 | 2.0 | 1 | 0.0 | 5.2 | 2.0 |
| 2 | 0.2 | 0.1744 | 0.0 | 2 | 0.2 | 5.2 | 0.0 |
| 3 | 0.5 | 0.1744 | 3.0 | 3 | 0.5 | 5.2 | 3.0 |
| 4 | 0.9 | 0.1744 | 4.0 | 4 | 0.9 | 5.2 | 4.0 |
| 5 | 1.2 | 0.1744 | 2.0 | 5 | 1.2 | 5.2 | 2.0 |
| 6 | 1.4 | 0.1744 | 0.0 | 6 | 1.4 | 5.2 | 0.0 |
| 7 | 2.0 | 0.1744 | 3.0 | 7 | 2.0 | 5.2 | 3.0 |
| 8 | 2.4 | 0.1744 | 5.0 | 8 | 2.4 | 5.2 | 5.0 |
| 9 | 3.0 | 0.1744 | 10.0 | 9 | 3.0 | 5.2 | 10.0 |

Figure 34:
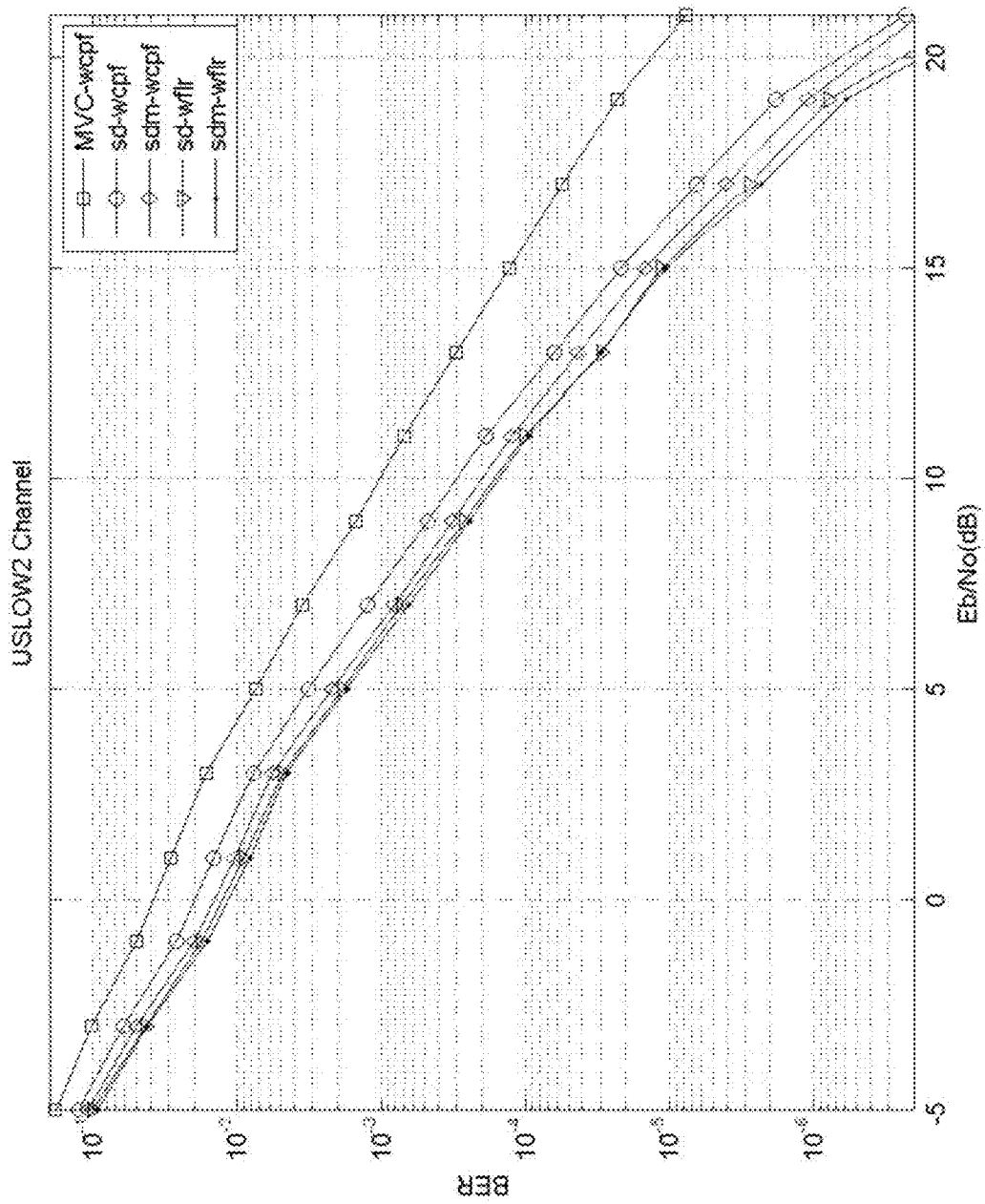
FIG. 34 illustrates the computer-simulated bit error rates (BERs) of the control data sequence of the FM HD Radio receivers in the prior art as compared to certain embodiments in a URBAN-SLOW (abbreviated as USLOW) multipath fading channel with a mobile speed of 2 kilometer per hour [KPH]
Figure 35:
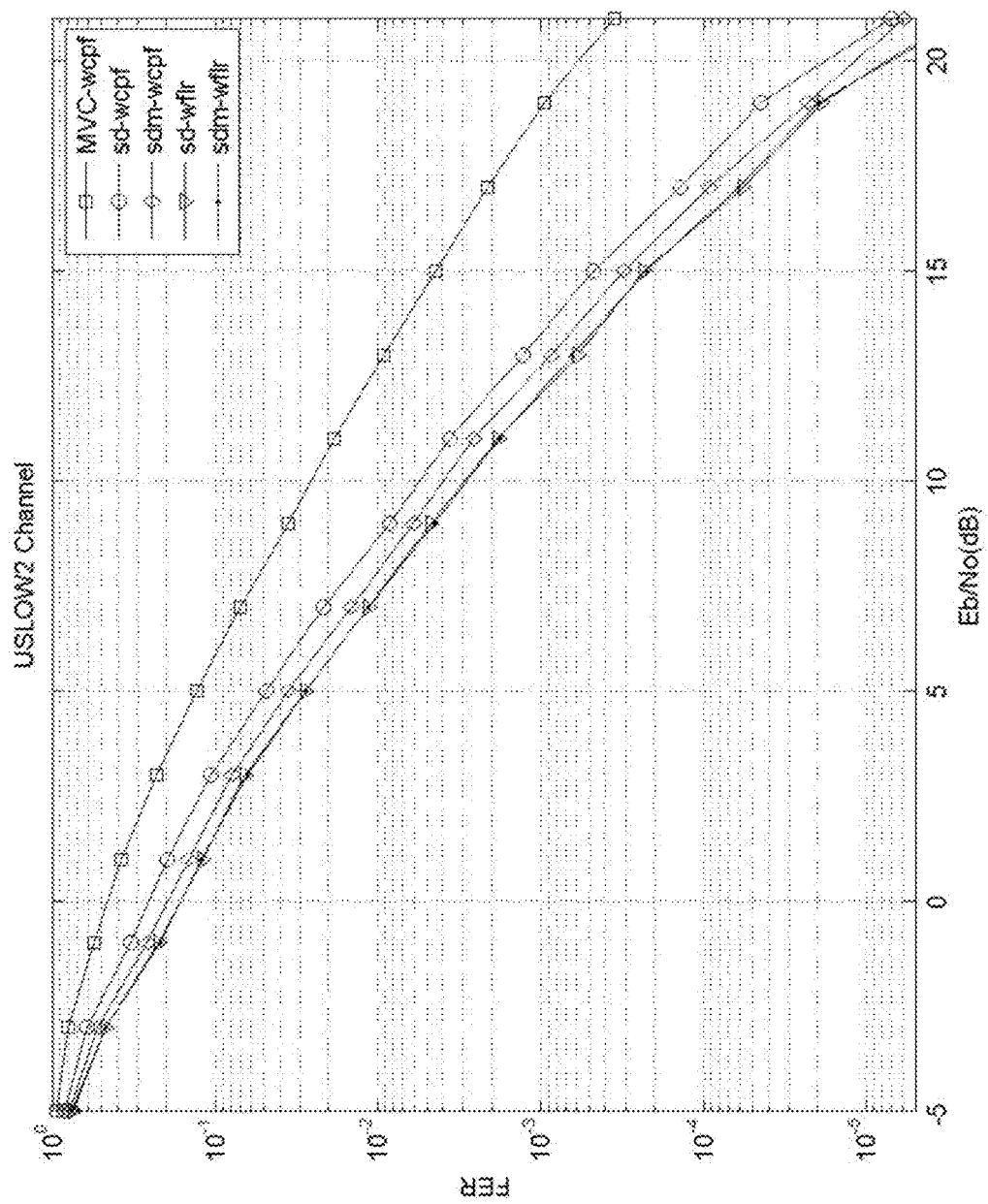
FIG. 35 illustrates the computer-simulated frame error rates (FERs) of the control data sequence of the FM HD Radio receivers in the prior art as compared to certain embodiment in a USLOW multipath fading channel with a mobile speed of 2 KPH.

FIG. 34 and FIG. 35 compare the BER and the FER performance of the majority voting combining with conventional parity flipping (MVC-wcpf) receiver with certain embodiments abbreviated as sd-wcpf, sdm-wcpf, sd-wflr, and sdm-wflr over the USLOW fading channel model, respectively. In these two figures, it is clearly shown that these embodiments outperform the prior art method referred to as the MVC-wcpf. It is also noted that the detection gain (i.e., a difference in Eb/No value in dB to get the same BER) in these embodiments over the MVC-wcpf increases as the Eb/No (or SNR) increases.

Moreover, for certain embodiments based on soft diversity combining (i.e., "sd") and soft diversity combining and multiple symbol detection (i.e., "sdm"), flipping the least reliable bit (i.e., "flr") is more effective in improving the decoding performance than the conventional parity flipping (i.e., "cpf"). It is also noted that the sd-wflr and sdm-wflr have comparable performance while the sd-wflr has lower complexity than sdm-wflr. The observed gains from the computer simulation of certain embodiments for the R matrix decoding are summarized in Table 12 in comparison to the conventional method.

TABLE 12

| MVC-wcpf | sd-wcpf | sdm-wcpf | sd-wflr | sdm-wflr |
|---|---|---|---|---|
| BER = 1e−5 | 4.2 dB | 4.9 dB | 5.3 dB | 5.4 dB |
| FER = 1e−3 | 5.5 dB | 6.3 dB | 7.0. dB | 7.0 dB |

Figure 36:
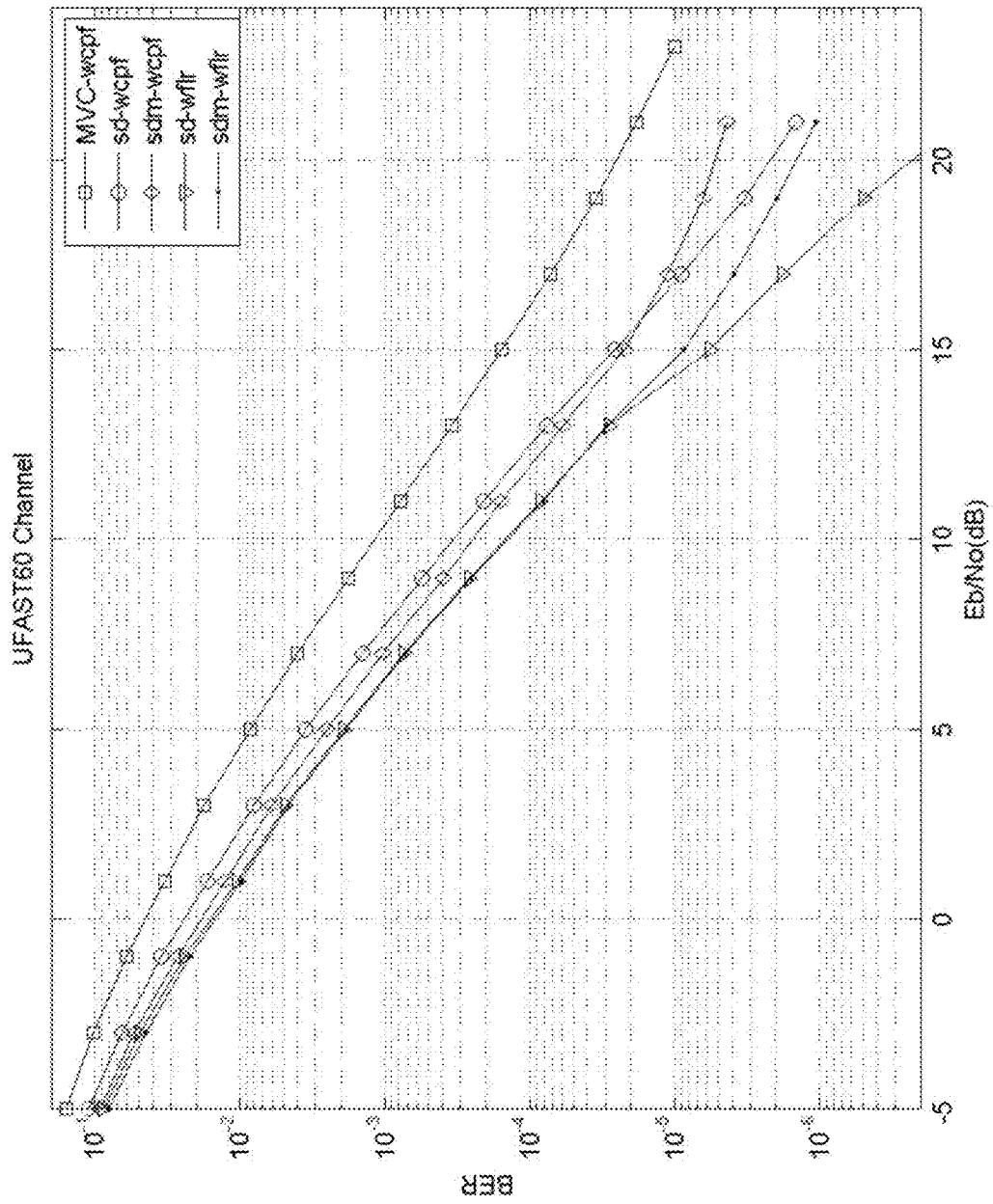
FIG. 36 illustrates the computer-simulated BERs of the control data sequence of the FM HD Radio receivers in the prior art as compared to certain embodiments in a URBAN-FAST (abbreviated as UFAST) multipath fading channel.
Figure 37:
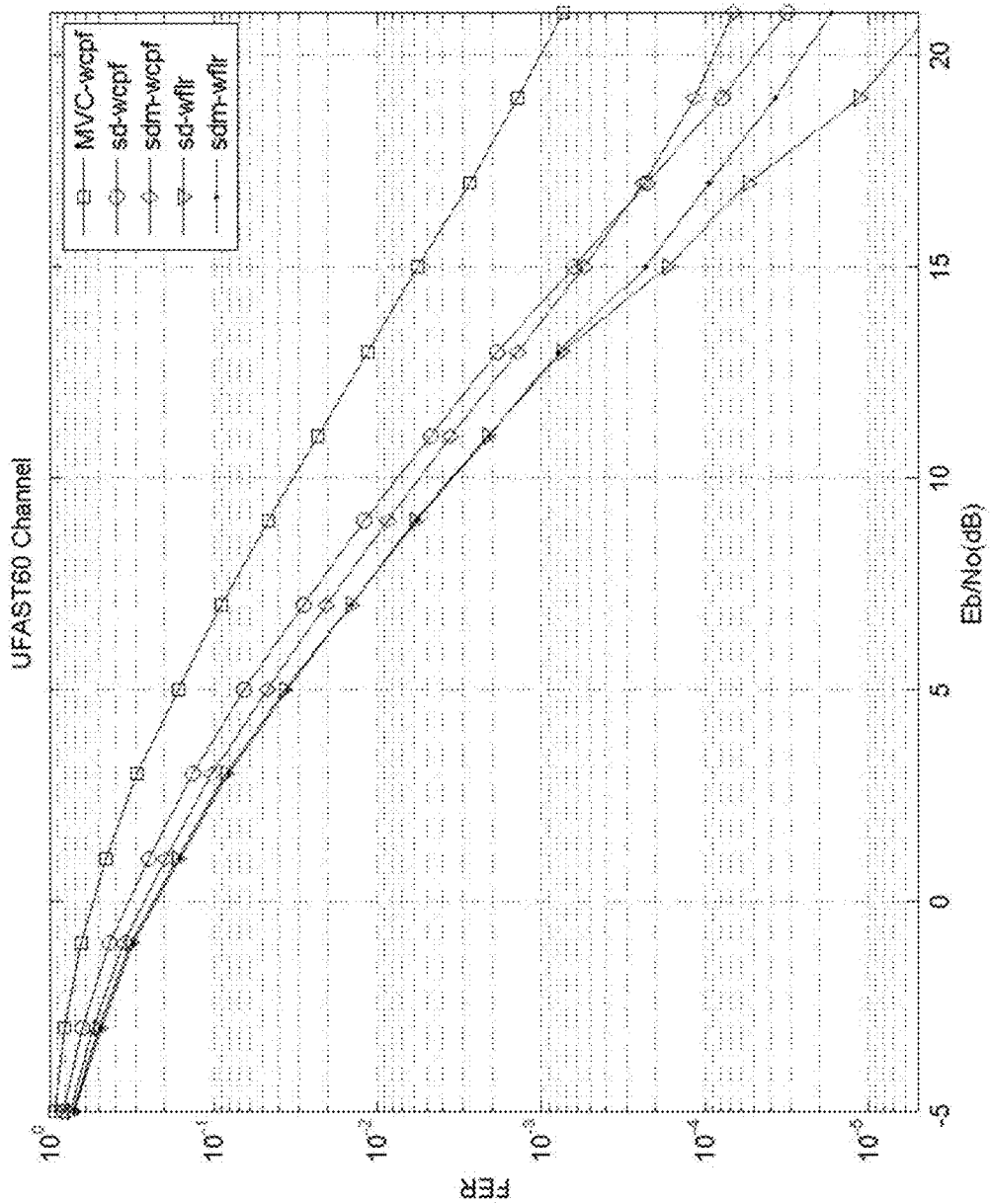
FIG. 37 illustrates the computer-simulated FERs of the control data sequence of the FM HD Radio receivers in the prior art as compared to certain embodiments in a UFAST multipath fading channel.

The conventional method and certain embodiments are also compared in terms of BER and FER in the UFAST channel in FIG. 36 and FIG. 37, respectively. In comparing FER curves in USLOW and UFAST, it is noted that the decoding performance of the prior art method and certain embodiments slightly degrade in the UFAST channel. However, it is clearly shown that certain embodiments sustain the detection gain over the MVC-wcpf even in the UFAST channel at the desired FER of $10^{-3}$. The observed gains from the computer simulation of certain embodiments for the R matrix decoding are summarized in Table 13 in comparison to the conventional method.

TABLE 13

| MVC-wcpf | sd-wflr | sdm-wflr | sd-wflr | sdm-wflr |
|---|---|---|---|---|
| BER = 1e−5 | 6.2 dB | 5.6 dB | 8.7 dB | 8.25 dB |
| FER = 1e−3 | 5.9 dB | 6.3 dB | 7.5 dB | 7.4 dB |

Application to R-Matrix Decoding in AM HD Radio Systems

Both the FM HD Radio systems and AM HD Radio systems have a similar system control data sequence structure of length M (=32) bits where synchronization and parity fields are the same in the M-bit sequence. However, in reference to FIG. 25, $R = R_d$ in the AM HD Radio systems as differential encoding is not employed. Also, the R matrix is a column vector of 256 bits as eight (8) M(=32)-bit column vectors are concatenated. Considering the symbol mapping onto BPSK signal constellation by the following rule:

Bit 0→0−j0.5 Bit 1→0+j0.5 and OFDM subcarrier mapping onto two subcarriers as

Subcarrier No. −1: −R* Subcarrier No. 1: R one can note that the system control data sequences on the two carriers are the same, i.e., elements of −R* and R. As such, the repetition factor U of the system control data sequence over the frequency domain is 2 for all bits in the sequence (while it could be much larger, depending on the field in the sequence, for the example of Primary Service Mode in the FM HD Radio system as illustrated earlier in Table).

In this case, for the decoding of $R_d$ in block 4123 of FIG. 26, upper and lower reference subcarrier are first equal gain combined by taking into account negative complex conjugation of the lower reference subcarrier. Next, in one embodiment, multiple symbol detection is also performed, with an option to perform additional combining over two or more subsequent blocks in the time domain. In other embodiments, the "conventional parity flipping" and preferably the "flipping the least reliable bit" are applicable to the AM HD Radio systems. It should be clear to those skilled in the art that although detailed description is omitted, the decoding of R (=$R_d$) matrix doesn't involve non-coherent decoding in block 4122 in FIG. 26 as differential encoding is not employed at the transmitter and coherent demodulation is facilitated by the presence of AM carrier and other auxiliary and control signals.

Channel Estimation in HD Radio Systems

Figure 38:
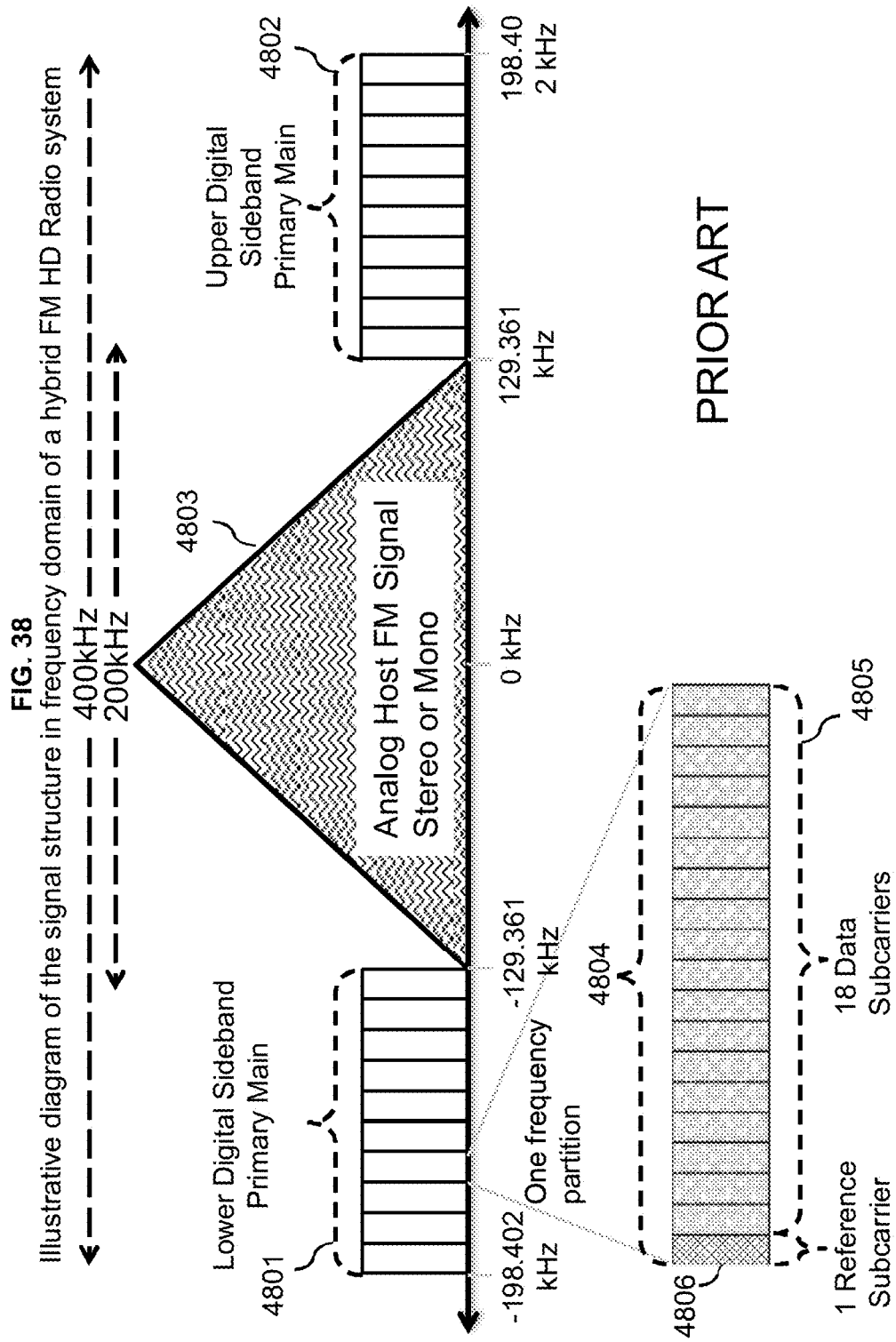
FIG. 38 illustrates the signal structure including frequency partitions of OFDM signal in the frequency domain of hybrid FM HD Radio systems.

Specifics of CSI estimation in HD Radio systems depend on the particular version, such as all-digital or hybrid, AM or FM. Without loss of generality, consider a hybrid FM mode illustrated in FIG. 38. In this example, the digital signal is transmitted in selected lower and upper primary sidebands as 4801 and 4802, respectively, while analog FM signal 4803 is shown in the middle. Each sideband contains multiple frequency partitions. One frequency partition 4804 is defined as a group of 19 OFDM subcarriers containing 18 data subcarriers 4805 and one reference subcarrier 4806 for control/synchronization purposes.

Each reference subcarrier 4806 in HD Radio system carries differentially encoded system control data sequences. Some fields of the control data sequence are known, such as SYNC bits, while others may carry control information that may repeat over subcarriers and/or consecutive blocks in time, as described in the previous embodiments. N reference subcarriers are distributed across OFDM spectrum, wherein N depends on a specific version and a mode.

The system control data sequence received on the reference subcarriers is decoded at the receiver by using the known structure of the transmitted signal according to inventive methods described in previous R-matrix embodiments. It was shown in FIG. 34-FIG. 37 that such inventive methods perform much better than prior art methods, typically by as much as 10 dB in the range of lower BERs. Such decoded and reconstructed reference subcarrier symbols are then employed as the "pilot" signals to facilitate CSI estimation according to the inventive methods of advanced CSI estimation embodiments. The specific constellation of reference subcarriers in HD Radio systems is analogous to the dedicated subcarriers case in FIG. 10a. The principal difference is that in HD Radio systems case, some "pilot" symbols on the reference subcarriers are known while others are reconstructed based on advanced decoding methods described earlier and could exhibit occasional erroneous reconstructed "pilot" symbols, which in turn may have a negative impact on CSI estimation.

Specifically for the hybrid FM case, CSI estimation is performed using the dedicated pilot scenario as described previously in the various embodiments of advanced CSI estimation. First, initial advanced CSI estimation is performed in accordance with the algorithm depicted by FIG. 15, with the corresponding descriptions, and LUTs Table 6-Table 9. Median and smoothing filters are applied to reduce the impact of additive noise and interference, host FM and possibly first adjacent FM interference. Iterative CSI estimation is also employed in accordance with the structure in FIG. 16 and corresponding descriptions. It is verified by simulations for a slow urban channel model that the decoded FERs of audio and data HD Radio channels, by employing advanced CSI methods described herein (e.g., in the second subsection), show similar and superior performances for cases of perfectly known pilots and reconstructed pilots decoded using the inventive methods or R-matrix embodiments. In contrast, using conventional single stage CSI estimation methods, such as described in U.S. Pat. Nos. 6,549,544, 7,724,850, with a fixed filter lengths suitable for a range of channel scenarios, the FER performance with reconstructed pilots may be as much as 0.5-1.0 dB worse than assuming perfectly known pilots, depending on a particular scenario.

In one embodiment, CSI estimation in AM HD Radio systems is performed using the AM carrier, reference subcarriers and training bits inserted into interleaved data sequences. CSI estimation on the AM carrier may be done by methods well known in the art. Known decoded bits on reference subcarriers are used also for CSI estimation in accordance with previous embodiments. Similarly, CSI estimation on training bits transmitted on data subcarriers are decoded in accordance with the embodiments of advanced CSI estimation. Aggregate use of all these components enables better CSI estimation.

Decoding Information Source 1 (Logical Channel P1)

As shown in FIG. 39a, the MPS PDU 4401 from Information Source 1 consists of a number of groups of information bits, e.g., MPS PDU header 4402, audio packets 4404, 4405, 4406, and program service data 4403. The MPS PDU header field 4402 contains necessary control information for proper processing of the PDU and covered by an appropriate RS code, e.g., (96,88). Depending on the length of the RS code block 4407, some part of the PSD field 4403 may be included in the RS code block. The RS parity bytes are placed in the beginning of the MPS PDU.

The PSD field 4403 begins with a flag 4411 to indicate its beginning and the PSD control 4412 and PSD Payload 4413 are protected by Cyclic Redundancy Check (CRC) parity bits field 4414. Within an MPS PDU, there may be a plurality of audio packets, e.g., 1-n. The audio packet length may be different depending on the audio codec used. Each audio packet is protected by its CRC parity bits field, e.g., 4416, 4418, or 4420.

Figure 39B:
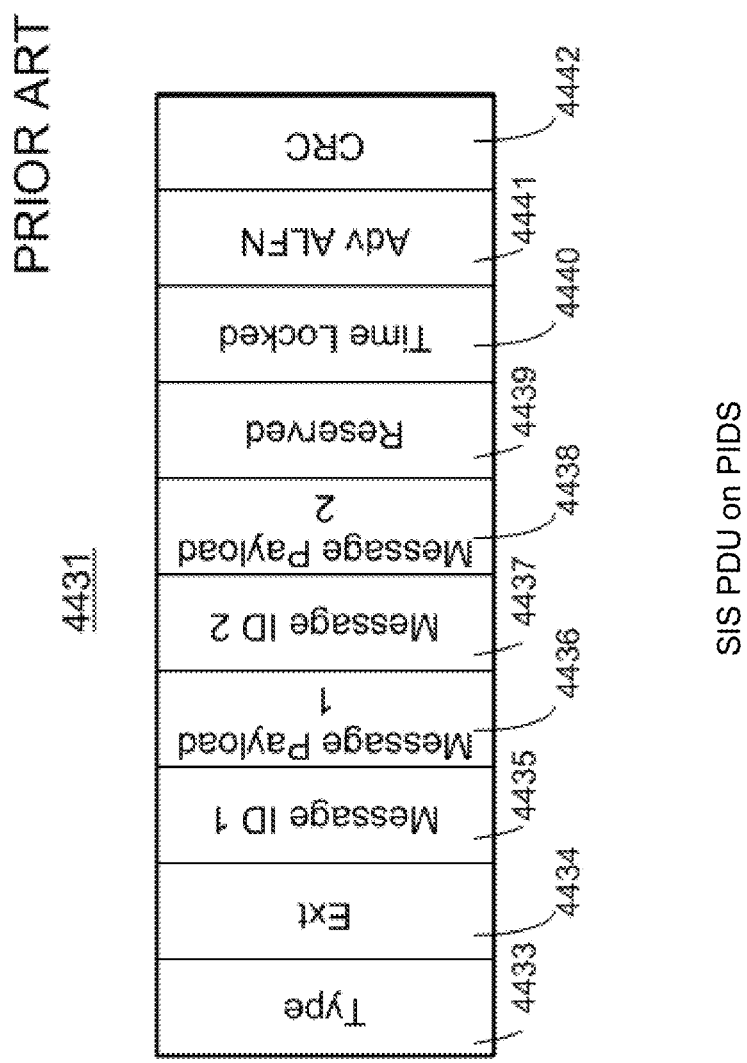

As shown in FIG. 39b, the SIS PDU 4431 consists of various fields 4433-4441, and these fields are protected by CRC parity bits field 4442. The length of SIS PDUs may be relatively short compared to the length of the MPS PDU and is typically fixed, e.g., 80.

Figure 40:
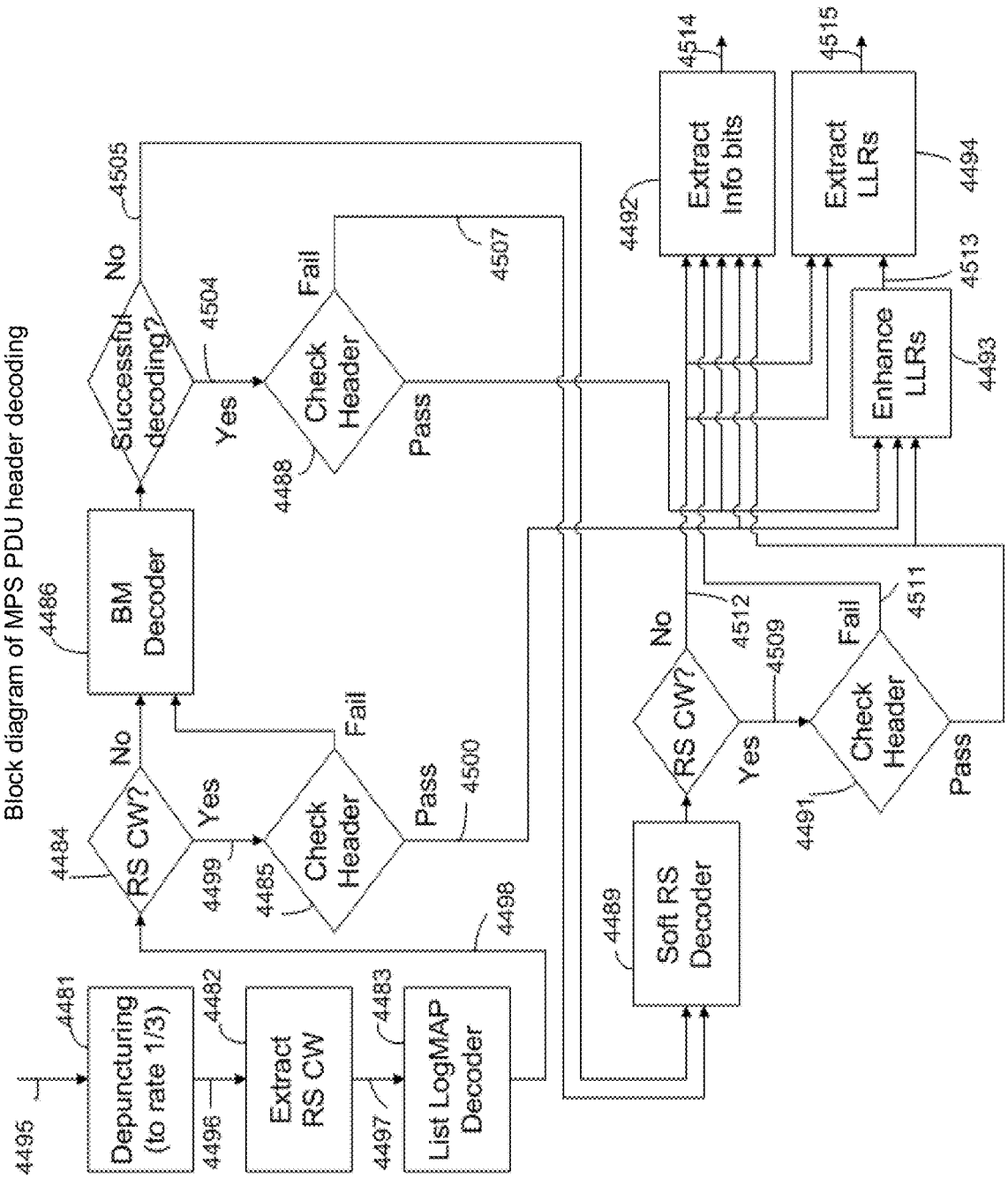
FIG. 40 is a diagram of processing flow for decoding of the MPS PDU header in accordance with certain embodiments of the invention.

FIG. 40 shows one embodiment for decoding of MPS PDU header. The signal on line 4495 in FIG. 40 is a stream of channel LLRs, which is also shown on line 4080 in FIG. 24b. After de-puncturing of the LLR stream in block 4481, i.e., inserting zero values in positions where the coded bits were punctured in the transmitter to bring the coded stream to the original code rate before puncturing, e.g., 1/3, the LLR sequence corresponding to the MPS PDU header, which corresponds to a RS codeword of length 96 bytes, is extracted in block 4482 from the stream on line 4496. This RS codeword output on line 4497 is decoded in block 4483 using a list Log-MAP decoding algorithm. The list Log-MAP decoder block produces a set of output LLRs, both information and coded bit LLRs, i.e., systematic and parity bits of the RS (96,88) codeword, and a predefined number of most likely hard-decision sequences (containing 0's and 1's) 4498 corresponding to the RS codeword. Such a predefined number, referred to as M_value, could be any integer larger than or equal to 2 (The special case M_value=1 corresponds to no list decoding). By increasing M_value, the performance of list decoding improves, but there is a diminishing return beyond a moderate M_value, say 32. In specific simulation examples of MPS PDU header decoding, M_value=32 was employed.

For the case of tail-biting convolutional code employed in HD Radio systems, tail-biting list Log-MAP decoding is employed in 4483. Since for tail-biting convolutional codes the initial encoder state is equal to the ending encoder state, Head and Tail bit sequences are used to facilitate tail-biting decoding. Specifically, for a given coded bit segment that is being decoded, say, $C=\{c_1, c_2, \ldots, c_t, c_{t+1}, \ldots, c_{N-h}, c_{N-h+1}, \ldots, c_{N-1}, c_N\}$, Head and Tail bit sequences, respectively, are added before bit $c_1$ and after bit $c_N$, respectively. Head and Tail bits are given by $H=\{c_{N-h+1}, \ldots, c_N\}$ and $T=\{c_1, \ldots, c_t\}$, such that the following sequence is being decoded $\check{C}=\{H,C,T\}$. For initialization of forward recursions in Log-MAP algorithm, from the first bit of Head sequence toward the last bit of Tail sequence, the trellis states at the beginning of the Head sequence are initiated with equal probabilities. For example, for a convolutional code with memory m, there are $2^m$ states and each state is assigned probability $1/2^m$. Similarly, for initialization of backward Log-MAP recursions, starting from the last bit of Tail sequence toward the first bit of Head sequence, all states are assigned same probability $1/2^m$ at the end of Tail sequence. The lengths of Head and Tail sequences, h and t, respectively, are selected to be several constraint lengths of the convolutional code. For example, for a convolutional code of constraint length 7, selection h=t=50 provides good results, such that no noticeable gain is observed by increasing their lengths beyond 50. This is motivated by the fact that a convolutional decoder converges to the correct sequence within few constraint lengths, which was exploited in the art previously to use a finite decoder memory in decoding of convolutional codes. Using the described Head and Tail approach, the decoding complexity for tail-biting decoding, relative to non tail-biting decoding, is increased by the factor 1+(h+t)/N, which becomes negligible for N>>h+t. As a point of reference, MATLAB tail-biting Viterbi algorithm requires processing proportional to 2·N, while still underperforming the aforementioned list Log-MAP tail-biting decoder by about a quarter dB at lower BER values, based on simulation results for fading channels.

List decoding is implemented according to the methods of Lanneman and Sundberg. In one embodiment, optimal generation of the list of most likely sequences is employed. In another embodiment, a suboptimum method is used. The list of length M_value of hard decision sequences is ordered such that the most likely sequence is the first on the list, next most likely is the second on the list, etc. In simulation results shown later, the suboptimum list generation method was used. By using the optimum list generation method, a small improvement in performance may be achieved in fading channels, although in AWGN channels the improvement is negligible with sufficiently large M_value.

Block 4484 checks, starting with the first entry in the list of hard-decision sequences on line 4498, each sequence to determine if the sequence is a RS codeword. That is, the RS (96,88) code is employed for error detection. If a valid RS codeword is declared, the codeword on line 4499 is further passed to block 4485 to check if the decoded sequence is a valid MPS PDU header by checking the consistency conditions for various fields in the MPS PDU header. The consistency check provides an additional level of error detection capability beyond that provided by the RS (96,88) code. The consistency check is performed by exploiting the deterministic relationship of some fields in the header with the corresponding fields in the previous radio frame, e.g., PDU Sequence Number in the Fixed Header part 4409 shown in FIG. 39*a* increases by one from one frame to the next frame, and similarly for other fields of the Fixed Header 4409. Also, the consistency check exploits the relationship between different fields within one MPS PDU header. For example, locator fields defined in the HD Radio standard, NOP_Lc, pointing to byte positions that delineate consecutive audio packets in the P1 logical channel of a radio frame must satisfy the following relationship, NOP_Lc(i) <NOP_Lc(i+1). In another embodiment, the consistency check could be omitted, since RS (96,88) has fairly good error detection capability, depending on the desired level of probability of undetected errors. If the sequence represents a consistent header it is passed on line 4500 to block 4492 to extract relevant information bits on line 4514 and it is also passed to block 4493 to produce enhanced LLRs on line 4513 which are passed to block 4494 to combine them with LLRs from other parts of the packet and to produce output LLRs on line 4515, if required for iterative decoding or iterative CSI estimation. Enhanced LLRs are simply hard decisions, +1 or −1, multiplied by a relatively large number. Enhanced LLRs are used for iterative decoding when the corresponding segment is declared correct, and enable to give more weight to such bit LLRs than to LLRs from other segments which may not have been declared correct and where normal LLRs would be used, which will slightly improve iterative decoding or CSI estimation.

If none of the valid sequences on line 4498 is a valid RS codeword, hard-decision RS decoding based on the Berlekamp Massey (BM) algorithm is performed on at least $L_{BM}$ of the M_value sequences in block 4486 where $L_{BM}$ is an integer less than or equal to M_value. Similarly, if none of valid RS codewords on line 4499 passes the consistency check in block 4485, the set of M_value sequences is passed to block 4486 for BM decoding as described above. If BM decoding was successful on any of these $L_{BM}$ sequences, the resulting highest ranked RS codeword on line 4504 is fed to block 4488 to see if it is a valid MPS PDU header. If so, information bits are extracted from it to line 4514 and it is also converted to enhanced LLRs on line 4513 to be used as the output LLRs on line 4515.

However, if none of the results is a valid MPS PDU header (line 4507) or BM decoding was not successful on any of the $L_{BM}$ sequences (on line 4505), the LLRs produced by Log-MAP corresponding to the RS codeword bits are fed to a soft-input soft-output (SISO) RS decoder, sometimes also referred to as 'soft' RS decoder, in block 4489. Operation and performance of soft RS decoder is explained in detail in previous embodiments. If soft RS decoding resulted in a valid RS codeword (on line 4509), it is further tested in block 4491 to see if it is a valid MPS PDU header. If so, information bits are extracted from it on line 4514 and it is also converted to enhanced LLRs on line 4513 and used as the output LLRs on line 4515. If the resulting RS codeword was not a valid MPS PDU header (on line 4511), the input LLRs to the soft RS decoder are passed to blocks 4492 and 4494 to extract information bits and output LLRs from them, respectively. When the soft RS decoder in block 4489 did not result in a valid RS codeword (on line 4512), it outputs a set of updated LLRs based on soft RS decoding employing BP decoding, as described in the corresponding embodiments. These LLRs are used in blocks 4492 and 4494 to extract information bits and output LLRs from them, respectively. The output LLRs may be used for further iterative processing shown in FIG. 46.

Since the MPS PDU header contains important information about the system and its information bits are carried on logical channel P1, it is important to decode this header as accurately as possible. In one embodiment, the MPS PDU header decoding is further improved by exploiting deterministic or probabilistic relationships of different fields either over consecutive frame intervals, or between consecutive fields. By exploiting the structure of particular fields, it is possible to improve the corresponding bits prior to RS decoding of the header. By correcting some bit errors in this manner, the error correction burden on the RS code is reduced and it may correct more erroneous code words on balance.

For example, several fields in the fixed part of the MPS PDU header in HD Radio systems, such as Stream ID, Blend Control, Latency, etc. are rarely changed and could be assumed to be constant from frame to frame. Thus, if the MPS PDU header is decoder correctly in frame (i−1), i.e., no errors are detected by the RS code, the corresponding fields could be assumed to take the same value in frame i, thus removing possible bit errors in some of the positions of these fields. Understandably, when one of these fields is changed, which occurs very rarely, the proposed approach will introduce an error even if the received bits of the corresponding field are correct. However, assuming that the frequency of changes is much slower than the bit error rate, the proposed approach is still beneficial for performance improvements. Alternatively, to minimize the adverse impact of assuming the field value from the previous frame, the field value from the previous frame could be assigned a probability that is proportional to the probability that the field will take same value in the next frame, while other possible field values could be assigned correspondingly smaller probabilities.

Some fields have deterministic relationship from frame to frame. For example, PDU Sequence Number in the fixed header part is increased by 1 from frame (i−1) to frame i, modulo the sequence number range. Thus, first time the MPS PDU header is decoded correctly, this field could be assumed to be known and to be deterministically changing from frame to frame.

Other fields may have different types of relationship. For example audio packets locator fields, referred to as Loc in the HD Radio standard, point to the last byte (CRC byte location) of the audio packet. Since there is a relatively large number of Loc fields, e.g., 24 to 40, possibly containing 16 bits each, it is very important to improve the reliability of these fields/bits prior to RS decoding. To facilitate that, one could first notice that the next Loc field takes larger value than the previous Loc field, that is $Loc(i) < Loc(i+1)$, $i = 0, 1, \ldots, NOP-2$, where NOP is the total number of audio packets in the frame, in general variable from frame to frame. This introduces a memory in the sequence of Loc fields, enabling to preprocess it with a trellis based algorithm. Although each 16-bit field in general could take any of $2^{16}$ possible values, thus suggesting a trellis with $2^{16}$ states, not all states will be possible. For example, consider the stage j of the trellis corresponding to $Loc(j)$ and consider the m-th state for $Loc(j)$. By exploiting the property that $Loc(j) < Loc(j+1)$, it is clear that stage m of $Loc(j)$ could only have transitions to states $(m+1), (m+2), \ldots, 2^{16}$ of $Loc(j+1)$. Thus, this results in a variable trellis with progressively reduced number of trellis branches/transitions.

Furthermore, the audio packets could be characterized by defining minimum and maximum audio packet lengths, Nmin and Nmax, respectively, determined by measurements of various audio traffic types and codec rates audio samples. Such information could be passed to the MPS PDU decoder as side information. This information may help further to drastically reduce the number of states in the trellis. Now the range of transitions from state m of $Loc(j)$ to the states of $Loc(j+1)$ is reduced from $(m+1) \sim 2^{16}$ to $(m+Nmin) \sim (m+Nmax)$, which will reduce trellis complexity significantly and also improve the decoding gain due to more constrained trellis, although occasionally the trellis description may not be complete when the actual packet length is either smaller than Nmin or larger than Nmax. Correspondingly, reduced trellis complexity and larger preprocessing gain could be achieved by tightening the range Nmin-Nmax, but with increased probability of incomplete trellis description which may cause an error floor at low bit error rates. Thus, a desired balance between the gain at low SNR and error floor at high SNR could be achieved by the system designer as desired.

Additional improvement could be achieved by exploiting some additional properties of the audio stream. For example, certain number of bits at the beginning of each audio frame may be constant in each audio frame, which could be provided from the audio codec as side information to the MPS PDU decoder. Such a priori knowledge of certain bits at the beginning of each audio packet can further be exploited to introduce bias of transitions through the trellis. For example, let us assume that L bits, $b\_1, \ldots, b\_L$, at the beginning of each audio packet are known. Then, for each state in the trellis of $Loc(j)$, one could examine the corresponding L bits in the audio bit sequence following the end of packet j indicated by the state of $Loc(j)$, and calculate the probability that they take values $b\_1, \ldots, b\_L$. These probabilities, in turn, could be appropriately related to the corresponding states of $Loc(j)$, thus making some states more likely than others and in that way further improving decoding of MPS PDU header. One could think of this approach as using a "diversity" approach. That is, decoding of the sequence of bits in MPS PDU header is improved by using a different sequence of bits, audio bits, by exploiting side information available for certain audio bits at the beginning of each audio frame, whereas the beginning of audio frame is related to the Loc field of the previous audio packet.

Thus, by taking soft bits from the SISO convolutional decoder output, say provided in a form of LLRs, the described trellis structure and properties could be utilized by a SISO variable trellis algorithm, such as Log-MAP, e.g., to produce improved LLRs that will be further processed by the RS decoder and enable it to achieve lower probability of incorrect decoding. By employing described techniques noticeable performance gain in decoding of MPS PDU header could be achieved.

Processing of PSD

Figure 41:
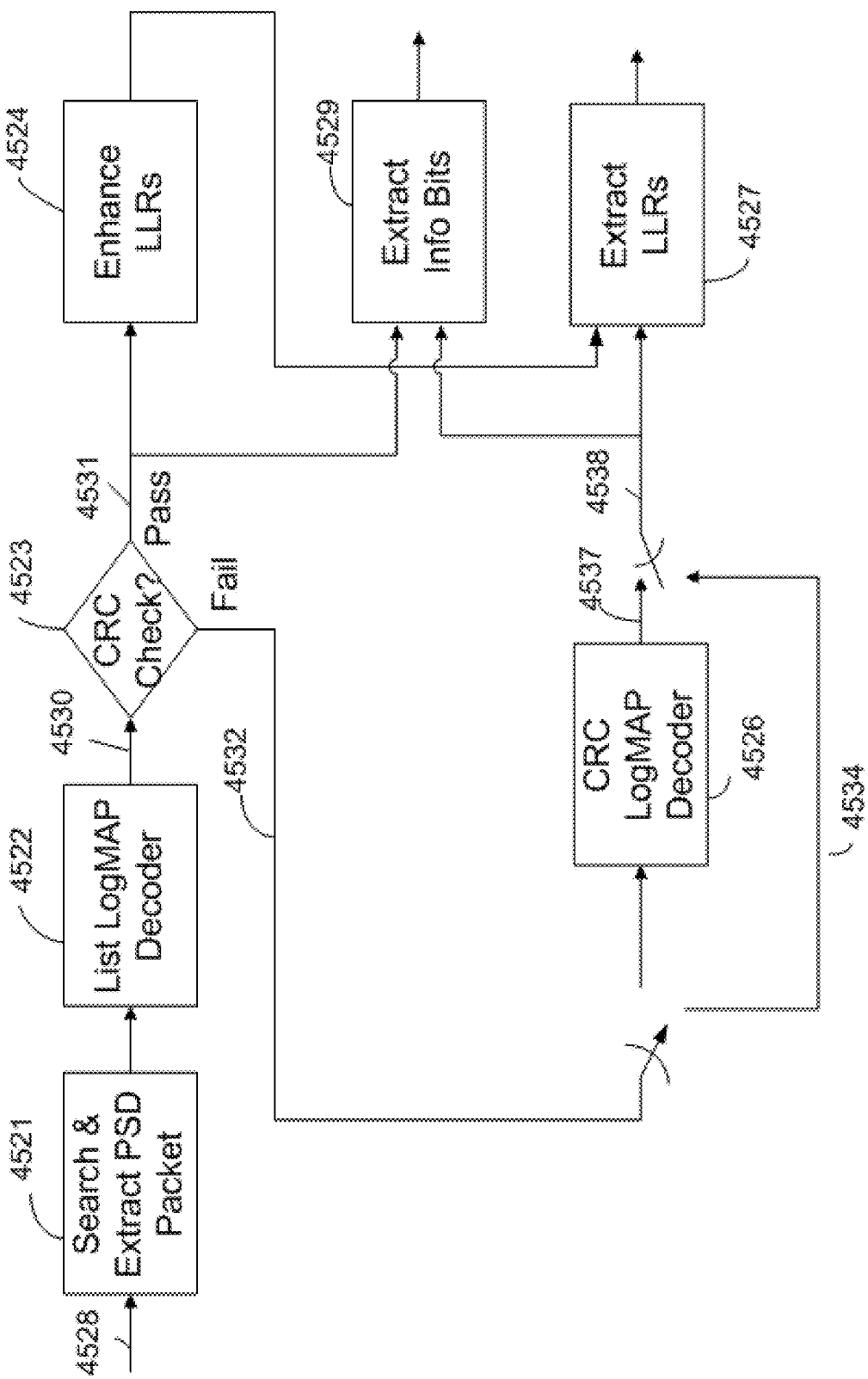
FIG. 41 is a diagram of processing flow for decoding of the PSD in accordance with certain embodiments of the invention.

FIG. 41 shows one embodiment for decoding of PSD PDUs. From a stream of channel LLRs for an MPS PDU on line 4528, which is also shown on line 4496 in FIG. 40, a PSD PDU is extracted in block 4521. Since the location of PSD PDU may not be fixed within the MPS PDU, its location is searched based on known information. One embodiment may include searching the FLAG bit pattern such as PSD Flag 4411 in FIG. 39*a* by cross-correlating the hard decoded sequence, using a sliding window. With the known FLAG pattern, select the position that maximizes the correlation peak. Another embodiment may use LLRs instead of hard decoded sequence to maximize the correlation peak, corresponding to proper alignment of the FLAG pattern.

Once the PSD PDU is found, list Log-MAP decoding is performed in block 4522 using as input the channel LLRs corresponding to the PSD PDU bits. The list Log-MAP decoder outputs bit decisions and the output LLRs of the information bits in the PSD PDU as well as a set (i.e., list) of path sequences, that is, hard-decision sequences, of binary value of 0 or 1 on line 4530. Then, CRC check is performed on the maximum a posteriori probability (MAP) bit decisions of the PSD PDU in block 4523, as known in the art. If the PSD PDU passes the CRC check 4531, its bit decisions are output as the final bit decisions in block 4529 for the information bits of the PSD PDU and each LLR value is enhanced in 4524 to a large value of magnitude preserving its polarity, e.g., 100 or −100 for logical bit 1 or 0 (or vice versa, depending on the binary bit mapping in the system). If the MAP PSD PDU sequence fails CRC check 4532, the M_value path sequences of the PSD PDU from the list decoder are then CRC-checked one at a time in block 4523 in the order they are placed in the list, until a path sequence in the list passes the CRC check. Some path sequences in the list may be the same and thus any duplicated path sequences may be removed before running this CRC check in order to reduce the processing time required to perform this operation. When the first path sequence is found that passes the CRC check 4523, the path sequence is output as the final bit decisions 4529 of the information bits of the PSD PDU and their LLR values are enhanced 4524 as described earlier. If no path sequence is found 4532 that passes the CRC check in block 4523, in one embodiment CRC Log-MAP decoding is performed 4526 on the decoder-output LLRs from block 4522. Then, the LLRs for the information bits of the PSD PDU are determined from the output LLRs of the CRC Log-MAP decoder (on line 4537) and passed to line 4538. Also, the final bit decisions for the information bits of the PSD PDU are made in block 4529 on the polarity of the output LLRs of the CRC Log-MAP decoder. In another embodiment, as an implementation alternative, if list decoding is employed in 4522, CRC Log-MAP decoding in 4526 could be skipped to reduce the processing complexity without sacrificing much the overall performance. In this case, and if CRC check 4523 fails on all sequences, the LLRs and bit decisions of the information bits of the PSD PDU are obtained from the output LLRs from block 4522 and passed via lines 4532, 4534 and 4538 to blocks 4529 and 4527. Thus, the CRC Log-MAP Decoder 4526 is optional, and is more beneficial if only Log-MAP decoding is used in 4522, and provides less gain when list Log-MAP decoding is employed in 4522. The output LLRs of information and/or coded bits may be used for further iterative processing shown in FIG. 46.

Processing of Audio

Figure 42:
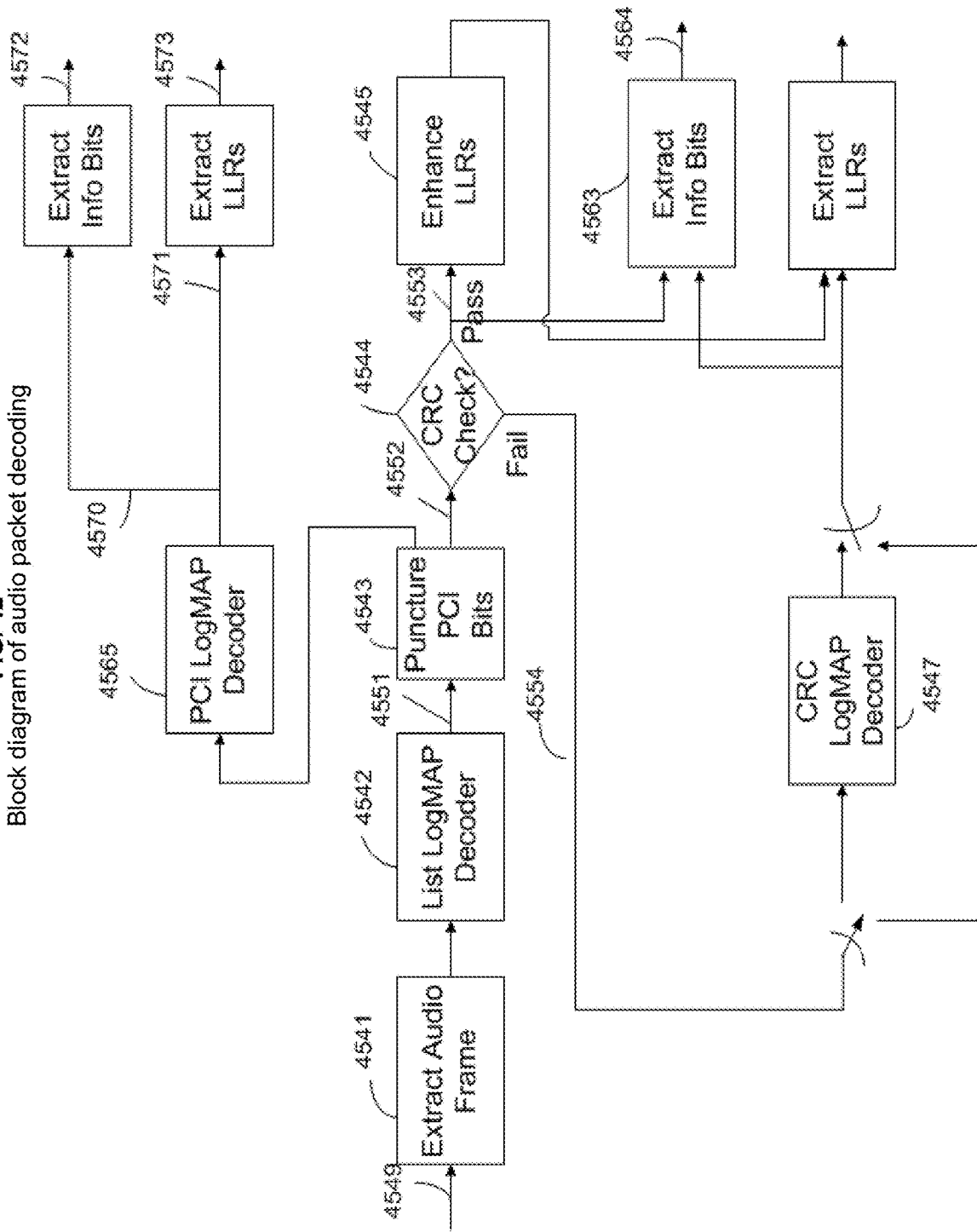
FIG. 42 is a diagram of processing flow for decoding of the audio packet in accordance with certain embodiments of the invention.

FIG. 42 shows one embodiment for decoding of audio packets. From a stream of channel LLRs for an MPS PDU on line 4549, which is also shown on line 4496 in FIG. 40, audio frames each of which includes an audio packet with a CRC field and any protocol control information (PCI) bits are extracted in block 4541.

For each audio frame output from block 4541, list Log-MAP decoding is performed in block 4542, similarly as described earlier for MPS PDU header. The list Log-MAP decoder outputs decoder-output LLRs of the information bits in the audio frame and corresponding bit decisions, as well as an ordered list of length M_value of hard decision sequences, from the most likely to the least likely, consisting of binary values 0 and 1 on line 4551. In block 4543, PCI bits are then identified and extracted and their decoder-output LLRs are collected for additional processing in block 4565. Block 4543 also outputs the bit decisions, their decoder-output LLRs, and the list of hard sequences of the audio packet on line 4552 after puncturing PCI bits from the audio frame. Then, the CRC check is performed on the MAP bit decisions of the audio packet in block 4544. If the audio packet passes CRC check (line 4553), its bit decisions are output as the final bit decisions by block 4563 to line 4564 for the information bits of the audio packet. Also, each LLR value is enhanced in block 4545 to a large value of magnitude preserving its polarity, e.g., 100 or −100 for logical bit 1 or 0 (or vice versa, depending on the binary bit mapping in the system). If the audio packet fails the CRC check in 4544 on the MAP decisions, the list of sequences of the audio packet are then CRC-checked one at a time in block 4544 in the order they are placed in the list until a path sequence in the list passes the CRC check. Some path sequences in the list may be the same and thus any duplicated path sequences may be removed before running this CRC checks in order to reduce the processing time required to perform this operation. When the first path sequence is found (line 4553) that passes the CRC check, the path sequence is output as the final bit decisions in block 4563 of the information bits of the audio packet and their LLR values are enhanced in block 4545 to a large value of magnitude preserving its polarity, e.g., 100 or −100 for logical bit 1 or 0. If no path sequence is found (line 4554) that passes the CRC check in block 4544, CRC Log-MAP decoding is optionally performed in block 4547 on the decoder-output LLRs from block 4543 via line 4554, especially when list decoding is performed in 4542. Then, the LLRs for the information bits of the audio packet are determined from the output LLRs of the CRC Log-MAP decoder (either total or extrinsic LLRs) in block 4547. Also, the final bit decisions for the information bits of the audio packet are made in block 4563 on the polarity of the output LLRs of the CRC Log-MAP decoder. As an implementation alternative in another embodiment, the CRC Log-MAP decoding in block 4547 could be skipped to reduce the processing complexity, without sacrificing much the overall performance. In this case, the LLRs and bit decisions of the information bits of the audio packet are obtained from the output LLRs from block 4543. When only Log-MAP decoding is used in block 4542, the performance gain due to optional CRC Log-MAP decoding is larger than in the case when block 4542 performs also list decoding. The output LLRs may be used for further iterative processing shown in FIG. 46.

The decoder-output LLRs for PCI bits extracted from the audio frame are processed by the Log-MAP decoder in block 4565, by fully exploiting the structure of PCI codewords. Block 4565 represents an additional Log-MAP decoder designed to decode a short-length sequence such as PCI bits obtained from a small set of code words. Once the PCI bits are processed by the Log-MAP decoder 4565, the output LLRs 4571 for the PCI bits are passed to 4573 and their bit decisions 4572 are obtained from the codeword decision on line 4570. The output LLRs may be used for further iterative processing shown in FIG. 46. Due to additional coding gain of PCI codewords, PCI bits exhibit much better performance than audio packet bits.

Figure 47:
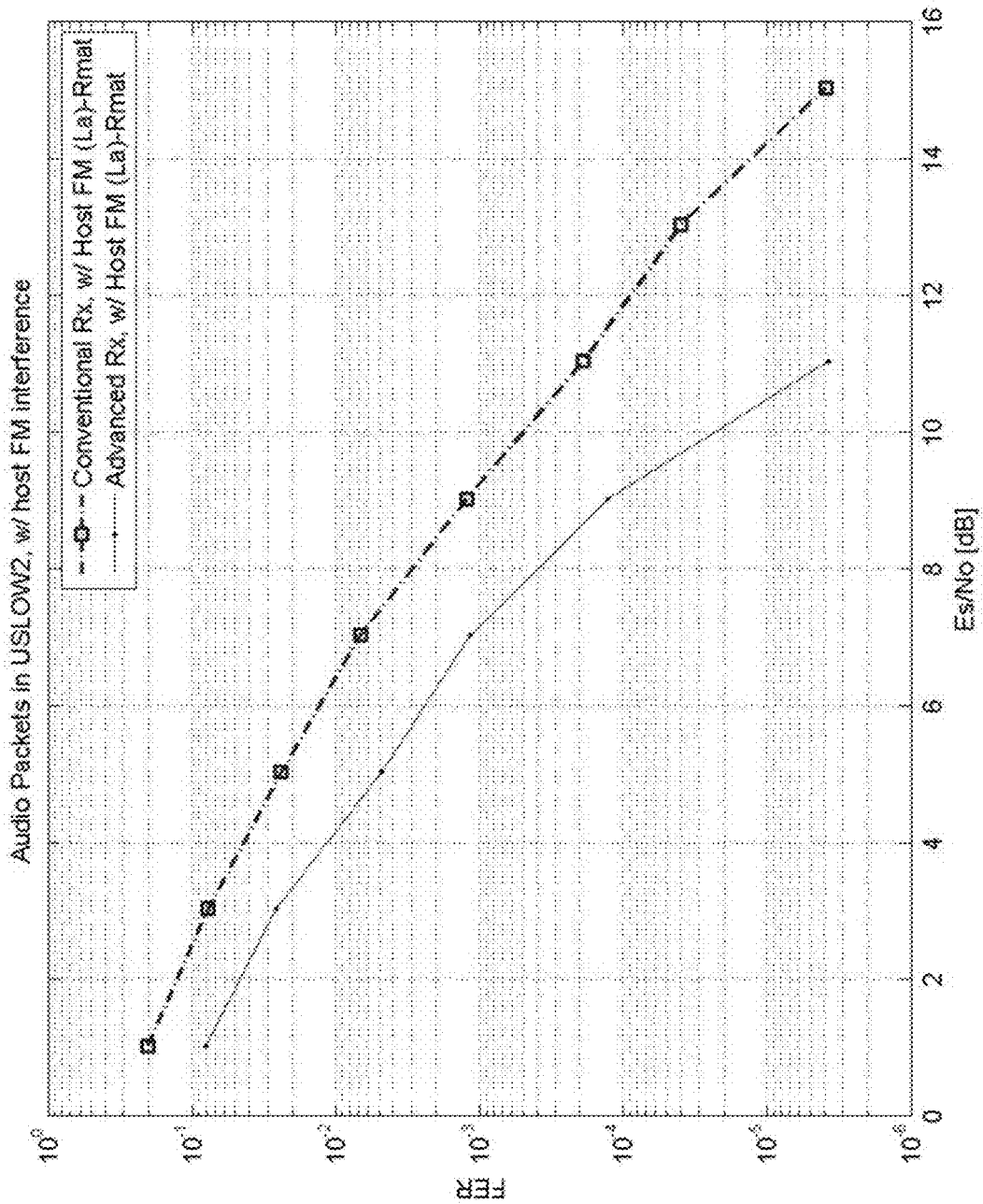
FIG. 47 illustrates the computer-simulated FERs of audio packets of the FM HD Radio receivers in the prior art and in certain embodiments of the invention in a USLOW multipath fading channel with a mobile speed of 2 KPH and in the presence of host FM interference.

FIG. 47 shows the performance of the audio component of P1 logical channel for hybrid FM HD Radio systems. The performance using advanced decoding implementing various embodiments is compared with performance using conventional methods. In this exemplary embodiment, it is assumed that digital, OFDM signal power is boosted by 10 dB (i.e., −10 dBc) relative to the level allowed by the original HD Radio standard, according to an FCC Order in 2010. Slow urban fading channel, USLOW2, is considered. The inventive methods employ advanced initial CSI estimation and one additional iterative CSI estimation stage after first FEC decoding of P1 packet employing tail-biting Log-MAP decoding. Inventive R-matrix decoding is employed to facilitate CSI estimation. After iterative CSI estimation, tail-biting list Log-MAP decoding is employed, as described earlier. The list decoder uses M_value=32. The conventional method includes a single stage CSI estimation using filter lengths over time and frequency suitable for the range of mobile speeds and frequency selectivity of the channel. The conventional method also uses tail-biting Log-MAP decoder described earlier, which provides similar, if not essentially the same, performance as MATLAB tail-biting Viterbi decoder. LLR metric calculation is implemented in the form of a linear clipper, suitable for Laplacian noise, to account for impulsiveness of host FM interference that exhibits approximately Laplacian distribution. Such a metric yields better performance than a usual LLR metric for AWGN. It can be seen that at $FER=10^{-5}$, the method according to certain aspects of the invention provides about 4 dB of gain.

Figure 48:
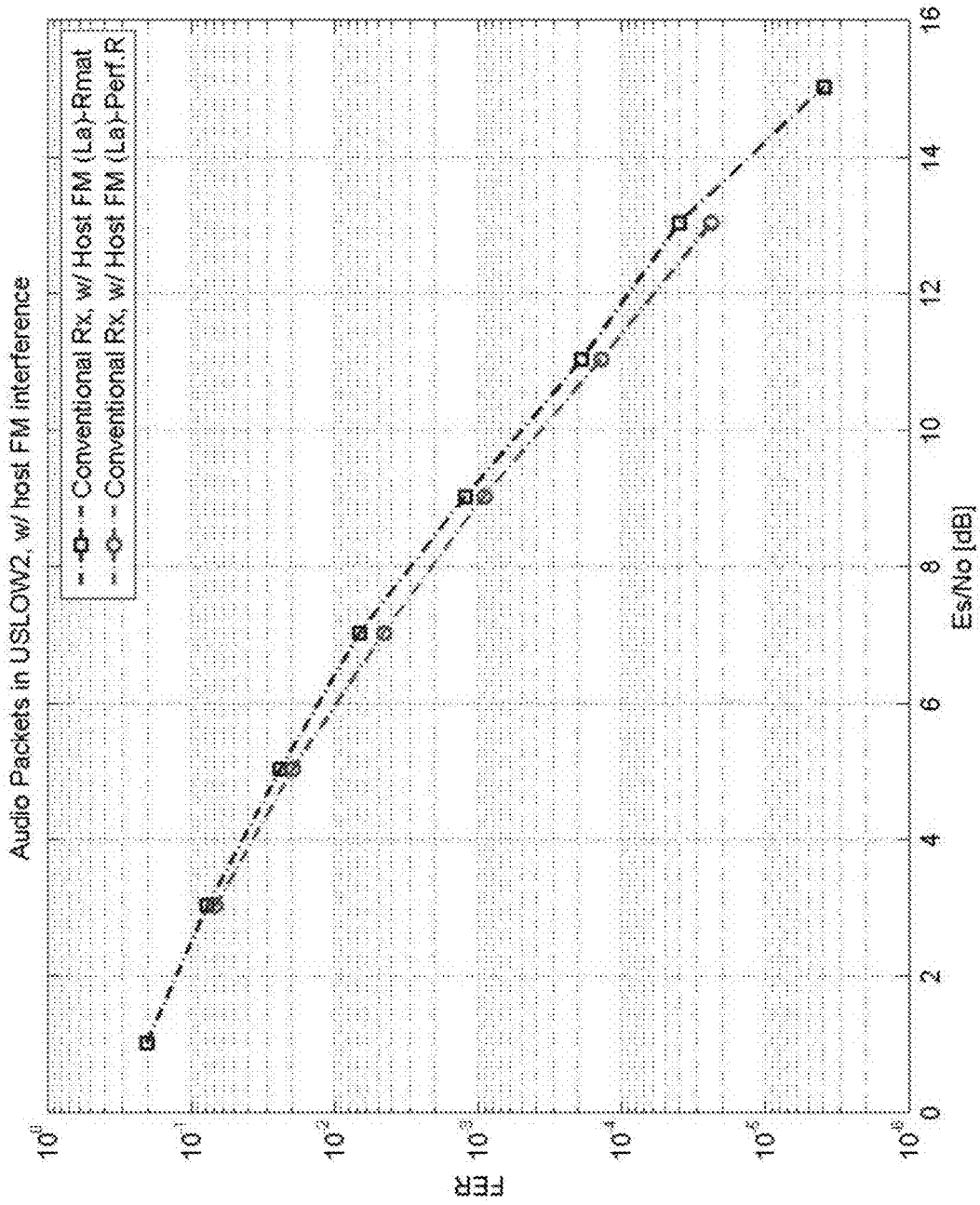
FIG. 48 illustrates the computer-simulated FERs of audio packets of the FM HD Radio receivers in the prior art with CSI estimated from reference subcarriers in a USLOW multipath fading channel with a mobile speed of 2 KPH and in the presence of host FM interference.

FIG. 48 shows the performance of conventional receivers in USLOW2 channel when reference subcarriers (R-matrix) data symbols used for CSI estimation are known and when they are reconstructed using R-matrix decoding with conventional methods described earlier. It can be seen that the receiver performance degrades by up to about 0.5 dB, in this scenario, with CSI estimation based on demodulation of reference subcarriers using the prior art method. In contrast, the advanced receiver employing inventive aspects as described in relation to FIG. 47 shows no performance difference, not shown in the figure, with CSI obtained using advanced R-matrix decoding and with perfect knowledge of R-matrix.

Figure 49:
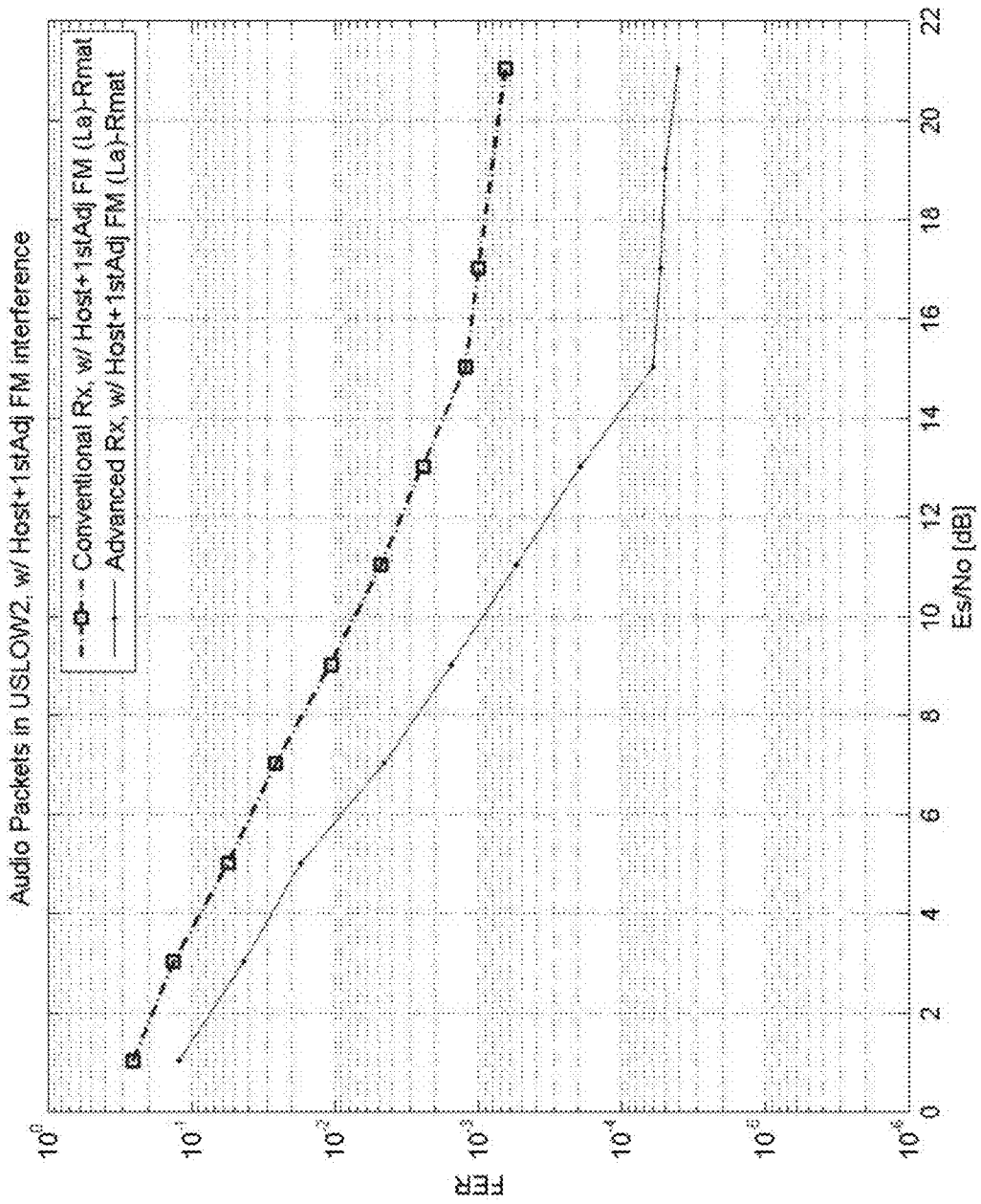
FIG. 49 illustrates the computer-simulated FERs of audio packets of the FM HD Radio receivers in the prior art and in certain embodiments of the invention in a USLOW multipath fading channel with a mobile speed of 2 KPH, and in the presence of host FM plus $1^{st}$ adjacent FM interference.

FIG. 49 shows audio packet performance for the same channel model as in FIG. 47, but now also a first adjacent channel interference is present at −20 dB relative to the host signal. This level of interference is illustrative of cases when first adjacent interference cancellation could not work because it is relatively weak, or could correspond to residual interference after applying first adjacent interference cancellation. One may note that both inventive and conventional approaches degrade by several dB due to additional interference that also exhibits impulsive characteristics. However, the conventional approach degrades more, such that the inventive approach achieves about 6 dB gain already at $FER=10^{-3}$. Eventually, both receivers exhibit error floor performance, but the error floor for the advanced receiver based on aspects of the invention is close to the target performance $FER=10^{-5}$ desired for commercial operation.

Figure 50:
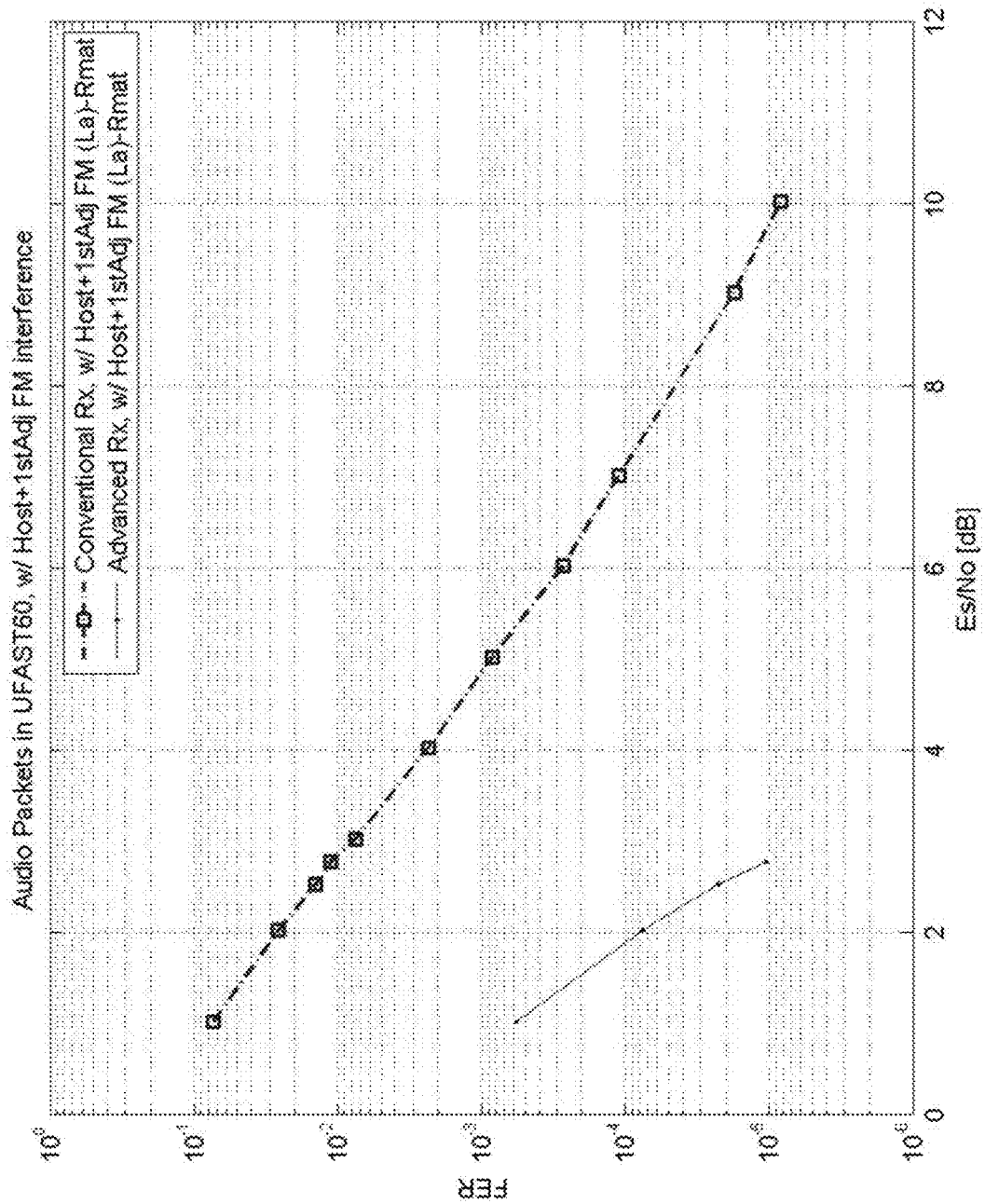
FIG. 50 illustrates the computer-simulated FERs of audio packets of the FM HD Radio receivers in the prior art and in certain embodiments of the invention in a UFAST multipath fading channel with a mobile speed of 60 KPH, and in the presence of host FM plus $1^{st}$ adjacent FM interference.

FIG. 50 shows audio packet performance in fast urban fading channel with an exemplary vehicle speed of 60 km per hour, UFAST60, and with a first adjacent channel interference present at −20 dB relative to the host signal. The exemplary embodiments of the conventional and advanced receivers employing inventive aspects are the same as those used to generate FIG. 49, except that the conventional method uses MATLAB tail-biting Viterbi decoder, which provides similar, if not essentially the same, performance as the tail-biting Log-MAP decoder described earlier. The advanced receiver with the inventive approach achieves about 7 dB gain in symbol energy to noise power ratio (Es/No) at $FER=10^{-5}$ desired for commercial operation.

Figure 51:
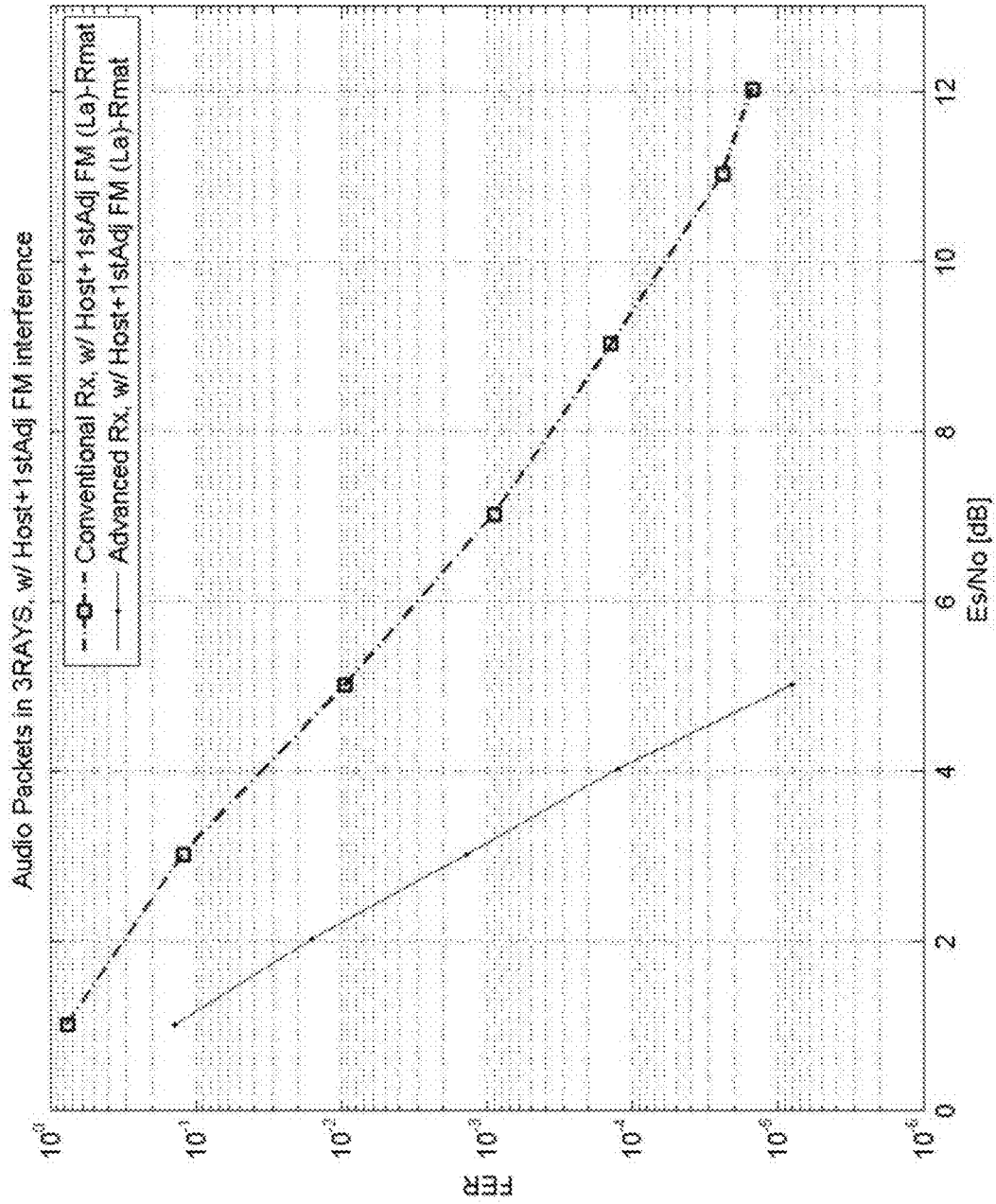
FIG. 51 illustrates the computer-simulated FERs of audio packets of the FM HD Radio receivers in the prior art and in certain embodiments of the invention in a 3-ray (abbreviated as 3RAYS) multipath fading channel at 100 KPH, and in the presence of host FM plus $1^{st}$ adjacent FM interference.

FIG. 51 shows audio packet performance in 3-ray fading channel, 3RAYS with mobile device speed of 100 KPH, and with a first adjacent channel interference present at −20 dB relative to the host signal. The exemplary embodiments of the conventional and advanced receivers employing inventive aspects are the same as those used to generate FIG. 50. The advanced receiver with the inventive approach achieves about 7 dB gain in Es/No at $FER=10^{-5}$ desired for commercial operation.

Figure 52:
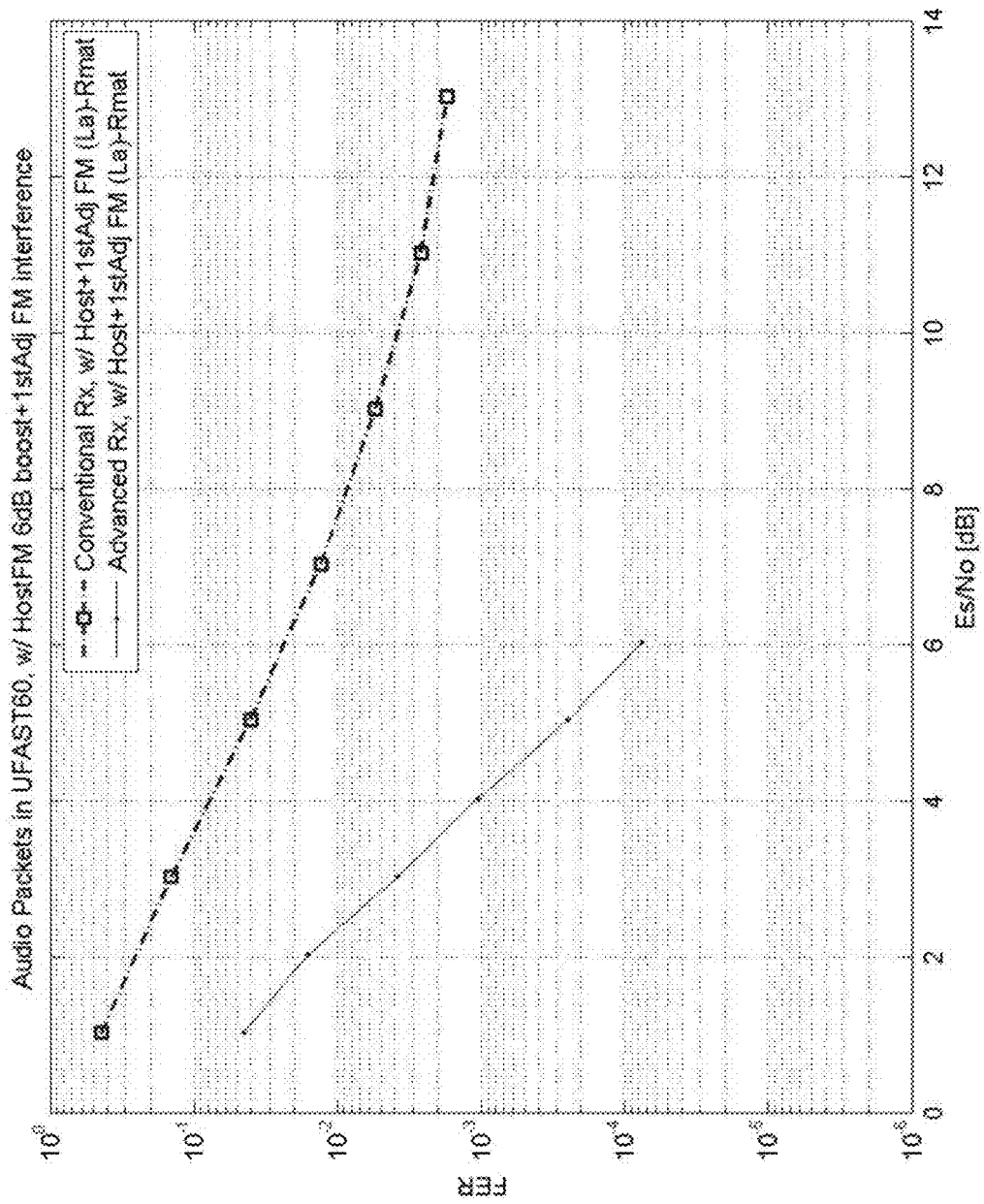
FIG. 52 illustrates the computer-simulated FERs of audio packets of the FM HD Radio receivers in the prior art and in certain embodiments of the invention in a UFAST multipath fading channel with a mobile speed of 60 KPH and in the presence of host FM plus $1^{st}$ adjacent FM interference; the digital signal level is boosted by 6 dB, as opposed to 10 dB in FIG. 50 and other figures, relative to the level allowed by the original HD Radio standard, according to an FCC Order in 2010.

FIG. 52 shows audio packet performance in UFAST60 described earlier. The exemplary embodiments of the conventional and advanced receivers employing inventive aspects are the same as those used to generate FIG. 50. In this exemplary embodiment, however, it is assumed that digital, OFDM signal power is boosted by 6 dB relative to the level allowed by the original HD Radio standard, according to an FCC Order in 2010, thus resulting in more FM interference seen by the digital OFDM signal than in the 10 dB power boost case in the previous example/figures. The advanced receiver provides more gain than in the case of 10 dB OFDM power boost in FIG. 50. Specifically, the gain is about 8.5 dB gain in Es/No at $FER=2\times10^{-3}$ and increasing as the conventional receiver exhibits the error floor. This demonstrates that the advanced receiver is more robust with increasing interference compared to the conventional receiver.

Figure 53:
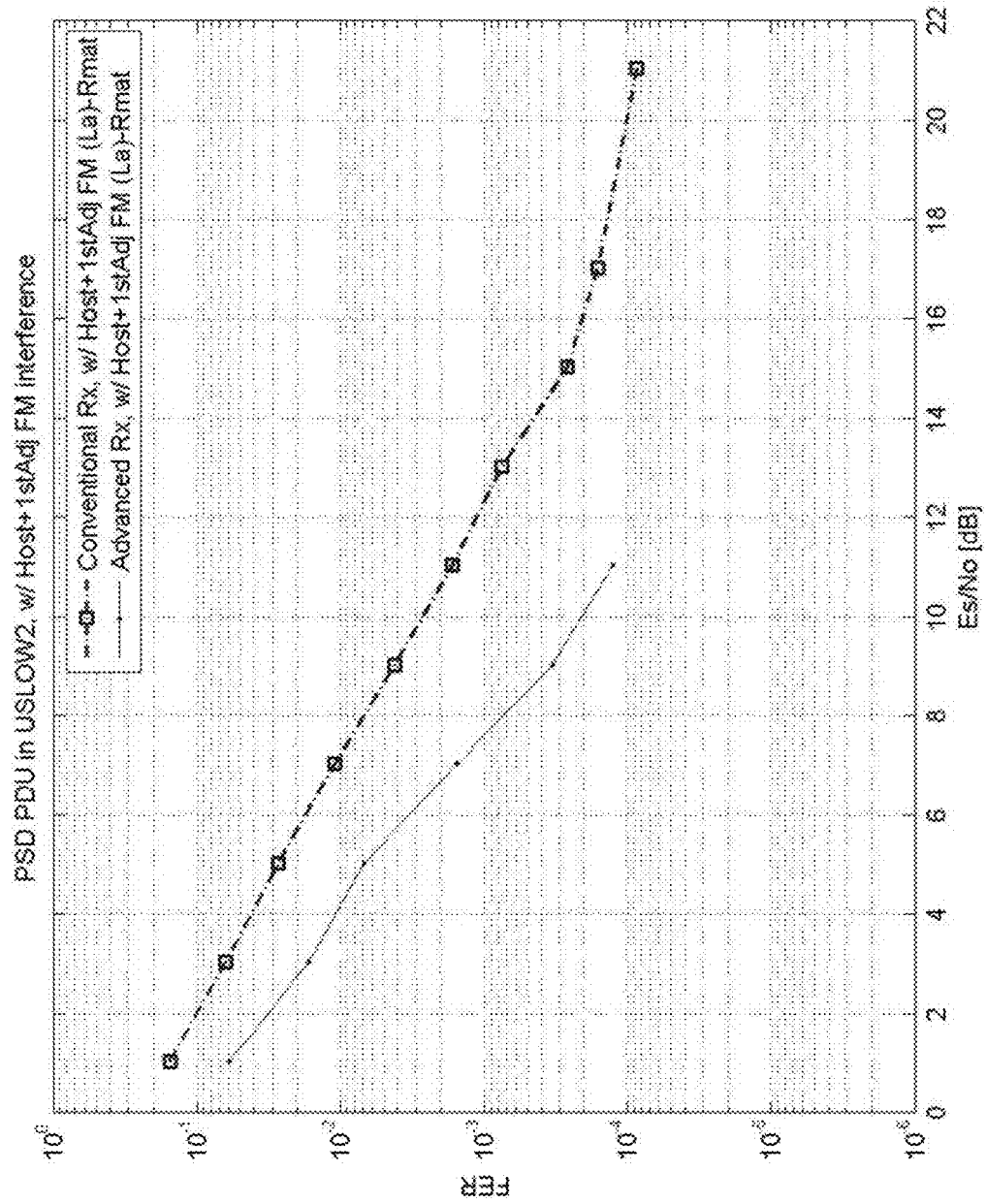
FIG. 53 illustrates the computer-simulated FERs of program PSD PDUs of the FM HD Radio receivers in the prior art and in certain embodiments of the invention in a USLOW multipath fading channel with a mobile speed of 2 KPH, and in the presence of host FM plus $1^{st}$ adjacent FM interference.

FIG. 53 shows the performance of program service data (PSD) PDU component of P1 logical channel for hybrid FM HD Radio systems. In this exemplary embodiment, it is assumed that the length of PSD PDUs is 1000 bytes. The exemplary embodiments of the conventional and advanced receivers employing inventive aspects are the same as those used to generate FIG. 49, and tested in the same channel model, USLOW2, with the same first adjacent channel interference present at −20 dB relative to the host signal. The advanced receiver with the inventive approach achieves about 7 dB gain in Es/No at $FER=2\times10^{-4}$.

Figure 54:
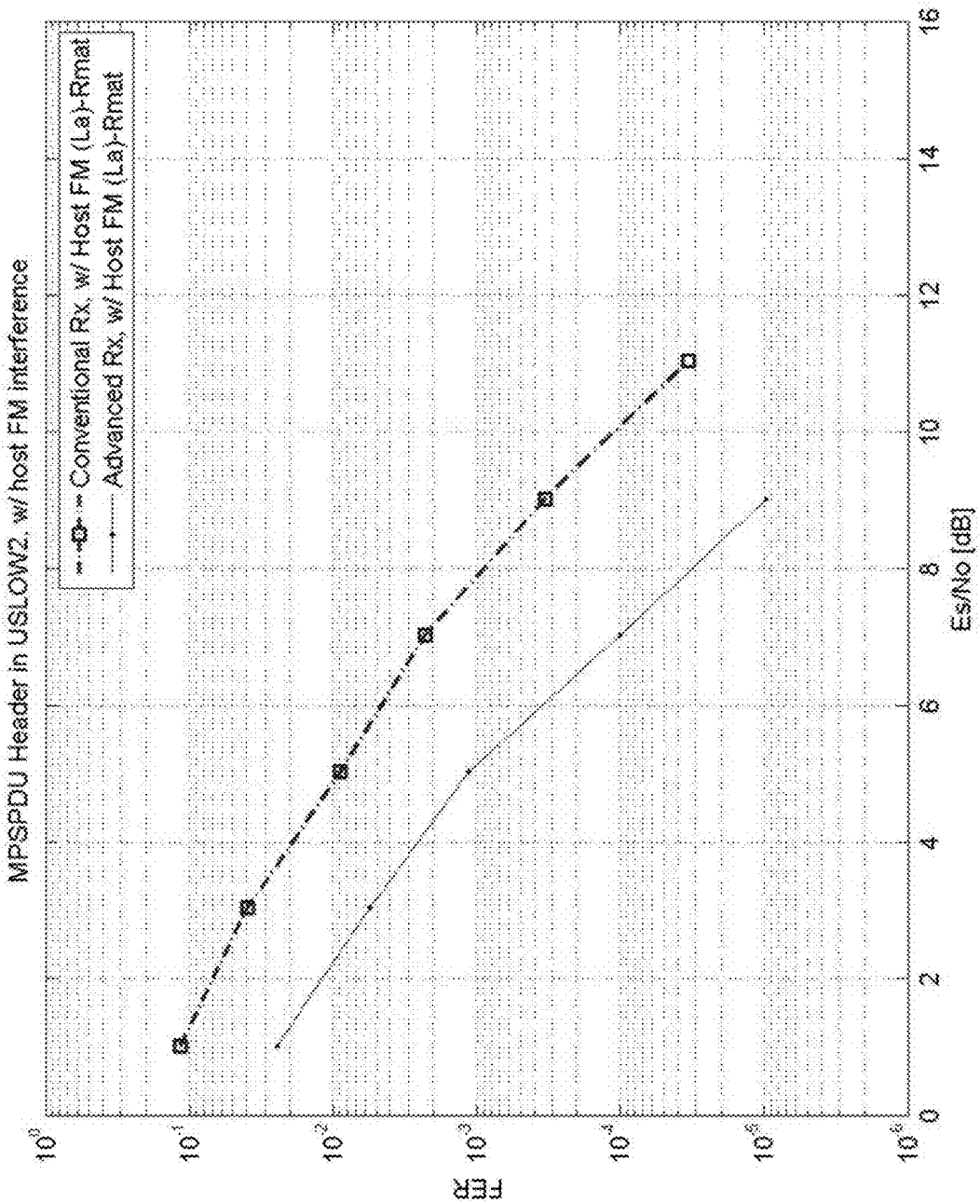
FIG. 54 illustrates the computer-simulated FERs of main program service MPS PDU headers of the FM HD Radio receivers in the prior art and in certain embodiments of the invention in a USLOW multipath fading channel with a mobile speed of 2 KPH, and in the presence of host FM interference.
Figure 55:
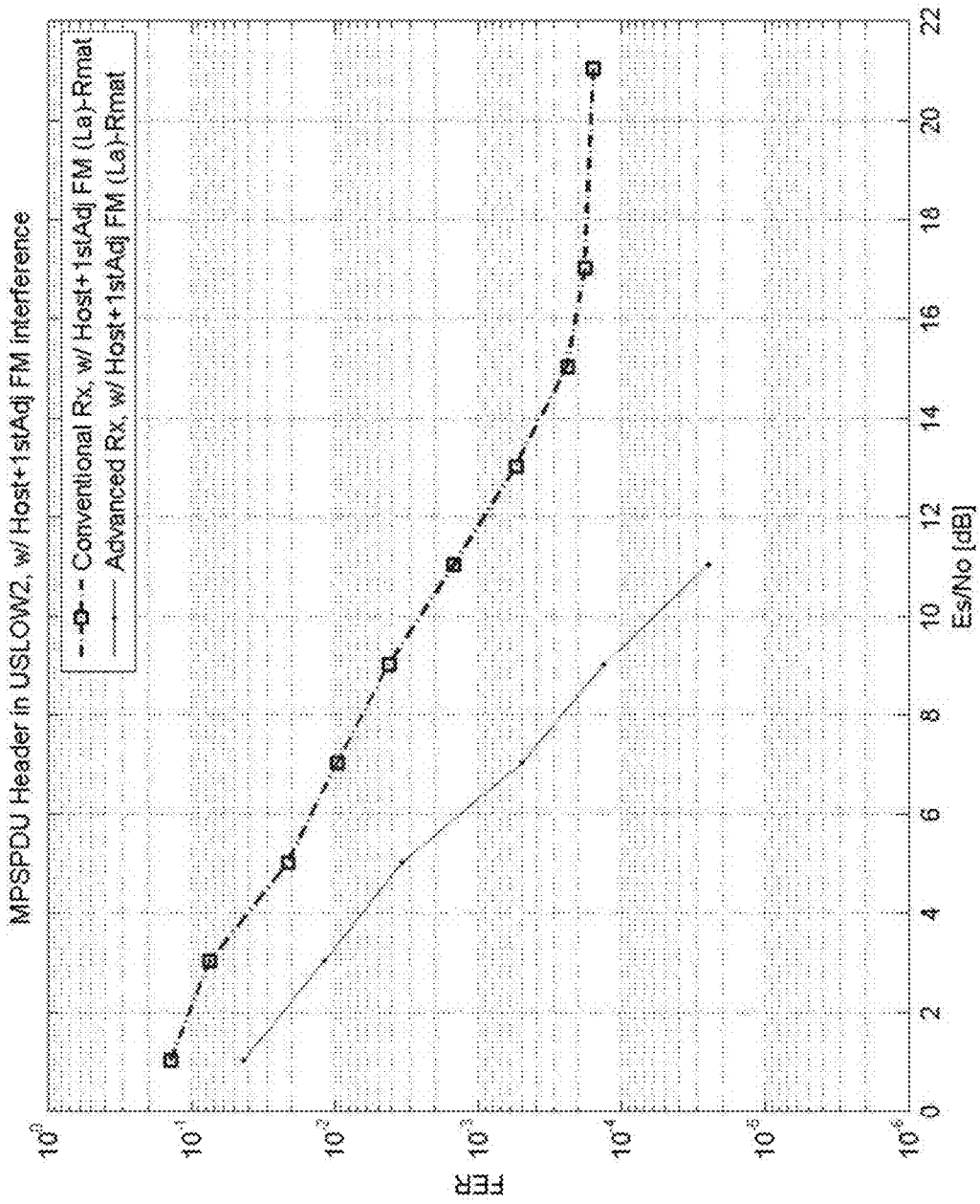
FIG. 55 illustrates the computer-simulated FERs of main program service MPS PDU headers of the FM HD Radio receivers in the prior art and in certain embodiments of the invention in a USLOW multipath fading channel with a mobile speed of 2 KPH, and in the presence of host FM plus $1^{st}$ adjacent FM interference.

FIG. 54 shows the performance of main program service (MPS) PDU header component of P1 logical channel for hybrid FM HD Radio systems. In this exemplary embodiment, it is assumed that the length of MPS PDU header is 88 bytes long, including fixed header, variable header, and part of the PSD PDU. The exemplary embodiments of the conventional and advanced receivers employing inventive aspects are the same as those used to generate FIG. 47, and tested under the same channel model, USLOW2, with the same level of a first adjacent channel interference at −20 dB relative to the host signal. The advanced receiver with the inventive approach achieves about 3 dB gain in Es/No at $FER=10^{-4}$. Similarly, FIG. 55 shows the performance of main program service (MPS) PDU header component of P1 logical channel for hybrid FM HD Radio systems with the same embodiments for the conventional and advanced receivers, as well as the channel and interference models, as those used in FIG. 49. The advanced receiver with the inventive approach achieves about 8.2 dB gain in Es/No at $FER=2\times10^{-4}$.

Figure 43:
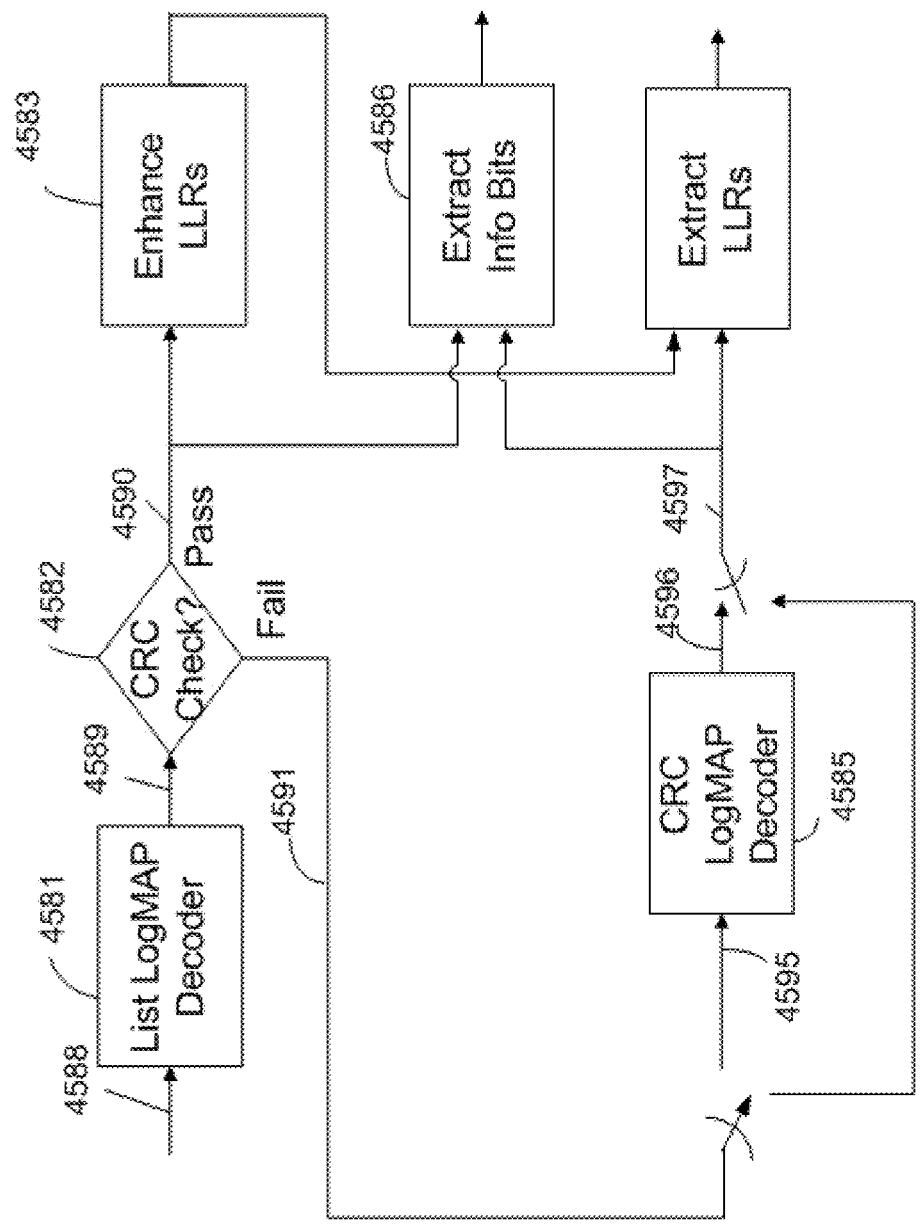
FIG. 43 is a diagram of processing flow for decoding of the SIS PDU in accordance with certain embodiments of the invention.

FIG. 43 shows one embodiment for decoding of PIDS PDUs. Using a stream of channel LLRs (after puncturing to a code rate 1/3 as in 4481 in FIG. 40) for a predefined number of PIDS PDUs on line 4588, list Log-MAP decoding in block 4581 is performed for each PIDS PDU. The list Log-MAP decoder outputs bit decisions and their decoder-output LLRs of the information and/or coded bits in the PIDS PDU as well as a set (i.e., list of length M_value) of hard decision path sequences of binary value of 0 or 1 on line 4589. Then, CRC check is performed on the MAP bit decisions of the PIDS PDU in block 4582. If the PIDS PDU passes CRC check (line 4590), MAP bit decisions are output as the final bit decisions in block 4586 for the information bits of the PIDS PDU and each LLR value is enhanced in block 4583 to a large value of magnitude preserving its polarity, e.g., 100 or −100 for logical bit 1 or 0 (or vice versa, depending on the binary bit mapping in the system). If the PIDS PDU MAP sequence fails CRC check (line 4591), the path sequences of the PIDS PDU in the list are then CRC-checked one at a time in block 4582 in the order they are placed in the list until a path sequence in the list passes the CRC check. Some path sequences in the list may be the same and thus any duplicated path sequences may be removed before running this CRC check in order to reduce the processing time required to perform this operation. When the first path sequence is found (line 4590) that passes the CRC check, the path sequence is output as the final bit decisions (in block 4586) of the information bits of the PIDS PDU and their LLR values are enhanced in block 4583 to a large value of magnitude preserving its polarity, e.g., 100 or −100 for logical bit 1 or 0. If no path sequence is found 4591 that passes the CRC check in block 4582, optional CRC Log-MAP decoding is performed in block 4585 on the decoder-output LLRs on line 4591 (switched to line 4595). Then, the LLRs for the information bits of the PIDS PDU are determined from the output LLRs on line 4596 (to line 4597) of the CRC Log-MAP decoder. Also, the final bit decisions for the information bits of the PIDS PDU are made in block 4586 on the polarity of the output LLRs of the CRC Log-MAP decoder. As an implementation alternative, in another embodiment, the CRC Log-MAP in block 4585 could be skipped to reduce the processing complexity, without sacrificing much the overall performance, especially when list decoding is employed. In this case, the LLRs and bit decisions of the information bits of the PIDS PDU are obtained from the output LLRs from block 4581 passed to line 4597. When only Log-MAP decoding is used in block 4581, the performance gain due to optional CRC Log-MAP decoding is larger than in the case when block 4581 performs also list decoding. The output LLRs may be used for further iterative processing shown in FIG. 46. The PIDS performance is better than the performance of audio packets, due to a larger gain of list decoding corresponding to shorter packet sizes used for PIDS PDUs.

Figure 56:
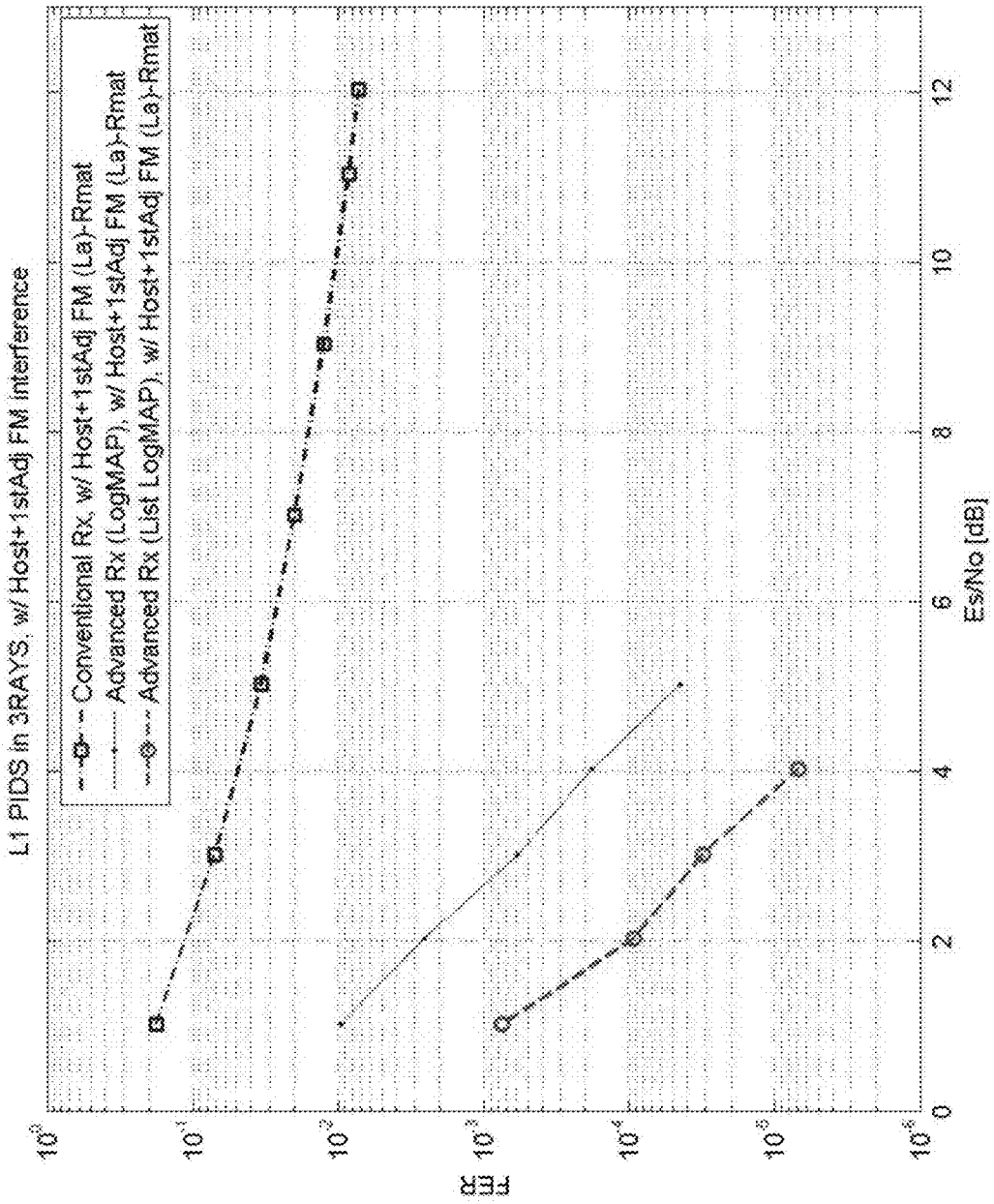
FIG. 56 illustrates the computer-simulated FERs of PIDS frames of the FM HD Radio receivers in the prior art and in certain embodiments of the invention in a 3RAYS multipath fading channel, and in the presence of host FM plus $1^{st}$ adjacent FM interference.

FIG. 56 shows PIDS frame performance in 3-ray fading channel, 3RAYS, and with a first adjacent channel interference present at −20 dB relative to the host signal. The exemplary embodiments of the conventional and advanced receivers employing inventive aspects are the same as those used to generate FIG. 51. It is also assumed that the length of PIDS frames is 80 bits long as described for the HD Radio systems. While the conventional receiver experiences relatively high FER, e.g., $10^{-2}$, over a wide range of Es/No values, e.g., up to 12 dB, the advanced receiver with the inventive approach (solid line with small dots) achieves about 9 dB gain in Es/No at FER=$10^{-2}$ when advanced initial CSI estimation is performed in combination of one additional iterative CSI estimation stage after first FEC decoding of P1 packet employing tail-biting Log-MAP decoding. In addition, when the advanced receiver (dashed line with circles) employs tail-biting list Log-MAP decoding after iterative CSI estimation as described earlier, it further improves FER by about 2.3 dB at FER=$10^{-4}$ and achieves the target performance FER=$10^{-5}$ (at Es/No<4 dB) desired for commercial operation.

Figure 39C:
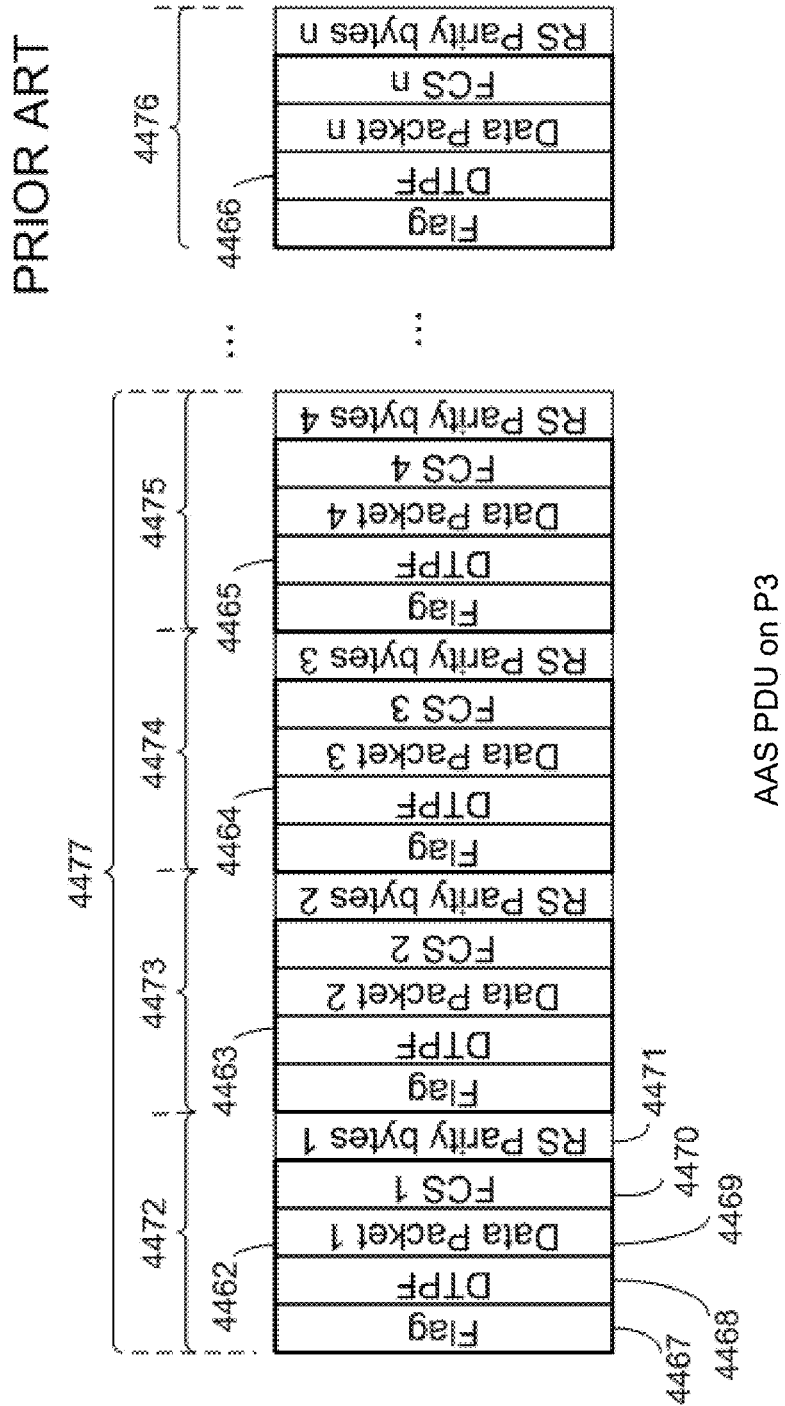

FIG. 39*c* shows a stream of AAS PDUs, 4462-4466. Each of the AAS PDUs contains Flag 4467, data transport packet format (DTPF) 4468, data packet 4469, and frame check sequence (FCS) 4470 (i.e., CRC). Each AAS PDU forms an information block of length k bytes for an (n,k) RS code, e.g., k=223 bytes, and n=255 bytes. When RS encoding is performed, (n−k) RS parity bytes 4471 are appended to the AAS PDU to form a RS codeword block 4472-4476. A group of consecutive RS codewords 4477 are then byte-interleaved with an interleaving depth of Rw (of typical value 4-64 as in HD Radio AAS specification). In one exemplary embodiment, but without loss of generality, Rw=4 is considered. Not shown for simplicity, the stream of RS blocks after byte interleaving is broken into a series of frames for inner convolutional code encoding at layer 1. In the exemplary embodiment, without loss of generality, each frame for convolutional encoding contains a sequence of bits of length corresponding to two RS blocks (e.g., Rw/2=2).

Figure 44:
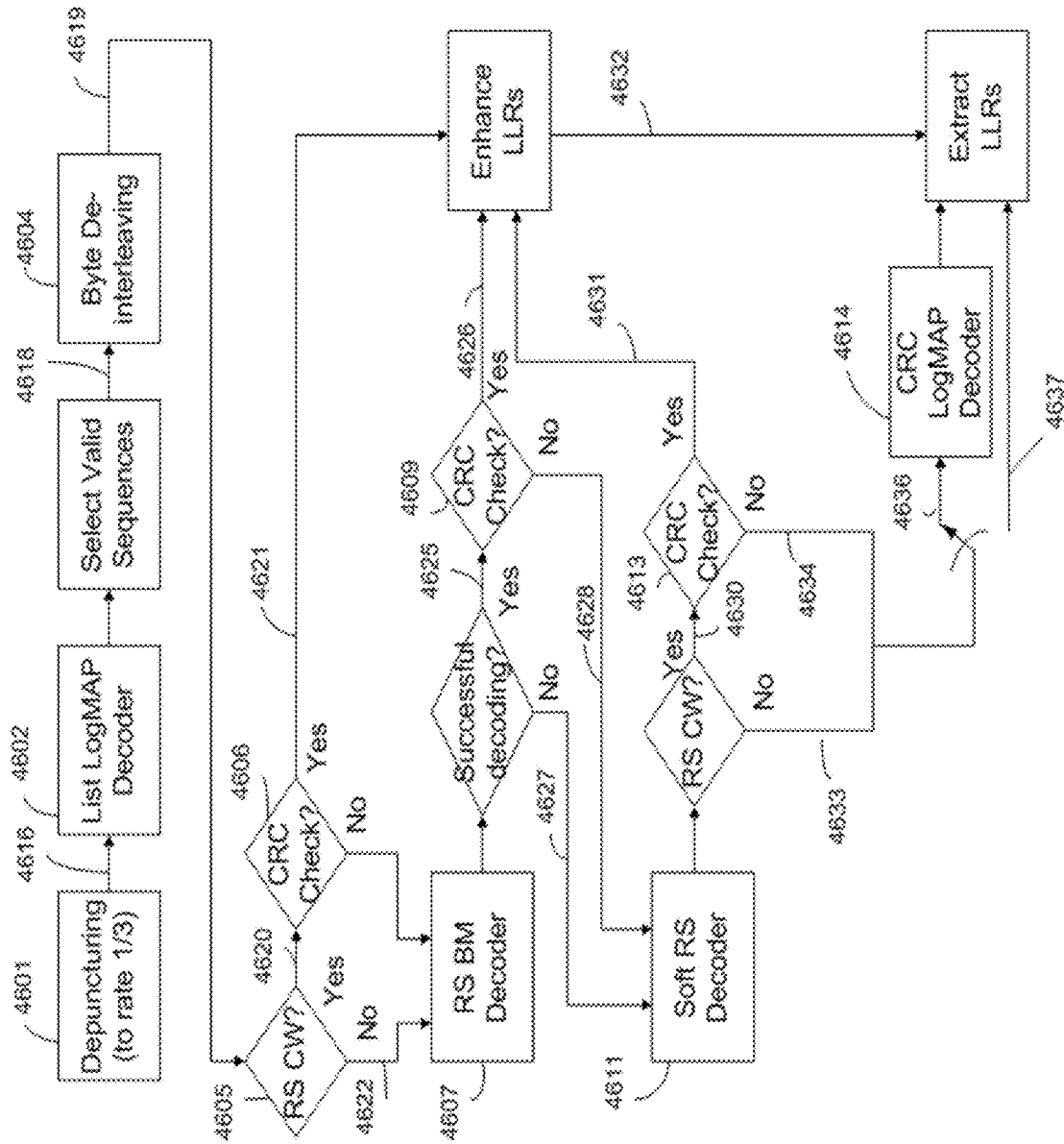
FIG. 44 is a diagram of processing flow for decoding of the AAS PDU in accordance with certain embodiments of the invention.

FIG. 44 represents one embodiment regarding the advanced concatenated decoder for HD Radio P3 channel carrying AAS data. The stream of channel LLRs corresponding to each convolutional code frame is de-punctured in block 4601 by inserting zero values in the positions where the coded bits were punctured in the transmitter, to bring the coded stream to original code rate. Each de-punctured frame on line 4616 is fed to the list Log-MAP decoder 4602. The decoder generates a set of output LLRs, both information and coded bit LLRs, and a predefined number M_value of most likely hard-decision sequences (containing 0's and 1's) for each frame. The list of hard decision sequences is ordered from the most likely sequence to the least likely sequence. M_value could be any integer larger than or equal to 2. Larger M_value results in better performance of list decoding, but the improvement diminishes beyond a moderate M_value, say 32. For P3 decoding in specific simulation examples M_value=8 was employed. Tail-biting Log-MAP decoding is employed in 4602, similarly as described in the context of MPS PDU Header decoding description. Both optimal and suboptimal generation of the list of most likely sequences may be employed in different embodiments. For computational efficiency, the size of M_value sequences for further processing is reduced in line 4618 as described below. For the AAS PDU structure shown in FIG. 39*c*, Rw/2 (i.e., 2) frames correspond to Rw (i.e., 4) RS codewords. The output LLRs and the hard-decision sequences corresponding to Rw/2 frames are restructured and de-interleaved in 4604 to generate a set of LLRs as well as a list of hard-decision sequences for each of the Rw RS codewords in line 4619.

Figure 45:
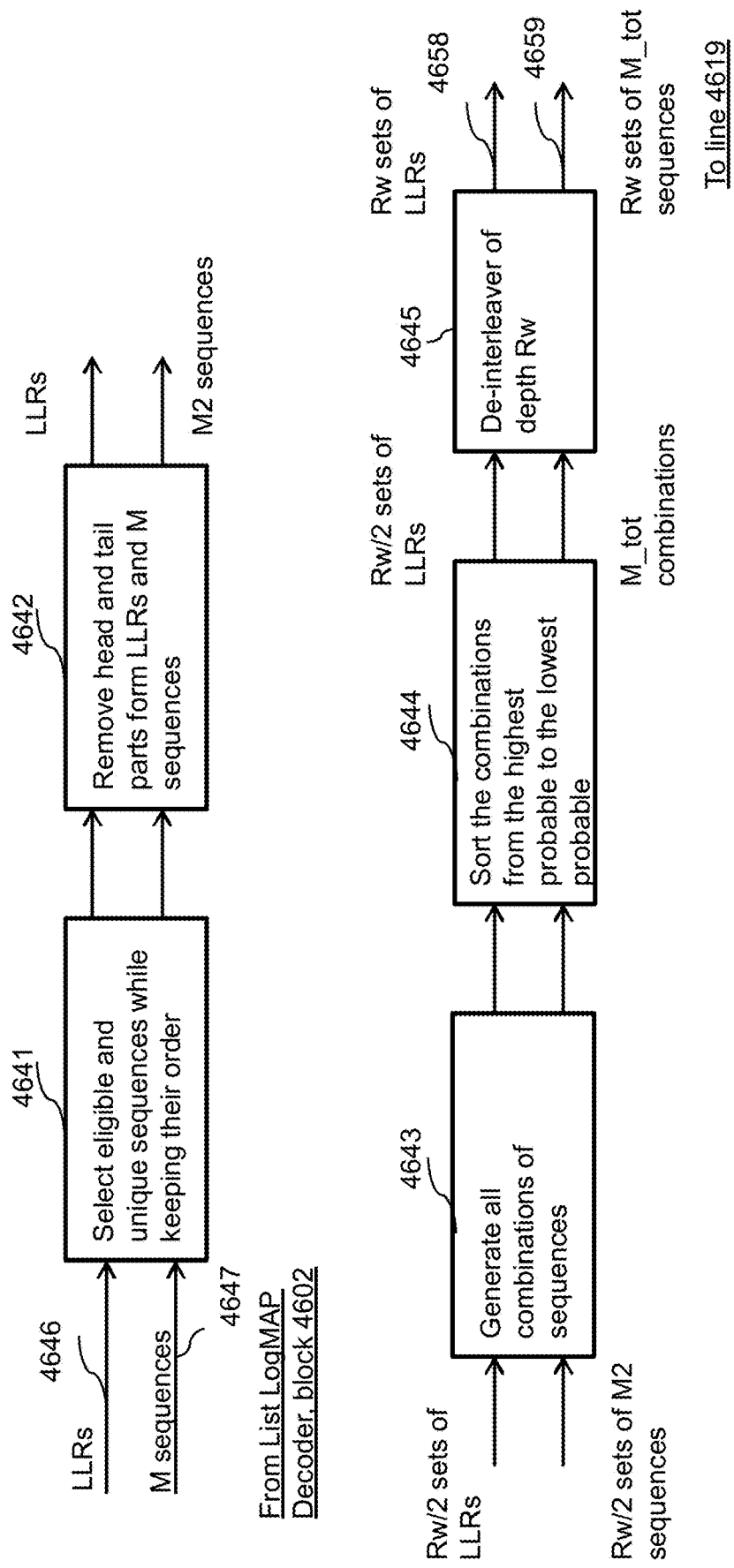
FIG. 45 is a diagram of processing flow for byte de-interleaving of LLRs and list sequences at the output of list Log-MAP decoder in accordance with certain embodiments of the invention.

For the specifics of the byte de-interleaving, refer to FIG. 45 which demonstrates the process for byte de-Interleaving of the hard-decision sequences corresponding to Rw/2 frames from the list Log-MAP decoder in FIG. 44. After list Log-MAP decoding of each frame, the output contains one set of LLRs in line 4646 as well as a list of M_value hard-decision sequences in line 4647. These sequences are ordered such that the first one has the highest probability of being the correct transmitted frame while the last one has the lowest probability of being correct. In order to feed these outputs to the next processing block (de-interleaver), the following steps are performed:

1. For a tail-biting convolutional code of constraint length k, the last (k−1) bits of Head should be the same as the last (k−1) bits of the packet for a hard-decision sequence to be correct. Therefore, the sequences that do not satisfy this condition are removed from the list while keeping the order of the remaining sequences. This results in $M_1 \leq M$ sequences.
2. Among the remaining $M_1$ sequences, some sequences may be the same as the others in the list. Therefore, only the unique sequences are kept that are a collection of the lowest-index sequence from each group of the same sequences. This results in a list of $M_2 \leq M_1$ sequences with their order in the list unchanged. Steps 1 and 2 are performed in block 4641.
3. Remove Head and Tail parts from the LLRs and sequences in block 4642.

As mentioned before, each set of Rw/2 frames corresponds to Rw RS codewords, in this exemplary embodiment. After removing Head and Tail parts, the soft LLRs from all the frames are sent to a de-interleaver with depth Rw in block 4645. Therefore, at the output, LLRs of each set of Rw/2 frames are converted to Rw set of LLRs each corresponding to one RS codeword, line 4658. Eight LLRs corresponding one byte symbol are moved together to match the byte interleaving in the transmitter. As it can be seen, de-interleaving of soft LLRs is straight forward. As for the hard-decision sequences, the task becomes more complicated. Consider a set of Rw/2 frames each with a set of hard-decision sequences obtained using the three step process above. The numbers of the hard-decision sequences for these frames may not be the same and are denoted as $$\{M_2^{(1)}, M_2^{(2)}, \ldots, M_2^{(Rw/2)}\}$$

The number of combinations will be $M_{total} = M_2^{(1)} \times M_2^{(2)} \times \ldots \times M_2^{(Rw/2)}$. Each combination can be fed to the de-interleaver of depth Rw in block 4645 to form a set of Rw sequences each corresponding to one RS codeword. In the end, for each of the Rw RS codewords corresponding to the set of Rw/2 frames, $M_{total}$ hard-decision sequences are obtained, line 4659. However, one issue remains to be addressed. As mentioned before, $M_2$ sequences of each frame are ordered from the highest probable one to the lowest probable one. When combining sequences from different frames, different combinations have different probabilities of being correct. For example, the combination of the first sequences from all Rw/2 frames has the highest probability of being correct. Therefore, according to certain aspects of the invention, the combinations are fed to the de-interleaver in order of their probabilities of being correct. This way, the $M_{total}$ hard-decision sequences of each RS codeword are also ordered from the highest probable one to the lowest probable one, in an approximate fashion as described in an example below.

As an example, for Rw=4, each set of 2 frames contains 4 RS codewords. Assuming the frames have $M_2^{(1)}$, $M_2^{(2)}$ sequences, the combinations should be of the following order:

(1,1), (2,1)
(1,1), (2,2)
(1,2), (2,1)
(1,1), (2,3)
(1,3), (2,1)
(1,2), (2,2)
. . .

where in (x,y) above, x denotes the frame number and y denotes the sequence number. This can be performed as follows:

1. Generate all combinations $(x_i, y_i)$, $(x_2, y_2)$ such that $x_1$, $x_2=1,2$, $y_1=M_2^{(1)}$ and $y_2=1$; $M_2^{(2)}$ in block 4643.
2. Sort the combinations in step 1 such that $y_1+y_2$ has an ascending order in block 4644.

After de-interleaving, for each RS codeword, the $M_{total}$ sequences on line 4619 in FIG. 44 are checked in block 4605 to see if any of them is a valid RS codeword, meaning the RS (255,223) code is used for error detection. If any of $M_{total}$ sequences is a valid RS codeword 4620, it is further tested to see if it passes the CRC check in block 4606. The CRC check provides an additional level of error detection capability beyond that provided by the RS (255,223) code. If CRC passes 4621, the sequence is converted to enhanced LLRs on line 4632 and is used as the output where information bits can be extracted from it. Similar to the discussion above pertaining to MPS PDU decoding, enhanced LLRs are used for iterative decoding by giving more weight to bit LLRs of the segments that are considered correct, compared to LLRs from other segments, which will slightly improve iterative decoding or CSI estimation. In case none of the $M_{total}$ sequences is a valid RS codeword 4622, hard decision RS decoding using Berlekamp Massey (BM) algorithm is performed on at least $L_{BM} \leq M_{total}$ of the $M_{total}$ sequences in block 4607. Similarly, if none of valid RS codewords passes the CRC check in block 4606, the set of $M_{total}$ sequences is passed to block 4607 for BM decoding as described above. In other embodiments, instead of BM algorithm other algorithms known in the art may be employed in 4607. Since the hard-decision sequences for each RS codeword are ordered based on their probability of being correct, in FIG. 44 block 4607 BM decoding is performed on the first $L_{BM}$ sequences starting from the highest probable one. This increases the chances of the BM decoder to decode faster and results in more efficient implementation.

If BM decoding was successful on any of these $L_{BM}$ sequences 4625, the resulting highest ranked RS codeword is fed to CRC check block 4609 and if CRC passed 4626, it is converted to enhanced LLRs on line 4632 and is used as the output. However, if CRC check did not pass 4628 or BM decoding was not successful on any of the $L_{BM}$ sequences 4627, the LLRs corresponding to the RS codeword are fed to a SISO, 'soft', RS decoder in block 4611, which has been explained in detail in previous embodiments of the invention. If soft RS decoding resulted in a valid RS codeword 4630, it will further be tested in the CRC check block 4613 and if CRC passed 4631, it will be converted to enhanced LLRs and used as the output on line 4632. If CRC did not pass 4634, the input LLRs to the soft RS decoder are used as the final output on line 4637 or they are optionally passed through a CRC Log-MAP decoder in block 4614 and its output LLRs are used as the final output of the whole decoder. If soft RS decoder did not result in a valid RS codeword 4633, it generates a set of updated LLRs based on soft RS decoding employing BP decoding, as described in the corresponding embodiments of the invention (see discussion pertaining to choosing the best LLR where it is stated that the average of LLRs from all matrices is the best choice in terms of bit error rate and should be selected as the final LLR). These LLRs are used as the final output on line 4637 or they can be optionally passed on line 4636 through the CRC Log-MAP decoder in block 4614 and its output can be used as the final output LLRs. The output LLRs may be used for further iterative processing shown in FIG. 46 by constructing from them extrinsic information as known in the art.

It should be mentioned that list Log-MAP decoding is primarily used for reduction of decoding complexity. The reason is that in most cases either one of the sequences is a valid RS codeword and passes the CRC check or one of the sequences may be decoded with the simple BM decoder and pass the CRC check. In both cases, the more complex soft RS decoding is skipped and the overall complexity is reduced. In another embodiment, Log-MAP decoding may be used instead of list Log-MAP decoding in block 4602. Log-MAP only generates a set of soft LLRs that go to line 4618 for byte de-interleaving. The output at line 4619 goes directly to block 4611 for soft RS decoding and everything else in between is skipped. It has been shown that using list Log-MAP decoding with BM before soft RS decoding yields better performance compared to a combination of Log-MAP and soft RS decoding.

Figure 57:
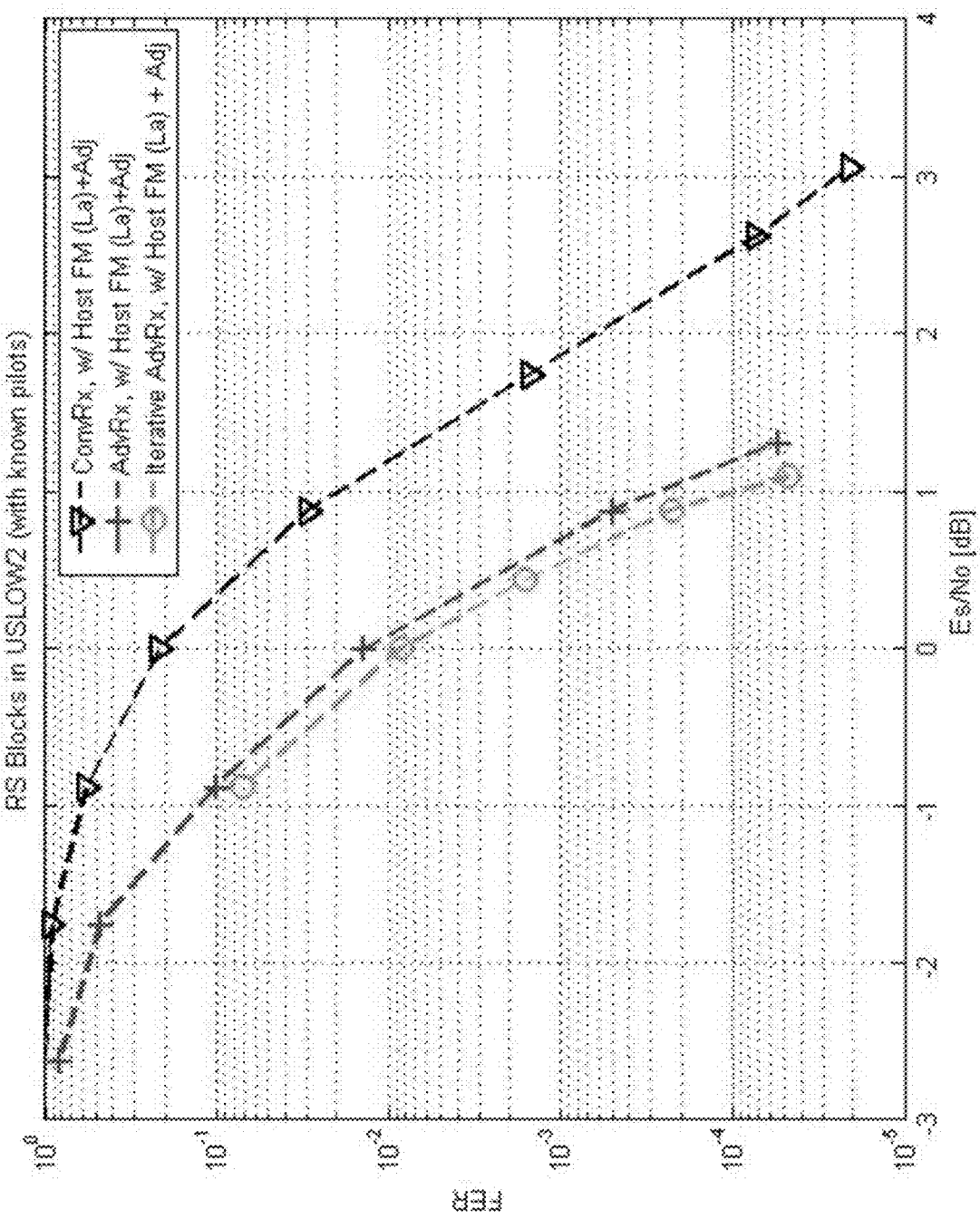
FIG. 57 illustrates the computer-simulated FERs of P3 AAS data of the FM HD Radio receivers in the prior art and in certain embodiments of the invention in a UFAST multipath fading channel with a mobile speed of 60 KPH, and in the presence of host FM plus $1^{st}$ adjacent FM interference.

FIG. 57 shows the performance of P3 logical channel for hybrid FM HD Radio systems. The performance using advanced decoding implementing various embodiments is compared with performance using conventional methods. In this exemplary embodiment it is assumed that digital, OFDM signal power is boosted by 10 dB (i.e., −10 dBc) relative to the level allowed by the original HD Radio standard, according to an FCC Order in 2010. Fast urban fading channel, UFAST60, is considered, with both host FM and $1^{st}$ adjacent interference. The inventive method employs advanced initial CSI estimation and one additional iterative CSI estimation stage after first FEC decoding of the P3 packet. In addition, inventive R-matrix decoding and tail-biting list Log-MAP decoding as well as inventive soft RS decoding are employed, as described earlier. The list decoder uses M_value=8. The soft RS decoder is the combination of the original proposed decoder and the alternative embodiment with disagreement positions as described earlier. Both the original proposed decoder and its alternative using disagreement positions use N_mat=6 matrices. In addition to the common first (n–k)–L (n=255×8=2040, k=223×8=1784) degree 1 columns, each matrix has a different set of L columns with degree 1 as discussed earlier. (L=18 for the original decoder and L=15 for the alternative decoder with disagreement positions). For each matrix, 7 rounds of sorting and matrix adaptation is performed. During each round, 3 iterations of simple greedy BP algorithm with $\alpha_1$=0.2, $\beta_1$=0.3475, $g_1$=0.61 (for the original decoder) and $\alpha_2$=0.18, $\beta_2$=0.43, $g_2$=0.62 (for the alternative decoder with disagreement positions) are performed except for the last round where 9 iterations are performed. At the end of iterations for each matrix that has not converged to a codeword as well as the input LLRs and the average LLRs of all 6 matrices, BM error and erasure decoding is used. For each set of LLRs, all symbols with probability of correct smaller than 0.4 are erased, such that the number of erasures does not exceed (255−223=32). As mentioned earlier, during the decoding process, hard decision RS decoding using Berlekamp Massey (BM) algorithm may be performed on $L_{BM}$=3 sequences in block 4607. The conventional method includes a single stage CSI estimation using filter lengths over time and frequency suitable for the range of mobile speeds and frequency selectivity of the channel. The conventional method also uses tail-biting Log-MAP decoder described earlier, which provides somewhat better performance than MATLAB tail-biting Viterbi decoder. It can be seen that at FER=$10^{-4}$, the advanced receiver (corresponding to the line with 'plus' symbols), implemented as described earlier, achieves a gain of 1.5 dB relative to the conventional receiver (corresponding to the line with 'triangle' symbols). In another exemplary embodiment, multiple iterations between outer RS decoder and inner convolutional Log-MAP (or list Log-MAP) decoder could be used to further improve BER and FER performance, as discussed in other embodiments.

Iterative Decoding in HD Radio Systems

Figure 46:
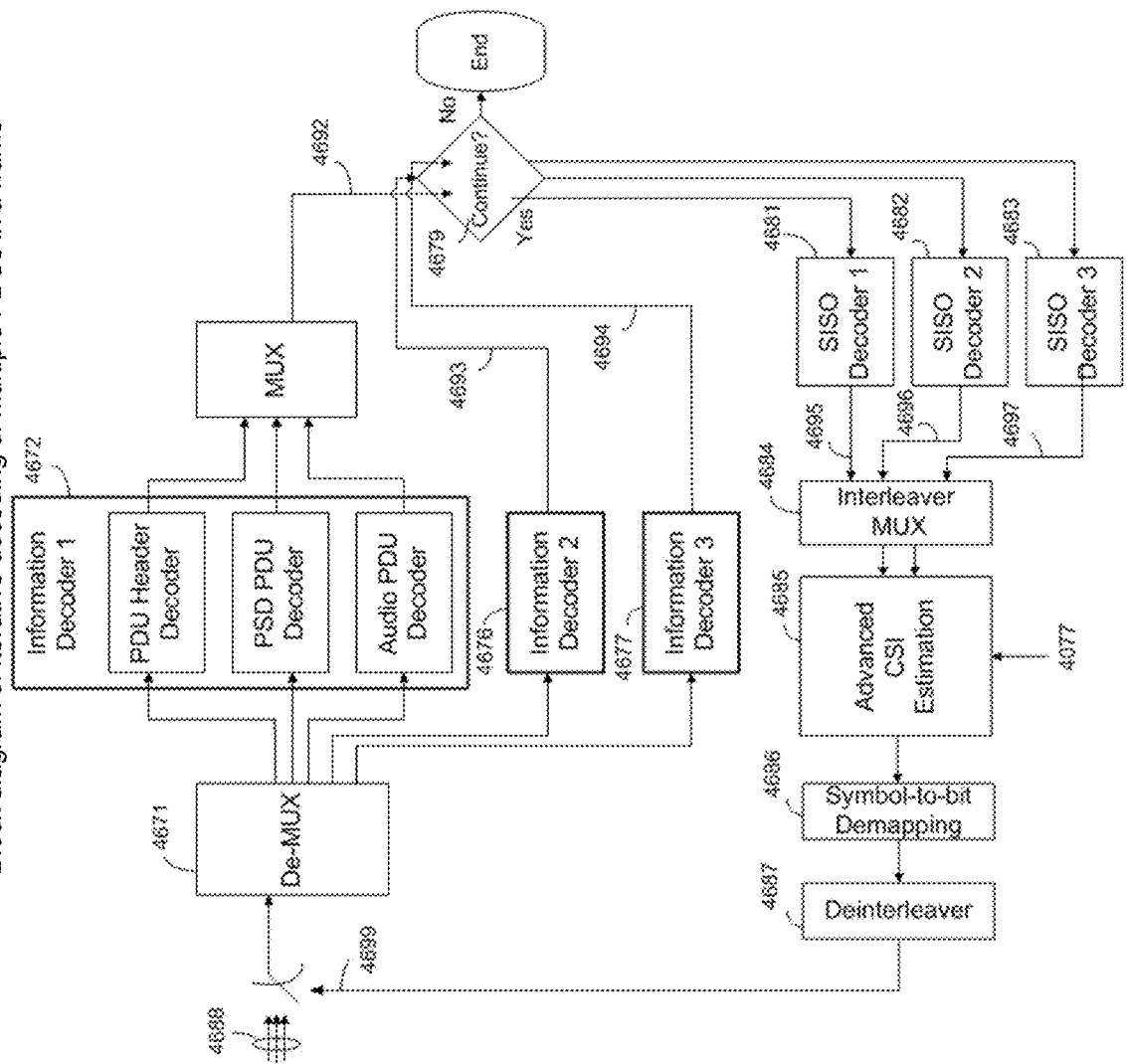
FIG. 46 is a diagram of iterative decoding of MPS, SIS, and AAS PDUs in accordance with certain embodiments of the invention.

FIG. 46 shows one embodiment for iterative decoding of the MPS, SIS, and AAS PDUs. The signal on line 4688 represents the outputs from blocks 4067, 4068, and 4069 in FIG. 24b. These streams of channel LLRs are de-multiplexed into three logical channel streams for further decoding of MPS PDUs in block 4672 (also block 4071 in FIG. 24b), SIS PDUs in block 4676 (also block 4072 in FIG. 24b), and AAS PDUs in block 4677 (also block 4073 in FIG. 24b), respectively. The three Information decoders output bit decisions for their respective PDU as well as LLRs on line 4692 for P1 MPS PDU, on line 4693 for SIS PDU on PIDS, and on line 4694 for AAS PDU on P3. The LLRs for each PDU may include enhanced LLRs for segments that have converged to correct codewords that pass CRC check as well as LLRs for non-converged segments (and also extrinsic information if iterations need to continue). A decision is made (block 4679) as to whether or not the iterative decoding should continue. Unless all PDUs are correctly decoded or a predefined number of iterations have reached, the three streams of enhanced LLRs and extrinsic information are supplied to SISO Decoders as a priori information for their respective output bits, i.e., the MPS PDU stream on line 4692 to block 4681, the SIS PDU stream to block 4682, and the AAS PDU stream to block 4683, respectively. The updated coded bit LLRs at the output of SISO decoders 4681-4683 may help to improve the CSI estimation in another round of CSI estimation. All of the output coded bit LLRs from the SISO decoders on lines 4695, 4696, and 4697 are properly interleaved and multiplexed in block 4684 for the same signal format as the outputs from block 4040 in FIG. 24a. Interleaved and multiplexed coded bit LLRs are mapped to a desired soft or hard symbols to facilitate CSI estimation in block 4685. Then, blocks 4685, 4686, and 4687, respectively, perform CSI estimation, symbol-to-bit de-mapping to get updated channel LLRs, and de-interleaving as previously described in reference to blocks 4064, 4065, and 4066 in FIG. 24b. Then, the output signal on line 4699 from block 4687 containing updated and more reliable channel LLRs for all information source streams 1, 2, and 3 is supplied to block 4671 for the next iteration of the processing in the subsequent blocks.

In summary, as discussed in FIG. 24b, first one or more iterations between CSI estimation and SISO decoding may be performed for the radio frame containing PDUs of multiple information sources. This helps to improve the performance of CSI estimation and consequently more reliable soft information at the output is given to information decoders 1, 2 and 3 for different PDUs. "Good" bits from successfully decoded PDUs propagate to other parts of transfer frames and overall radio frame comprising multiple information streams to improve their performance, via SISO decoders 4681-4683 and Advanced CSI Estimation 4685. Then a few global iterations are performed between information decoders 1, 2 and 3, 4672, 4676 and 4677, SISO decoders 4681-4683 and Advanced CSI Estimation 4685. These iterations improve the reliability of LLRs at the output of information decoders which result in more reliable decoded information sequences and consequently improved performance of the whole system.

Although not explicitly shown in FIG. 46, the output LLRs from blocks 4672, 4676, and 4677 may go through additional processing for the specific PDU format, as applicable, such as byte-interleaving for the signal on line 4694, as the decoding of AAS PDUs in block 4677 involved byte de-interleaving. But these additional processing omitted in FIG. 46 do not alter certain aspects of the invention that are focused on iterative processing of the enhanced output LLRs from the Information Decoders through SISO Decoders and Advanced CSI Decoder, which were also placed in the forward path for the non-iterative decoding process shown in blocks 4064-4069 in FIG. 24b. An illustration of the performance improvement with iterative decoding is shown in FIG. 57. For the considered channel scenario described earlier for the example in FIG. 57, the iterative advanced receiver using one more decoding iteration (corresponding to the line with 'circle' symbols) provides an additional gain of about 0.25 dB, compared to using one more decoding iteration, compared to the advance receiver with only a single decoding stage. It should also be noticed that additional iterations are required very infrequently in the region of FER of interest.

While there have been shown and described various novel features of the invention as applied to particular embodiments thereof, it will be understood that various omissions, substitutions and changes in the form and details of the systems and methods described and illustrated may be made by those skilled in the art without departing from the spirit of the invention. Those skilled in the art will recognize, based on the above disclosure and an understanding therefrom, that the particular hardware and devices that are part of FM HD and AM HD Radio systems, and the general functionality provided by and incorporated therein, may vary in different embodiments of the invention. Accordingly, the particular system components shown in FIG. 1-FIG. 57 are for illustrative purposes to facilitate a full and complete understanding and appreciation of the various aspects and functionality of particular embodiments of the invention as realized in systems and methods thereof. Those skilled in the art will appreciate that the invention can be practiced in other than the described embodiments, which are presented for purposes of illustration and not limitation, and the present invention is limited only by the claims which follow.

What is claimed is:

1. A method for generating check-to-variable messages during an iteration in decoding of codes represented by a parity check matrix, the method comprising the following steps for at least one variable node:
   a. calculating a check-to-variable message Mcv(i,j) from check node i to variable node j;
   b. identifying two smallest absolute values, $Min_1$ and $Min_2$, in a set of variable-to-check messages Mvc(i, k), where k≠j, excluding the message from variable j to check node i, Mvc(i,j);
   c. calculating a scaling factor $\alpha = 1 - \beta \cdot Min_1/Min_2$, where β is a non-negative number such that 0≤β≤1; and
   d. scaling the check-to-variable message Mcv(i,j) as Mcv(i,j)=α·Mcv(i,j).

2. The method of claim 1 wherein the check-to-variable message Mcv(i,j) from check node i to variable node j is calculated using a min-sum algorithm.

3. The method of claim 1 wherein the check-to-variable message Mcv(i,j) from check node i to variable node j is calculated using a sum-product algorithm.

4. A method for modifying variable-to-check messages during an iteration in decoding of codes represented by a parity check matrix, the method comprising the following steps for at least one variable node:
   a. calculating variable-to-check messages $Mvc(i,j)^{(n-1)}$ and $Mvc(i,j)^{(n)}$ from variable node j to check node i, respectively, in iterations (n−1) and (n), where n>2;
   b. comparing the positive or negative signs of variable-to-check messages $Mvc(i,j)^{(n-1)}$ and $Mvc(i,j)^{(n)}$ calculated in step a; and
   c. if said signs in step b) are different, generate modified variable-to-check message $\hat{M}vc(i,j)^{(n)}$ according to $\hat{M}vc(i,j)^{(n)} = g \cdot Mvc(i,j)^{(n)} + (1-g) \cdot Mvc(i,j)^{(n-1)}$, where 0.5<g≤1.

5. The method of claim 4 wherein the variable-to-check messages $Mvc(i,j)^{(n-1)}$ and $Mvc(i,j)^{(n)}$ from variable node j to check node i are calculated using a min-sum algorithm.

6. The method of claim 4 wherein the variable-to-check messages $Mvc(i,j)^{(n-1)}$ and $Mvc(i,j)^{(n)}$ from variable node j to check node i are calculated using a sum-product algorithm.

7. A method for simple greedy scheduling of check equation updates, for at least M equations, 1<M≤N−K, during an iteration in decoding of codes represented by a parity check matrix with N−K parity check rows and N columns, comprising the following steps:
   a. for the set of M'≤M of non-updated check nodes out of M check nodes of the parity check matrix, calculating $Val_i = Min_1 + Min_2$, i=1, 2, ..., L where L≥1 and where $Min_1$ and $Min_2$ are the two smallest values in the set of absolute values of variable-to-check messages {|Mvc(i, :)|} where index i corresponds to the set of non-updated check nodes;
   b. sorting the set {$Val_i$} calculated in step a in decreasing order to obtain an ordering vector I={$I_1, I_2, ..., I_L$}, such that $I_1$ is the index of a check node with the largest value Val, $I_2$ is the index of a check node with the next largest value Val and $I_L$, is the index of a check node with the smallest value Val;
   c. updating L check node equations selected in step b according to the ordering vector, I={$I_1, I_2, ..., I_L$} calculated in step b, by calculating and propagating corresponding check-to-variable messages and updating variable-to-check messages for all variables that receive check-to-variable messages in this step; and
   d. repeating steps a, b and c until all check nodes are updated by calculating and propagating corresponding check-to-variable messages.

8. The method of claim 7 wherein the check-to-variable messages {Mcv(i,j)} are calculated using a min-sum algorithm.

9. The method of claim 7 wherein the check-to-variable messages {Mcv(i,j)} are calculated using a sum-product algorithm.

10. A method for decoding codes represented by a parity check matrix of dimension (N−K)×N, comprising:
    a. generating P>1 parity check matrices with N−K sparse columns wherein up to N−K sparse columns contain only a single entry equal to 1 per column, wherein sparse columns of each of P parity check matrices correspond to different subsets of N−K bit log-likelihood ratios of N−K+R least reliable bit log-likelihood ratios, wherein R≥P is a configurable integer;
    b. decoding of channel log-likelihood ratios using said P parity check matrices with sparse columns to produce updated log-likelihood ratios by employing soft-input soft-output message passing decoding until a desired number of iterations is reached or until said decoding using at least one of said P matrices produces a valid codeword; and
    c. on the condition that decoding using said P parity check matrices produces no valid codeword, performing additional decoding that is based at least in part on algebraic decoding of the sequences of said updated log-likelihood ratios.

11. The method of claim 10 wherein said soft-input soft-output message passing decoding comprises the following steps for at least one variable node:
    a. calculating a check-to-variable message Mcv(i,j) from check node i to variable node j;
    b. identifying two smallest absolute values, $Min_1$ and $Min_2$, in a set of variable-to-check messages Mvc(i, k), where k≠j, excluding the message from variable j to check node i, Mvc(i,j);
    c. calculating the scaling factor $\alpha = 1 - \beta \cdot Min_1/Min_2$, where β is a non-negative number such that 0≤β≤1; and
    d. scaling the check-to-variable message Mcv(i,j) as Mcv(i,j)=α·Mcv(i,j).

12. The method of claim 10 wherein said soft-input soft-output message passing decoding comprises simple greedy scheduling of check equation updates, for at least M equations, 1<M≤N−K, during an iteration in decoding of codes represented by a parity check matrix with N−K parity check rows and N columns, comprises the following steps:
    a. for the set of M'≤M of non-updated check nodes out of M check nodes of the parity check matrix, calculating $Val_i = Min_1 + Min_2$, i=1, 2, ..., L where L≥1 and where $Min_1$ and $Min_2$ are the two smallest values in the set of absolute values of variable-to-check messages $\{|Mvc(i, :)|\}$ where index i corresponds to the set of non-updated check nodes;

b. sorting the set $\{Val_i\}$ calculated in step a in decreasing order to obtain an ordering vector $I=\{I_1, I_2, \ldots, I_L\}$, such that $I_1$ is the index of a check node with the largest value Val, $I_2$ is the index of a check node with the next largest value Val and $I_L$, is the index of a check node with the smallest value Val;

c. updating L check node equations selected in step b according to the ordering vector, $I=\{I_1, I_2, \ldots, I_L\}$ calculated in step b, by calculating and propagating corresponding check-to-variable messages and updating variable-to-check messages for all variables that received check-to-variable messages in this step; and d. repeating steps a, b and c until all check nodes are updated by calculating and propagating corresponding check-to-variable messages.

13. The method of claim 12 including storing updated P sequences of bit log likelihood ratios obtained after IT>1 iterations of said soft-input soft-output message passing decoding using P parity check matrices and on the condition that no valid codeword is produced using said additional decoding, further comprising the following steps:

a. identifying Q≤N−K disagreement positions on hard decisions of said P sequences of bit log-likelihood ratios;

b. generating P new parity check matrices such that the sparse columns include N−K columns corresponding to said Q≤N−K disagreement positions and, on the condition that Q<N−K, up to N−K−Q sparse columns corresponding to different combinations of N−K−Q of N−K−Q+R least reliable said updated P sequences of bit log-likelihood ratios, wherein R≥P is a configurable integer;

c. decoding said updated log-likelihood ratios using said P new parity check matrices to produce further updated log-likelihood ratios, employing soft-input soft-output message passing decoding until a desired number of iterations is reached or until decoding using at least one of said P new parity check matrices produces a valid codeword; and d. on the condition that said decoding using said P parity check matrices produces no valid codeword, performing additional decoding that is based at least in part on algebraic decoding of the sequences of said further updated log-likelihood ratios.

14. The method of claim 10 wherein said additional decoding is based on error and erasure decoding.

15. The method of claim 10 wherein said additional decoding is based on error only decoding.

16. The method of claim 10 wherein said soft-input soft-output message passing decoding is based on best graph belief propagation.

17. The method of claim 10 wherein said soft-input soft-output message passing decoding is based on belief propagation.

18. The method of claim 10 wherein during the course of iterations of said soft-input soft-output message passing decoding, one or more of P parity check matrices are updated one or more times based on updated bit log-likelihood ratios, wherein up to N−K sparse columns contain only a single entry equal to 1 per column, and wherein sparse columns of said one or more P parity check matrices correspond to different subsets of N−K bit log-likelihood ratios of N−K+R least reliable bit log-likelihood ratios.

19. A method for simple greedy scheduling of check equation updates, for at least M equations, where 1<M≤N−K, during an iteration in decoding of codes represented by a parity check matrix with N−K parity check rows and N columns, the method comprising the following steps:

a. for each check node i, out of M check nodes of the parity check matrix, calculating $Val_i=Min_1+Min_2$, i=1, 2, ..., L where L≥1 and where $Min_1$ and $Min_2$ are the two smallest values in the set of absolute values of variable-to-check messages $\{|Mvc(i,:)|\}$ where index i corresponds to the set of check nodes;

b. sorting the set $\{Val_i\}$ calculated in step a in decreasing order to obtain an ordering vector $I=\{I_1, I_2, \ldots, I_M\}$, such that $I_1$ is the index of a check node with the largest value Val, $I_2$ is the index of a check node with the next largest value Val and $I_M$ is the index of a check node with the smallest value Val; and c. updating M check node equations, according to the ordering vector, $I=\{I_1, I_2, \ldots I_M\}$ calculated in step b, by calculating and propagating corresponding check-to-variable messages.

20. The method of claim 19 wherein the variable-to-check messages Mvc(i, j) are calculated using a min-sum algorithm.

21. The method of claim 19 wherein the variable-to-check messages Mvc(i, j) are calculated using a sum-product algorithm.

\* \* \* \* \*